US007538033B2

(12) United States Patent
Trezza

(10) Patent No.: US 7,538,033 B2
(45) Date of Patent: May 26, 2009

(54) POST-ATTACHMENT CHIP-TO-CHIP CONNECTION

(76) Inventor: John Trezza, 12 White Oak Dr., Nashua, NH (US) 03063

( * ) Notice: Subject to any disclaimer, the term of this patent is extended or adjusted under 35 U.S.C. 154(b) by 0 days.

(21) Appl. No.: 11/329,873

(22) Filed: Jan. 10, 2006

(65) Prior Publication Data
US 2006/0281307 A1 Dec. 14, 2006

Related U.S. Application Data

(60) Provisional application No. 60/690,759, filed on Jun. 14, 2005.

(51) Int. Cl.
*H01L 21/30* (2006.01)
(52) U.S. Cl. ........................ 438/667; 438/455
(58) Field of Classification Search ................ 438/406, 438/672, 107, 108, 597, 678, 675, 460, 106, 438/637, 640, 667, 455, 456
See application file for complete search history.

(56) References Cited

U.S. PATENT DOCUMENTS

| 3,312,878 | A | 4/1967 | Poch et al. |
| 3,720,309 | A | 3/1973 | Weir |
| 4,915,494 | A | 4/1990 | Shipley et al. |
| 5,089,055 | A | 2/1992 | Nakamura |
| 5,089,880 | A | 2/1992 | Meyer et al. |
| 5,100,480 | A | 3/1992 | Hayafuji |
| 5,220,530 | A | 6/1993 | Itoh |
| 5,229,315 | A | 7/1993 | Jun et al. |
| 5,308,784 | A | 5/1994 | Kim et al. |
| 5,399,898 | A | 3/1995 | Rostoker |
| 5,427,834 | A | 6/1995 | Sodetz |

(Continued)

FOREIGN PATENT DOCUMENTS

EP 0 516 866 A1 12/1992

(Continued)

OTHER PUBLICATIONS

Topol, A.W.; Furman, B.K.; Guarini, K.W.; Shi, L.; Cohen, G.M.; Walker, G.F., "Enabling Technologies for Wafer-Level Bonding of 3D MEMS and Integrated Circuit Structures", Electronic Components and Technology Conference, 2004. Proceedings. 54th, Publication Date: Jun. 1-4, 2004, vol. 1, pp. 931-938 vol. 1.*

(Continued)

*Primary Examiner*—W. David Coleman
*Assistant Examiner*—Shaka Scarlett

(57) ABSTRACT

A method of forming an electrical connection from a first chip, having a contact pad exposed through an opening in cover glass on the chip, to a second chip having a first side and a second side and involves attaching the second chip to the first chip, etching an annular via having an inner and outer perimeter, the inner perimeter corresponding to an outer perimeter of the contact pad, the annular via extending into and through the second chip and down to the cover glass such that the annular via's inner perimeter substantially corresponds to the contact pad's outer perimeter, filling the annular via with an insulator, removing semiconductor material of the second chip within the inner perimeter of the insulator to create a void extending from the second side to the contact pad, and filling at least some of the void with a conductive material.

17 Claims, 122 Drawing Sheets

U.S. PATENT DOCUMENTS

| | | | |
|---|---|---|---|
| 5,470,787 A | 11/1995 | Greer | |
| 5,523,628 A | 6/1996 | Williams et al. | |
| 5,561,594 A | 10/1996 | Wakefield | |
| 5,563,084 A | 10/1996 | Ramm et al. | |
| 5,587,119 A * | 12/1996 | White | 264/104 |
| 5,589,029 A | 12/1996 | Matsui et al. | |
| 5,598,965 A | 2/1997 | Scheu | |
| 5,608,264 A | 3/1997 | Gaul | |
| 5,635,014 A | 6/1997 | Taylor | |
| 5,708,569 A * | 1/1998 | Howard et al. | 361/760 |
| 5,780,776 A | 7/1998 | Noda | |
| 5,814,889 A | 9/1998 | Gaul | |
| 5,872,338 A | 2/1999 | Lan et al. | |
| 5,929,524 A | 7/1999 | Drynan et al. | |
| 5,962,922 A * | 10/1999 | Wang | 257/773 |
| 5,963,793 A | 10/1999 | Rinne et al. | |
| 5,973,396 A | 10/1999 | Farnworth | |
| 6,037,665 A * | 3/2000 | Miyazaki | 257/773 |
| 6,075,710 A | 6/2000 | Lau | |
| 6,087,719 A | 7/2000 | Tsunashima | |
| 6,118,181 A | 9/2000 | Merchant et al. | |
| 6,135,635 A | 10/2000 | Miller et al. | |
| 6,184,066 B1 | 2/2001 | Chino et al. | |
| 6,188,118 B1 | 2/2001 | Severn | |
| 6,207,475 B1 | 3/2001 | Lin et al. | |
| 6,215,114 B1 | 4/2001 | Yagi et al. | |
| 6,283,693 B1 | 9/2001 | Acello et al. | |
| 6,314,013 B1 | 11/2001 | Ahn et al. | |
| 6,316,737 B1 * | 11/2001 | Evans et al. | 174/260 |
| 6,393,638 B1 | 5/2002 | Maccoll | |
| 6,410,431 B2 | 6/2002 | Bertin et al. | |
| 6,451,626 B1 | 9/2002 | Lin | |
| 6,498,089 B2 | 12/2002 | Komada | |
| 6,555,418 B2 | 4/2003 | Kurosawa et al. | |
| 6,557,192 B2 | 5/2003 | Zheng | |
| 6,559,540 B2 | 5/2003 | Kawashima | |
| 6,576,830 B2 | 6/2003 | Nagao et al. | |
| 6,577,013 B1 | 6/2003 | Glenn et al. | |
| 6,590,278 B1 | 7/2003 | Behun et al. | |
| 6,599,778 B2 | 7/2003 | Pogge et al. | |
| 6,617,507 B2 | 9/2003 | Mapes et al. | |
| 6,635,960 B2 | 10/2003 | Farrar | |
| 6,635,970 B2 | 10/2003 | Lasky et al. | |
| 6,686,654 B2 | 2/2004 | Farrar et al. | |
| 6,689,949 B2 | 2/2004 | Ortabasi | |
| 6,703,555 B2 | 3/2004 | Takabayashi et al. | |
| 6,704,953 B2 | 3/2004 | Fishman | |
| 6,706,554 B2 | 3/2004 | Ogura | |
| 6,717,045 B2 | 4/2004 | Chen | |
| 6,730,840 B2 | 5/2004 | Sasaoka et al. | |
| 6,740,576 B1 * | 5/2004 | Lin et al. | 438/611 |
| 6,756,594 B2 | 6/2004 | George et al. | |
| 6,770,555 B2 | 8/2004 | Yamazaki | |
| 6,770,822 B2 | 8/2004 | Pasternak et al. | |
| 6,780,280 B2 | 8/2004 | Halterbeck et al. | |
| 6,818,818 B2 | 11/2004 | Bareis | |
| 6,824,643 B2 | 11/2004 | Yoshimoto et al. | |
| 6,869,856 B2 | 3/2005 | Combi et al. | |
| 6,872,635 B2 | 3/2005 | Hayashi et al. | |
| 6,889,427 B2 | 5/2005 | Yee et al. | |
| 6,903,443 B2 | 6/2005 | Farnworth et al. | |
| 6,938,783 B2 | 9/2005 | Chung | |
| 6,939,789 B2 | 9/2005 | Huang et al. | |
| 6,967,307 B2 | 11/2005 | Hembree et al. | |
| 6,992,824 B1 | 1/2006 | Motamedi et al. | |
| 7,013,509 B2 | 3/2006 | Hickman | |
| 7,023,347 B2 | 4/2006 | Arneson et al. | |
| 7,107,666 B2 | 9/2006 | Hiatt et al. | |
| 7,135,777 B2 | 11/2006 | Bakir et al. | |
| 7,138,706 B2 | 11/2006 | Arai et al. | |
| 7,144,759 B1 | 12/2006 | Hilton et al. | |
| 7,157,310 B2 * | 1/2007 | Benson et al. | 438/107 |
| 7,157,372 B1 | 1/2007 | Trezza | |
| 7,170,183 B1 | 1/2007 | Kim et al. | |
| 7,227,213 B2 | 6/2007 | Mastromatteo et al. | |
| 7,242,099 B2 | 7/2007 | Lin et al. | |
| 7,249,992 B2 | 7/2007 | Kalenian et al. | |
| 7,253,519 B2 | 8/2007 | Huang et al. | |
| 7,262,082 B1 | 8/2007 | Lin et al. | |
| 7,271,491 B1 * | 9/2007 | Akram | 257/774 |
| 7,276,787 B2 | 10/2007 | Edelstein et al. | |
| 7,294,531 B2 | 11/2007 | Hwang et al. | |
| 7,300,865 B2 | 11/2007 | Hsieh et al. | |
| 2001/0001292 A1 * | 5/2001 | Bertin et al. | 438/107 |
| 2001/0018230 A1 | 8/2001 | Jimarez et al. | |
| 2001/0033509 A1 | 10/2001 | Ahn et al. | |
| 2001/0048166 A1 | 12/2001 | Miyazaki | |
| 2002/0017399 A1 | 2/2002 | Chang et al. | |
| 2002/0027441 A1 | 3/2002 | Akram et al. | |
| 2002/0053726 A1 | 5/2002 | Mikubo et al. | |
| 2002/0094675 A1 | 7/2002 | Kerr et al. | |
| 2002/0102835 A1 | 8/2002 | Stucchi et al. | |
| 2002/0127761 A1 | 9/2002 | Mottura et al. | |
| 2002/0134581 A1 | 9/2002 | Figueroa et al. | |
| 2003/0047799 A1 | 3/2003 | Cheever et al. | |
| 2003/0049425 A1 | 3/2003 | Ono et al. | |
| 2003/0052324 A1 | 3/2003 | Kimura | |
| 2003/0080408 A1 | 5/2003 | Farnworth et al. | |
| 2003/0085471 A1 | 5/2003 | Iijima et al. | |
| 2003/0159262 A1 | 8/2003 | Pasternak et al. | |
| 2003/0206603 A1 | 11/2003 | Bakir et al. | |
| 2003/0222354 A1 | 12/2003 | Mastromatteo et al. | |
| 2004/0029304 A1 | 2/2004 | Naydenkov et al. | |
| 2004/0051168 A1 | 3/2004 | Arai et al. | |
| 2004/0077154 A1 * | 4/2004 | Nagarajan et al. | 438/455 |
| 2004/0124523 A1 | 7/2004 | Poo et al. | |
| 2004/0126927 A1 | 7/2004 | Lin et al. | |
| 2004/0199998 A1 | 10/2004 | Shinner | |
| 2004/0207061 A1 | 10/2004 | Farrar et al. | |
| 2004/0256686 A1 | 12/2004 | Sassolini et al. | |
| 2004/0262635 A1 | 12/2004 | Lee | |
| 2005/0046034 A1 | 3/2005 | Farrar | |
| 2005/0104027 A1 | 5/2005 | Lazarev | |
| 2005/0104219 A1 | 5/2005 | Matsui | |
| 2005/0121768 A1 * | 6/2005 | Edelstein et al. | 257/698 |
| 2005/0146049 A1 | 7/2005 | Kripesh et al. | |
| 2005/0163982 A1 | 7/2005 | Ono et al. | |
| 2005/0230804 A1 | 10/2005 | Tanida et al. | |
| 2005/0233504 A1 | 10/2005 | Doi et al. | |
| 2005/0262634 A1 | 12/2005 | Gottlieb | |
| 2005/0263869 A1 | 12/2005 | Tanaka et al. | |
| 2006/0001174 A1 | 1/2006 | Matsui | |
| 2006/0057836 A1 * | 3/2006 | Nagarajan et al. | 438/622 |
| 2006/0228825 A1 | 10/2006 | Hembree | |
| 2006/0252262 A1 | 11/2006 | Kazemi | |
| 2006/0275946 A1 | 12/2006 | MacNamara et al. | |
| 2006/0278988 A1 | 12/2006 | Trezza et al. | |
| 2006/0278992 A1 | 12/2006 | Trezza et al. | |
| 2006/0281303 A1 | 12/2006 | Trezza et al. | |
| 2006/0281363 A1 | 12/2006 | Trezza | |
| 2006/0289990 A1 | 12/2006 | Farrar | |
| 2007/0096263 A1 | 5/2007 | Furukawa et al. | |
| 2007/0228576 A1 | 10/2007 | Trezza | |
| 2007/0249093 A1 | 10/2007 | Aiba et al. | |
| 2007/0278641 A1 | 12/2007 | Trezza | |
| 2008/0029851 A1 | 2/2008 | Kirby et al. | |
| 2008/0284037 A1 | 11/2008 | Andry et al. | |

FOREIGN PATENT DOCUMENTS

| | | |
|---|---|---|
| EP | 0620701 | 10/1994 |
| EP | 0 757 386 A2 | 2/1997 |
| EP | 1 415 950 | 5/2004 |
| EP | 1 643 819 | 4/2006 |

| | | |
|---|---|---|
| JP | 2001-129800 | 5/2001 |
| JP | 2004-214423 | 7/2004 |
| JP | 2004-273596 | 9/2004 |

OTHER PUBLICATIONS

Topol et al. "Enabling Technologies for Wafer-Level Bonding of 3D MEMS and Integrated Circuit Structures", Electronic Components and technology Conference 2004, Proceedings 54th, vol. 1, Jun. 1-4, 2004, pp. 931-938.*

International Search Report for PCT/US06/23297, dated Jan. 3, 2007.

International Search Report, PCT/US06/23249, dated Jun. 11, 2007.

International Search Report for PCT/US06/23366, dated Dec. 8, 2006.

International Search Report and Written Opinion for PCT/US2006/23249 mailed Jun. 19, 2007.

International Search Report and Written Opinion for PCT/US2006/23365 mailed Jan. 19, 2007.

International Search Report and Written Opinion for PCT/US2006/23362 mailed May 20, 2008.

International Search Report and Written Opinion for PCT/US2006/023250 mailed on May 19, 2008.

International Search Report and Written Opinion for PCT/US2008/053994 mailed on May 26, 2008.

International Search Report and Written Opinion for PCT/US2007/089061 mailed on Jun. 26, 2008.

International Search Report and Written Opinion for PCT/US2006/023367 mailed on Jun. 10, 2008.

Written Opinion for PCT/US2006/023297 mailed on Jan. 3, 2007.

Written Opinion for PCT/US2006/023364 mailed on Dec. 28, 2006.

Written Opinion for PCT/US2006/023366 mailed on Dec. 8, 2006.

Written Opinion for PCT/US2006/023361 mailed on Sep. 19, 2007.

"Fiber Optics Tutorial—Terminating Website" http://www.lanshack.com/fiber-optic-tutorial-termination.asp, Accessed Aug. 1, 2003, Available from www.archive.org, 7 pages.

International Search Report and Written Opinion for PCT/US2008/064136 mailed on Sep. 26, 2008.

* cited by examiner

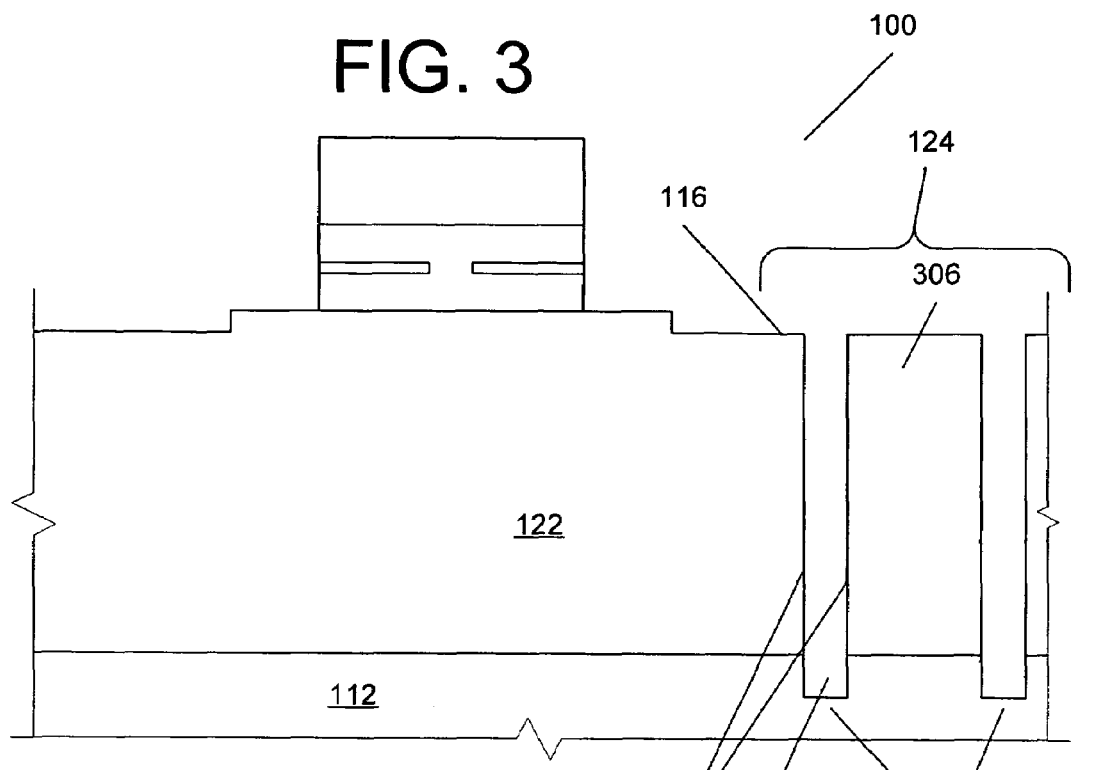
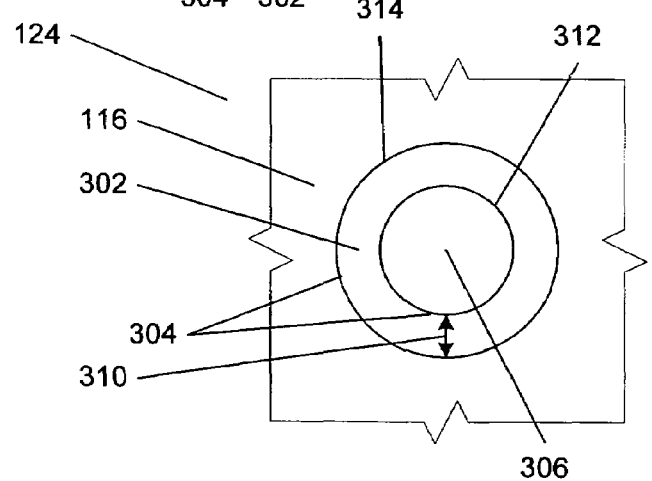

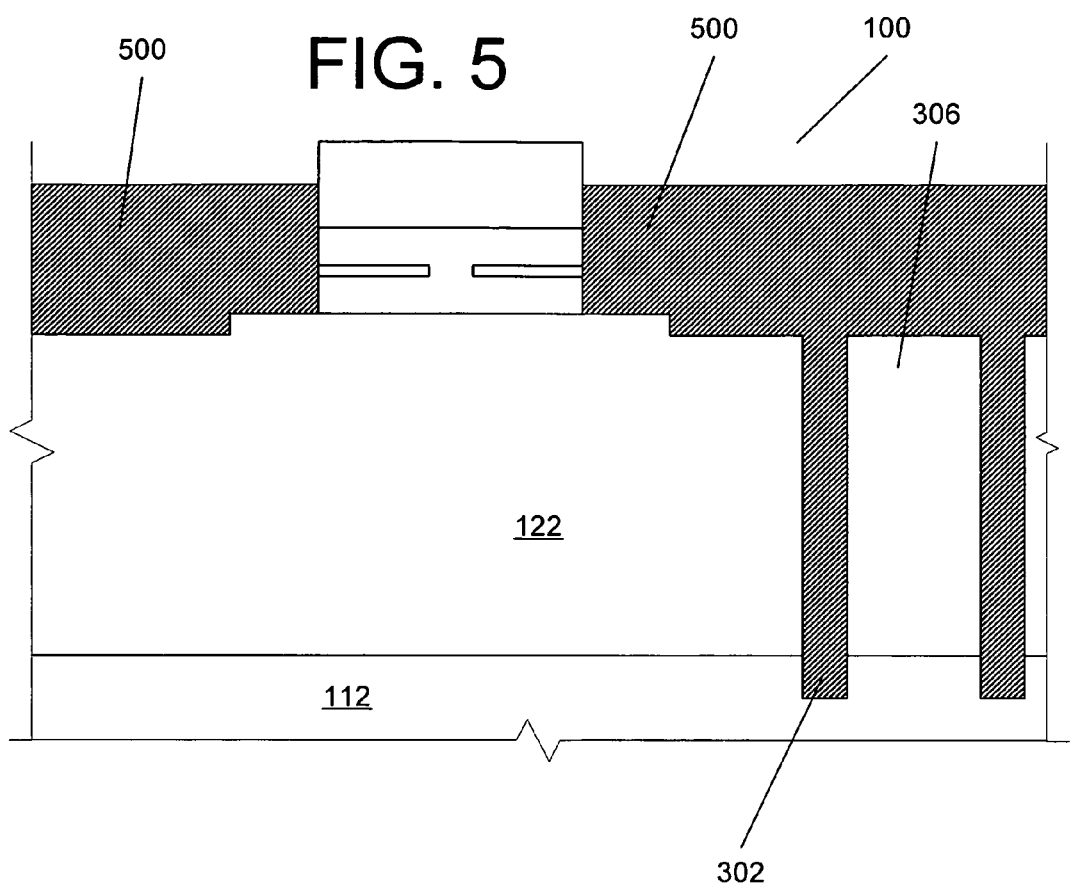
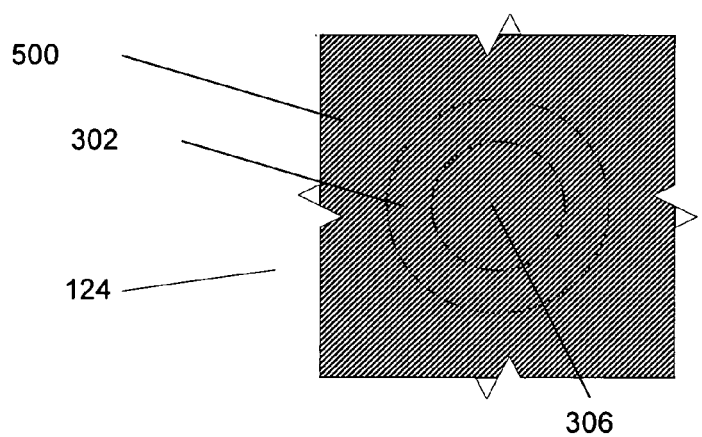

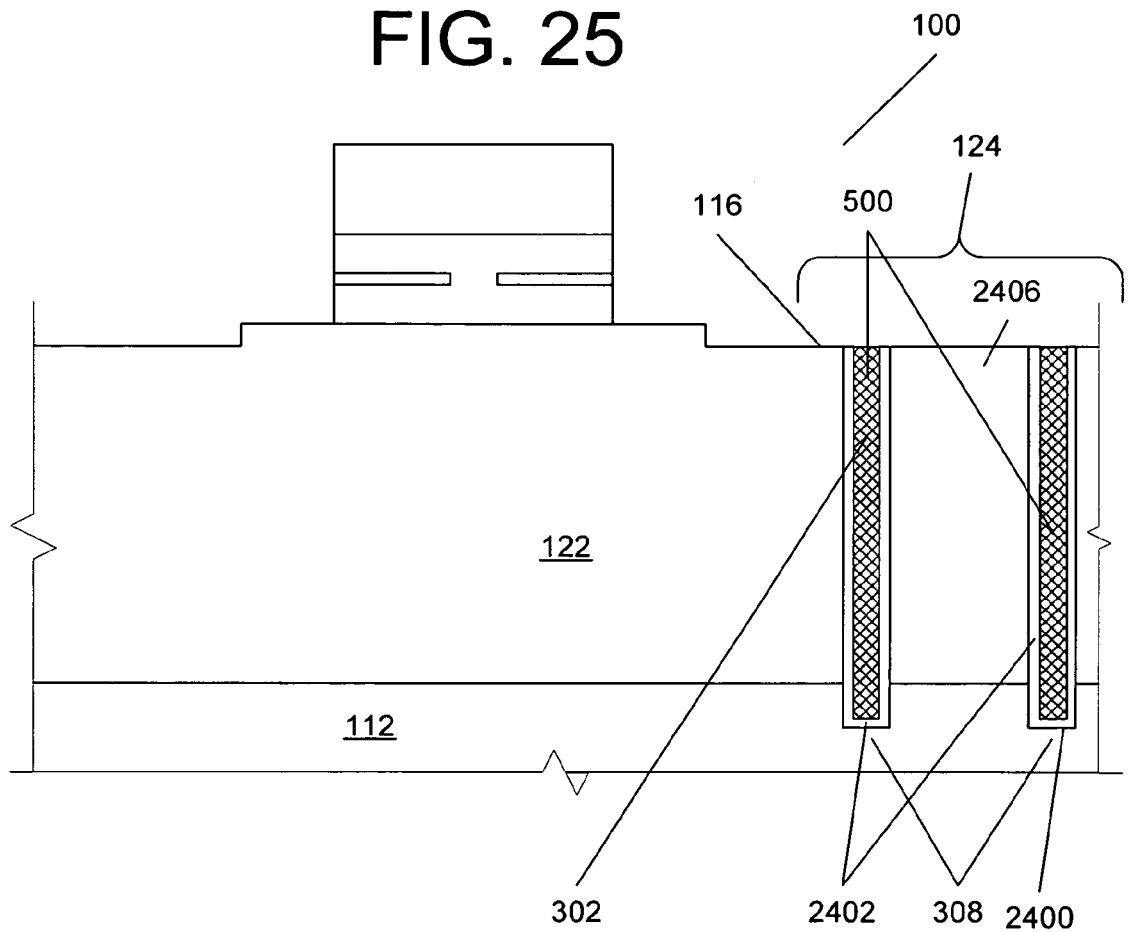

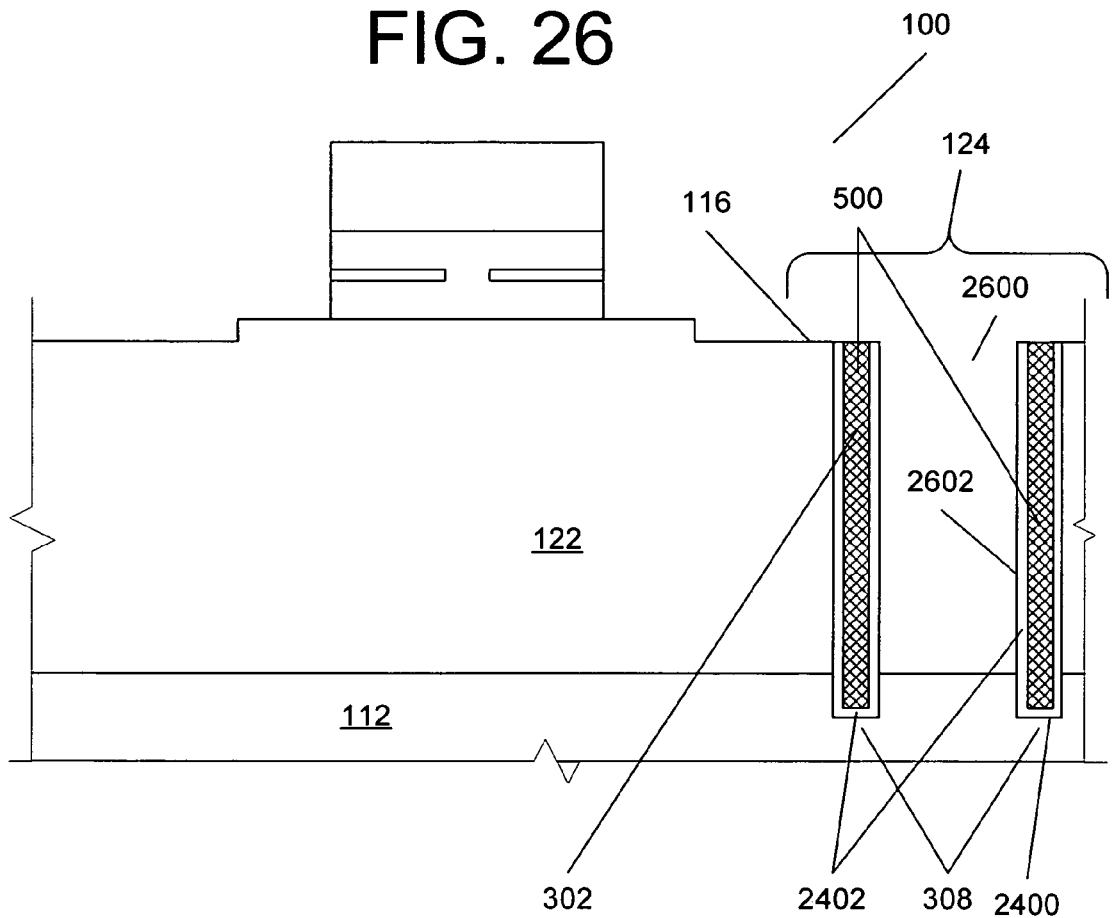

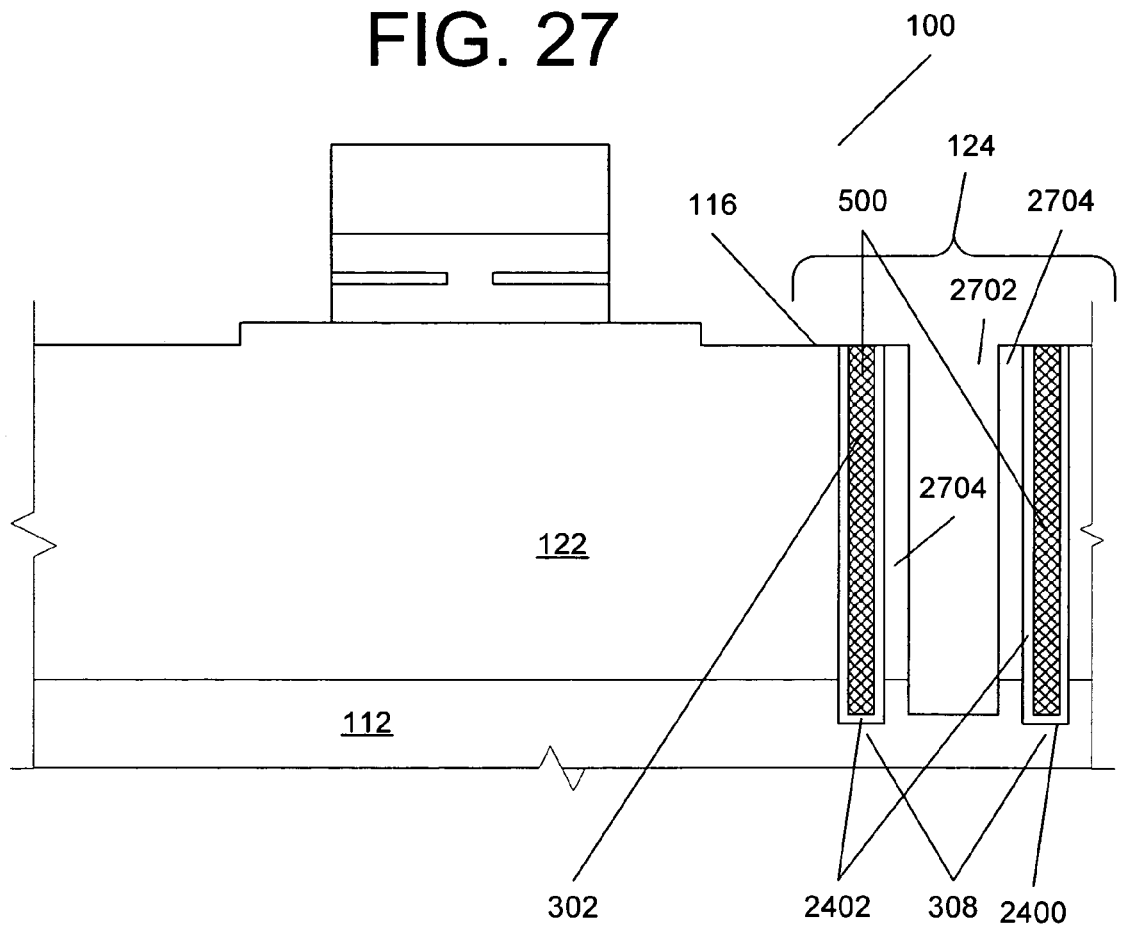

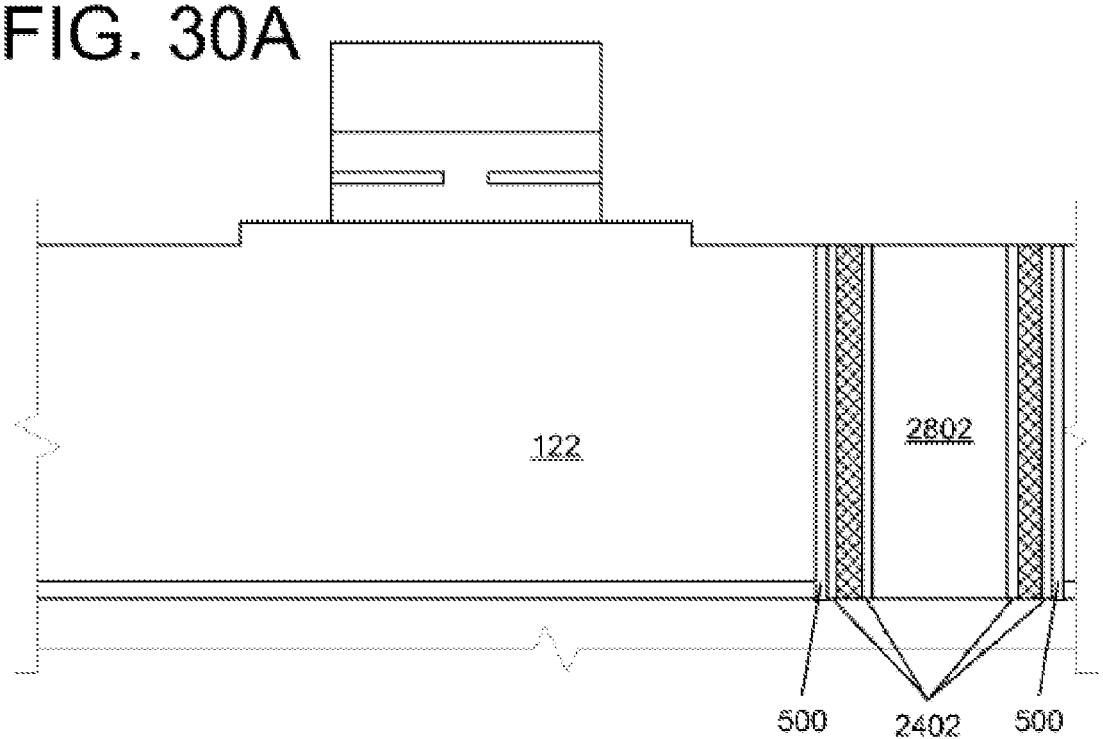
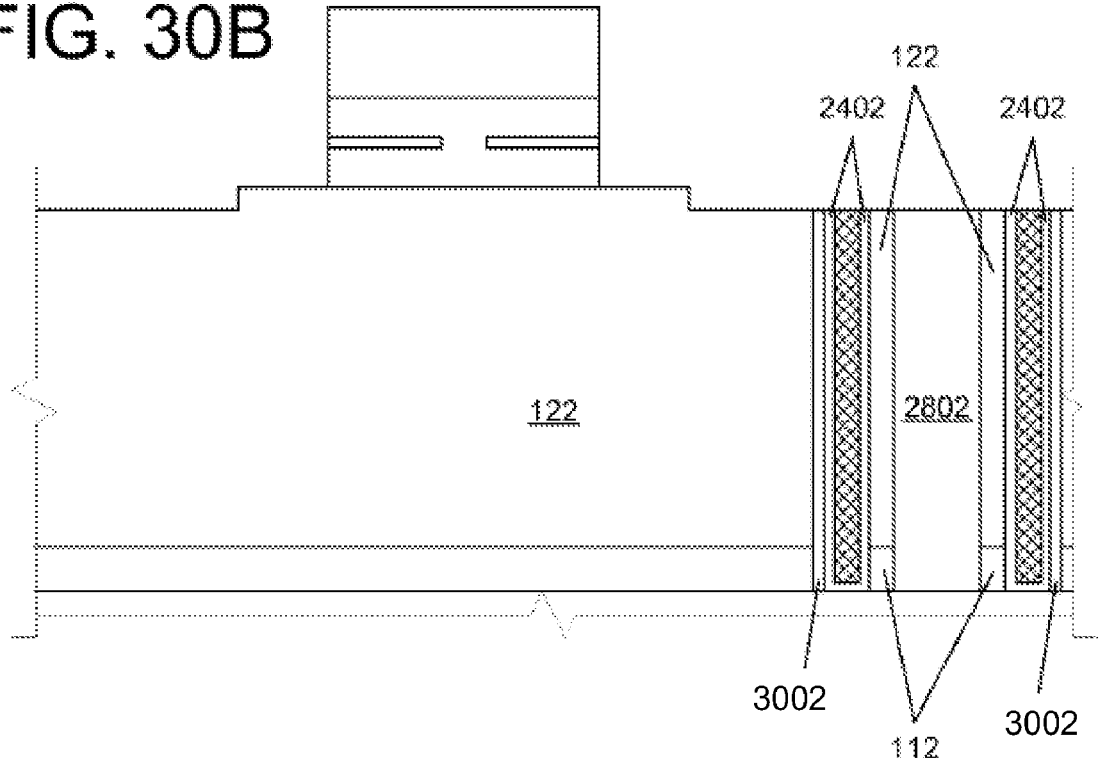

FC 150
300g pressure (heat to 360°C)
FIG. 45
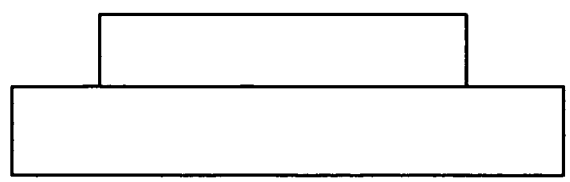
Ramp to 360°C
Daughter Pressure: 300g
Daughter Temp; to 360°C
Mother Temp: Ramp XX to 360°C
Wafer Size: 2"
TACK
Alignment Time: 2 minutes
Pressure/heat time: 1 minute
Unload Time: 0.5 minute
Total per-die time 3.5 minutes
Fuse Time: N/A
XX = Isotherm Temperature

Datacon Slow Stage 1 to 3kg Pressure at tack
Heat to 340°C to 360°C at tack
Less technical fuse complexity

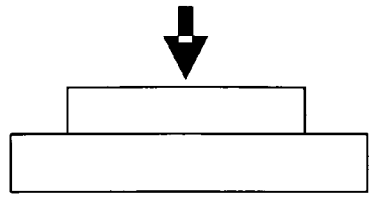

Fixed at 230°C

Daughter Pressure: 3000g
Daughter Temp; to 360°C
Mother Temp: FIXED 230°C
Max Wafer Size: 8"

TACK
Alignment Time: 0.02 min
Pressure/heat time: 0.6 min
Unload Time: 0.02
Total per-die time 0.64 minutes Fuse Time: Anneal—not 'true' 'deep fuse' needed

Lower risk tack & fuse— put lots of time on tack to de-risk fuse

Datacon Fast Stage 1 to 3kg pressure at tack
Heat to 320°C at tack
Greater technical fuse complexity
(pressure; environment)

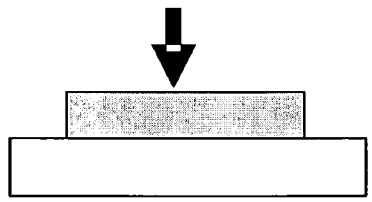

Fixed at 230°C

Daughter Pressure: 3000g
Daughter Temp; to 320°C
Mother Temp: FIXED 230°C
Max Wafer Size: 8"

TACK
Alignment Time: 0.02 min
Pressure/heat time: 0.04 min
Unload Time: 0.02
Total per-die time 0.08 minutes Fuse Time: 10 min (per wafer)

Decrease time on tack to speed throughput

There is a Continuum from stage 1 to 2

FIG. 46

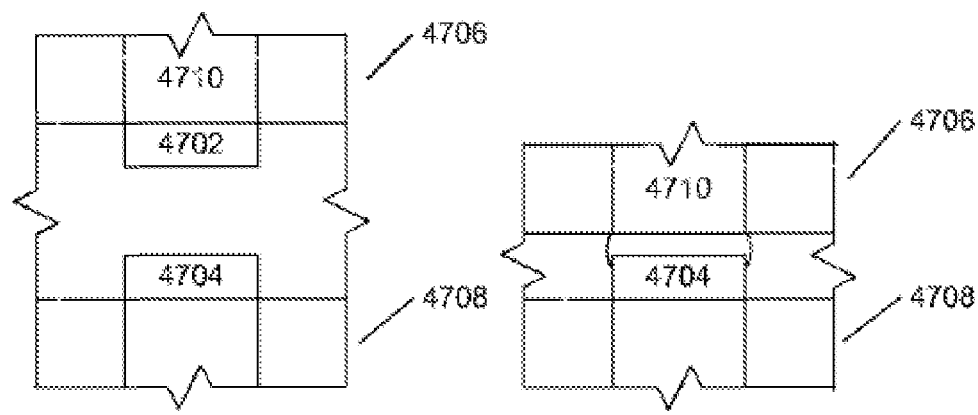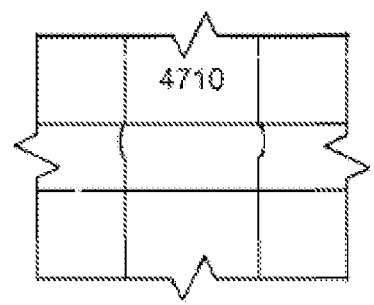
FIG. 47
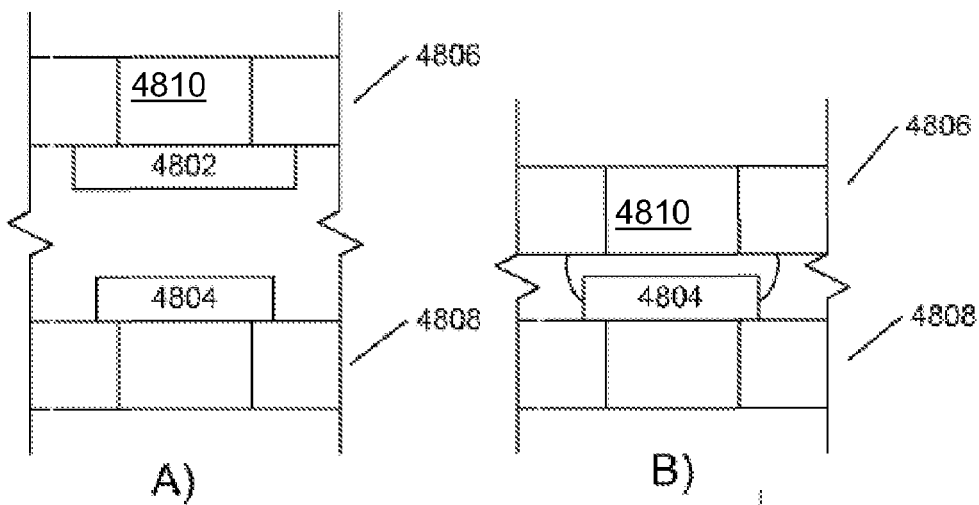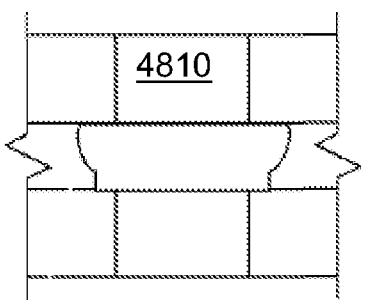
FIG. 48

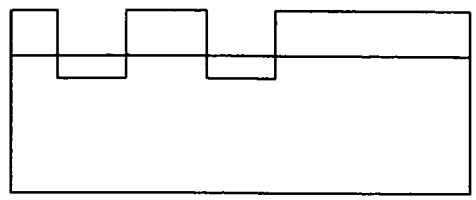 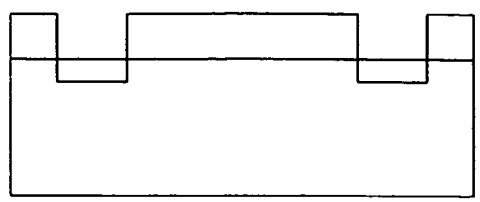
a)                  b)
FIG. 57
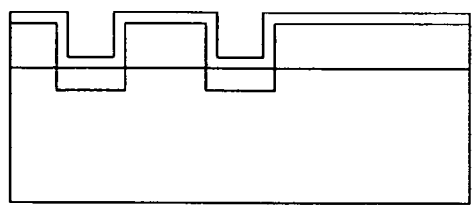 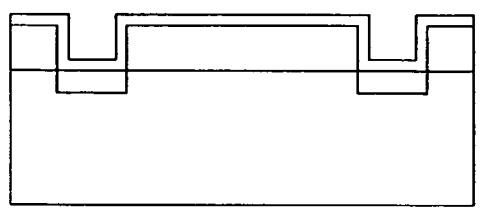
a)                  b)
FIG. 58
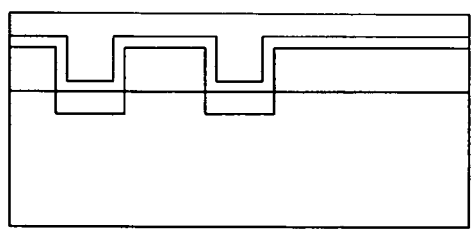 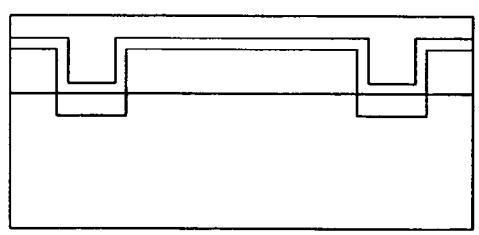
a)                  b)
FIG. 59

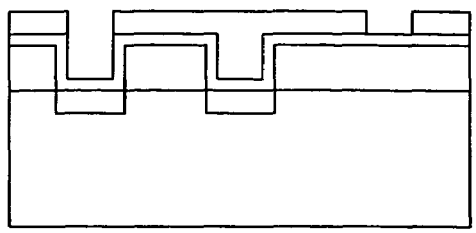 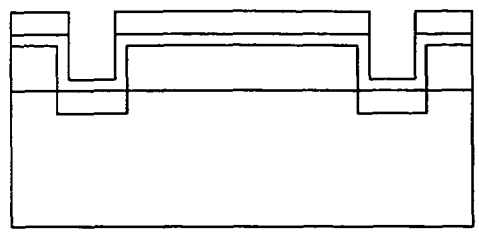
a)          b)
FIG. 60
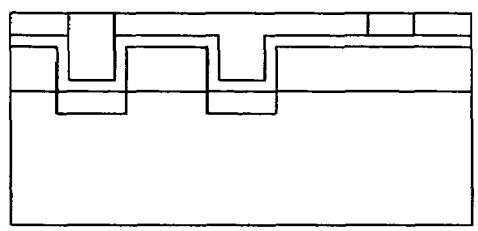 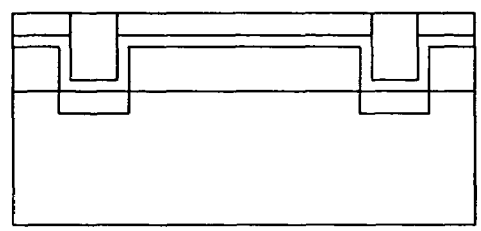
a)          b)
FIG. 61
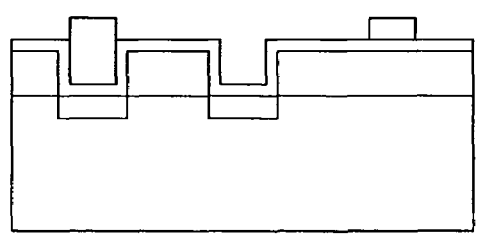 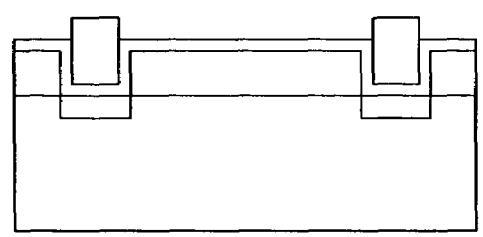
a)          b)
FIG. 62

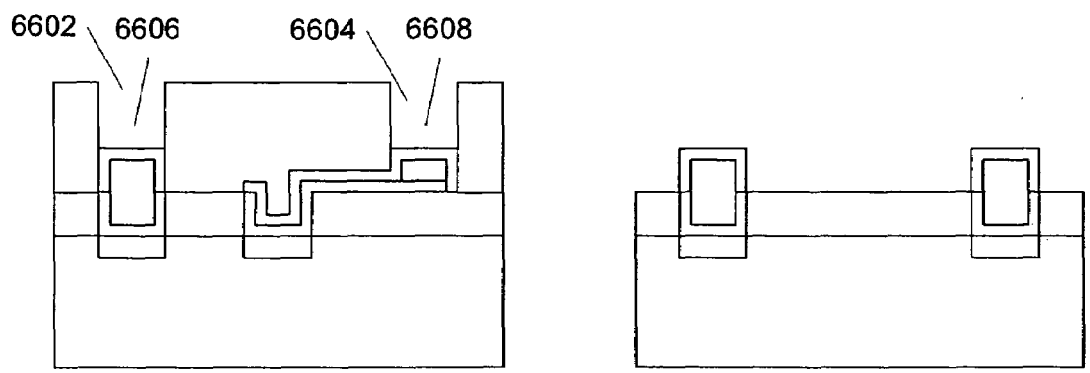
a) FIG. 66 b)
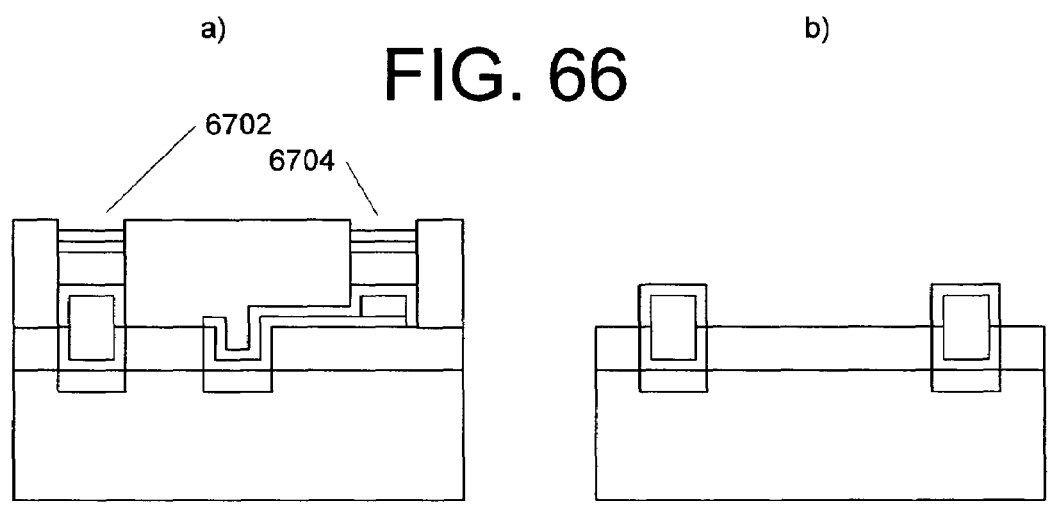
a) FIG. 67 b)
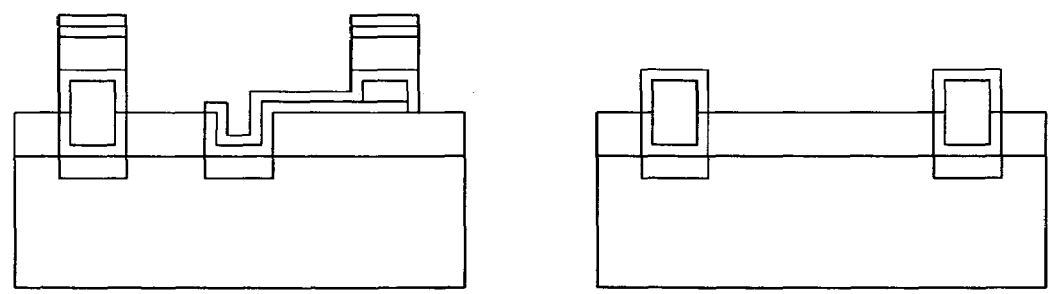
a) FIG. 68 b)

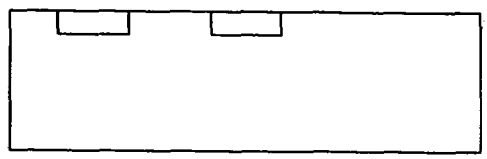 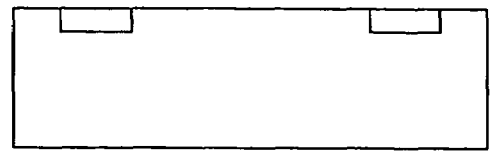
a) b)
FIG. 72
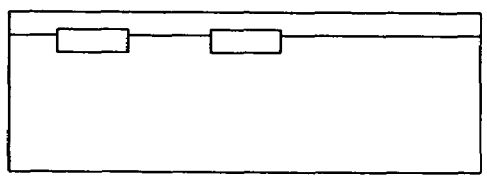 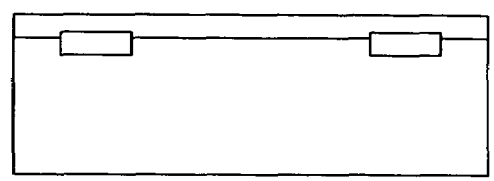
a) b)
FIG. 73
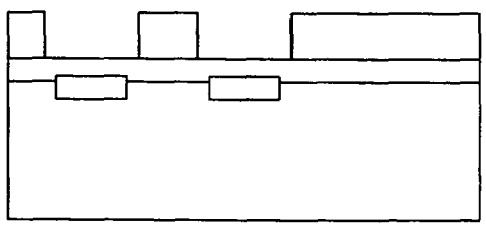 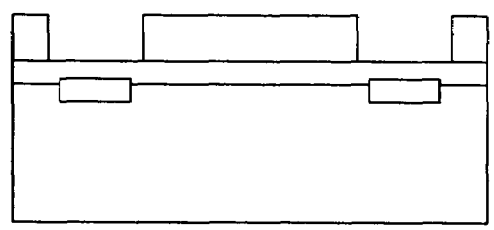
a) b)
FIG. 74

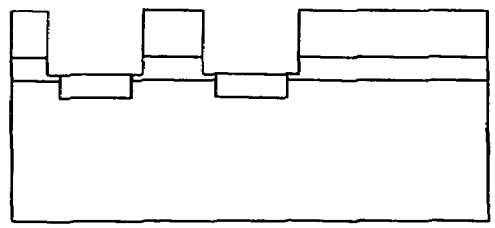
a)
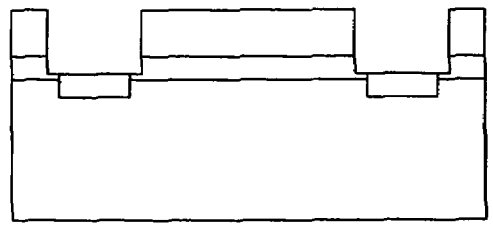
b)
FIG. 75
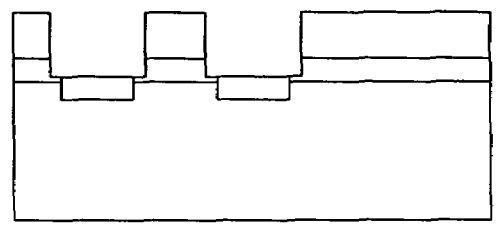
a)
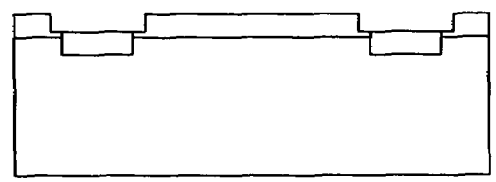
b)
FIG. 76
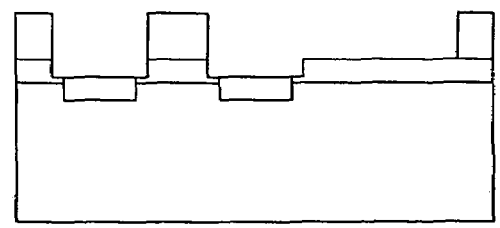
a)
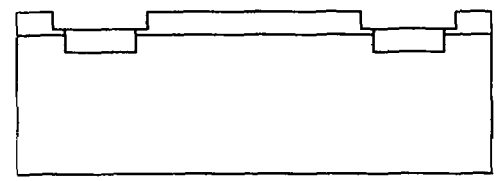
b)
FIG. 77

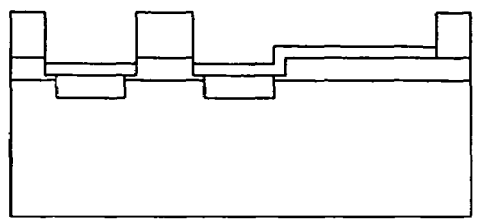 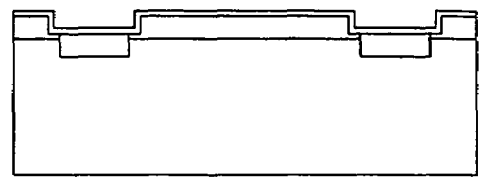
a) b)
FIG. 78
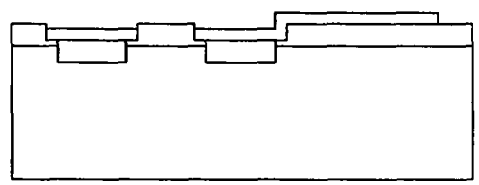 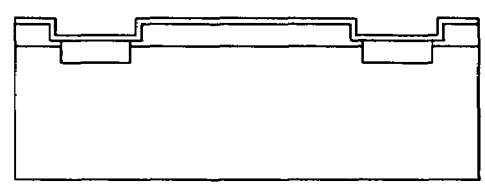
a) b)
FIG. 79
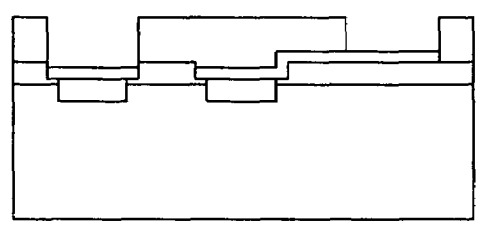 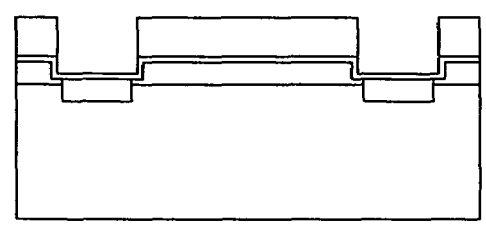
a) b)
FIG. 80

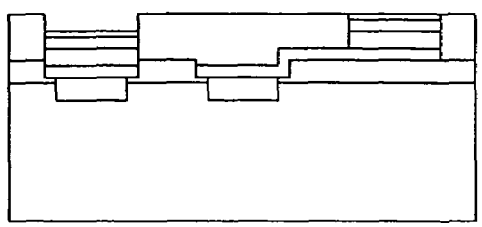 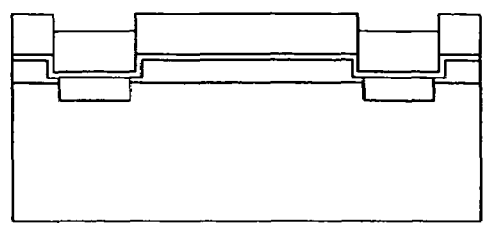
a)　　　　　　　　　　　　b)
FIG. 81
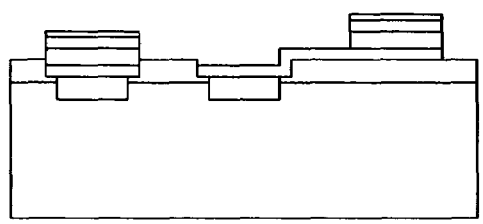 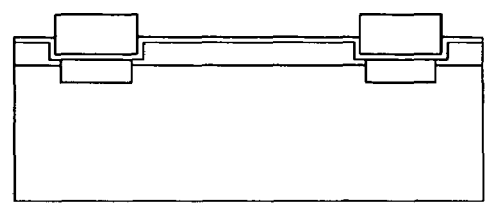
a)　　　　　　　　　　　　b)
FIG. 82
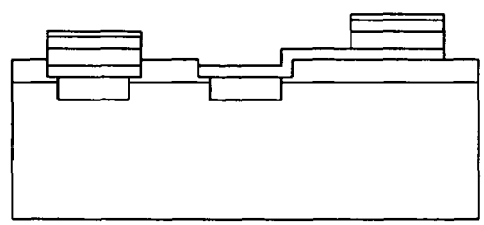 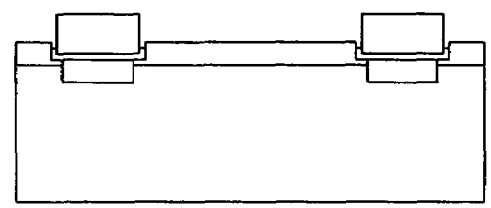
a)　　　　　　　　　　　　b)
FIG. 83 a)                          b)

20um diameter
~ 150um deep 20 um diameter
100um deep filled Via

FIG. 109
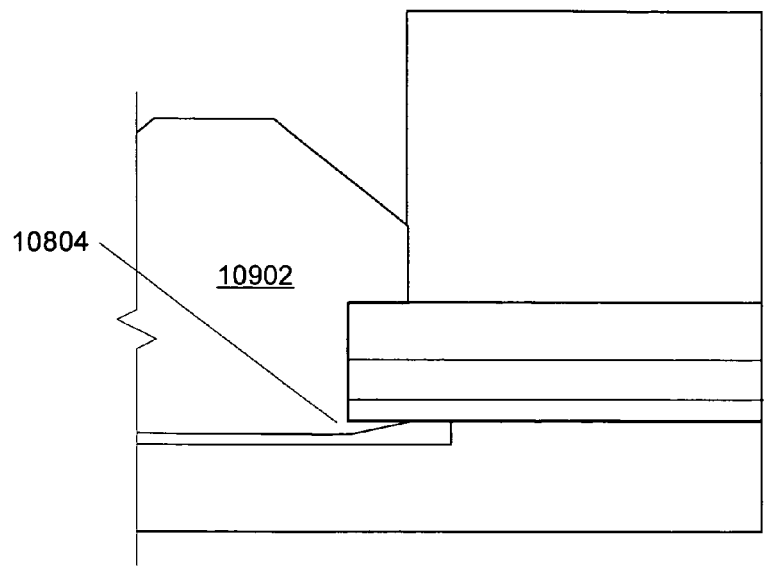
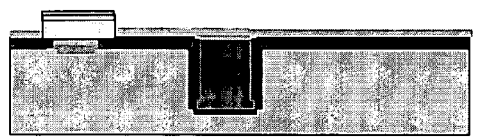 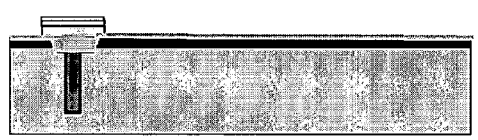 Daughter Wafer
 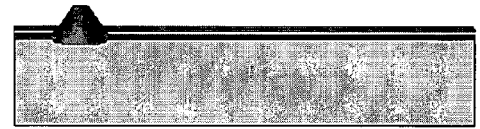 Mother Wafer
FIG. 110
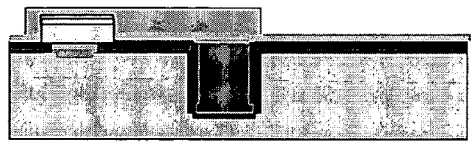 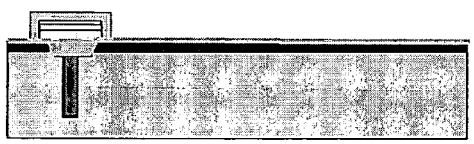 Daughter Wafer
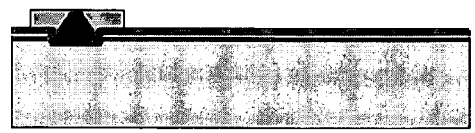 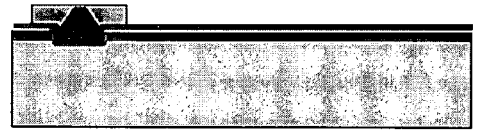 Mother Wafer
FIG. 111

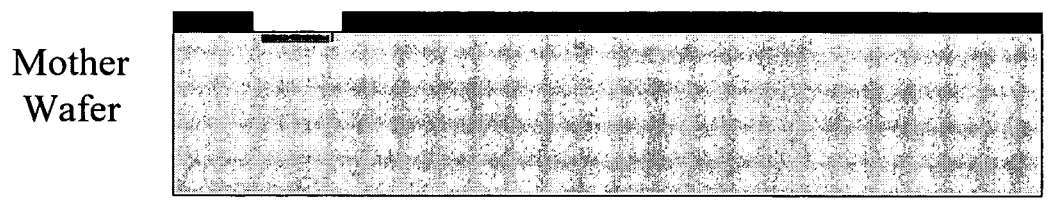
FIG. 126
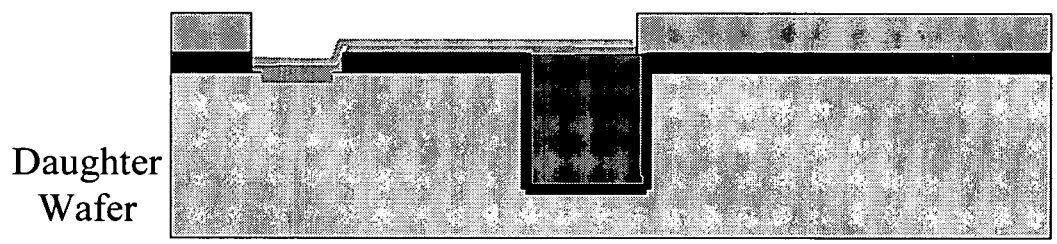
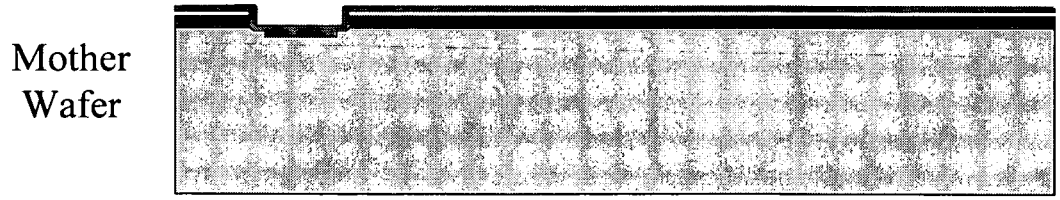
FIG. 127

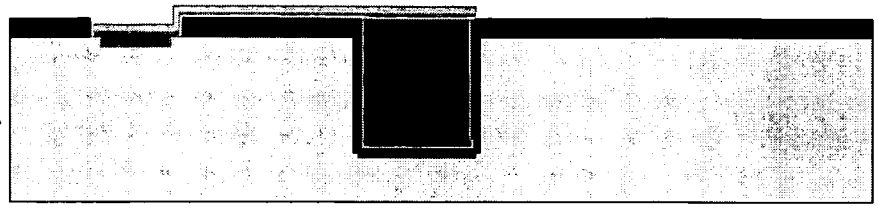
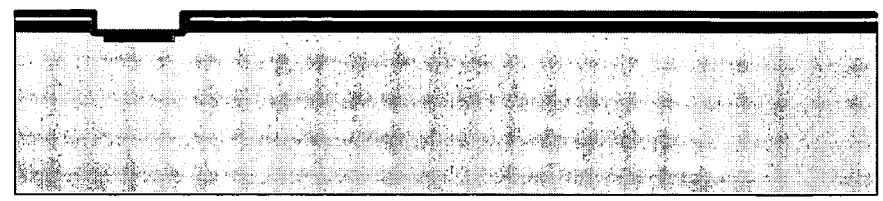
FIG. 128
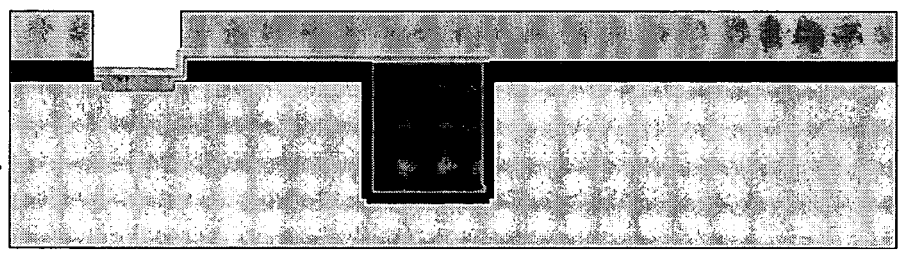
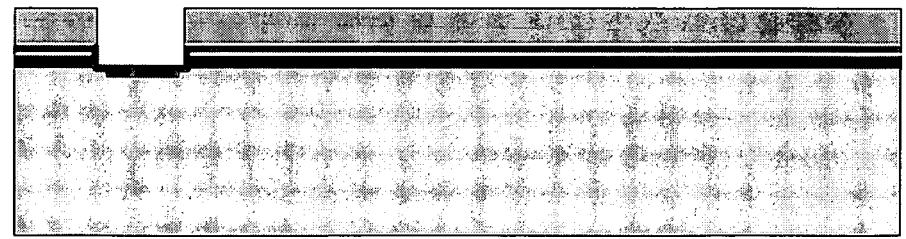
FIG. 129

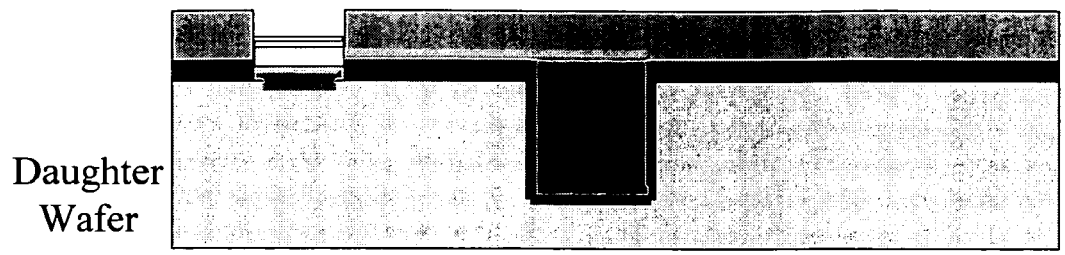
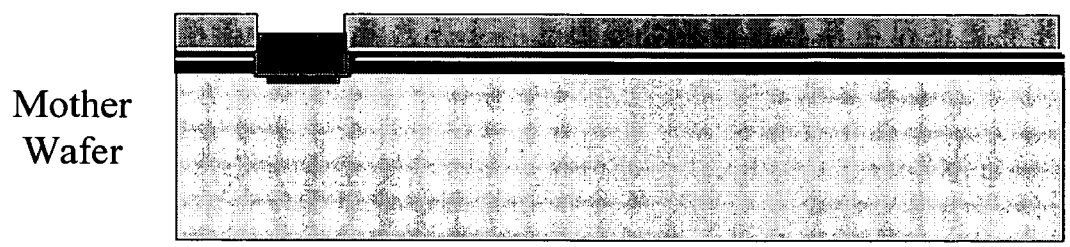
FIG. 130
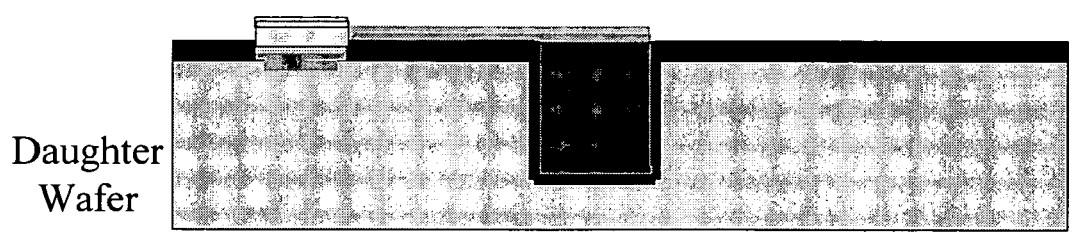
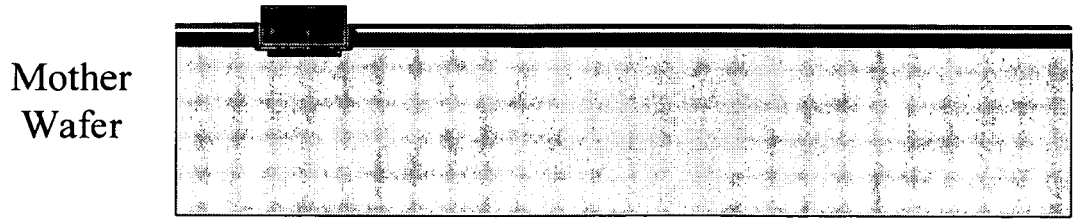
FIG. 131

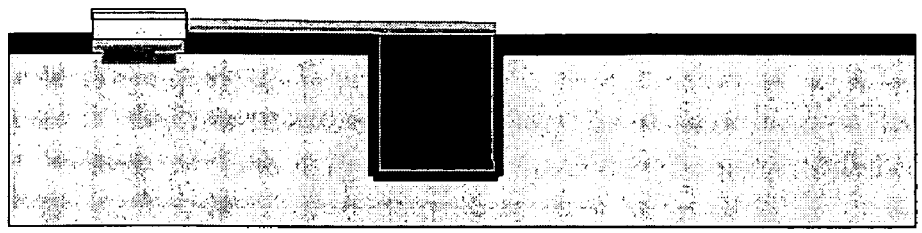
FIG. 132
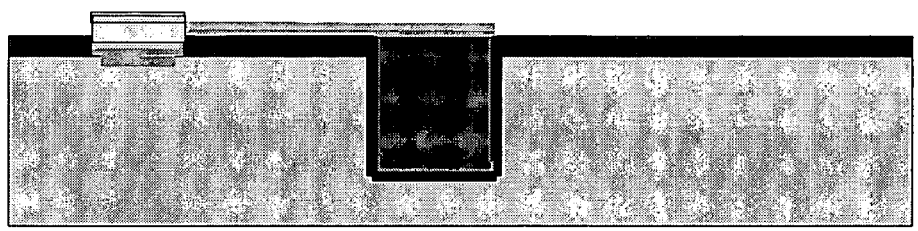
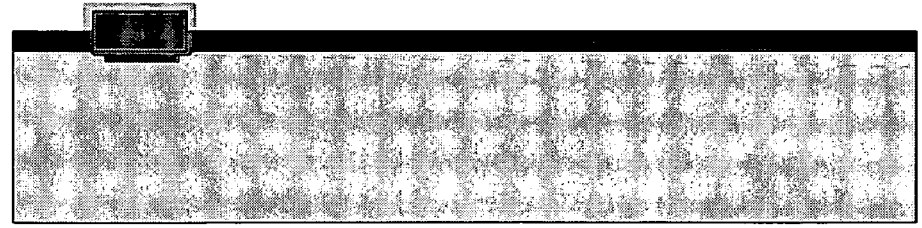
FIG. 133

Daughter Wafer
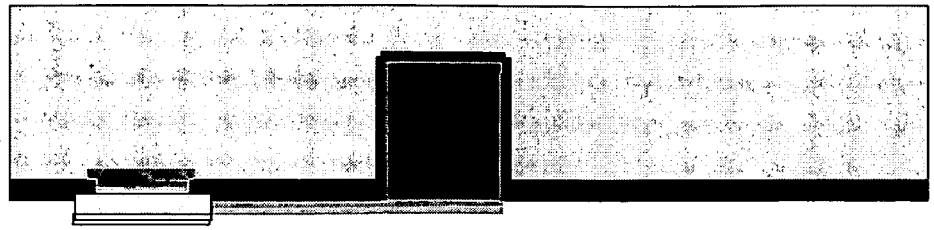
Mother Wafer
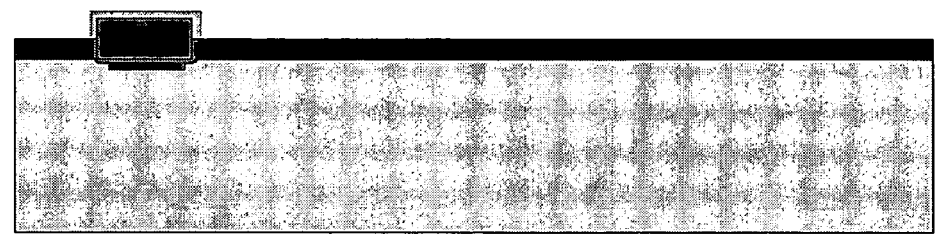
FIG. 134
Daughter Wafer
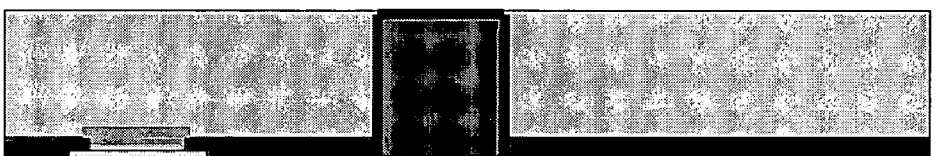
Mother Wafer
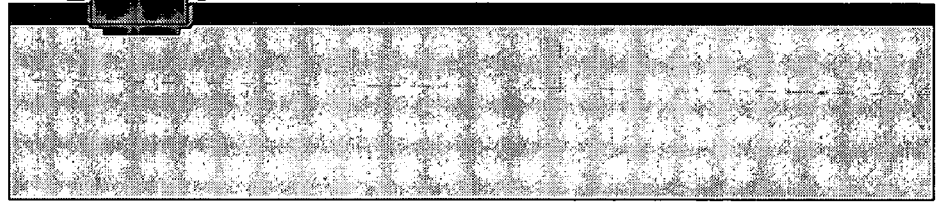
FIG. 135

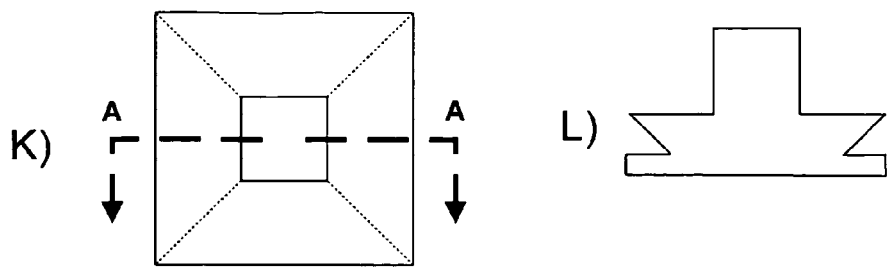
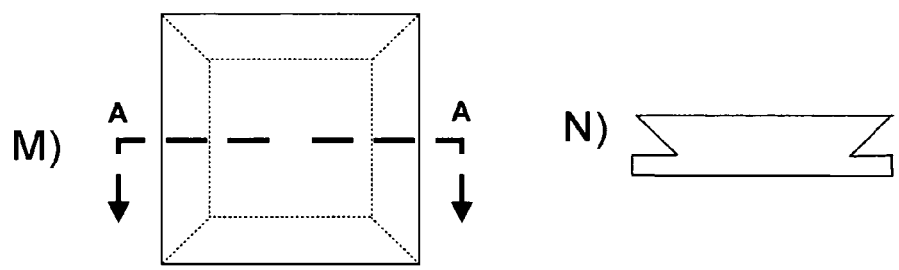
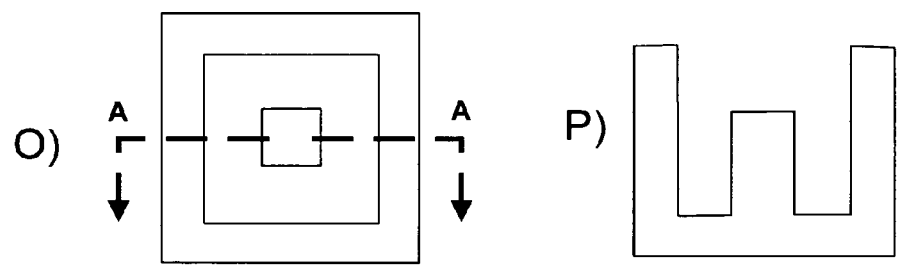
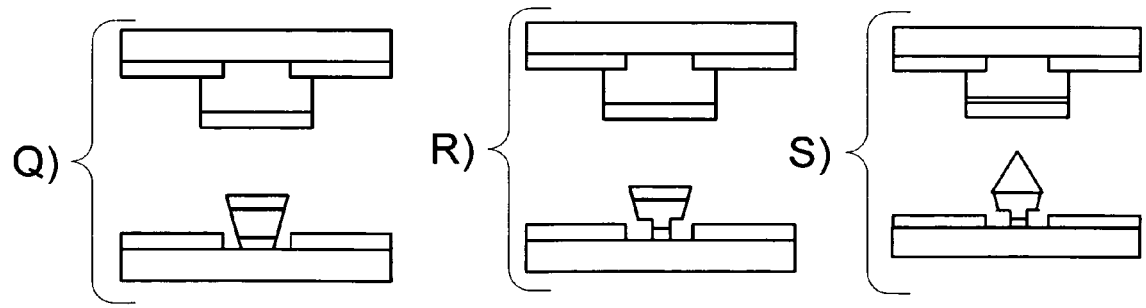
FIG. 143-2

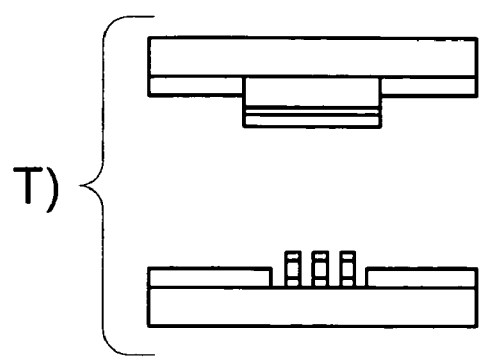 T)
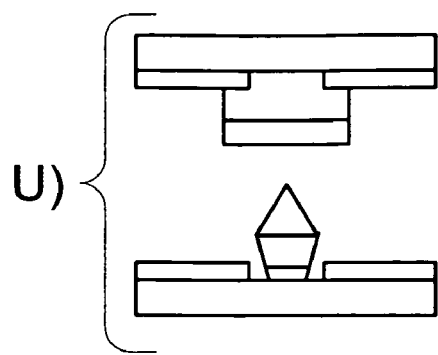 U)
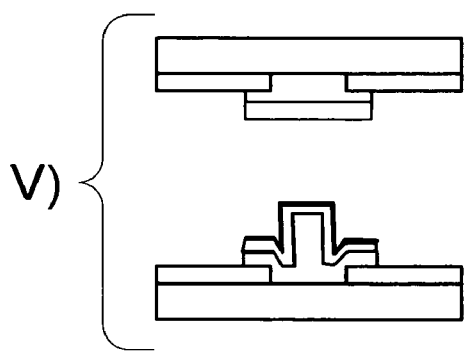 V)
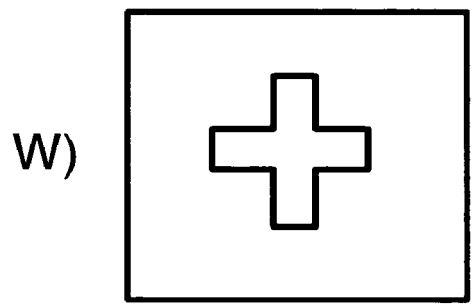 W)
 X)
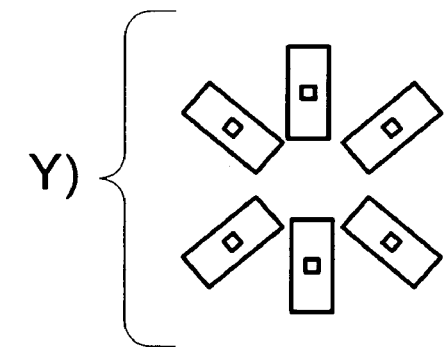 Y)
FIG. 143-3

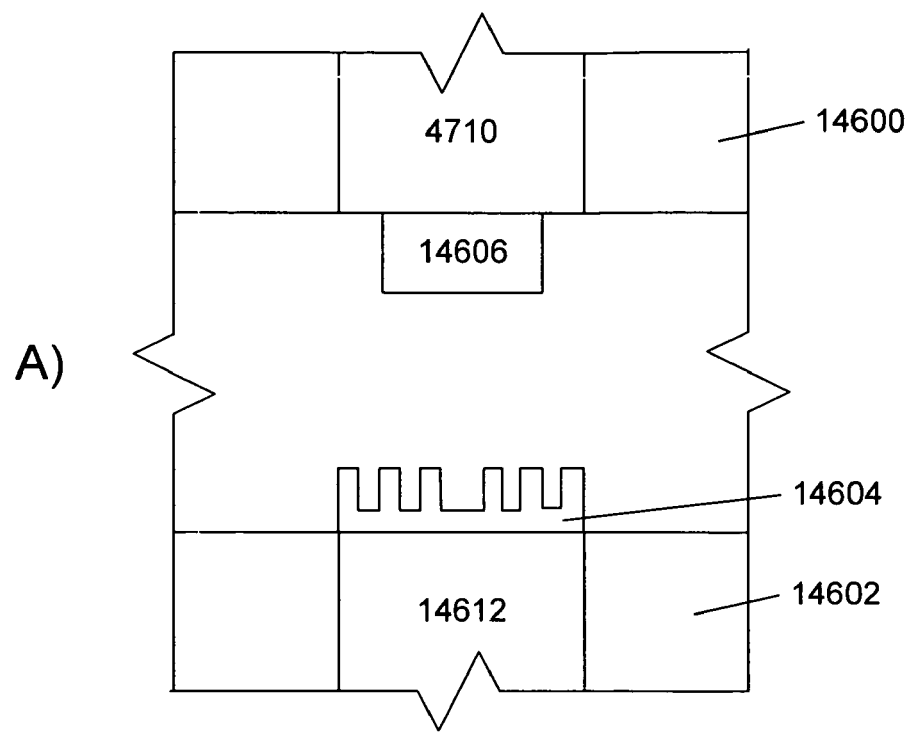
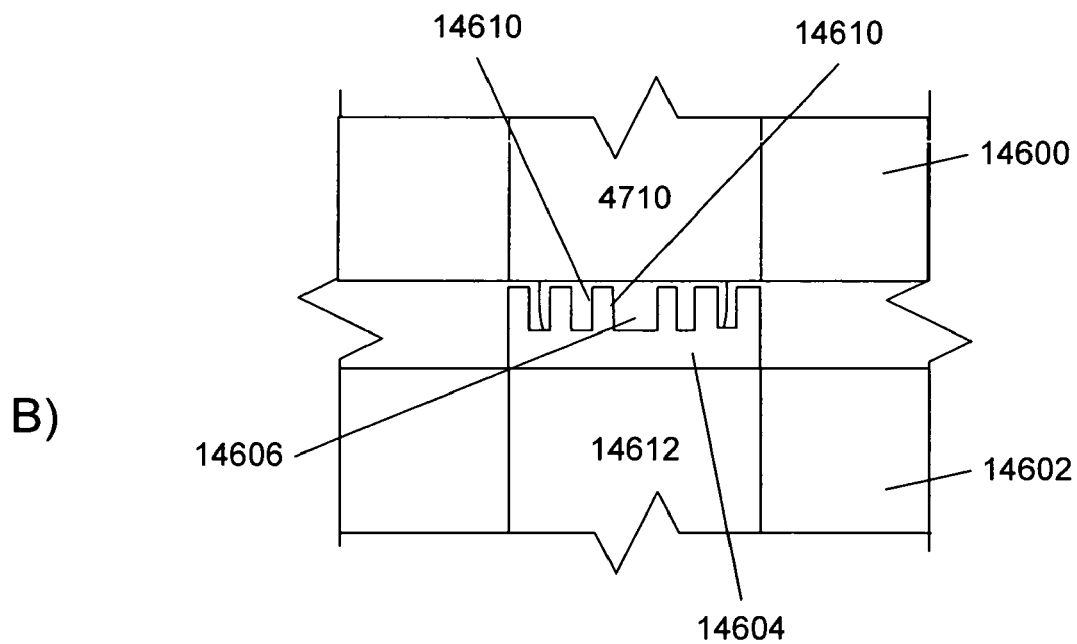
FIG. 146

15um diameter 135 deep

15702

15704

25um diameter 155 deep

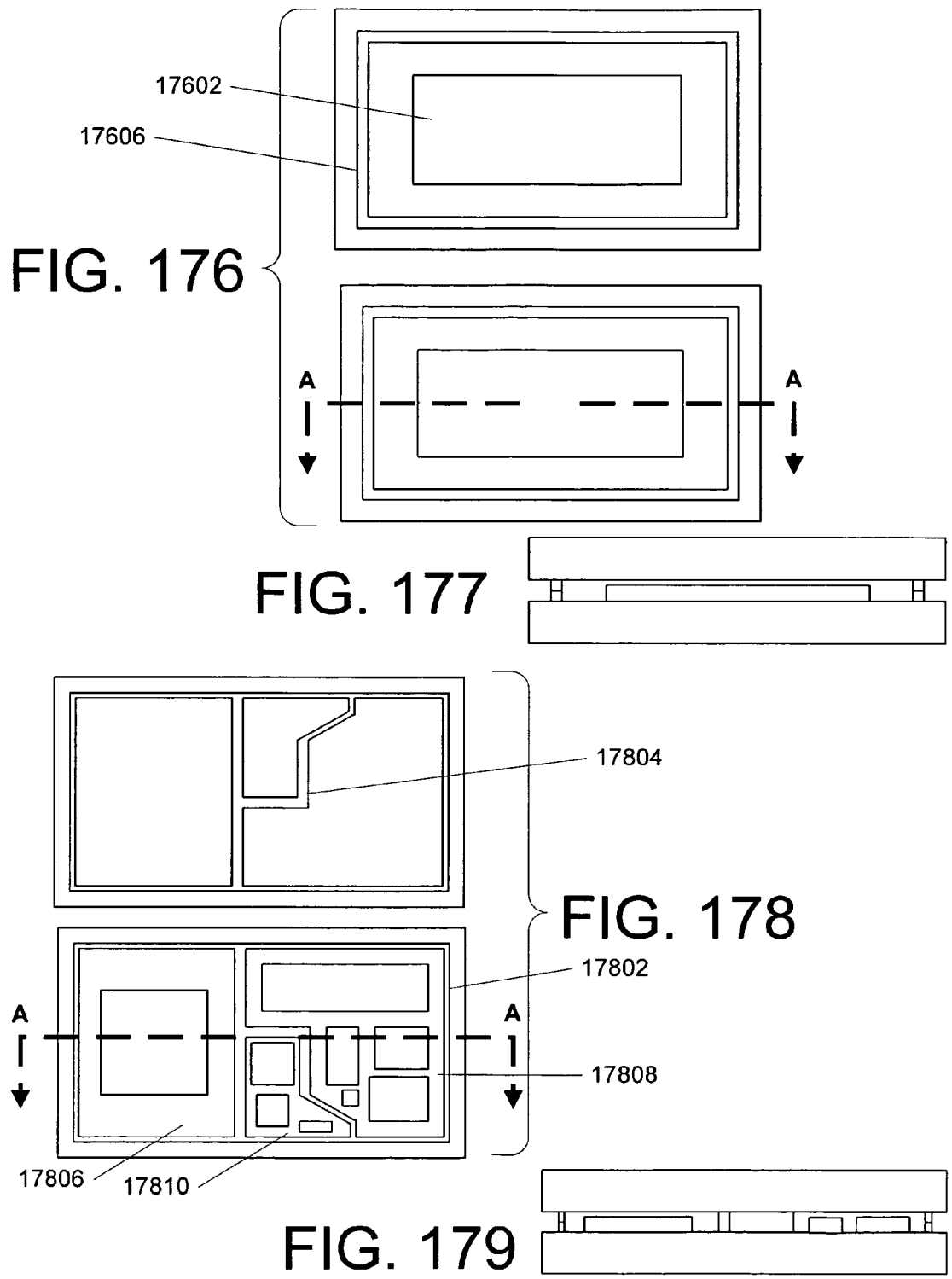

FIG. 180

| | Sputtered Contact (Typically Malleable) | | Plated Contact (Malleable or Rigid) | | | | Electroless (Typically Rigid) | |
|---|---|---|---|---|---|---|---|---|
| | With Reroute | Without Reroute | Electroplated | | | | With reroute | Without reroute |
| | Lithography for barrier metal and reroute where used | Lithography for barrier metal | With or w/o reroute (electroplate over rigid barrier) | With or without reroute (pre-electroless seed etch) | With or without reroute (post-electroless seed etch) | With or without reroute (post-electroless seed etch WITH Sidewall electroless protect) | | |
| 1 | | | Clean and prepare parts | | | | Prepare parts for electroless plating process | |
| 1 | Oxidation cap layer / diffusion cap layer deposition | | Barrier layer deposition (sputtered) | | | | | |
| 2 | Resist strip | | | Seed layer deposition | | | | |
| 2 | Lithography for pads | | | Lithography for pads | | | | |
| 3 | Metal deposition (sputter) | | | Metal deposition (plating) | | | Metal deposition and cap plating | |
| 4 | Resist strip | | Electroplate barrier and cap | Resist strip | | | | |
| 5 | | | Lithography (contact protect plus reroute(if used)) | | Lithography (contact protect plus reroute (if used)) | | Lithography (contact protect plus reroute) | |
| | | | | | | | Metal deposition (reroute) | |
| | | | | | | | Resist strip | |
| 6 | | | Seed etch (around pad and to create reroute (if used)) | Seed etch (around pad and to create reroute (if used)) | | | | |
| 7 | | | Resist strip | | | | | |
| 8 | Electroless barrier and cap (ONLY for rigid metal deposition materials, not malleable materials | | | | Electroless barrier and cap (ONLY for rigid metal deposition materials, not malleable materials | | | |
| | | | | | | Lithography (contact protect plus reroute) | | |
| | | | | | | Seed etch (around pad and to create reroute (if used)) | | |
| | | | | | | Resist strip | | |
| | | | | | | Electroless barrier and cap (ONLY for rigid metal deposition materials, not malleable materials | | |

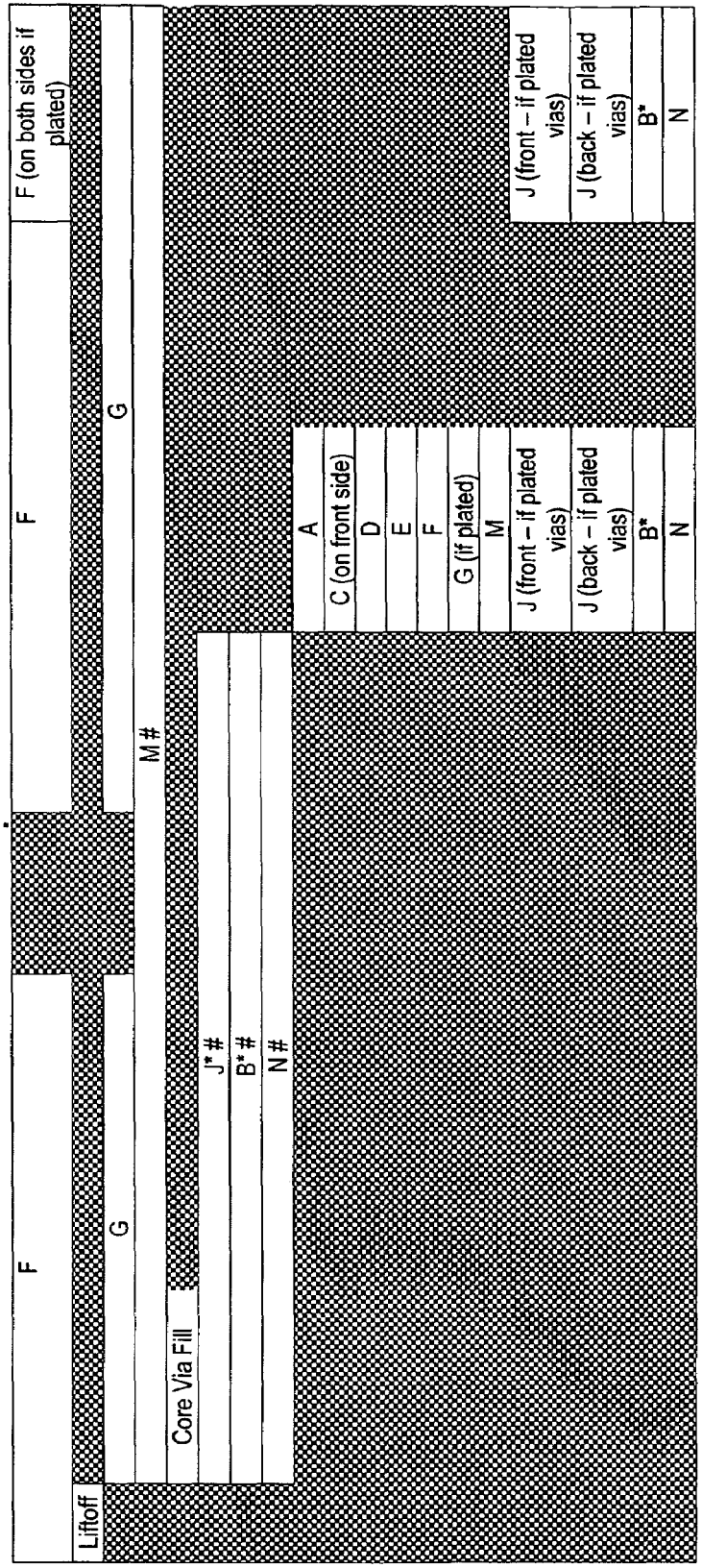

FIG. 182

| Via Specific | | | | | | | Non Via | | |
|---|---|---|---|---|---|---|---|---|---|
| Post-Hybrid Thin | | | Pre-Hybrid Thin | | | | Single Layer | | |
| Prep Mother Rigid | Prep Mother Malleable | Via Process Daughter Rigid | Prep Mother Rigid | Prep Mother Malleable | Via Process Daughter Rigid | | Prep Mother Rigid | Prep Mother Malleable | |
| | | | Via Process Daughter Malleable | | | | | Prep Daughter Malleable | Prep Daughter Rigid |
| | Via Process Daughter Malleable | | | | | | | | |
| | | | Daughter Front Side Protect | | | | | | |
| | | | Daughter Thin Wafer Backside | | | | | | |
| | | | Daughter Etch Wafer Backside | | | | | | |
| | | | Daughter Barrier & Cap | | | | | | |
| | | | Remove Daughter Front Side Protect | | | | | | |
| | | | | | Prep Daughter Backside (Metal Deposition) | | | | |
| Dice | | | | | | | | | |
| Mother Wafer to 240°C | | | | | | | | | |
| Tack – Chips to 320°C (up to 400°C) | | | | | | | | | |
| Fuse | | | | | | | | | |
| Encapsulate Wafer | | | | | | | | | |
| Thin Wafer Backside | | | | | | | | | |
| Etch Wafer Backside | | | | | | | | | |
| Barrier & Cap | | | | | | | | | |
| Remove encapsulant | | | | | | | | | |

Daughter Wafer
FIG. 183
Mother Wafer
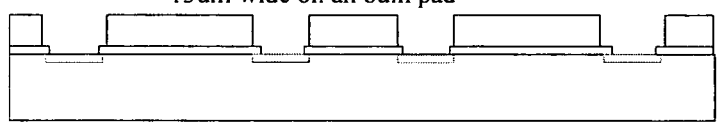
30um wide on a 14um pad
13um wide on an 8um pad
Daughter Wafer
FIG. 184
10um resist target (AZ4903 or Shipley STR1075)
Mother Wafer
Daughter Wafer
Ti (200Å) / Pd (3000Å) / Au (400Å)
FIG. 185
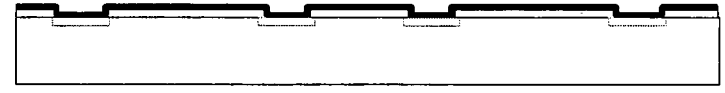
Mother Wafer
$Ti_{0.1}/W_{0.9}$ (1000Å) + Cu (3000Å)

7um resist (e.g. 10um on a 14um pad wide)

4.4 to 5um above glass 15 to 16 um wide openings (or if doing a self-aligned seed-etch in step 8, the as wide as is needed to ensure undercut doesn't affect bumps)

Barrier is 2um Ni + 3000Å Au

7um resist (e.g. 10um on a 14um pad wide

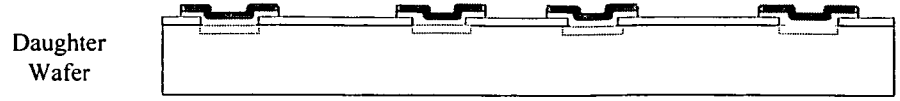
Daughter Wafer
Mother Wafer
FIG. 199
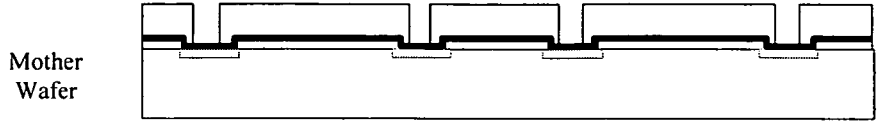
30um wide on a 14um pad
13um wide on an 8um pad
Daughter Wafer
FIG. 200  10um resist target (AZ4903 or Shipley STR1075)
Mother Wafer
Au (400Å)
Au/Sn 6um to 8um above glass
(more is better than less)
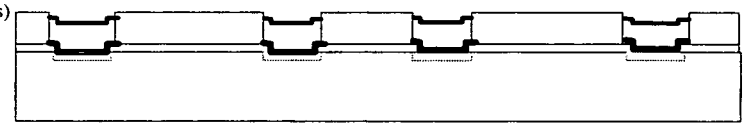
Daughter Wafer
FIG. 201
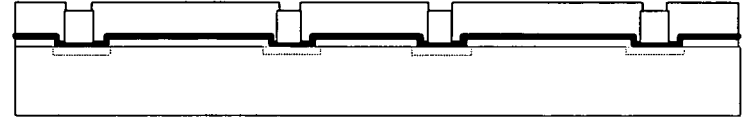
Mother Wafer
4.4 to 5um above glass

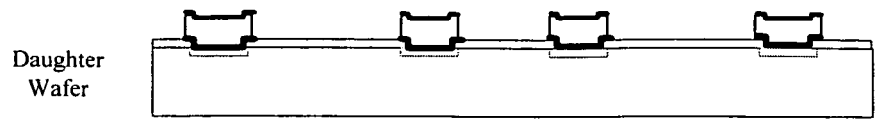
Daughter Wafer
FIG. 202
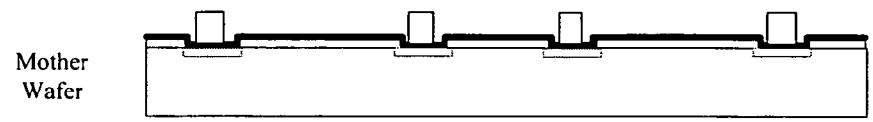
Mother Wafer
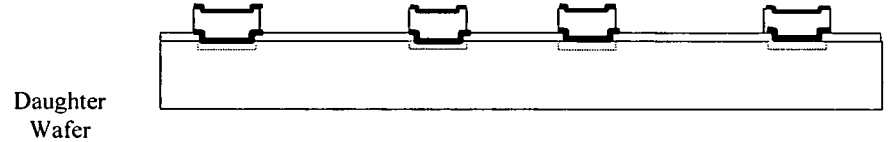
Daughter Wafer
FIG. 203
Mother Wafer
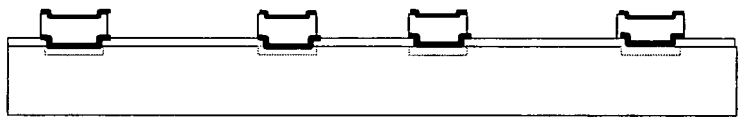
Daughter Wafer
FIG. 204
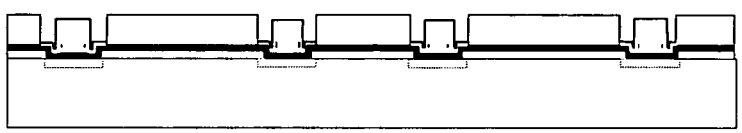
Mother Wafer
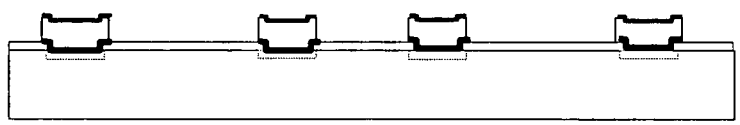
Daughter Wafer
FIG. 205
Mother Wafer

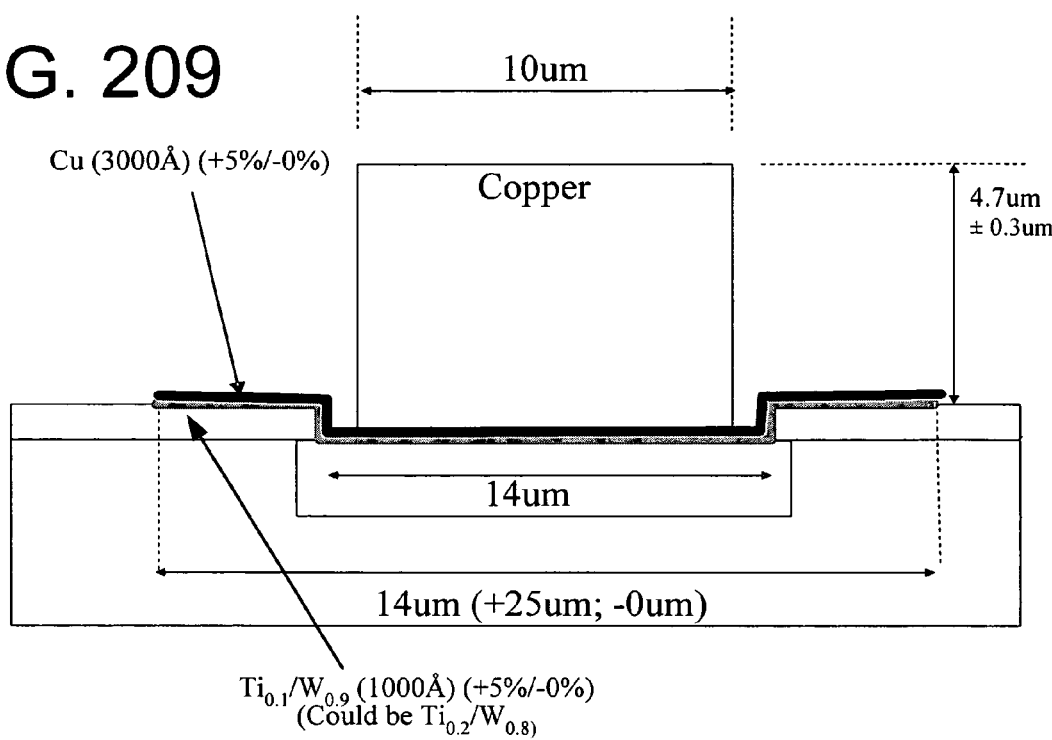
FIG. 209 Mother (50um pitch) [BEFORE BARRIER DEPOSITION]
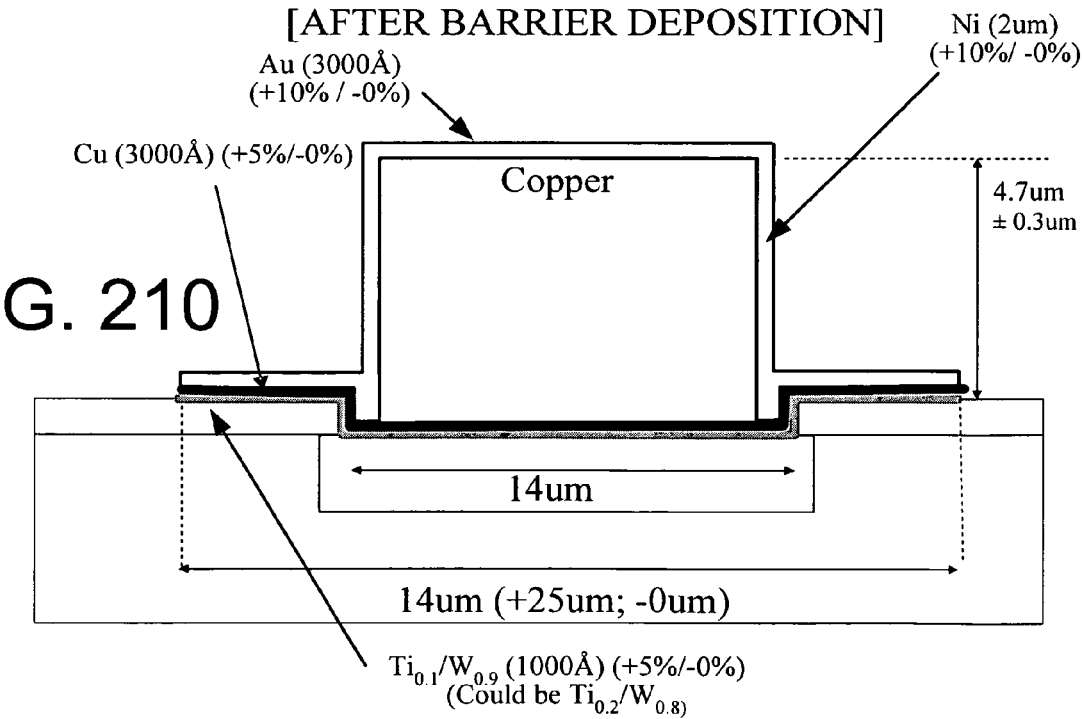
FIG. 210 [AFTER BARRIER DEPOSITION]

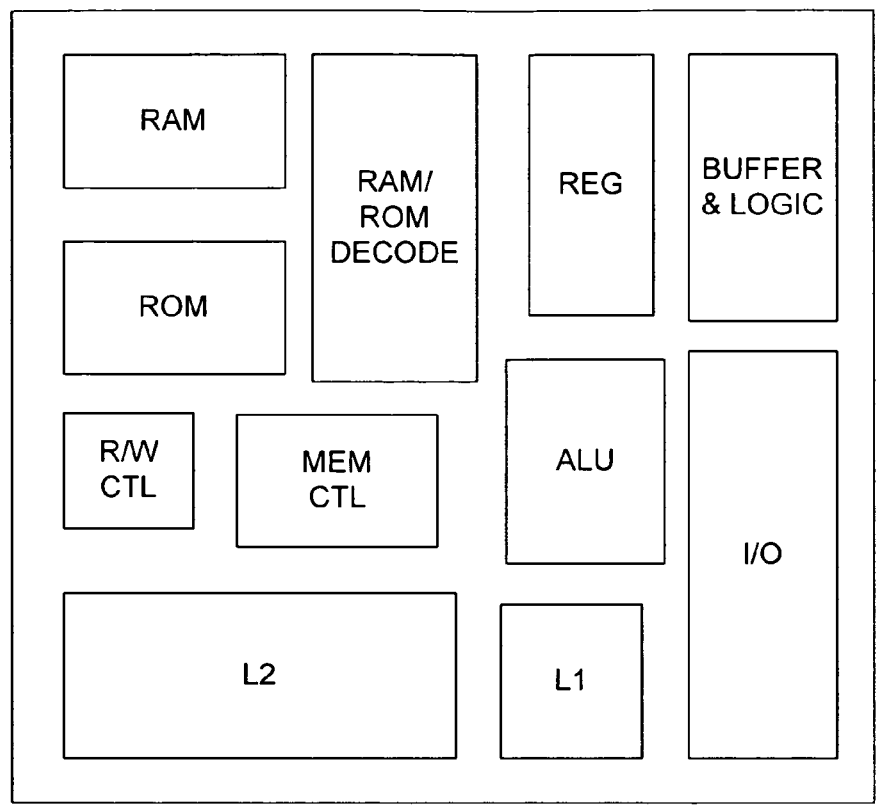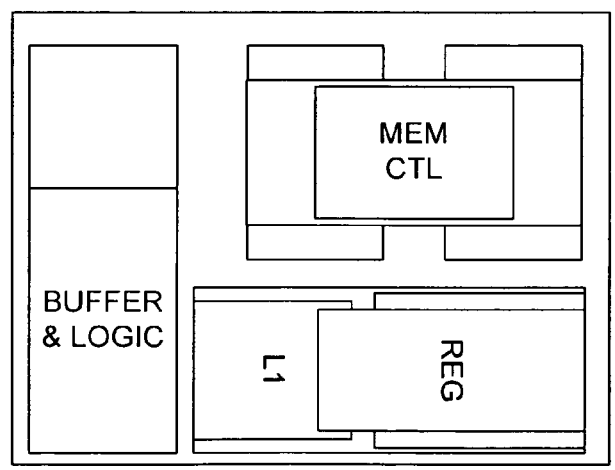
FIG. 221

Daughter GaAs wafer with Ti/Au pads on the chip.

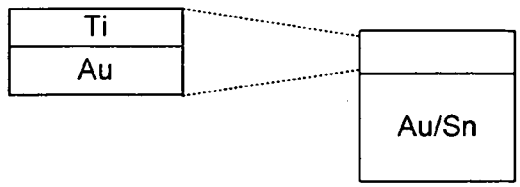

EXAMPLE 1
Barrier Layer(s): None - not needed
Standoff layer: Au/Sn
Diffusion layer: Au/Sn

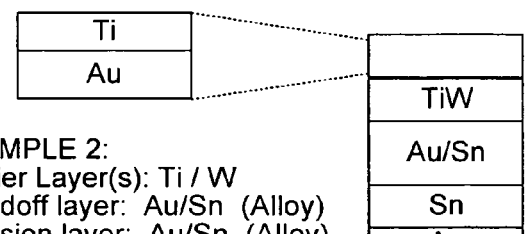

EXAMPLE 2:
Barrier Layer(s): Ti / W
Standoff layer: Au/Sn (Alloy)
Diffusion layer: Au/Sn (Alloy)
Cap/Adhesion Layer: Sn + Au
 (antioxidation layer)

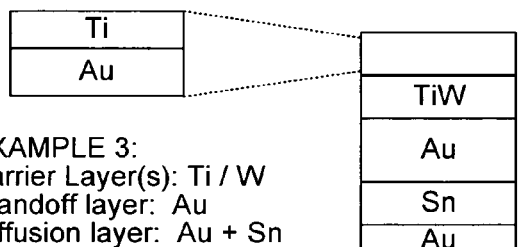

EXAMPLE 3:
Barrier Layer(s): Ti / W
Standoff layer: Au
Diffusion layer: Au + Sn
 together
Cap/Adhesion Layer: Sn + Au
 (antioxidation layer)

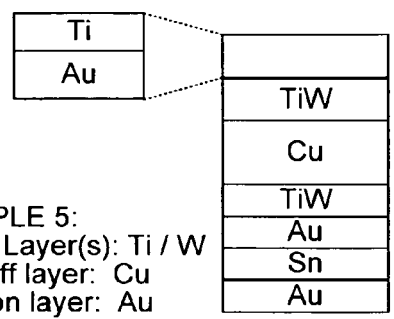

EXAMPLE 5:
Barrier Layer(s): Ti / W
Standoff layer: Cu
Diffusion layer: Au
Cap/Adhesion Layer: Sn+Au
 (antioxidation layer)

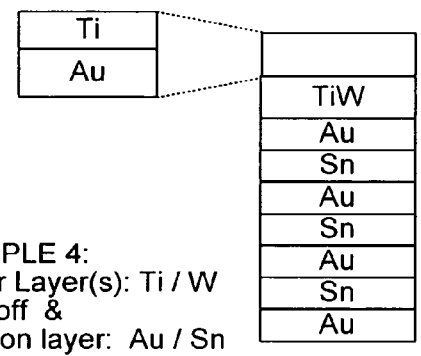

EXAMPLE 4:
Barrier Layer(s): Ti / W
Standoff &
Diffusion layer: Au / Sn
 (superlattice)
Cap/Adhesion
Layer: Sn layer + Au
 (antioxidation layer)

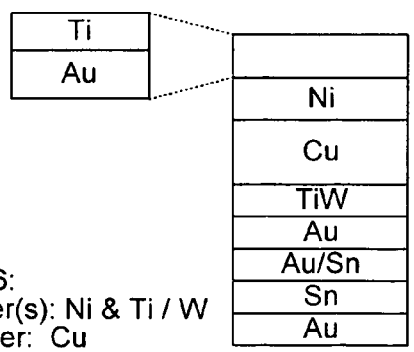

EXAMPLE 6:
Barrier Layer(s): Ni & Ti / W
Standoff layer: Cu
Diffusion layer: Au
Cap/Adhesion Layer: Au/Sn & Sn+Au (antioxidation layer)

FIG. 241

EXAMPLE 1:
Cap/Diffusion Layer: Au
Rigid layer: Ni
Barrier layer: Ni
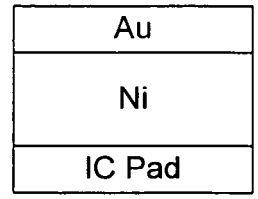
EXAMPLE 2:
Cap/Diffusion Layer: Au/Sn
Rigid layer: Ni
Barrier layer: Ni
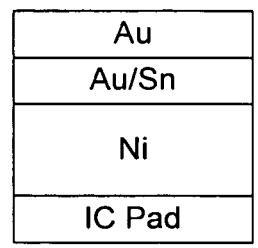
EXAMPLE 3:
Cap/Diffusion Layer: Au
Rigid layer: W
Barrier layer: Ti/W
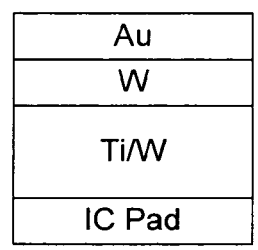
EXAMPLE 4:
Cap/Diffusion Layer: Ni / Au
Rigid layer: Cu
Barrier layer: Ti/ W
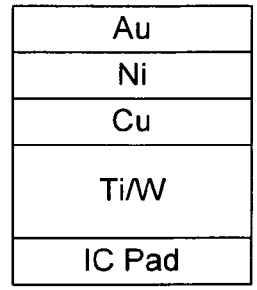
FIG. 242

FIG. 243A
Barrier
Malleable
Anti-oxidation Cap
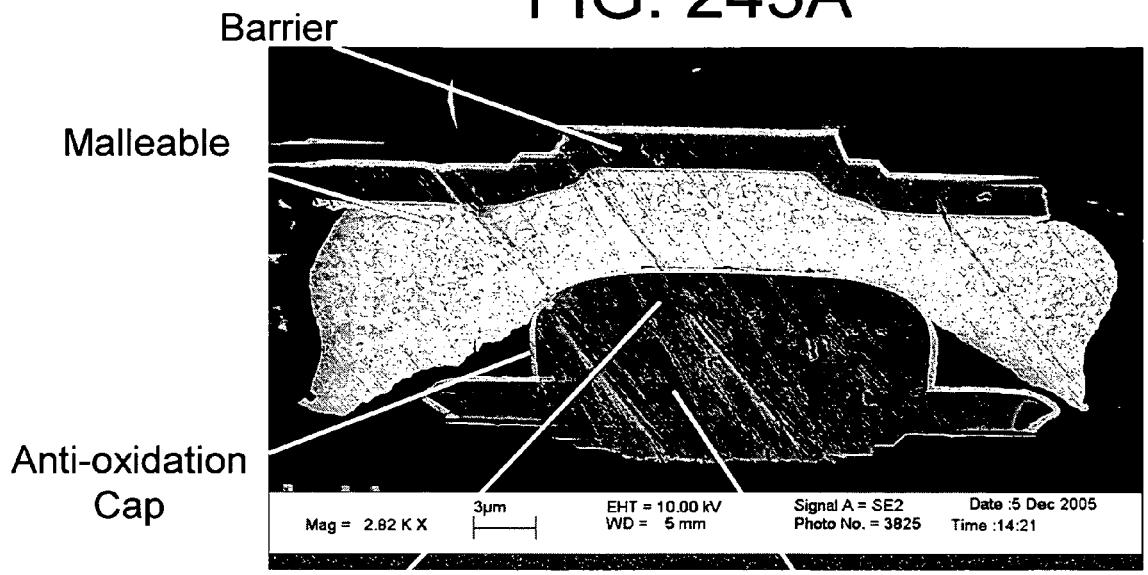
Barrier
Rigid
Barrier
Malleable
Interdiffusion (mixing of malleable with cap and barrier)
Barrier
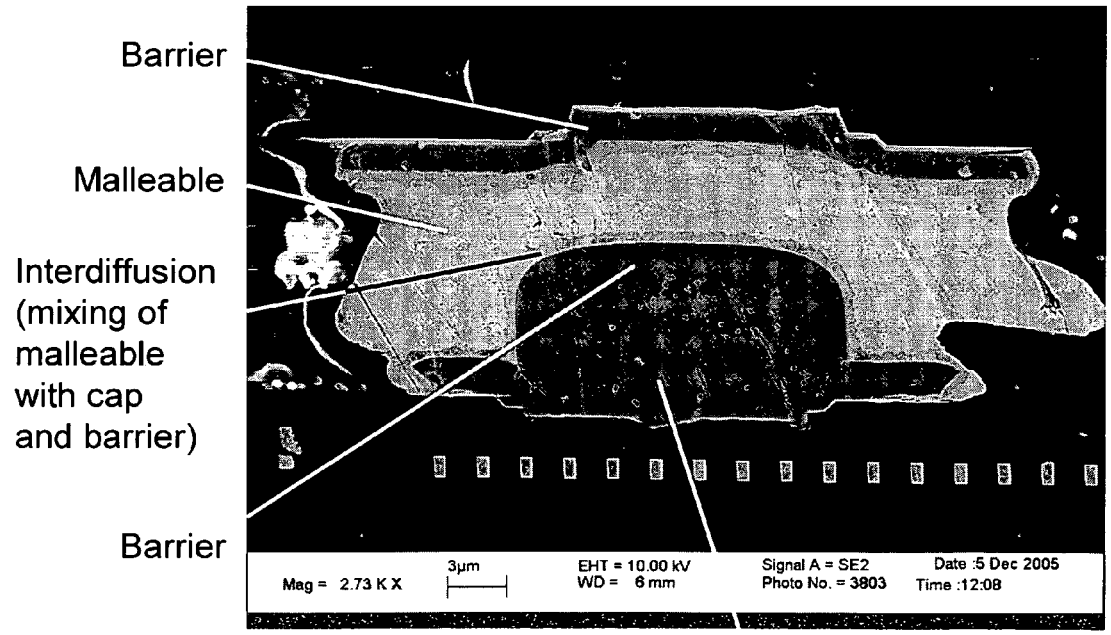
FIG. 243B
Rigid FIG. 244
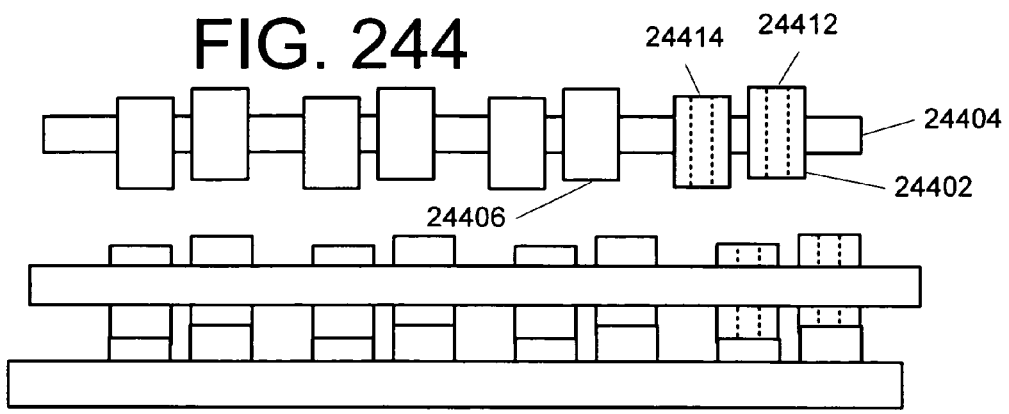
FIG. 245
FIG. 246
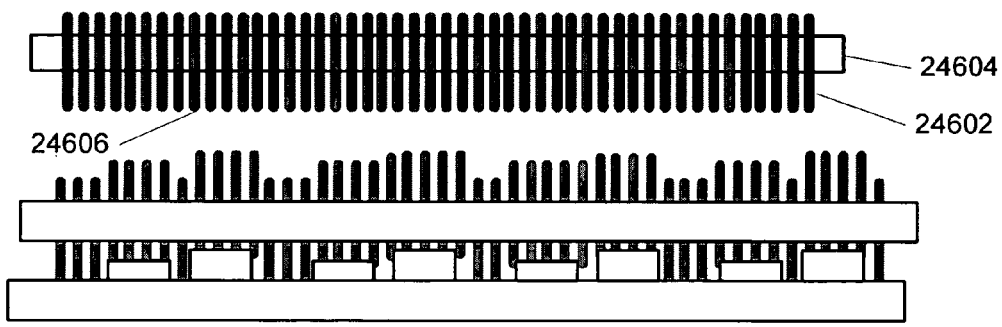
FIG. 247
FIG. 248
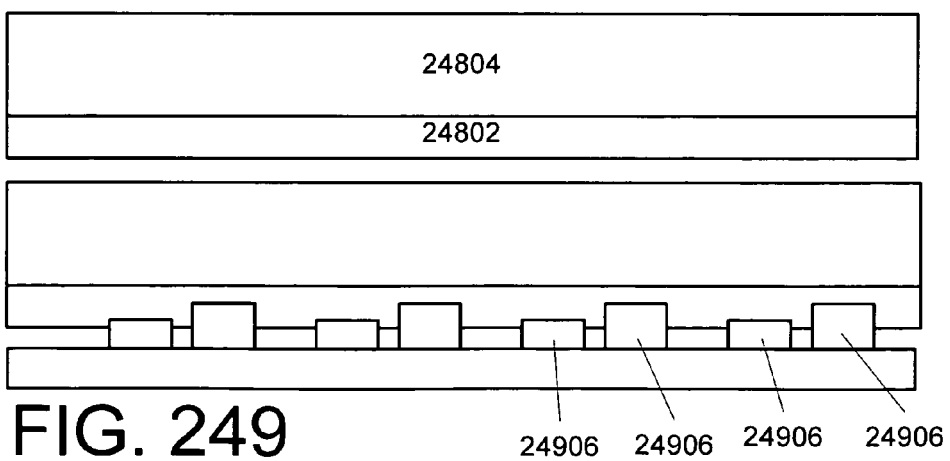
FIG. 249

FIG. 250
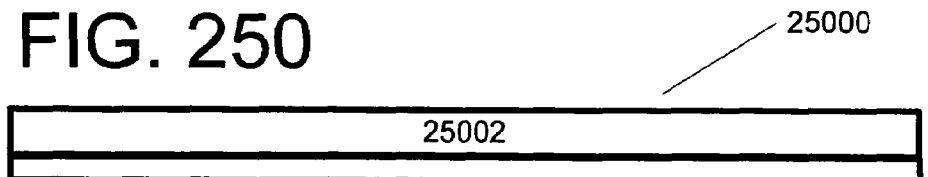
FIG. 251
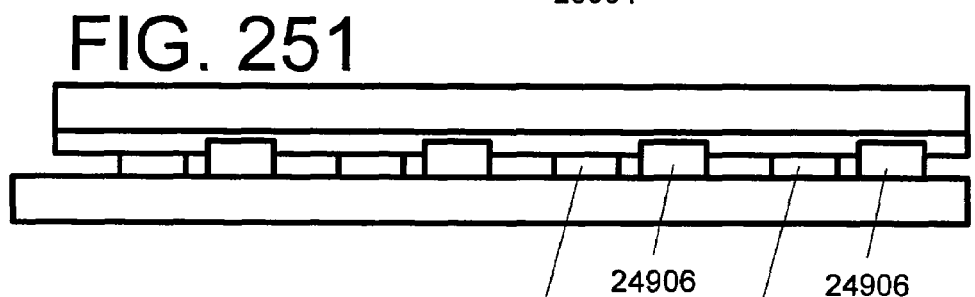
FIG. 252
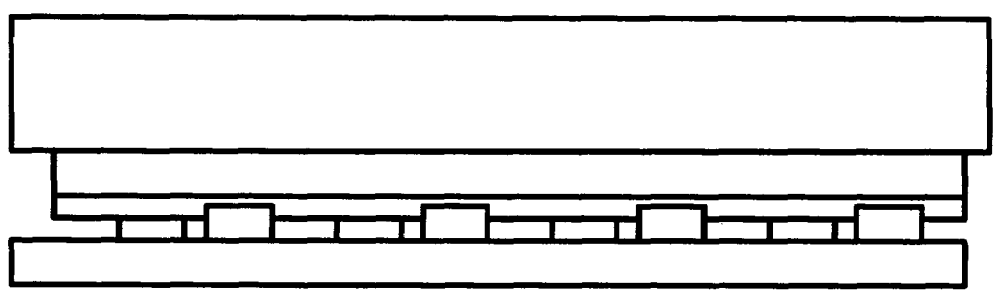
FIG. 253
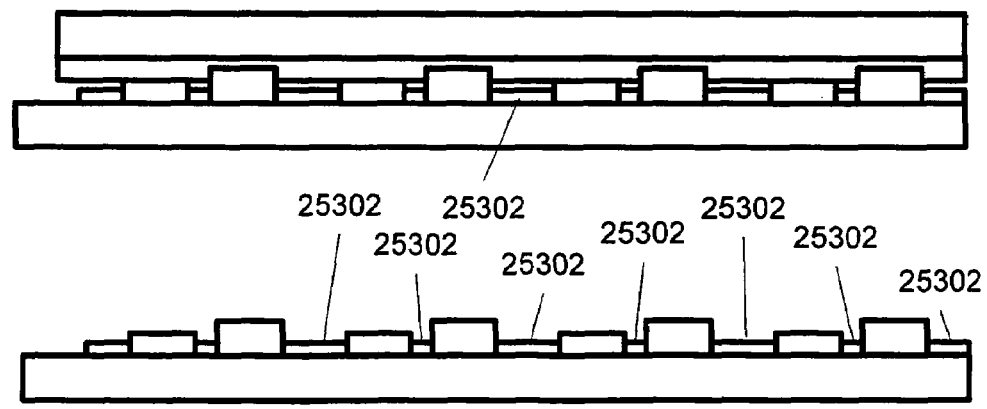
FIG. 254

POST-ATTACHMENT CHIP-TO-CHIP CONNECTION

This application claims priority under 35 USC 119(e)(1) of United States Provisional Patent Application Ser. No. 60/690,759, filed Jun. 14, 2005.

FIELD OF THE INVENTION

The present invention relates to semiconductors and, more particularly, to electrical connections for such devices.

BACKGROUND

Making electrical contacts that extend all the way through an electronic chip (by creating electrically conductive vias) is difficult. Doing so with precision or controlled repeatability, let alone in volume is nearly impossible unless one or more of the following is the case: a) the vias are very shallow, i.e. significantly less than 100 microns in depth, b) the via width is large, or c) the vias are separated by large distances, i.e. many times the via width. The difficulty is compounded when the vias are close enough for signal cross-talk to occur, or if the chip through which the via passes has a charge, because the conductor in the via can not be allowed act as a short, nor can it carry a charge different from the charge of the pertinent portion of the chip. In addition, conventional processes, to the extent they exist, are unsuitable for use with formed integrated circuit (IC) chips (i.e. containing active semiconductor devices) and increase cost because those processes can damage the chips and thereby reduce the ultimate yield. Adding further to the above difficulties is the need to be concerned with capacitance and resistance problems when the material the via passes through has a charge or when the frequencies of the signals to be carried through the vias are very high, for example, in excess of about 0.3 GHz.

Indeed, there are numerous problems that are extant in the semiconductor art including: use of large, non-scaleable packaging; assembly costs don't scale like semiconductors; chip cost is proportional to area, and the highest performance processes are the most expensive, but only fraction of chip area actually requires high-performance processes; current processes are limited in voltage and other technologies; chip designers are limited to one process and one material for design; large, high power pad drivers are needed for chip-to-chip (through package) connections; even small changes or correction of trivial design errors require fabrication of one or more new masks for a whole new chip; making whole new chips requires millions of dollars in mask costs alone; individual chips are difficult and complicated to test and combinations of chips are even more difficult to test prior to complete packaging.

Accordingly, there is a significant need in the art for technology that can address one or more of the above problems.

SUMMARY OF THE INVENTION

We have developed a process that facilitates forming chip to chip electrical connections with vias that pass through a wafer, a preformed third-party chip, or a doped semiconductor substrate. Aspects described herein aid in the approach and represent improvements in the general field of joining of chips to each other.

One aspect involves a method of forming an electrical connection from a first chip, having a contact pad exposed through an opening in cover glass on the chip, to a second chip having a first side and a second side and involves attaching the second chip to the first chip, etching an annular via having an inner and outer perimeter, the inner perimeter corresponding to an outer perimeter of the contact pad, the annular via extending into and through the second chip and down to the cover glass such that the annular via's inner perimeter substantially corresponds to the contact pad's outer perimeter, filling the annular via with an insulator, removing semiconductor material of the second chip within the inner perimeter of the insulator to create a void extending from the second side to the contact pad, and filling at least some of the void with a conductive material.

Another aspect involves gluing the first side of the second chip to the first chip.

Yet another aspect involves processing at least one of the first side of the second chip, or a side of the first chip to which the first side of the second chip will attach, such that the first chip and second chip will be bonded to each other by one of van der Waal's force or covalent bonding.

Another aspect involves performing a wafer fusion process.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

FIG. 3 shows a simplified cutaway view of the portion of FIG. 1;

FIG. 4 is a top view of the upper surface of the specified area of FIG. 1 following creation of the trench shown in side view in FIG. 3;

FIG. 5 shows a simplified cutaway view of the portion of FIG. 1 as a result of continued processing;

FIG. 6 is a top view of the upper surface of the specified area of FIG. 1 following the filling of the trench with electrically insulating material shown in side view in FIG. 5;

FIG. 25 illustrates in simplified form the dual conductor variant following filling the trench with electrically insulating material 500;

FIG. 26 illustrates in simplified form, a via trench created by removing the entire island of semiconductor material;

FIG. 27 illustrates in simplified form, a via trench created by removing only an inner portion island of semiconductor material;

FIGS. 30A and 30B respectively illustrate use of an optional additional thermally created dielectric or insulator in the approaches of FIGS. 28 and 29;

FIGS. 45 and 46 illustrate in simplified form, example tack and fuse parameters;

FIG. 47 is a simplified example involving "minimal" contacts;

FIG. 48 is a simplified example involving an extended contact;

FIG. 53 through FIG. 71 illustrate a simplified example variant of a basic contact formation and hybridization approach;

FIG. 72 through FIG. 87 illustrate an alternative simplified example variant of a basic contact formation and hybridization approach;

FIG. 103 through FIG. 125 illustrate, in simplified parallel form, a variant process of preparing wafers for hybridization to other elements;

FIG. 126 through FIG. 139 illustrate in abbreviated form, a further variant process of preparing wafers for hybridization to other elements;

FIGS. 143A through 143Y are representative, illustrative examples of some of the myriad of possible mother contact profiles;

FIG. 146 illustrates, in simplified form, a further profiled contact example;

FIGS. 176 through 179 illustrate two simple examples of hermetic sealing using contacts as described herein;

FIG. 180 is a chart summarizing different approaches for forming other variants using the rigid/malleable contact paradigm;

FIGS. 181 and 182 are charts summarizing different approaches for forming via variants;

FIGS. 183 through 195 illustrate in greater detail the process flow for a particular instance involving deposition of metal on a daughter wafer;

FIGS. 196 through 205 illustrate in greater detail the process flow for a particular instance involving plating of metal on a daughter wafer;

FIG. 209 illustrates an example and some typical dimensions for a mother wafer contact having 14 micron wide contact pads spaced on a 50 micron pitch, before barrier deposition;

FIG. 210 illustrates the contact of FIG. 209 after barrier and cap deposition;

FIG. 221 shows a direct comparison of the footprint of the chip of FIG. 219 to that of the chip of FIG. 220;

FIG. 241 in simplified form example material configurations of the functional layers of daughter contacts;

FIG. 242 in simplified form example material configurations of the functional layers of mother contacts;

FIGS. 243A, 243B and 243C are photographs of joined mother and daughter contacts;

FIGS. 244 and 245 illustrate in simplified form single pin-per-chip tooling;

FIGS. 246 and 247 illustrate in simplified form multiple pins-per-chip tooling;

FIGS. 248 and 249 illustrate in simplified form an alternative tooling approach; and FIGS. 250 through 254 illustrate in simplified form another alternative tooling approach.

DETAILED DESCRIPTION

Figure 1:
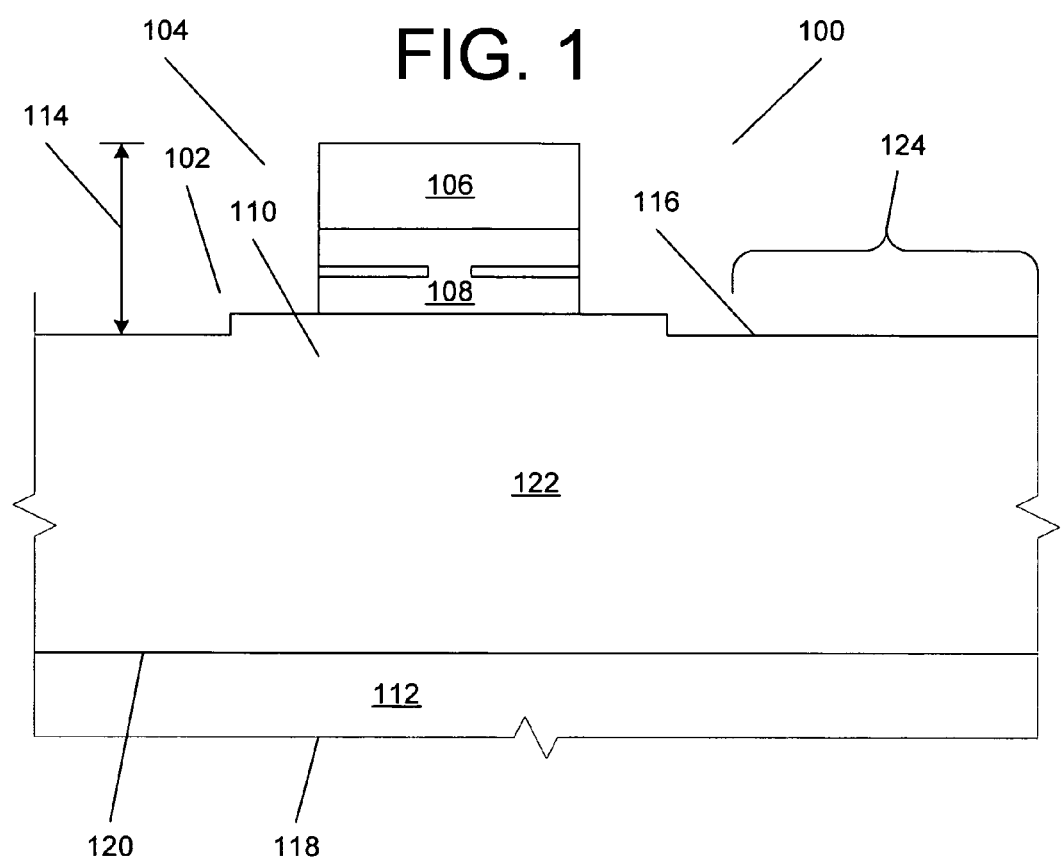
FIG. 1 is a simplified representation a side view of a portion of a chip containing multiple active electronic devices.

At the outset, it is to be understood that the term "wafer" as used herein is intended to interchangeably encompass all of the terms "chip", "die" and "wafer" unless the specific statement is clearly and exclusively only referring to an entire wafer from which chips can be diced, for example, in references to an 8 inch or 12 inch wafer, chip or die "-to-wafer", "wafer-to-wafer", or "wafer scale" processing. If use of the term would, as a technical matter, make sense if replaced by the term "chip" or "die", those terms are also intended. Moreover, a substantive reference to "wafer or chip" or "wafer or die" herein should be considered an inadvertent redundancy unless the above is satisfied.

In general, specific implementations of aspects described herein make it possible to form connections among two or more wafers containing fully-formed electronic, active optical or electro-optical devices in a simple, controllable fashion which also allows for a deep via depth, high repeatability, controlled capacitance and resistance, and electrical isolation between the via and the wafer or substrate through which the via passes.

Implementations of our process make it possible to form an electrically conductive via that is narrow in width (i.e. down to about 15 microns wide or less) as well as deep (i.e. to more than about 50 microns in depth) through a chip of depth to width ratios on the order of 3:1 and as much as 30:1, although aspect rations on the order of 5:1 to 10:1 will be more typical. Moreover, our approach advantageously makes it possible to do so in circumstances where the portion of the chip the via passes through will be electrically active. Specifically, we make it possible to provide electrical access through the doped semiconductor part of a wafer using a passage where side-walls insulate the doped semiconductor from an electrical conductor which propagates through the passage. Moreover, our process works for narrow passages (i.e. about 15 microns wide or, in some cases less) while allowing for tight control of the thickness of the isolating material and the electrical conductor so as to maintain a constant and acceptable capacitance and resistance.

Still further, our approach is suitable for use in forming contacts having, if circular, a diameter of between 0.1 micron to 15 micron pads, the upper end not being a limit but rather simply the size below which our approach permits integration not generally possible with other approaches, and the lower end being a function of currently available photolithography technology. In other words, advances in photolithographic technology that allow for smaller definition will also allow the current limit to go smaller.

Still further, and unlike solder contacts, which can be hundreds or thousands of microns long, or wirebond contacts, which can also be thousands of microns long and thus often require significant pad drivers to drive the impedance between chips, through our approaches, we can use very short contacts (10 microns or less) which allows much lower parasitic electrical effects between the chips. Our typical contact has spacing between contacts three times or less the width of the malleable material (defined and discussed below) prior to integration with a complementary contact (e.g. if the initial contact is 8 microns high, spacing between contacts would be up to about 25 microns.

Our approach further permits stacking of chips on a separation spacing of less than or equal to about 20 microns. In practice, less than or equal to 10 micron spacing will be typical, although we have demonstrated that less than about 1 micron spacing can be done. In general, the minimum is determined by the topology of the closest surfaces of the two wafers being joined; when they are touching at their highest points the distance between the pads represents the maximum height spacing.

Our approach further makes it possible to form contacts on a pitch of less than or equal to 50 microns. Typically, pitches of less that or equal to about 25 microns will be used, although we have demonstrated that pitches as small as 7 microns can be done, again that limit being a function of currently available photolithography technology. Here too, as technology advances, pitches can be smaller.

Features of some variants include one or more of the following: potential for millions of contacts/cm$^2$; electrical, mechanical and thermal attachment occurs concurrently; attachment done with low force but yields high strength connection (on the order of 1,000 kg/cm$^2$); connections can be done with economies of scale; non-planar wafers can be accommodated; most processing can be done on a wafer scale (e.g. 10 micron GaAs on 8", 10" or 12" wafers); processes can be done on a chip to chip, chip to wafer, or wafer to wafer basis; processes are electrically grounded; connections are made on a pre-formed (i.e. device bearing chip) so can be used with third-party supplied chips; making of vias before multiple chips are connected; capability to test chip combination before it is permanently connected and to rework if necessary; mixing and matching of different technologies (i.e GaAs to InP, InP to Si, GaAs to Si, SiGe to SiGe to Si, etc. and even an insulator wafer made of, for example, ceramic, LCP or glass); an ability to create chip-sized packages that take advantage of semiconductor process economies; ability to allow low-speed functions to be moved off of core, expensive processes, but still have entire set of circuits act like a single chip, allows design of an individual chip to take advantage of the variety of voltages, technologies, and materials available and best suited for that particular design; irrespective of the technologies required for other aspects of the design; enhanced off-chip communication; facilitates increased modularity of design at the chip level allowing leverage of core designs into multiple products without having to absorb redundant non-recurring engineering costs; and allows matching of speed with technology type so that low speed circuitry need not be formed on expensive, higher speed technology than necessary.

In overview, our processes improve the ability to create a chip-to-chip connection using "through-wafer" electrical contact that can be used with a doped substrate but will not short out the substrate and thus can carry an opposite charge to that of the substrate through which it passes. In addition, this "through-wafer" approach is usable with wafers of semiconductor materials, insulators such as ceramics, and other conductive or non-conductive materials. Moreover, using current equipment for etching semiconductor materials, i.e. having a 30 to 1 aspect ratio, the process works well for vias of narrow cross section (i.e. 15 microns wide, or in some cases less) and vias extending for an overall depth from in excess of 50 microns to depths of 500 microns or more. In addition, the process allows for close control of capacitance and resistance such that, for example, the vias created using the process can carry high speed electrical signals (i.e. of frequencies in excess of 0.3 GHz) or, in some implementations, optical signals.

Some implementations will also allow for concentric vias that, if conductive, can each carry different signals or different charges. Still further, some implementations allow for concentric vias in which the inner via can be used to as part of a cooling system by using a part of the arrangement to become part of a heat pipe arrangement. Other implementations provide the advantage that they are compatible with, and allow use of, stacking approaches in which chips are stacked and electrically connected to other chips on a chip-to-chip, chip-to-wafer or wafer-to-wafer basis.

Advantageously, virtually all of the stacking processes and variants described herein, or straightforwardly derived therefrom, only require a new stacked piece to be aligned to the piece directly below it. This is in sharp contrast to prior art techniques that attempted to stack and which must align all pieces in the stack together and then insert a conductive material to form the trans-stack connections. Such an approach requires all of the pieces in the stack to be accurately aligned with respect to every other piece in common rather than just to the piece below it. Moreover, our approaches work equally well with uniaxial, coaxial and triaxial connections, whereas alignment in-common approaches do not, if they can be done at all.

The various approaches are described for simplicity by way of example, using examples involving wafers of semiconductor material, for example silicon (Si), silicon-germanium (SiGe), gallium-arsenide (GaAs), etc., that have been pre-formed (i.e. they already contain integrated circuits or their components, and/or optical devices such as lasers, detectors, modulators as well as contact pads for those devices).

The first example of the approach involves a two-etch process where only wafer, for purposes of example semiconductor material (i.e. doped semiconductor with or without some or all of its associated substrate), needs to be etched. This example process begins with a device-bearing wafer of semiconductor material. One or more trench regions of precise width are etched in the wafer to the desired depth such that, in the case of a semiconductor wafer, the trench extends into the wafer substrate and creates a perimeter about a portion of the semiconductor material. Notably, the shape of the perimeter can be any closed shape and the outer and inner walls of the trench need not be the same shape. Capacitance and resistance of the ultimate via connection can be controlled through selection of the shape of the inner and outer perimeter of the trench and their separation distance(s). The trench depth is typically 50 microns or more, in some cases 500 microns or more, but the trench does not propagate through the entire substrate of the wafer so that the bounded semiconductor piece doesn't fall out. The trench is then filled with an electrically insulating material. At least a portion of the bounded semiconductor piece is then etched away leaving a hole of narrower cross section than that bounded by the outer trench wall, such that the via created by etching the semiconductor piece is bounded either by insulating material or a perimeter ring of material from the center semiconductor piece for part of its depth and substrate for the rest. The hole is metalized to create an electrical connection between the top of the wafer and the bottom of the hole. The back of the wafer (i.e. the substrate) is then thinned to expose metalization at the bottom of the hole which then becomes a substrate side contact or a portion thereof (interchangeably referred to herein by the broad term "contact"). Typically, at least the full depth of a portion of the surface defining the hole will be metalized, although in some implementations the metalization will only extend to a sufficient depth that it will be exposed when the substrate is sufficiently thinned. In this manner, if the process used to perform the metalization can not be used to metalize down to the full depth, as long as sufficient metalization extends down to where the thinning will stop, the contact can be formed. For example, in one example implementation, if the via extends partway into the substrate for a total length of about 600 microns, but the metalization can only be reliably done to an overall depth of about 300 microns (i.e. 300 microns less than the via itself), the process is not adversely affected so long as the substrate can be thinned to at least reach the metallization without unacceptably weakening the wafer or chip.

Through the above approach, variants described herein, and permutations and combinations thereof, connection points can be brought closer to the on-chip devices. By bringing connection points closer to on-chip devices, this approach facilitates chip-to-chip connections in the vertical direction (i.e. through chip stacking), can reduce the distance between connection points, and reduce or eliminate the need to use wirebonds for chip to chip connections. Moreover, the approach facilitates creation of sub-component specialty designs that can be mixed and matched as desired during production. In other words, a third dimension becomes more readily available for chipset materials, geometries and manufacture. In addition, the approach enables mixing of different speed or types of material technologies as well as mix-and-matching of component or subcomponent designs thereby providing development and manufacturing cost savings. Still further chip-to-chip connections can be created that use optical rather than electrical connections between chips.

The above is further facilitated through the optional use of a chip-to-chip connection approach that reduces the stress on chips being joined, thereby reducing the risk of chip damage.

The particular aspects described above are illustrated in greater detail by way of a number of examples and with specific reference to figures which, for purposes of illustration and clarity of presentation, are overly simplified and not to scale. In some cases, the scales are intentionally grossly exaggerated or distorted at the expense of accuracy for enhanced clarity of presentation and understanding.

Moreover, the approaches described herein are independent of the particular devices on the chip or with which the aspects described herein are used. Thus, the references to any specific type of device, for example the laser of the first example, are arbitrary and irrelevant to the aspects described herein except to the extent that they are devices to which electrical contact may need to be made. In other words, the approaches described herein are essentially identical for all devices and circuit elements to which contact may be made.

FIG. 1 is a simplified side view of a portion 100 of a chip 102 containing multiple solid state electronic devices, for example, resistors, capacitors, transistors, diodes, lasers, photodetectors or some combination thereof. The portion 100 shown in FIG. 1, for example purposes only, comprises a laser 104, having a "top" mirror 106 an active region 108 below the top mirror 106 and a "bottom" mirror 110, located on a substrate 112, such that the device 104 has a height 114 several microns above the top outer surface 116 of the non-device portion of the chip 102 near the device 104.

As shown, the laser 104 is a conventional vertical cavity surface emitting laser (VCSEL). For purposes of explanation, it should be assumed that the top mirror 106 will need to be electrically connected to some element on the side 118 of the substrate opposite the side 120 carrying the laser 104 and pass through the doped semiconductor material 122 near the device 104 within a specified area 124.

At the outset, it should be understood that to the extend lasers or photodetectors are discussed as the devices, the terms "top" and "bottom" follow a convention whereby the "bottom" is the portion closest to the substrate, irrespective of whether the laser emits towards or away from the substrate 112 (or in the case of a photodetector the direction from which it receives light).

Figure 2:
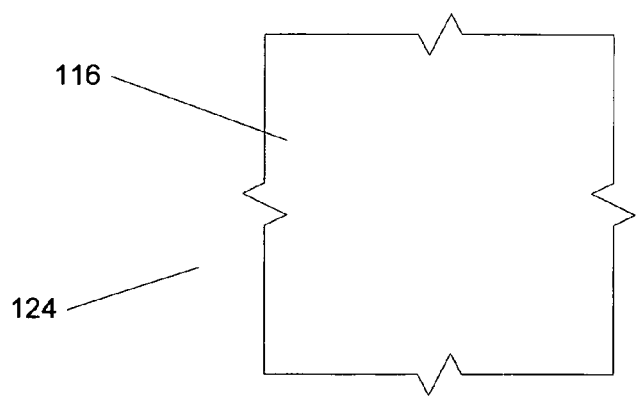
FIG. 2 is a top view of the upper surface of the specified area of FIG. 1.

FIG. 2 is a top view of the upper surface 116 of the specified area 124 of FIG. 1 before the process starts.

The basic process of forming the through-chip contact will be described with reference to those aspects introduced in FIGS. 1 and 2.

FIG. 3 shows a simplified cutaway view of the portion 100 of FIG. 1 as a result of processing as follows.

First, a trench 302 is etched into and through the semiconductor material 122, preferably using an anisotropic etching process (in order to create relatively straight trench sidewalls 304), to a depth that brings the trench 302 part way into the substrate 112. The overall depth of the trench 302 can be 100 microns or more, in some cases extending for 500 to 600 microns or more. However, the trench 302 should stop before extending completely through the substrate 112 otherwise the ability to implement the invention can, in many cases, be lost. The trench 302 is shaped such that it is closed on itself creating a cross section in a plane parallel to the plane of the substrate that is an annulus. Through use of this annular trench 302, an "island" 306 of the semiconductor material 122 will remain and be held in place at least by the intact part 308 of the substrate 112. At this point it is worth noting that, while the "annulus" referred to for the trench 302 is shown as circular in shape, this is only for purposes of simplicity of illustration. As used herein, the terms "annular" or "annulus" should be understood to not be limited to any particular or regular shape nor does the outer periphery have to have the same shape as the inner periphery. As long as the trench is a closed shape so that it creates an isolated "island" within it, the trench is to be considered an annulus trench or "annular" as used herein. In other words, the terms are intended to include any combination of closed perimeter shapes including closed polygons (regular or irregular) or other closed perimeter shapes whether, for example, the shape is smooth, erose, etc. Moreover, the terms are intended to encompass fixed and varying widths as needed or desired for the particular instance.

FIG. 4 is a top view of the upper surface 116 of the specified area 124 of FIG. 1 following creation of the trench 302 shown in side view in FIG. 3. In this view, the annulus nature of the trench 302 is clearly visible. The trench 302 has a closed inner 312 and outer 314 perimeter and a width 310 so that the trench 302 surrounds, and thereby creates, an island 306 from the semiconductor material 122 within it.

FIG. 5 shows a simplified cutaway view of the portion 100 of FIG. 1 as a result of continued processing as follows.

At least the trench 302 is coated with a dielectric or other electrically insulating material 500, which can optionally also cover a portion of the top outer surface 116 to a desired thickness. Optionally, if heat transfer is a concern a material that, while electrically insulating, is a good thermal conductor may be used as the electrically insulating material 500.

Advantages achieved by the above approach can be appreciated when viewed in contrast in the context of the prior art. First, as a general matter, it is extremely difficult to apply dielectric materials in a uniform manner, particularly where a uniform thickness is required. Second, this problem is compounded when the dielectric needs to be applied to a non-flat surface and is further compounded when they must be applied to vertical walls, such as those of the vias described herein. Thus, to the extent other approaches attempt to create holes and then accurately coat the walls of those holes with dielectric and thereafter make them conductive, those approaches lack any meaningful ability to control uniformity. The lack of uniformity present in those approaches dramatically affects capacitance and impedance, and hence performance, particularly where the signal frequencies involved will be very high, for example, in excess of about 0.3 GHz. In contrast, with the approaches described herein, precise control of capacitance and resistance is possible because the dimensions of the trench 302 can be precisely controlled to the precision of the trench 302 itself. The peripheral walls of the trench 302 define the thickness and uniformity in coverage of the insulating material 500 (and hence, the ultimate capacitance and impedance) because they constrain it. Therefore, all that is required is ensuring that the trench 302 is filled—a very low precision and low cost process. Thus, unlike the prior art, precision during application of the dielectric is unnecessary.

FIG. 6 is a top view of the upper surface 116 of the specified area 124 of FIG. 1 as shown in side view in FIG. 5, following the filling of the trench 302 and (the optional) partially also covering some of the top outer surface 116 with the electrically insulating material 500.

Figure 7:
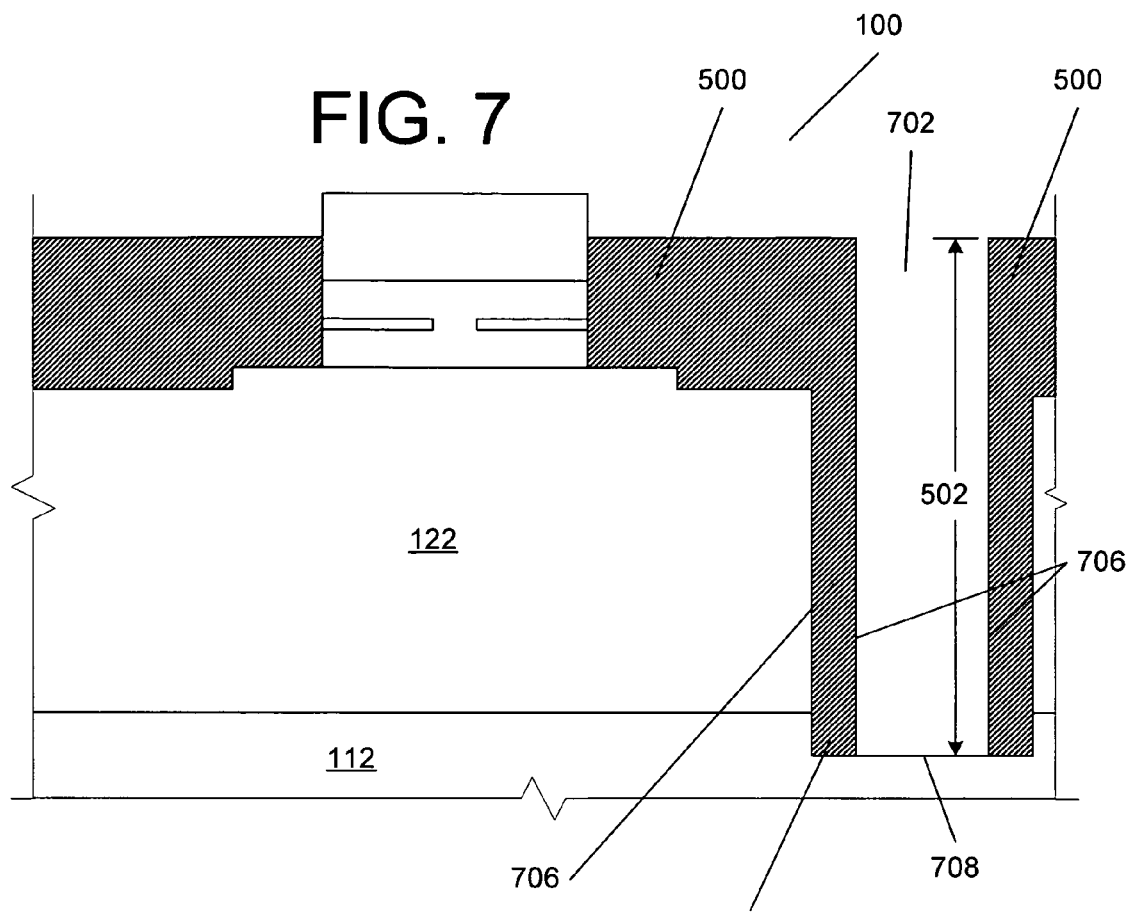
FIG. 7 shows a simplified cutaway view of the portion of FIG. 1 as a result of continued processing.

FIG. 7 shows a simplified cutaway view of the portion 100 of FIG. 1 as a result of continued processing as follows.

Once the electrically insulating material 500 has solidified (by hardening, curing or other processing), a via trench 702 is created by removing the island 306 of semiconductor material within the annulus 704 of insulating material 500 to a sufficient depth 502 necessary to achieve the particular desired implementation, for purposes of example, a depth similar in depth to that of the trench 302 (i.e. such that it too extends some distance into the substrate 112 but preferably not fully through it). In practice, the depth 502 of the via trench 702 can be longer or shorter than depth of the trench 302 provided it too extends sufficiently deep that it can be reached, if necessary during processing as described below, in this example case, essentially the same distance into the substrate 112 as the trench 302. Moreover, the innermost wall of the annulus 704 that bounds the island 306 dictates the shape and profile of the via trench 702 that is created by the removal process will be a dielectric. Accordingly, it will not typically be impacted by an etch process, a low precision etch process can be used to remove the island 306 of semiconductor material because rigorous control of the removal is unnecessary in the width or depth directions. Of course, removal can be augmented, or alternatively otherwise be accomplished, by using one or more other suitable processes, for example, laser ablation, laser drilling or some combination thereof.

Continuing with the process of this example, once the via trench 702 has been created, the sidewall(s) 706 of the via trench 702, as well as the bottom 708 of the via trench 702, will all be electrically non-conducting because the sidewall(s) 706 will be the insulating material 500 and the bottom 708 will be defined by the substrate 112.

Figure 8:
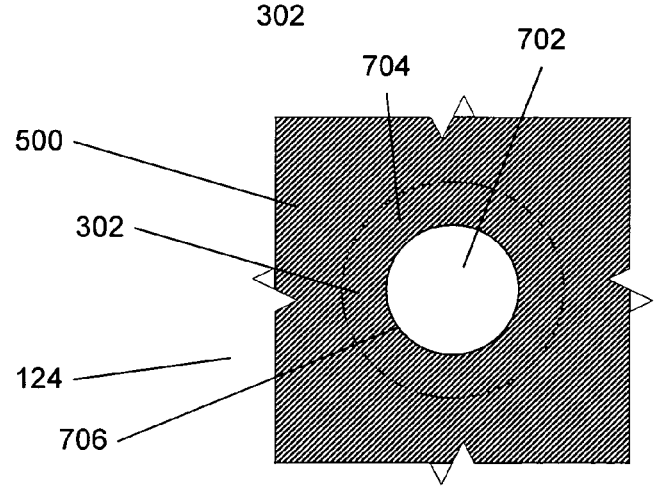
FIG. 8 is a top view of the upper surface of the specified area 124 of FIG. 1 following the creation of the via trench.

FIG. 8 is a top view of the upper surface 116 of the specified area 124 of FIG. 1 following the creation of the via trench 702 within the annulus 704 of electrically insulating material 500 shown in side view in FIG. 7.

Figure 9:
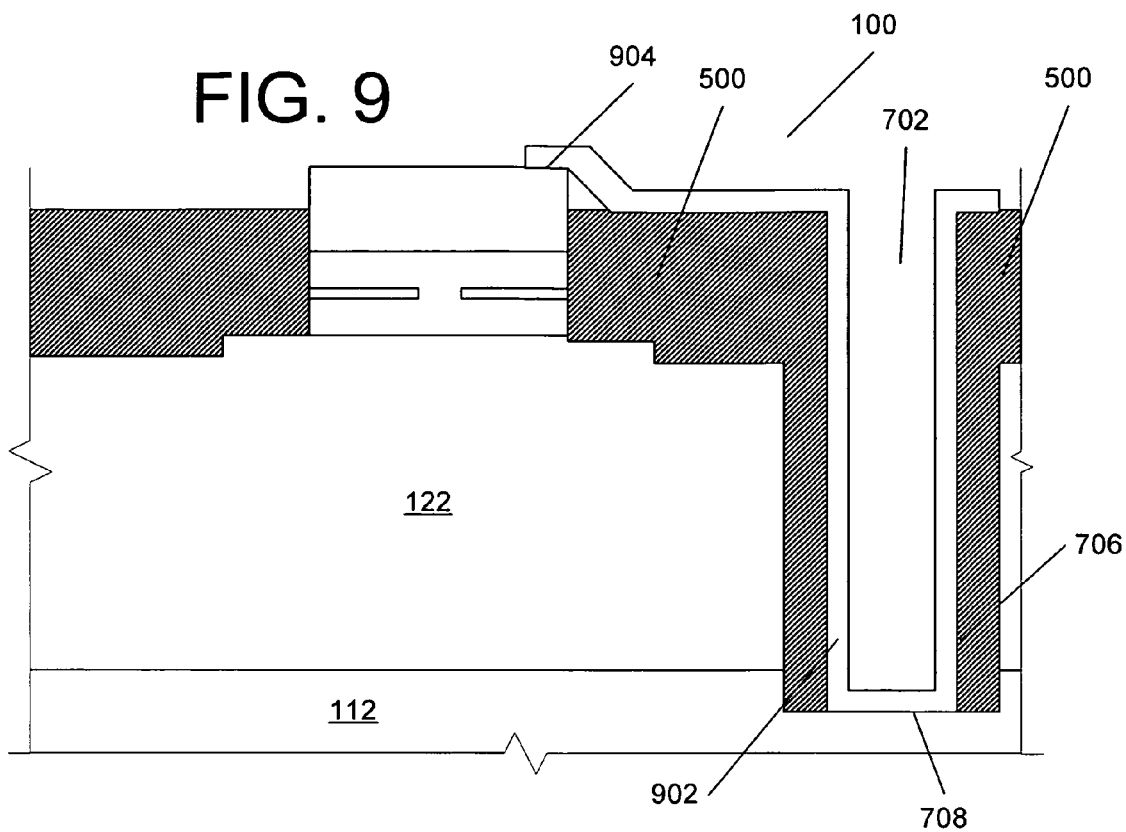
FIG. 9 shows a simplified cutaway view of the portion of FIG. 1 as a result of continued processing.

FIG. 9 shows a simplified cutaway view of the portion 100 of FIG. 1 as a result of continued processing as follows.

The via trench 702 is made electrically conductive by "metalizing" at least a longitudinal portion of the via trench sidewall surface 706 (i.e. along its depth), for example, using sputtering, evaporation, plating or other physical or chemical deposition techniques for applying metals or, if need be, some combination thereof. In other words, the metalizing can involve use of a conductive solid, a conductive epoxy or a reflowable material (e.g. an appropriate temperature conductive liquidus like a solder). This metalizing process can, and typically will, be used to create a continuous electrically conductive connection from at least about the via bottom 708 to the upper surface 116, and in many cases, all the way to the device of interest if it is part of the chip in which the via was made. By way of representative example FIG. 9 shows an electrical trace 902 created by this process extending from a contact 904 on the upper mirror 106 of the laser 104 to the bottom 708 of the via trench 702. As shown, the entire surfaces of the sidewall(s) 706 and bottom 708 of the via trench 702 are completely coated with metal.

As noted above, because the width and length of the insulating annulus can be rigorously controlled, as can the thickness of the conductor formed by the metalizing, a constant capacitance relative to the metalized surface can be achieved. Moreover, the insulating material 500 electrically isolates the contact 904 from the semiconductor material 122 it is passing through and thus, can account for defects in the semiconductor material that might otherwise electrically short the contact to another device or conductor.

Figure 10:
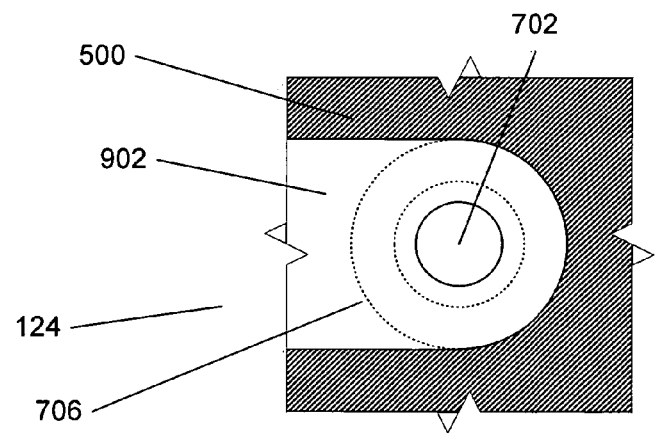
FIG. 10 is a top view of the upper surface of the specified area of FIG. 1 following metalization of the via trench.

FIG. 10 is a top view of the upper surface 116 of the specified area 124 of FIG. 1 following metalization of the via trench 702 and creation of the electrical trace 902 to the device contact 904 as shown in side view in FIG. 9.

Figure 11:
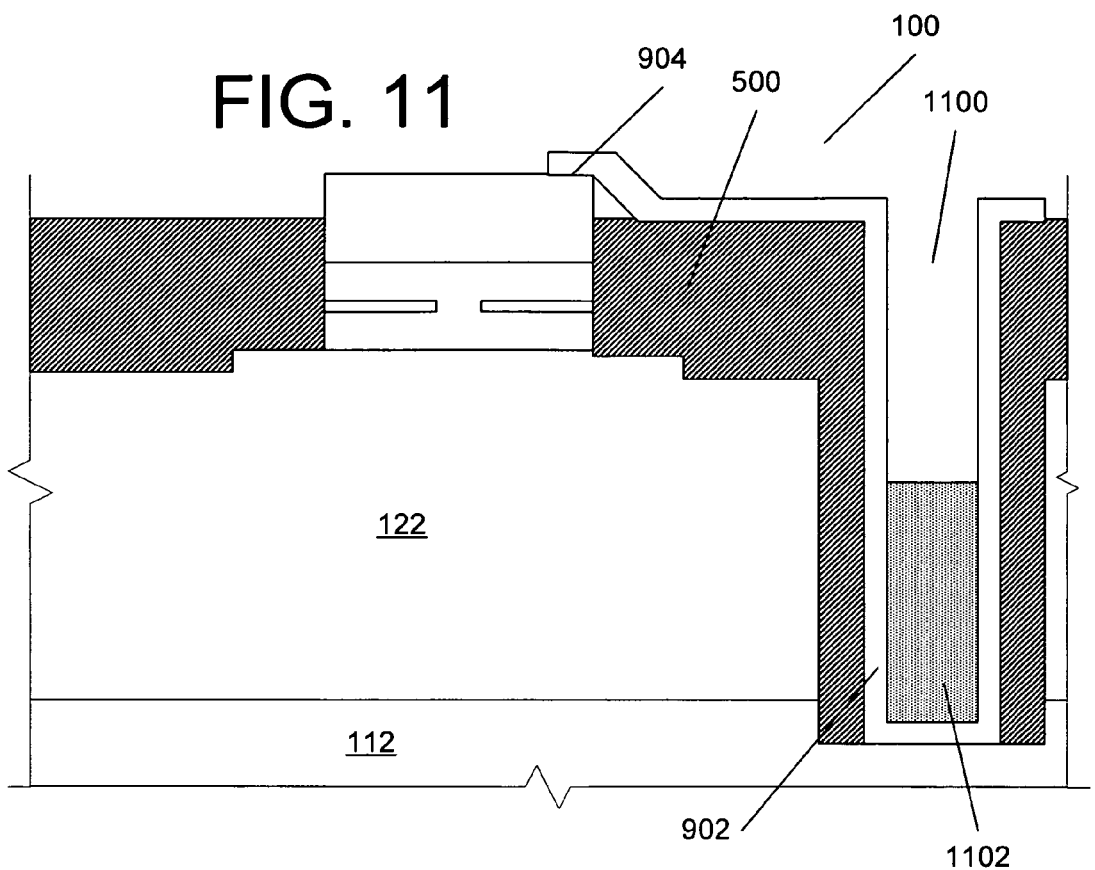
FIG. 11 shows a simplified cutaway view of the portion of FIG. 1 as a result of continued optional processing.
Figure 12:
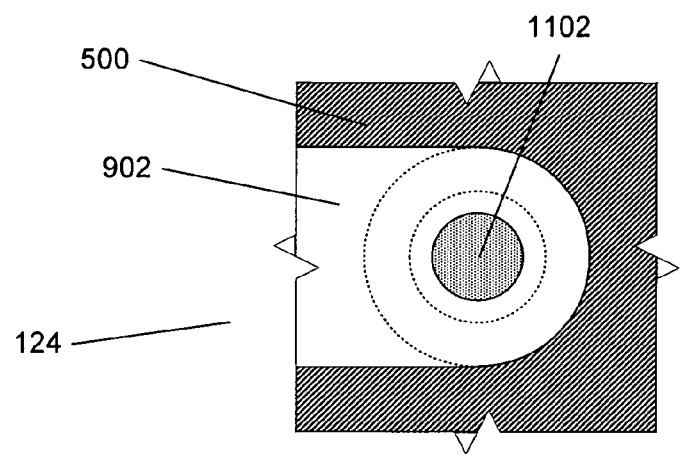
FIG. 12 is a top view of the upper surface of the specified area of FIG. 1 following the optional introduction of the bonding substance into the remaining void.

FIG. 11 through FIG. 14 illustrate additional, optional, processing that may be useful or desirable for some implementations. The approach shown in FIG. 11 or FIG. 12 is independent of the approach shown in FIG. 13 or FIG. 14. As a result, depending upon the particular implementation, either the approach shown in FIG. 11 and FIG. 12 or the approach shown in FIG. 13 and FIG. 14 can be separately used, or the two approaches can be used together in either order.

There are several advantages that can be obtained through use of one or both of these optional approaches. First, filling the void with a material adds mechanical strength and increases structural rigidity thereby reducing potential stresses. Second, the use of solder, an epoxy or other bonding material can aid in the ultimate connection of the chip to another element, particularly when the connection involves hybridization of that chip to another chip. Third, by inserting a material into the void, the risk of undesirable materials entering the void is reduced. Finally, the filler material reduces or eliminates the possibility of damaging the metalized portion within the via trench, particularly if less than the total sidewall is metalized. In addition, by varying the thickness of the insulator and metal, the coefficient of thermal expansion ("CTE") of the wafer can be balanced so as to match that of the wafer. For example, an oxide (CTE of 1 ppm) can be used in conjunction with copper (CTE of 17 ppm) to match the CTE of silicon (CTE of 2.5 ppm).

Of course, since these aspects are both optional, both can be dispensed with while still using the invention. For completeness of understanding however, both processes are illustrated in connection with FIG. 11 through FIG. 14.

FIG. 11 shows a simplified cutaway view of the portion 100 of FIG. 1 as a result of the optional processing as follows.

Once the metalization is complete, if the remaining void 1100 is not going to be left empty for use as described later, the remaining void 1100 can optionally be partially or wholly filled with some material, for example, in this case a bonding substance 1102. Depending upon the particular implementation this variant will be used for, the bonding substance 1102 can be conductive or non-conductive, i.e. an electrically conductive substance such as solder, metal or alloy that can be applied through, for example, electroless or electroplating techniques or deposited by evaporative deposition or sputtering, or a non-conductive bonding agent like, for example, an appropriate type of glue or epoxy or oxide like silicon dioxide.

FIG. 12 is a top view of the upper surface 116 of the specified area 124 of FIG. 1 following the optional introduction of the bonding substance 1102 into the remaining void 1100 of via trench 702 shown in side view in FIG. 11.

Figure 13:
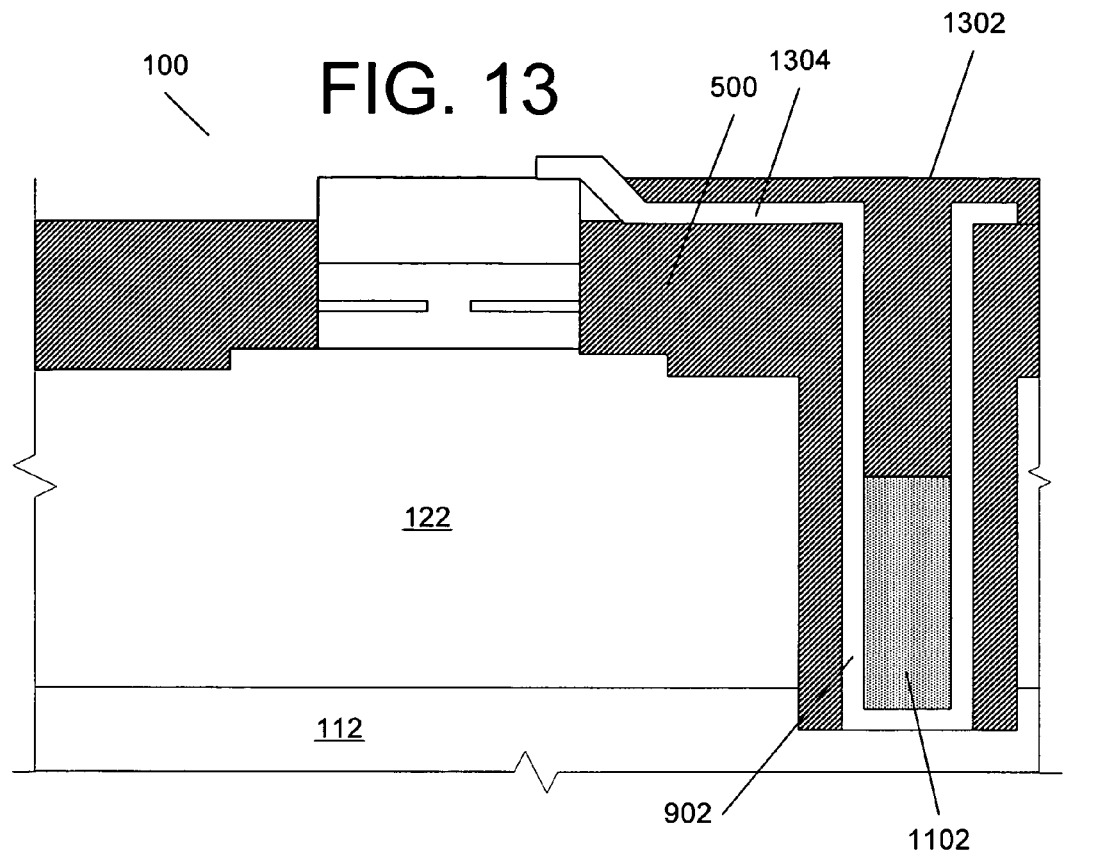
FIG. 13 shows a simplified cutaway view of the portion of FIG. 1 as a result of other optional processing.

FIG. 13 shows a simplified cutaway view of the portion 100 of FIG. 1 as a result of the optional processing as follows.

Alternatively or additionally, if the metalization has not completely filled the void, once the metalization is finished, the remaining void 1100, if any, can optionally be partially or wholly filled with, for example, a simple finishing substance 1302. Depending upon the particular implementation this variant will be used for, the finishing substance 1302 can be, for example, an insulator such as the insulating material 500 that was initially used to fill the trench 302 a conductor such as a conductive epoxy, a conductive solid, or a reflowable material, otherwise a conformal coating can be used. In addition, the finishing substance 1302, if used, need not be introduced solely into the void 1100. As shown in FIG. 13, if it is an electrical insulating material and a bonding substance 1102 has been used, the finishing substance 1302 can be inserted after and on top of any such bonding substance 1102 and can extend outside the void 1100 so as to cover and protect some part of the outer surface of the wafer and/or a part 1304 of the trace 902 that extends to the contact 904, or, even if there is no void, to planarize the wafer. For example, the finishing substance 1302 could be an oxide that can be flattened and thereby planarize the wafer so that the full surface can be used for bonding to another element like a wafer or individual chip.

Figure 14:
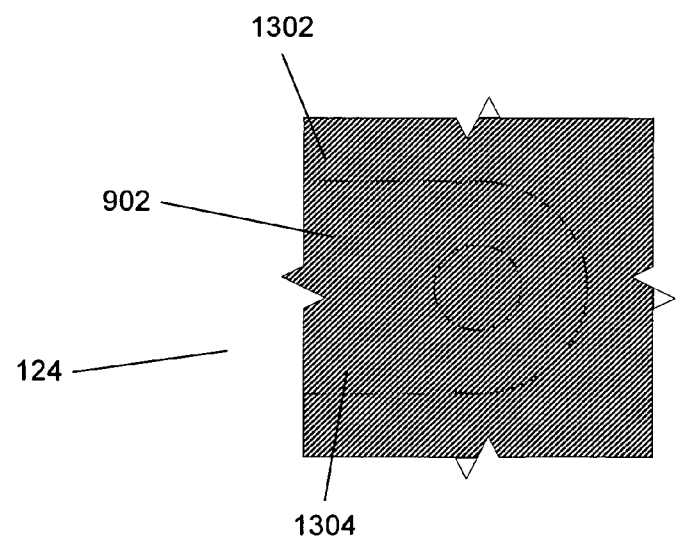
FIG. 14 is a top view of the upper surface of the specified area of FIG. 1 following the optional addition of the finishing substance into the remaining void.

FIG. 14 is a top view of an insulator upper surface 116 of the specified area 124 of FIG. 1 following the optional addition of the finishing substance 1302 into the remaining void 1100 on top of the bonding substance 1102 as shown in side view in FIG. 13 and in sufficient quantity to provide covering and protection for at least a part 1304 of the trace 902.

Figure 15:
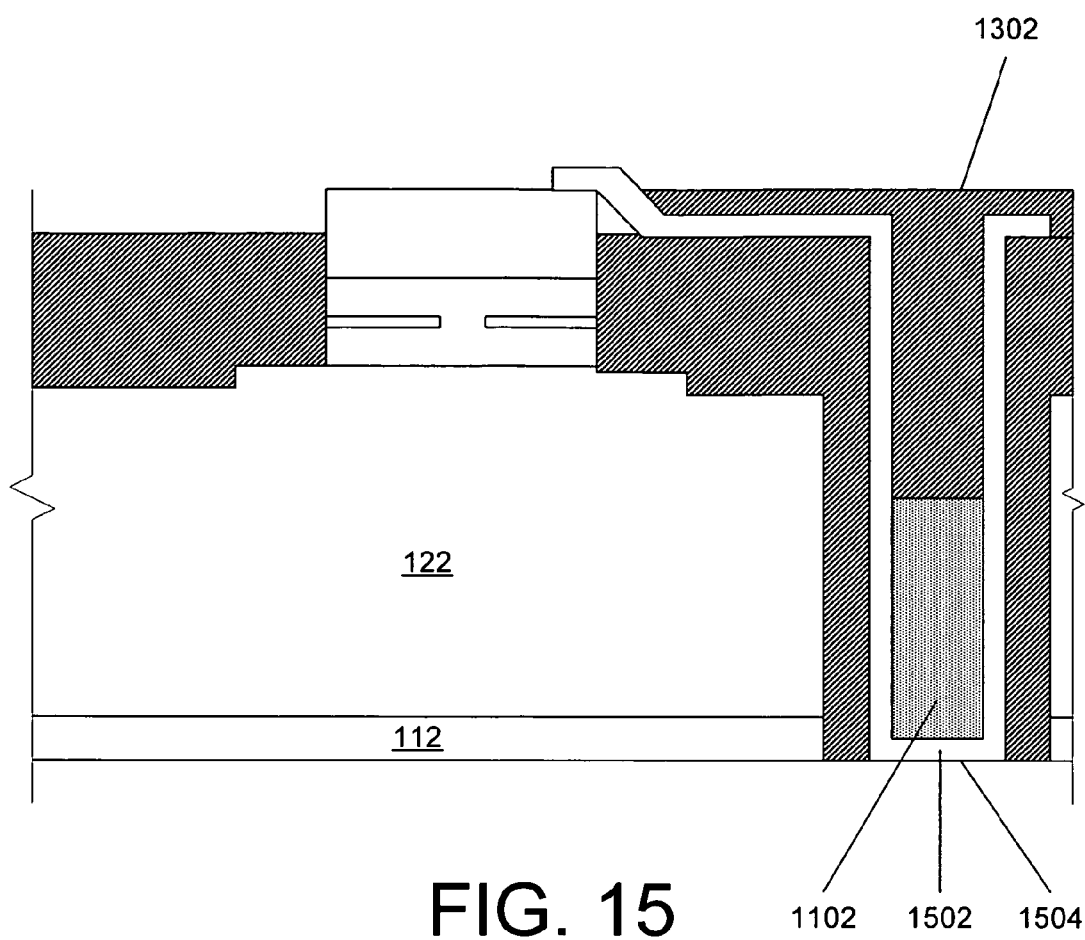
FIG. 15 shows a simplified cutaway view of the portion of FIG. 1 as a result of continued processing.

Returning to the basic process, FIG. 15 shows a simplified cutaway view of the portion 100 of FIG. 1 as a result of continued processing as follows.

Once the metalization aspect shown in FIG. 9 and FIG. 10 is complete (whether or not one or both of the optional aspects shown in FIG. 11 through FIG. 14 are used) the back (i.e. non-device carrying) side 118 of the substrate 112 is thinned using, for example, a chemical process such as etching, a mechanical process such as polishing, a chemical mechanical process (CMP) or some combination thereof, at least until the bottom metalization 1502 is exposed, thereby creating an electrical contact 1504 on the back 118 of the substrate 112 that is electrically connected to the device contact 904 that is electrically isolated from the doped semiconductor material 122 (in this case the bottom mirror 110 of the laser 104) without the need for performing any specialized backside processing.

Figure 16:
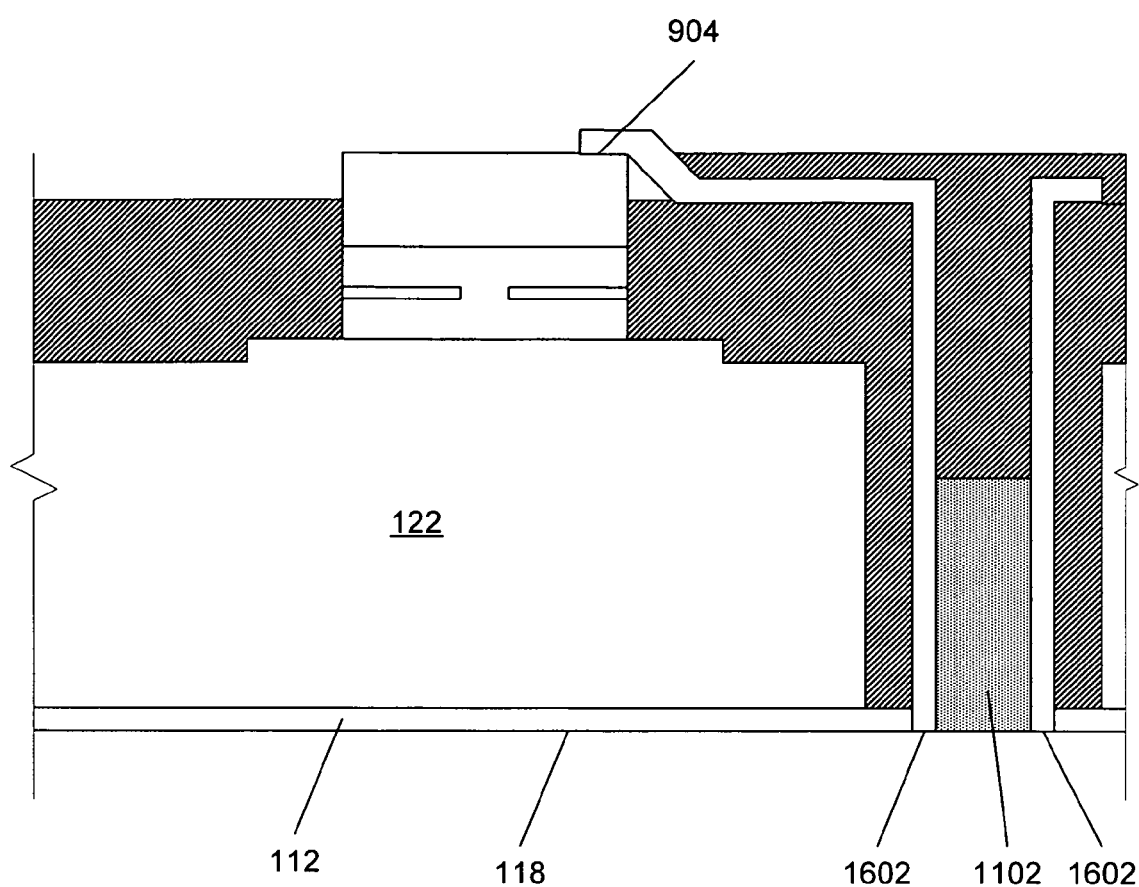
FIG. 16 shows a simplified cutaway view of the portion of FIG. 1 following thinning of the substrate to remove the bottom metalization.

Alternatively, the thinning can be performed until the bottom metallization 1502 is removed or the void 1100 volume is exposed (whether filed or not). FIG. 16 shows a simplified cutaway view of the portion of FIG. 15 following thinning of the substrate to remove the bottom metalization. Advantageously, if the approach of at least FIG. 11 and FIG. 12 was used, the void 1100 was filled with a bonding substance 1102. Thus, as shown in FIG. 16, thinning the back side 118 of the substrate 112 until the bottom metalization 1502 of FIG. 15 is removed exposes the bonding substance 1102 while leaving an "annulet" of metal contact 1602 that can still serve as part of the back side electrical contact. Thus, if the bonding substance 1102 is electrically conductive, for example solder, the annulet 1602 and the bonding substance 1102 together act as the contact, whereas if the bonding substance 1102 is not electrically conductive, it can still be used to bond the chip to another element while the annulet 1602 acts as the contact and provides an electrically conductive path from the back side 118 to the device contact 904.

Alternatively, the arrangements of FIG. 15 or FIG. 16 could be thinned so that the metallization or metal contact protrudes beyond the bottom of the wafer for use as a contact in the post and penetration approach alone or with a tack and fuse approach as described herein.

It should now be appreciated that above basic process, as well as the more complex alternative processes that follow and build upon the basic process, provide a further advantage over the prior art in that making of the vias before fabrication of the devices (e.g. transistors, diodes, lasers, photodetectors, etc.) on the wafer is not required. Moreover, the process does not require that the vias only occur in on the periphery of the chip in areas where conventional wirebond pads would occur. Instead, the instant process is more localized and can be performed at sufficiently low temperatures such that circuitry can be formed on or embedded in the semiconductor before via formation and the vias can be placed in areas other than the periphery of the chip. This makes it possible to use the process with chips made by others, without the need to be involved in the design process of those chips, and as will be described in greater detail below, to make connection paths between devices on different chips much shorter than could be done through the use of wirebond pads. Still further, because the process facilitates making paths through the wafer, as described in greater detail below, the process is highly useful for chip stacking or for creating mix and match chip "units".

One problem that can arise in connection with the filling of a trench with an electrically insulating material, particularly when the trench is narrow in width and relatively deep, for example 100 microns or more in depth, is the possibility of there being pinholes, air bubbles or other imperfections in the electrically insulating material. These imperfections, if extant, could result in an undesirable conductive path between doped semiconductor material of a device the trench passes through and a conductor within it.

Advantageously, if this is a potential problem or concern, the alternative variant shown in FIG. 17 through FIG. 23 can render the problem or concern moot.

Figure 17:
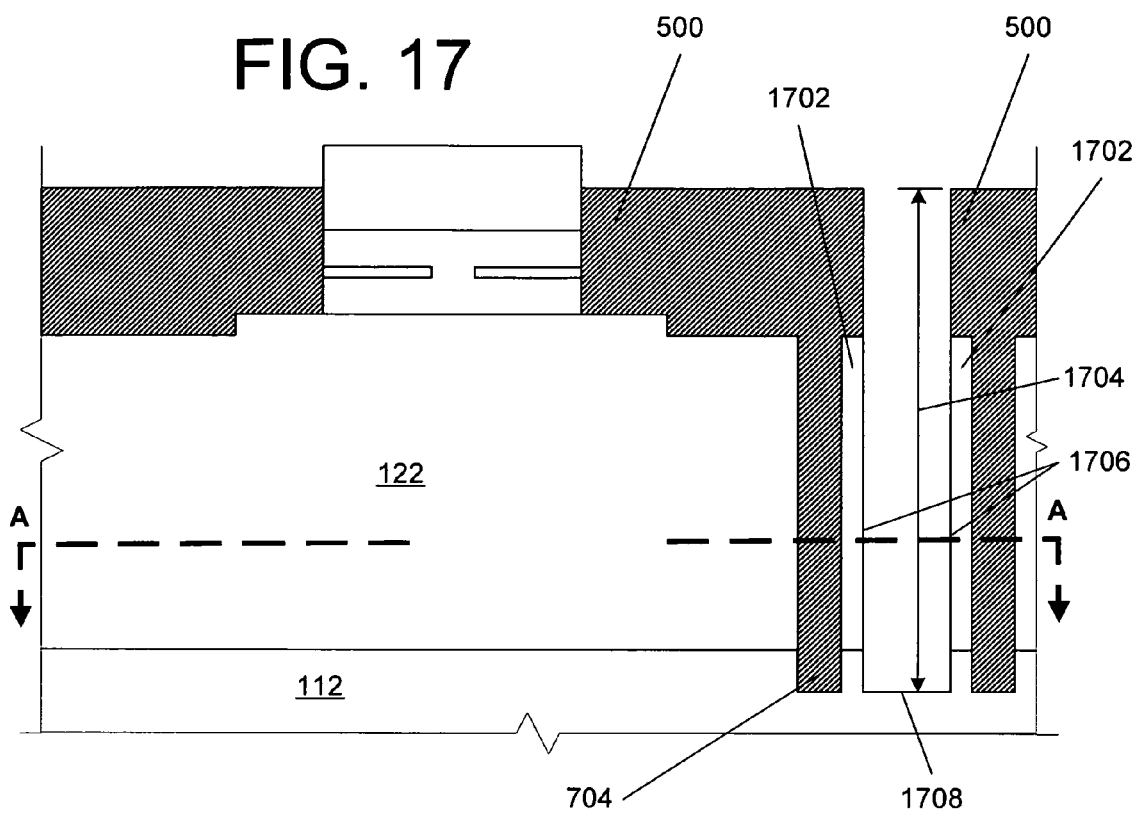
FIG. 17 shows a simplified cutaway view of the portion of FIG. 5 as a result of processing of an alternative variant.

FIG. 17 shows a simplified cutaway view of the portion 100 of FIG. 5 as a result of processing according to this alternative variant as follows.

As with FIG. 7, a via trench 1700 is created however, unlike FIG. 7, the entire island 306 of semiconductor material 122 within the annulus 704 of insulating material 500 is not removed. Rather, the via trench 1700 is smaller than that of FIG. 7 so that a perimeter annulus volume 1702 of semiconductor material 122 remains. Since the perimeter volume 1702 of semiconductor material 122 is bounded by the insulating material 500 and the substrate 112, it is electrically isolated from the semiconductor material 122 of the device 104. In addition, since the overall semiconductor material 122 is more perfectly and uniformly formed, any imperfection in the insulating material 500 within the trench 302 will be isolated from metalization in the via 1700 by the perimeter volume 1702 of semiconductor material 122. Other than the above, the approach is the same as described in connection with FIG. 7. Thus, the via trench 1700 is similarly made to a depth 1704 that extends to within the substrate 112 (but preferably not fully through it), for example, by a further etching process or through another suitable process, for example, laser drilling. Once the via trench 1700 has been created, the sidewall(s) 1706 of the via trench 1700, as well as the bottom 1708 of the via trench 1700, will all be electrically non-conducting as described above, but the sidewall(s) 1706 will be the isolated semiconductor material 1702 surrounded by the annulus insulating material 704.

Figure 18:
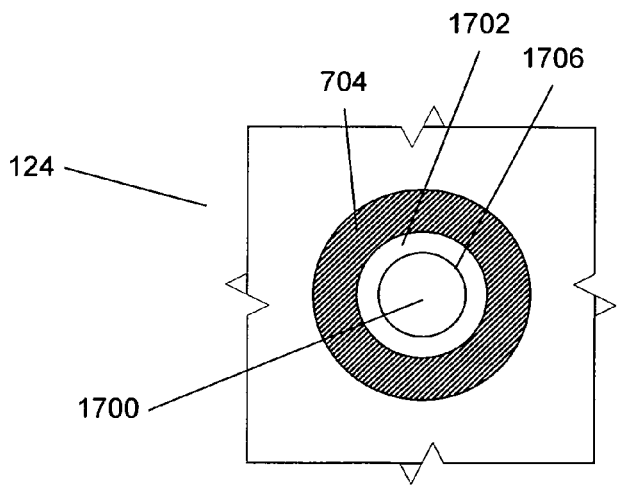
FIG. 18 is a top view of a section taken below the specified area of FIG. 1 following the creation of the via trench.

FIG. 18 is a top view of a section taken at A-A below the specified area 124 of FIG. 1 following the creation of the via trench 1700 within the annulus of semiconductor material 1702 that is bounded by the electrically insulating material 704 as shown in side view in FIG. 17.

Figure 19:
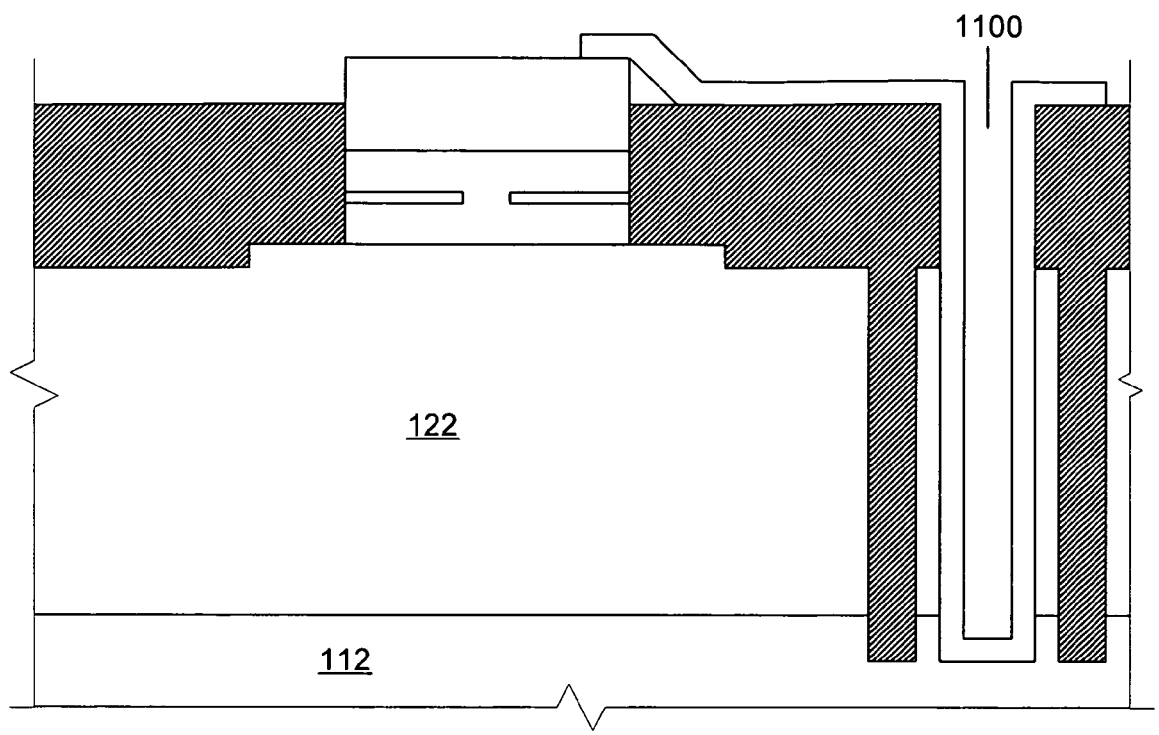
FIG. 19 shows a simplified cutaway view of the portion of FIG. 5 as a result of further processing in the manner described in connection with FIG. 9.

FIG. 19 shows a simplified cutaway view of the portion 100 of FIG. 5 as a result of further metallization processing of this alternative variant of FIG. 17 in the manner described in connection with FIG. 9.

Figure 20:
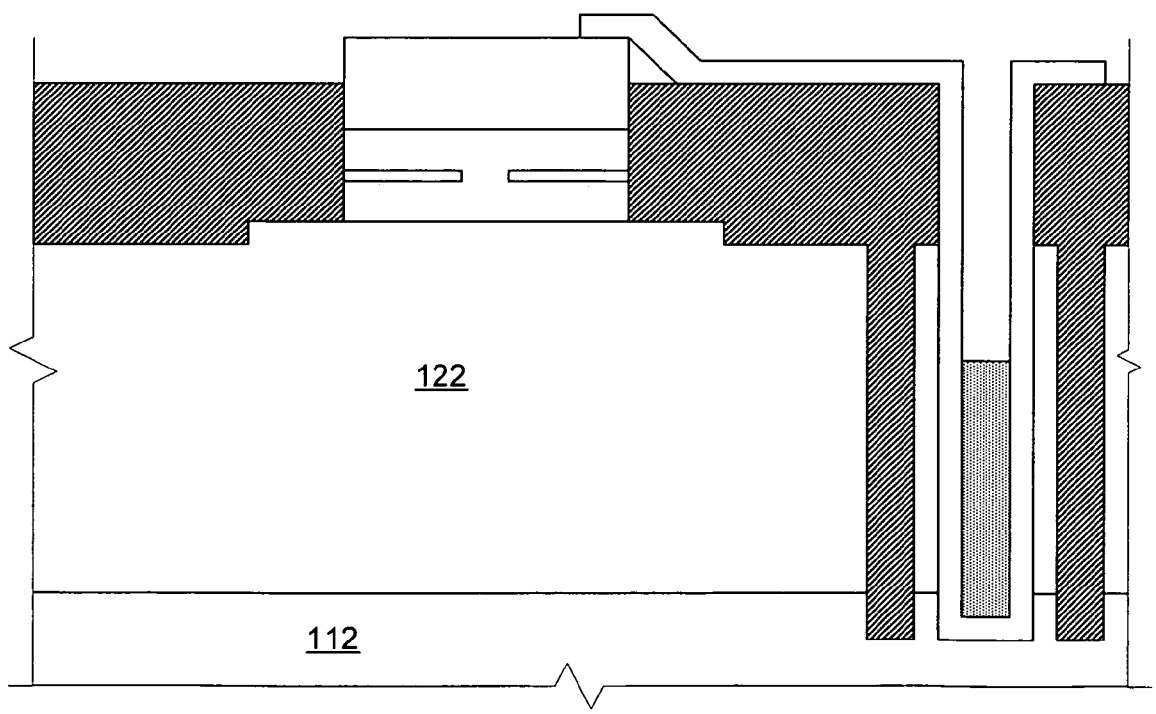
FIG. 20 shows a simplified cutaway view of the portion of FIG. 5 as a result of further optional processing in the manner described in connection with FIG. 11.

FIG. 20 shows a simplified cutaway view of the portion 100 of FIG. 5 as a result of further optional processing of this alternative variant of FIG. 17 in the manner described in connection with FIG. 11.

Figure 21:
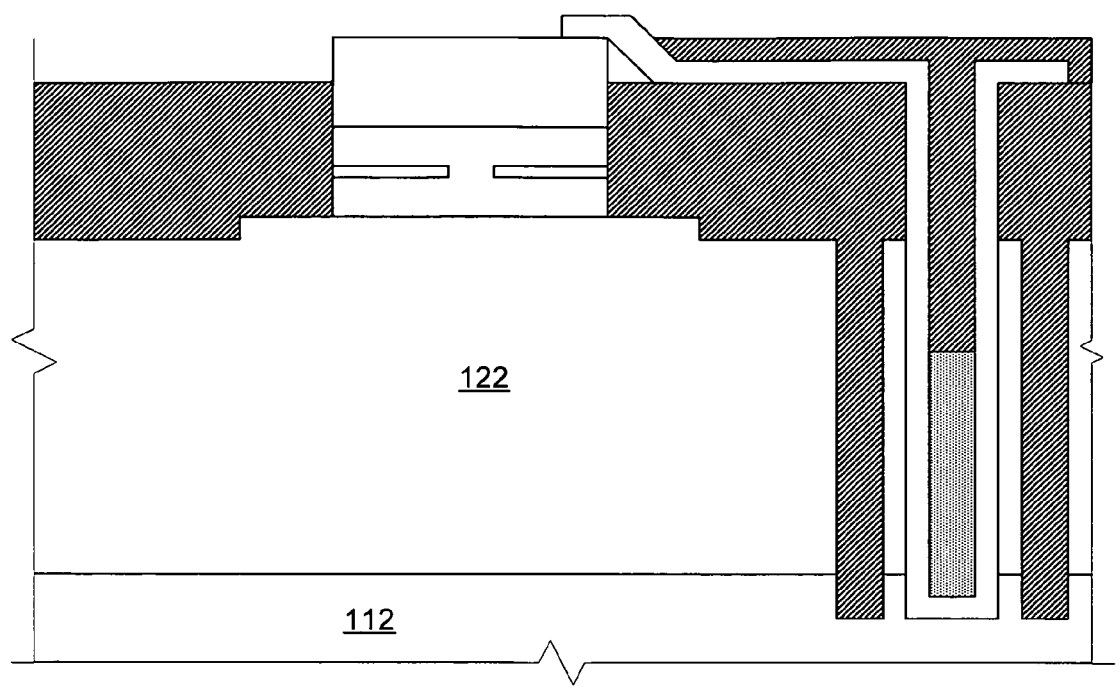
FIG. 21 shows a simplified cutaway view of the portion of FIG. 5 as a result of further optional processing in the manner described in connection with FIG. 13.

FIG. 21 shows a simplified cutaway view of the portion 100 of FIG. 5 as a result of further optional processing of this alternative variant of FIG. 17 in the manner described in connection with FIG. 13.

Figure 22:
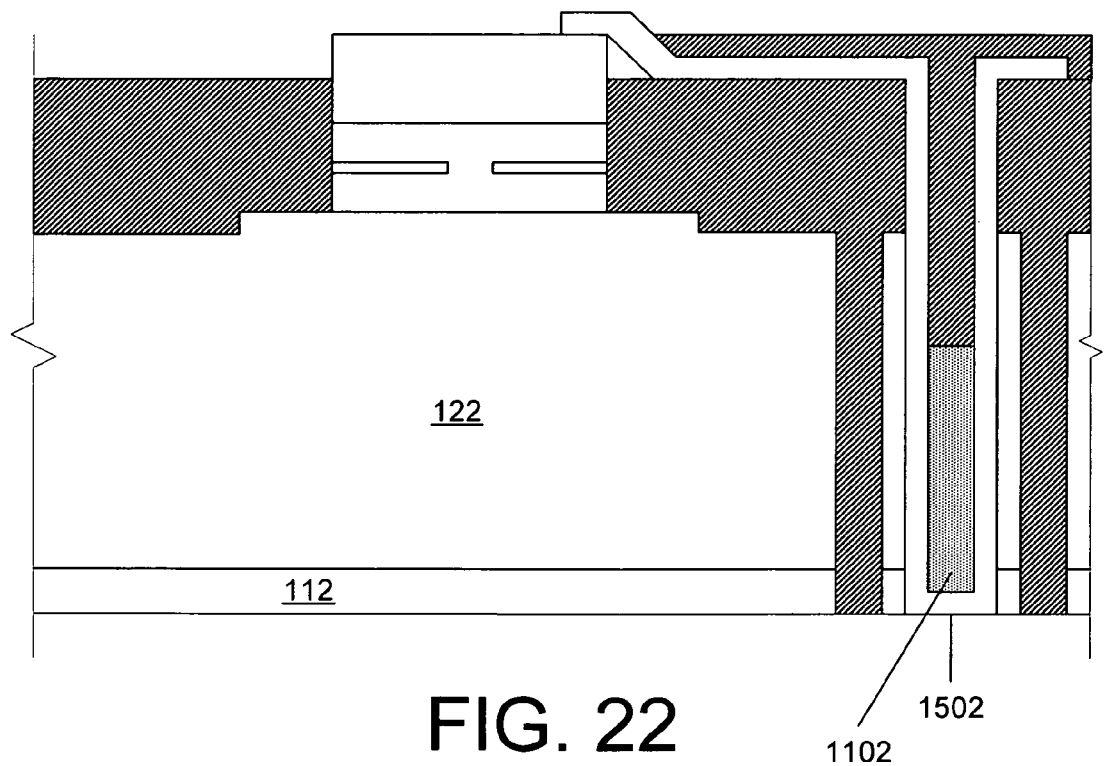
FIG. 22 shows a simplified cutaway view of the portion of FIG. 5 as a result of thinning the substrate to expose the bottom metalization in the manner described in connection with FIG. 15 in the alternative variant of FIG. 17.

FIG. 22 shows a simplified cutaway view of the portion 100 of FIG. 5 as a result of thinning the substrate to expose the bottom metalization 1502 in the manner described in connection with FIG. 15 for the alternative variant of FIG. 17.

Figure 23:
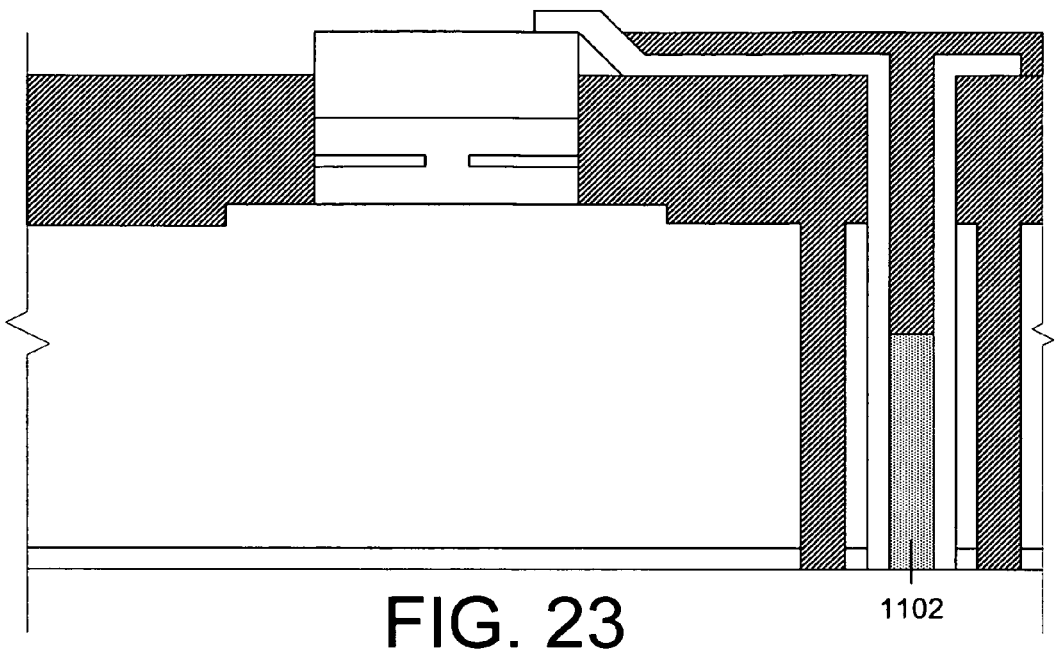
FIG. 23 shows a simplified cutaway view of the portion of FIG. 5 as a result of thinning the substrate to remove the bottom metalization in the manner described in connection with FIG. 16 for the alternative variant of FIG. 17.

FIG. 23 shows a simplified cutaway view of the portion 100 of FIG. 5 as a result of thinning the substrate to remove the bottom metalization 1502 and expose the bonding substance 1102 in the manner described in connection with FIG. 16 for the alternative variant of FIG. 17.

Based upon the above, further alternative variants can be created having dual isolated (i.e. coaxial or coax) conductors. This is advantageous because dual conductors allow for greater contact density and can reduce cross-talk. In addition, with the dual conductor variants, as will be seen, the outer conductors are separated electrically from the inner conductor allowing them to operate at different voltages; for one conductor to operate as a electro-magnetic interference (EMI) shield to protect against signal noise, or to allow the signals to propagate differentially through the structure so that lower noise data transfer can occur. Moreover, as with the single conductor approach, only one lithography defined precision etch is performed, the annular trench. As will be seen below, removal of the central material is controlled by the boundary metal and thus is not subject to process variations inherent in photolithographically defined steps or etching. Thus, even this approach is more reproducible and process robust.

Two example coax variants are illustrated in FIGS. 24 through 29B as follows. These variants are suitable for cases where the outermost conductor can be in direct contact with the semiconductor material without adverse effect. Example alternative coax variants follow thereafter in FIGS. 30A and 30B. The alternative dual conductor variants of FIGS. 30A and 30B are analogous to and improve upon the alternative variant shown in FIG. 17 through FIG. 23 and thus likewise suitable to render the same problems or concerns moot.

Figure 24:
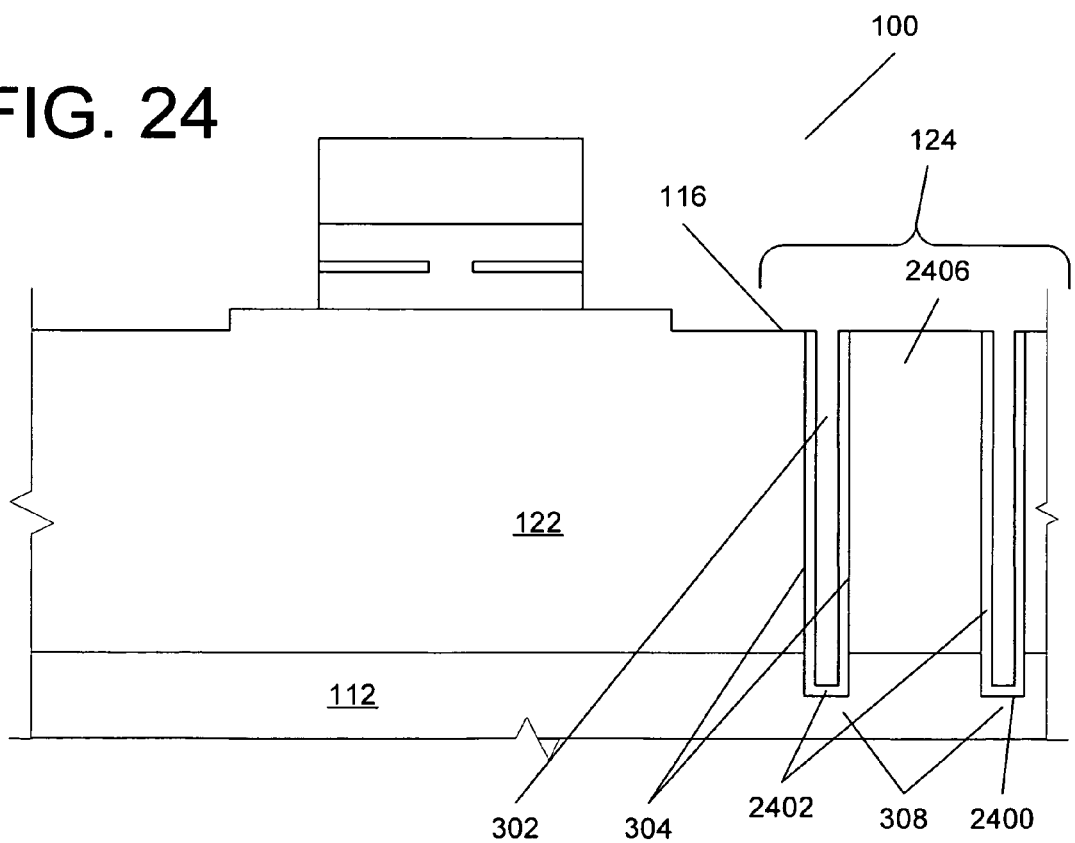
FIG. 24 illustrates in simplified form a dual conductor variant following metallization of the sidewalls.

Initially, the basic dual-conductor creation process follows the approach described in connection with FIGS. 1 through 3. Since this variant builds upon those described previously, for simplicity, only those additional or different aspects relevant to this variant are discussed, the remainder being discernable from the preceding discussion. Thereafter, the processing according to this dual conductor alternative variant is as follows. First, as shown in FIG. 24, at least the sidewalls 304 of FIG. 3 are metalized 2402 as described above. Note that the lowest surface 2400 of the trench 302 may, or may not, be metalized but, as will be evident from the following, this will not affect the ultimate result. FIG. 24 shows a simplified cutaway view of the portion 100 of FIG. 3 immediately following metallization according to this variant.

Following metalization, at least the trench 302 is filled with the electrically insulating material 500. The result of this step is shown in FIG. 25.

Again, as shown in FIG. 26, a via trench 2600 is created by removing the entire island 2406 of semiconductor material 122 bounded by the inner perimeter of the annulus 2602 of metallization 2402.

Alternatively, as shown in FIG. 27, an approach similar to that of FIG. 17 can be employed at this point (i.e. instead of removing the entire island 306 of semiconductor material 122 within the annulus 704 of insulating material 500, only an inner portion is removed 2702 so that a perimeter annulus volume 2704 of semiconductor material 122 remains).

Otherwise, and thereafter, the approach is essentially the same as described previously. The via trench 2600, 2702 is made to a depth that extends to within the substrate 112 (but preferably not fully through it), for example, by a further etching process or through another suitable process, for example, laser drilling or ablation.

The via trench 2600, 2702 is then filled with a conductor 2802 and the substrate is thinned as described above. In the case of the first example dual-conductor variant (FIG. 28A), until the bottom metalizing is removed and the inner conductor 2802 is exposed on the substrate 112 side as shown in FIG. 28B. In the case of the second example dual-conductor variant (FIG. 29A), thinning is performed until the lowermost portion of the metallization is exposed along with the inner conductor as shown in FIG. 29B. Note that in the variant of FIG. 28B, one conductor is made up of the outer ring of metalizing 2804 and the other is made up of the inner ring of metalizing 2806 plus the inner conductor 2802 because the two abut and hence, are shorted together, whereas in the variant of FIG. 29B, one conductor is made up of the metalizing 2402 and the other is made up of the inner conductor 2802.

Thus, in dual-conductor variants such as shown in FIG. 28B, it is highly desirable to make sure that the depth of the annulus 704 and the depth of the via trench 2700 are both beyond the point to which the substrate will ultimately be thinned. In other words, if the overall thickness of the wafer is 500 microns and the wafer substrate will be thinned by 200 microns, the depth of the via trench 2700 must be at least 300 microns plus the likely metallization thickness and, consequently, the original depth of the annulus 704 would have likely needed to be even more than that of the via trench 2700. The reason for this requirement is that electrical isolation between the two conductors is necessary. The above also is the reason why, in some implementations, a failure to coat the lowest part of the trench 302 will have little to no impact, because it is removed during the thinning process anyway.

Based upon the above, it should be recognized that a further alternative coax variant, similar to that of FIG. 28B or 29B, can be created merely by making the sidewalls of the trench non-conductive prior to metalizing. This can be accomplished by, for example, applying a thin coating of dielectric to the sidewalls through dielectric sputtering, plasma deposition, or by pre-creating the initial annular trenches (i.e. before electronic device fabrication) and using a thermal or steam oxidation technique. This technique involves exposing the sidewalls to a reactive gas so, in the case of a silicon wafer, it is oxidized (the conceptual equivalent of causing iron to rust) to form a thin coating of silicon dioxide on the sidewall surfaces. In general overview, the oxidation of the silicon can be performed in a steam environment in accordance with the Deal-Grove model. This approach causes the oxidation to occur in a highly controlled and accurately reproducible manner. Analogous processes can be used to create a coating of silicon oxy-nitride or silicon nitride. Advantageously, with this variant, because the resulting oxide is not deposited—it is thermally grown—it forms evenly and thereby does not introduce the problems inherent with applying a dielectric in liquid, viscous, paste or other form. Moreover, it creates a highly uniform, extremely controllable dielectric material coating, to depths of a millimeter or more, across 12 inch silicon wafers to extremely precise tolerances. Still further, this process has the effect of smoothing the sidewalls, thereby aiding in more uniform metallization.

Of course, it will be understood that this further alternative variant may be unsuitable for some applications, due to the dielectric constant of silicon dioxide, silicon oxy-nitride or silicon nitride, or impossible to implement for others due to other factors not pertinent to an understanding of the subject matter described herein. Otherwise, the approach is the same as described in connection with any of the variants described above in connection with FIGS. 24 through 29B.

For completeness, examples illustrating adding the optional additional thermally created dielectric or insulator 3002 aspect to the approaches of FIGS. 28 and 29 are respectively illustrated in FIGS. 30A and 30B. It should also be appreciated that, in some variants of FIG. 30B, namely those having only partial removal of the inner island so as to leave an annulet of semiconductor material about the via trench, the thermally created dielectric approach can be used to form a dielectric coating on the remaining annulet—provided that aspect is also performed either prior to device creation, following taking suitable measures to ensure the process will not damage any devices that have already been formed in or on the chip, or on a chip where any devices that are in or on the chip are impervious to the process.

Alternatively, the partial removal can be an inverse partial removal, i.e. the inner island is removed from the via trench inward, leaving a smaller island within the via trench. With this variant, the smaller island can serve as a post upon which a contact can be built up and connected to the metalization or conductor. Similarly, the partial removal can be a partial removal from the depth perspective, leaving a well or recess that can be used as the female part of a male/female connector or, if made conductive, can serve as an electrical contact.

Figure 28A:
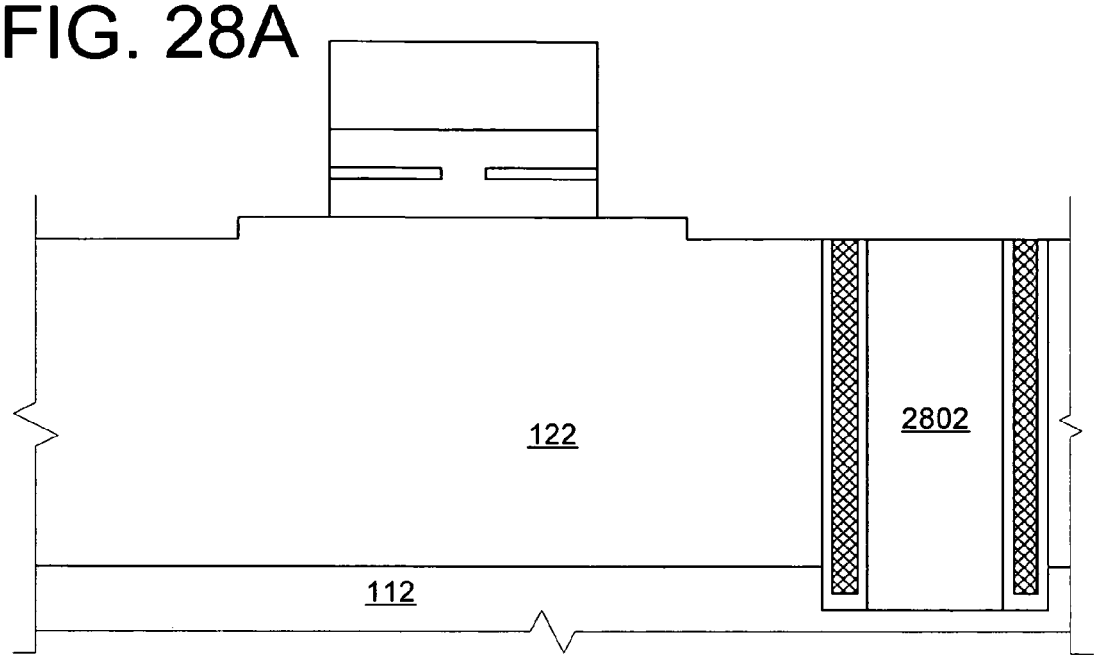
FIG. 28 illustrates in simplified form one example dual-conductor variant.
Figure 29A:
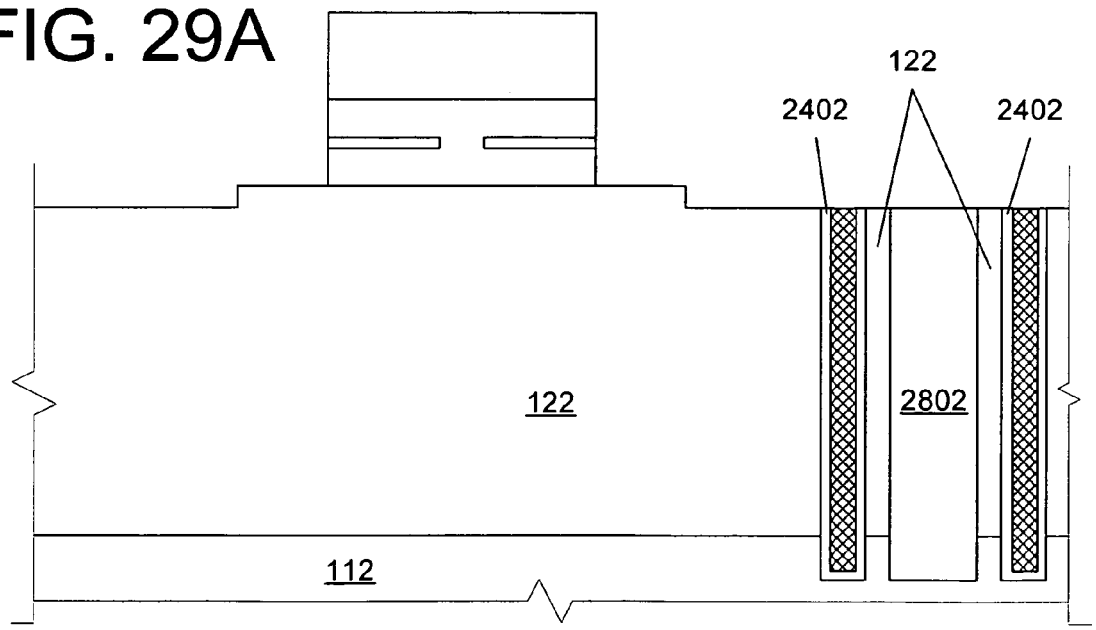
FIG. 29 illustrates in simplified form another example dual-conductor variant.
Figure 28B:
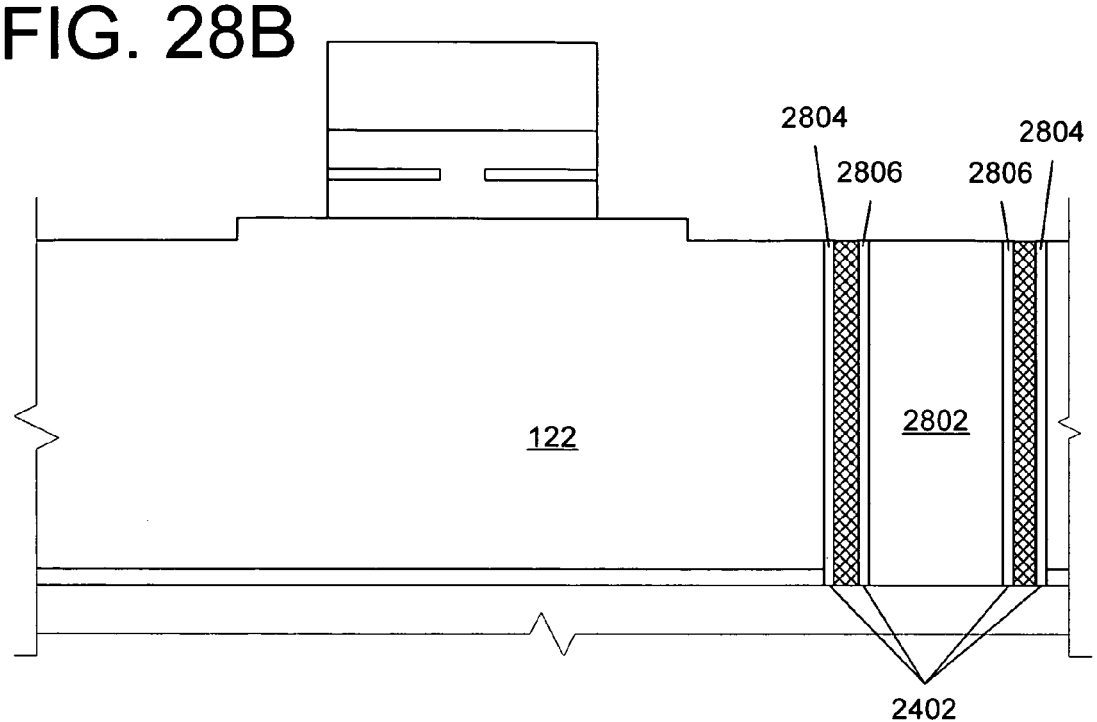
Figure 29B:
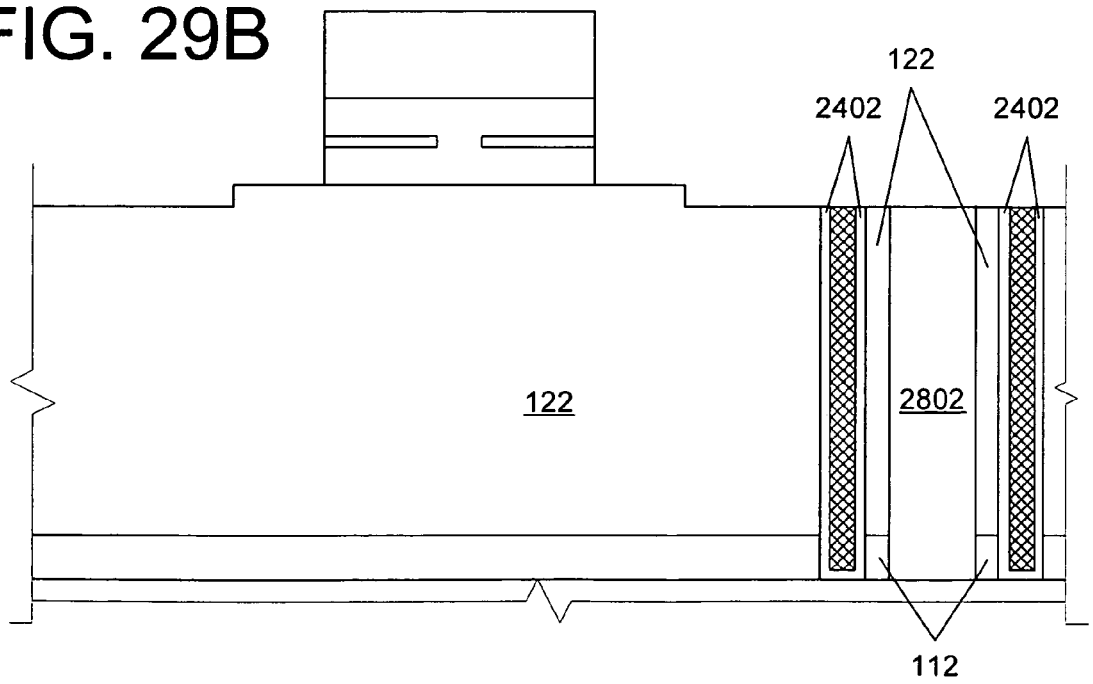
Figure 31:
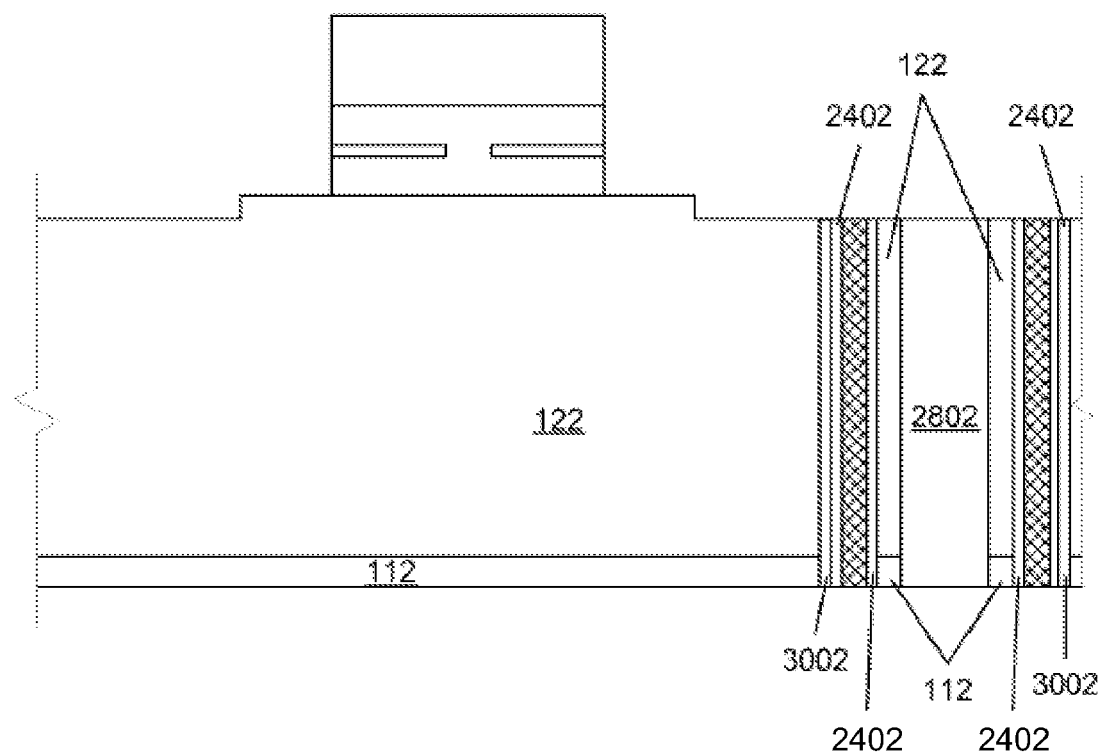
FIG. 31 illustrates in simplified form one example three-conductor variant.

Advantageously, it should now be apparent from the above that, as shown in FIG. 31, a three-conductor (i.e. triaxial or triax) variant can also be constructed merely by taking the approach resulting in FIG. 28B but thinning to the extent shown in FIG. 28A (i.e. until the metalization material at the bottom of the trench is completely removed). This three conductor variant is advantageous because it allows the outer metallization to act as a shield between the inner metallization and/or conductor and the device bearing semiconductor material nearby, the metalization metallization between the outer metalization and the inner conductor to act as either a shield between the two, or as a third conductor. Thus, the same three-conductor variant provides several alternative advantages in its own right. Of course, it is to be understood that, in view of the relationship between the single-conductor, two-conductor and three-conductor variants, all options described for use with any one (i.e. coatings (thermally created or applied), void-filling, post and penetration contacts (described below), etc.) are generally interchangeably applicable to all.

As briefly noted above, it is not necessary that the remaining void existing after removal of the central island of material be filled with anything at all. Moreover, in some implementations described herein there are specific advantages to not doing so.

Figure 32:
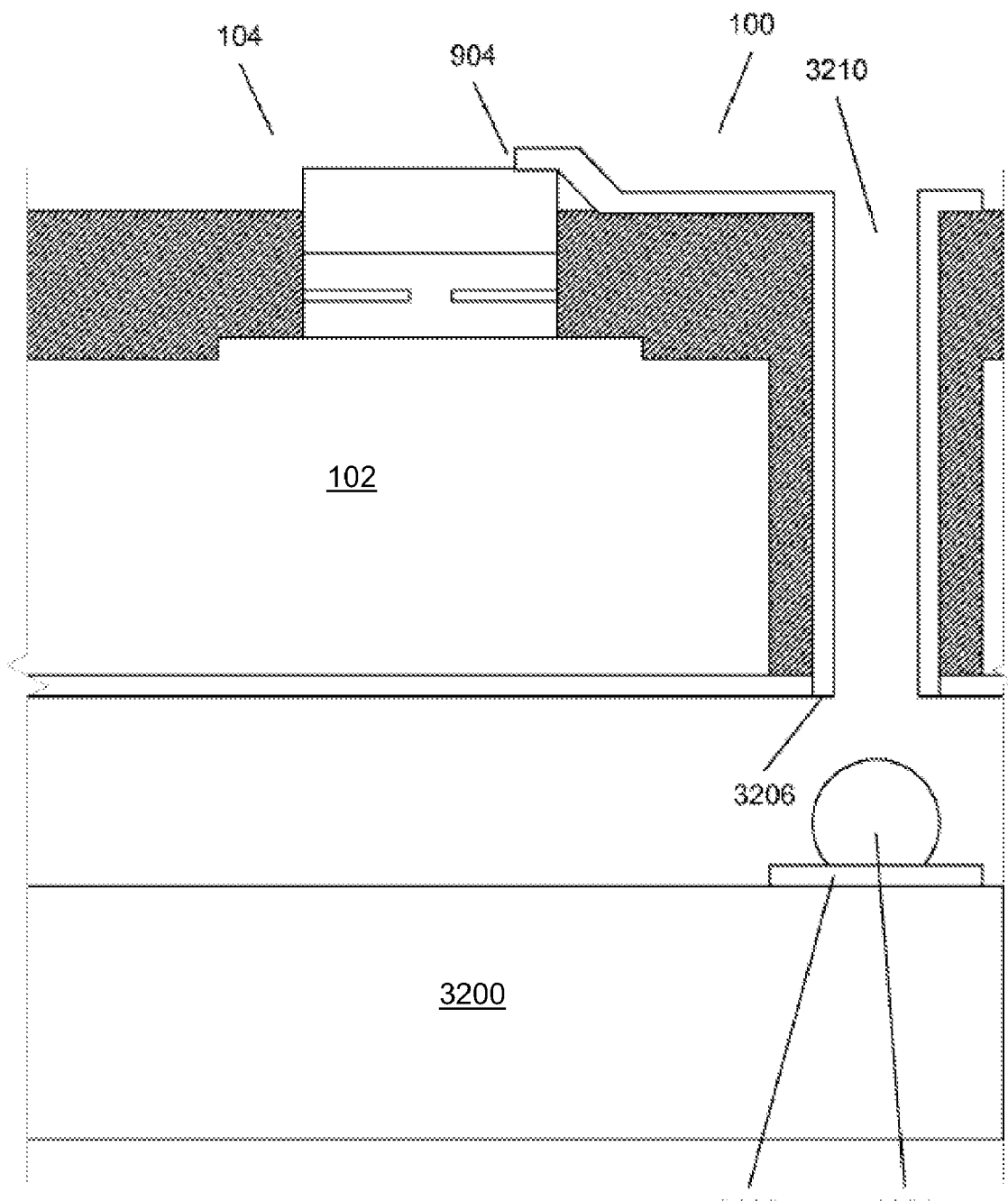
FIG. 32 shows a simplified cutaway view of a portion of an example alternative chip implementation similar to the implementation of FIG. 9 through FIG. 16 except the void remaining after metalization is not filled.

FIG. 32 shows a simplified cutaway view of a portion 100 of a chip implementation, (similar to the implementation of FIG. 9 through FIG. 16 except the void 3210 remaining after metalization has not been filled at all) positioned above an electronic chip 3200 to which the chip 102 will be hybridized so that the contact pad 3202 on the electronic chip 3200 that is to be electrically connected to the top contact 904 of the laser 104 is beneath the void 3210. A solder bump or other softenable, deformable, electrically conductive material 3204 rests on the contact pad 3202 and will be used to physically and electrically bond this portion of the two chips 102, 3200 together either through capillary action or deformation upon insertion with pressure.

Figure 33:
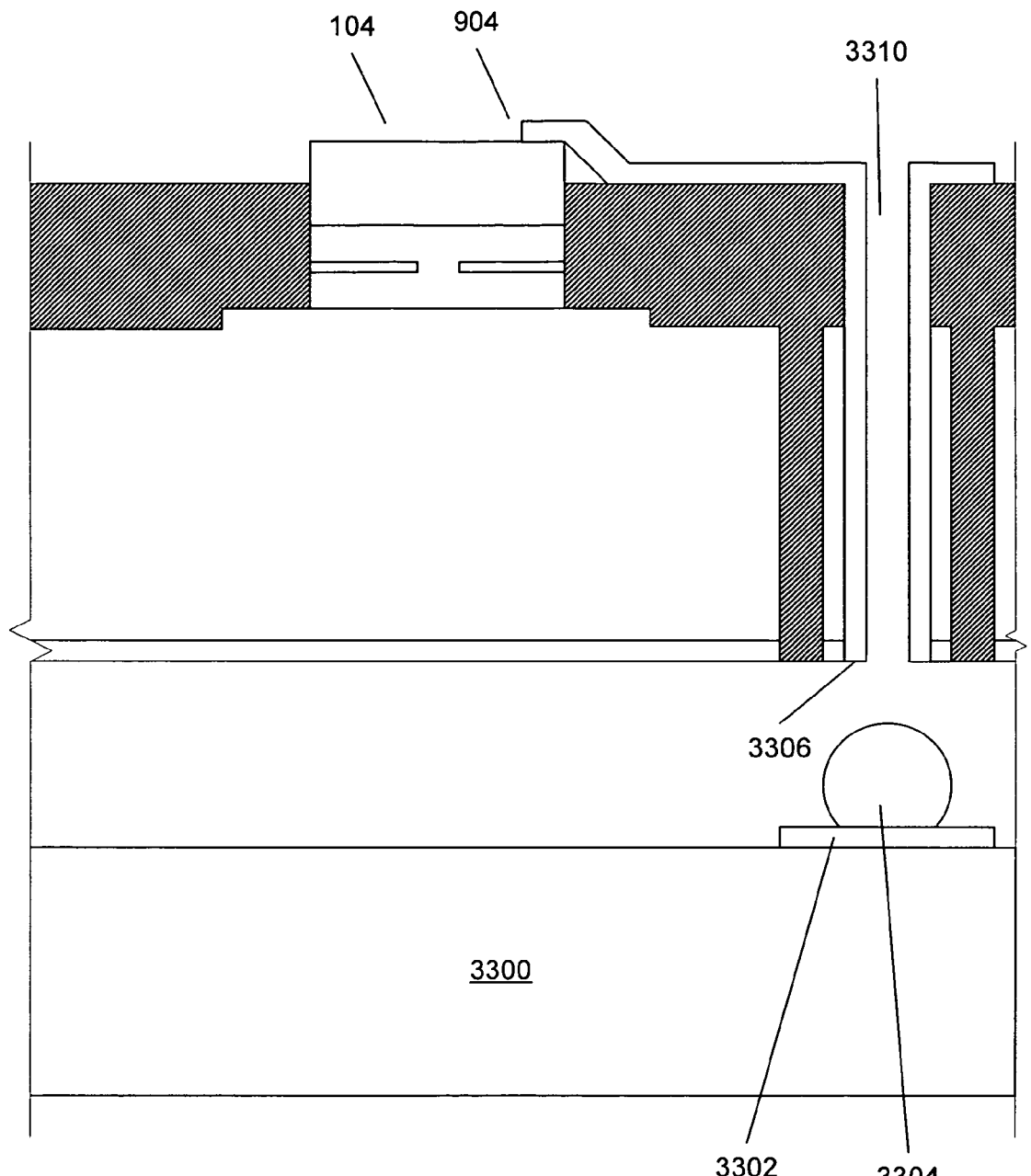
FIG. 33 shows a simplified cutaway view of a portion of an example alternative chip implementation, similar to that of FIG. 23 except the void remaining after metalization is not filled.

FIG. 33 shows a simplified cutaway view of a portion of an alternative chip implementation, similar to that of FIG. 23 except, as with FIG. 32, the void 3310 remaining after metalization has not been filled, positioned above an electronic chip 3300 to which the chip 102 will be hybridized so that the contact pad 3302 on the electronic chip 3300 that is to be electrically connected to the top contact 904 of the laser 104 is beneath the void 3310. A solder bump 2404 rests on the contact pad 3302 and will be used to physically and electrically bond this portion of two chips 3302, 3300 together.

By not filling the void 3210, 3310 in the implementation of FIG. 32 or FIG. 33, capillary action can be used to draw the solder 3204 into the void 3210, 3310 or pressure can be used to cause the deformable material 3204 to deform and enter into the voids, and thereby a) insure a good electrical connection and b) aid in alignment of the chips to each other.

Figure 34:
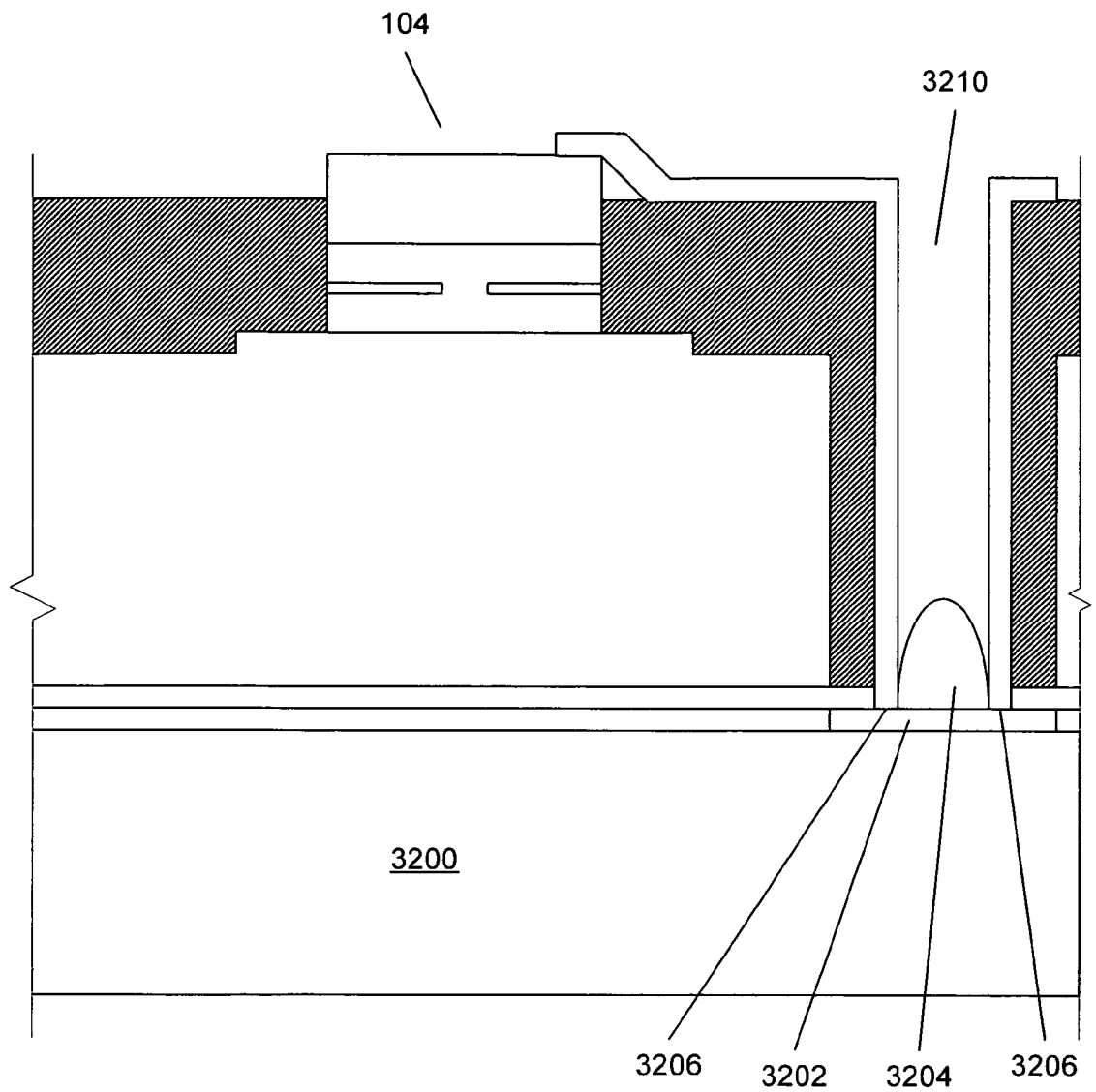
FIG. 34 and FIG. 35 each show the respective cross sections of the chips of FIG. 32 and FIG. 33 following hybridization to each other.
Figure 35:
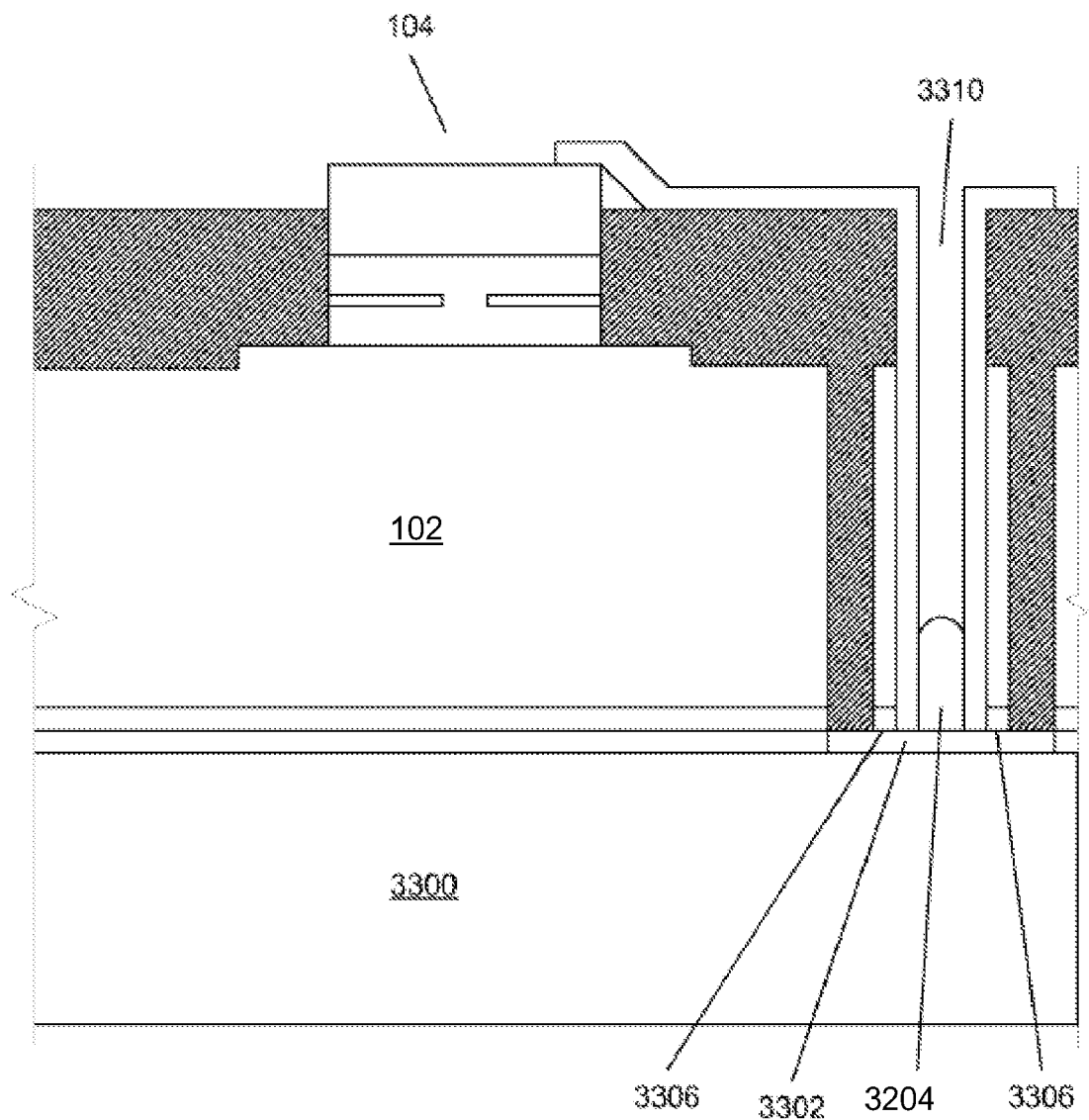

FIG. 34 and FIG. 35 each show the respective cross sections of FIG. 32 and FIG. 33 following hybridization of the chips to each other. As can be seen, the solder 3202 has been drawn up into the respective voids 3210, 3310 with the contact 3206, 3306 of the chip being relatively centered over the contact 3202, 3302 of the respective electronic chip 3200, 3300 to which it is hybridized.

Figure 36:
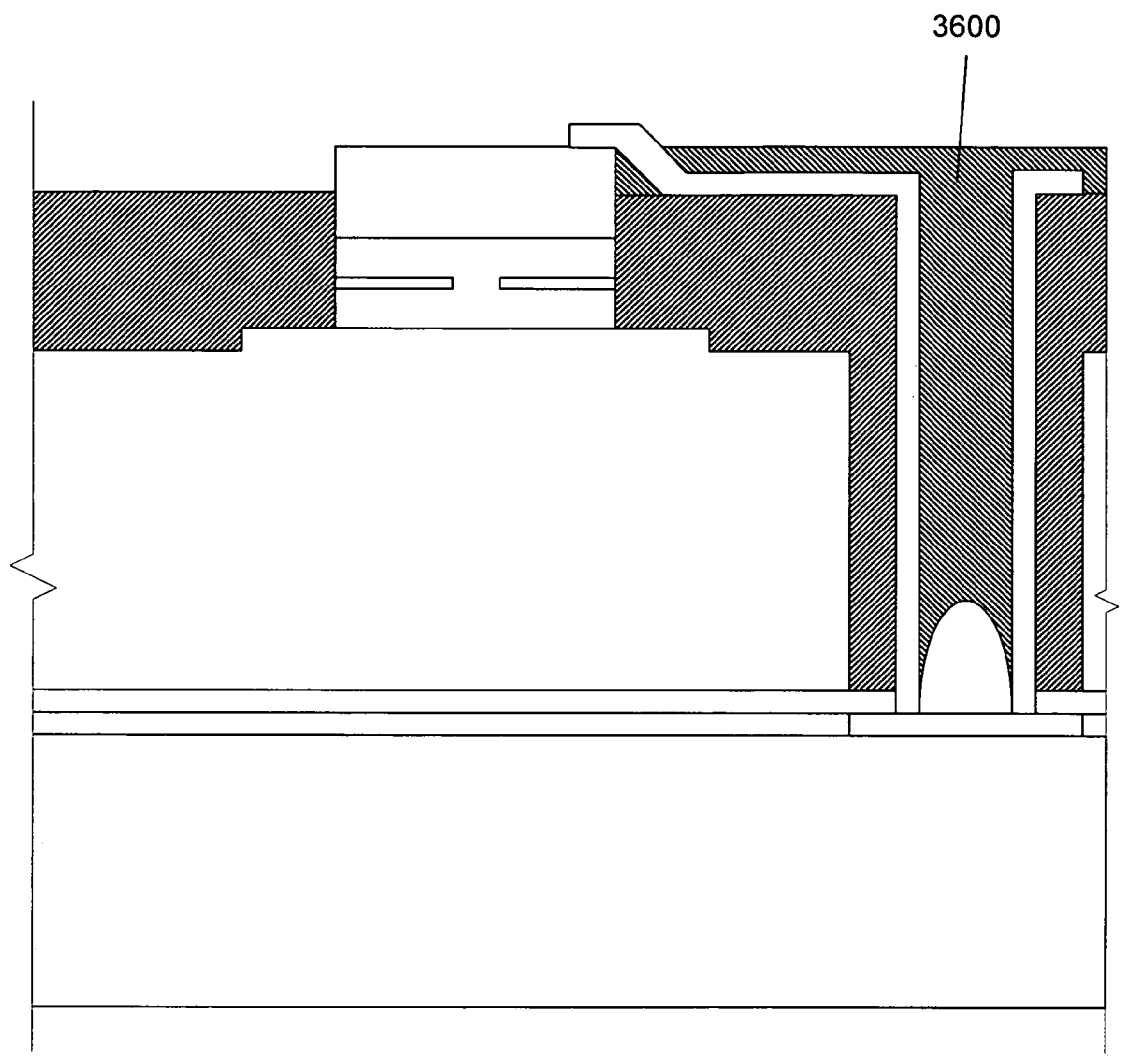
FIG. 36 shows the implementation of FIG. 34 after optional coating with an insulator conformal coating.

As shown in FIG. 36 for the implementation of FIG. 34 (although the same is equally true for the implementation of FIG. 35 but not shown), coating with an insulator or conformal coating 3600 can optionally be performed.

Figure 37:
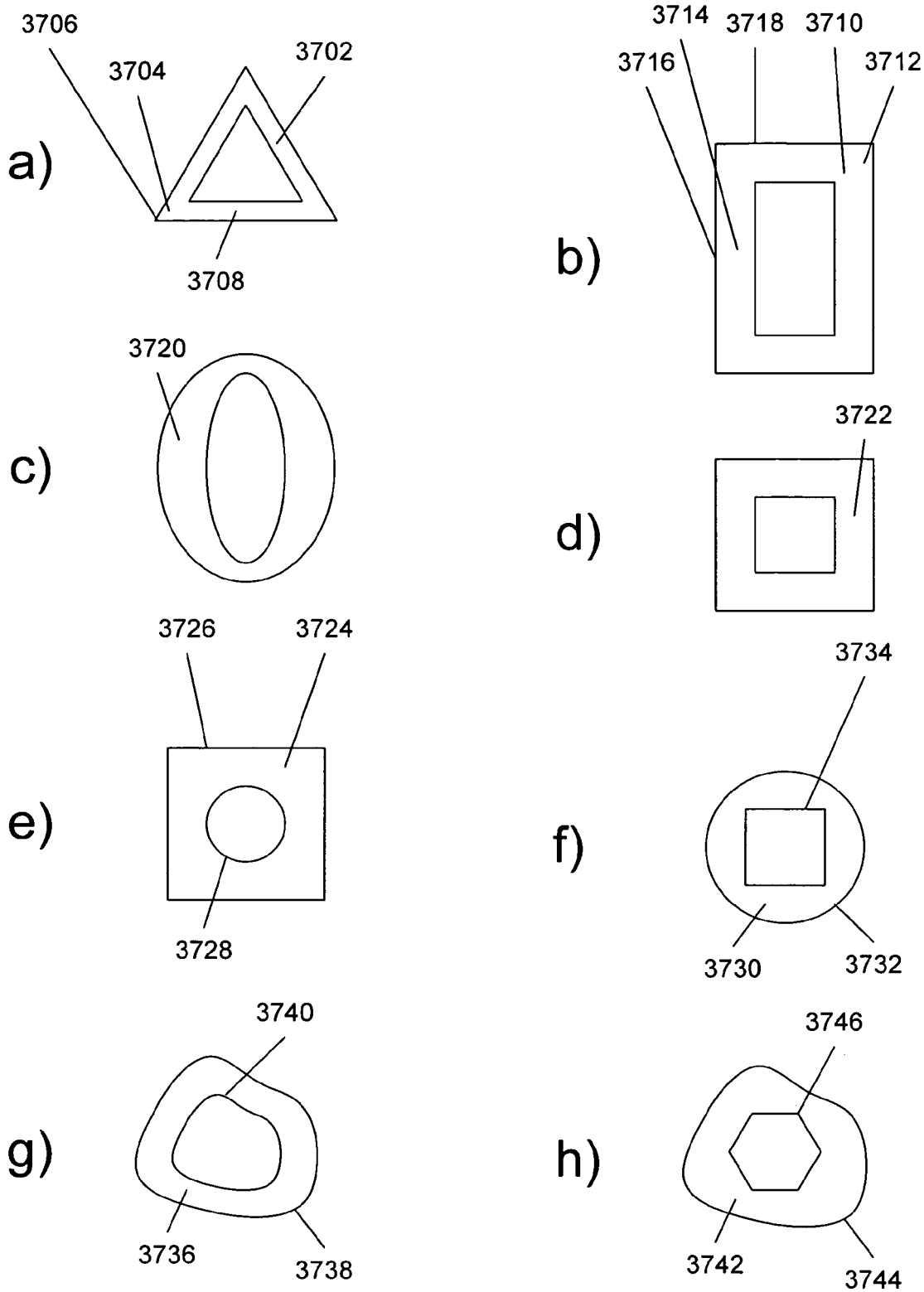
FIG. 37 shows representative examples of cross sections of annulus trenches.

As briefly noted above, irrespective of the variant used, the annulus trench described above (as well as the perimeter of semiconductor material if that variant is used) can be any closed shape. However, as an extension of the above, it should also be understood that the via trench need not be the same shape as the annulus trench nor does the width of the annulus trench have to be uniform, although in most implementations both will be the same shape, for ease of implementation reasons as well as capacitance or resistance or both. FIG. 37a through FIG. 37f show a few representative examples of cross sections of annulus trenches to illustrate the point. In FIG. 37a, the annulus trench 3702 is illustrated as being triangular. As a result, the width 3704 of the trench 3702 is larger at the points 3706 of the triangle than at the sides 3708. In FIG. 37b, the annulus trench 3710 is illustrated as being rectangular. As a result, the width of the trench 3710 is larger at the corners 3712 than at the sides 3714 and the long sides 3716 are spaced farther apart than the short sides 3718. In FIG. 37c, the annulus trench 3720 is illustrated as being bounded by two different ovals. As a result, the overall width of the annulus trench 3720 varies with position. In FIG. 37d, the annulus trench 3722 is illustrated as being square. As a result, the width of the trench 3722 is larger at the corners than at the sides but the sides are uniformly spaced apart. In FIG. 37e, the annulus trench 3724 is illustrated as square at the outer perimeter 3726, but circular at the inner perimeter 3728. In FIG. 37f, the annulus trench 3730 is illustrated as circular at the outer perimeter 3732, but square at the inner perimeter 3734. In FIG. 37g, the annulus trench 3736 is a convexo-concave (or kidney-like shape) shape where the outer perimeter 3738 and the inner perimeter 3740 are scaled versions of each other and the width of the trench is constant. In FIG. 37h, the annulus trench 3742 has an outer perimeter 3744 similar in shape to that of FIG. 37g and an inner perimeter 3746 of hexagonal shape.

An extension of the above applies equally to the variants that have an annulus of semiconductor material in addition to the annulus of insulator, i.e. the shape of each peripheral surface can be the same as the others or one or more can be different from one or more of the others as desired or as needed for the particular application.

In addition to the advantages obtainable, per se, from use of the above to ultimately create connections between two chips, the above approaches provide significant advantages in the area of chip, die or wafer stacking, particularly where the chip, die or wafer is pre-processed, e.g. it is fully formed from a function standpoint in that it already has whatever functional devices in terms of the transistors, capacitors, diodes, switches, resistors, capacitors, etc. it will contain created on it.

Creating vias using the annular via process provides a way to stack wafers in a manner which allows electrical conductivity and also requires little or no post-processing of the after the wafers are fused. This is highly beneficial, both on a cost and yield basis, particularly at the wafer level where two wafers are to be hybridized together or a wafer is to be populated with multiple individual chips. When putting wafers together, one of the key realizations is that the hybridized two-wafer piece (i.e. after putting two wafers together) has a much higher value than a single wafer piece (i.e. the single wafer immediately prior to hybridization). Likewise if three wafer pieces are stacked together, the value is even higher. Any post-processing that has to be done to a series of stacked dies after they are integrated adds a lot of risk because damage will result in scrapping a very high-value added piece.

Thus, the above processes provide a much better approach because all of the via processing and thinning occurs before the devices are stacked. As a result, fully stack-ready pieces are created that can just be layered one on top of another for joining (i.e. hybridization) with no additional wafer processing, via formation having been done post creation of the on-chip devices and prior to hybridization. As chips are stacked with the above approaches, while the value of the combination goes up and up, the number of steps to attach another layer is typically just one, namely—attach the next die (unless thinning is necessary and was not performed prior to the hybridization). This minimizes the risk of yield loss to expensive parts due to post processing inherent in stacking prior art where chips are stacked and thereafter, electrical contacts are created.

Thus, in contrast to the prior art, creating the vias before stacking allows for:

1) reduced or no post-processing on the stacked piece (resulting in less labor and higher yield); and 2) greater alignment tolerance (each chip only needs to be aligned well relative to the one immediately below (as opposed to stacking prior art which requires all pieces to be aligned in common relative to the bottom piece)).

Figure 38:
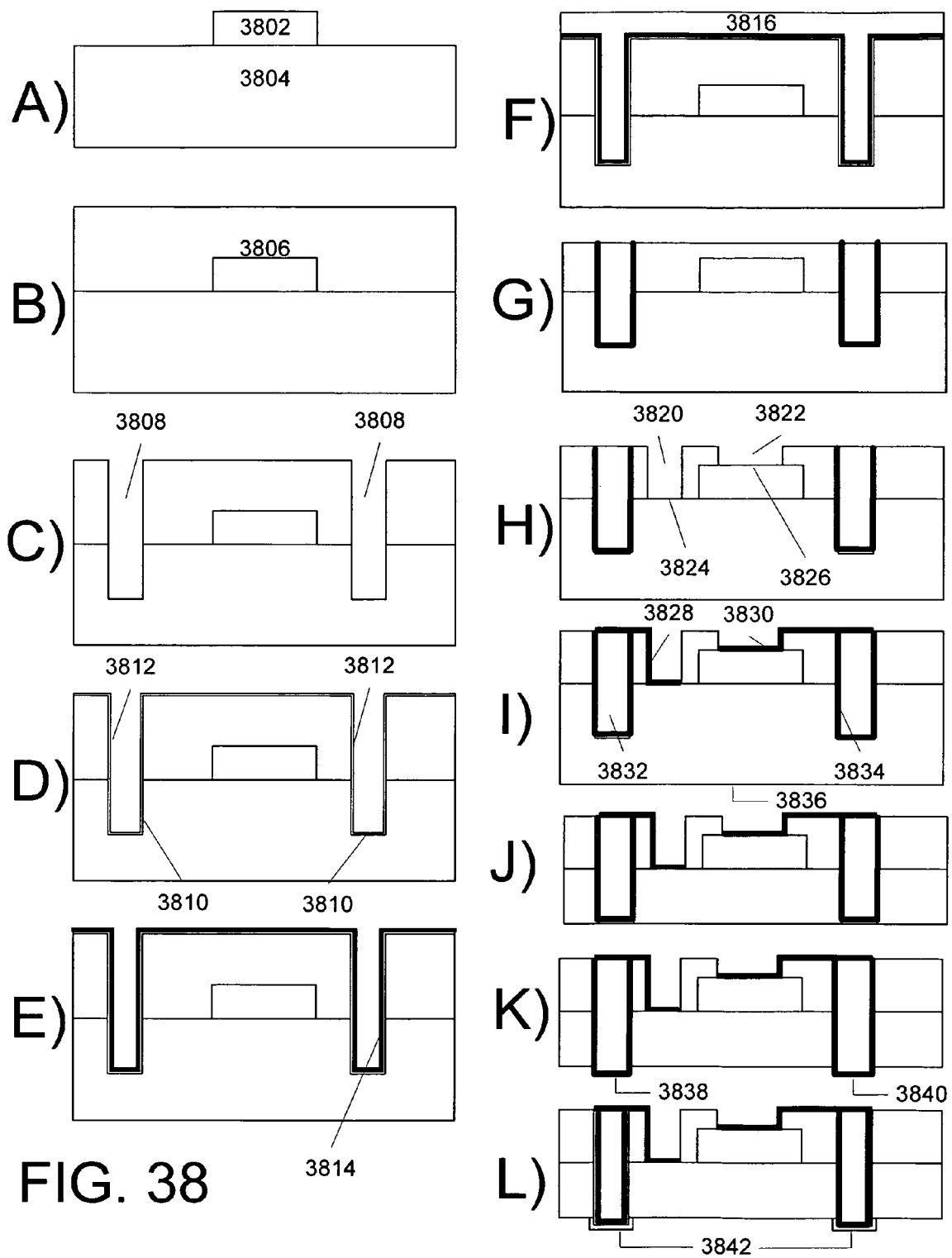
FIG. 38 illustrates in simplified form, a generic overview form a process for preparing a wafer for stacking.

FIG. 38 illustrates in simplified form, a generic overview form a process for preparing a wafer for stacking. FIG. 38A shows in simplified form a portion of the initial, fully formed wafer and, specifically a device 3802 and its underlying substrate 3804. The generic process is as follows. First, a material 3806 is deposited on the device side of the wafer (FIG. 38B). Then, the material 3806 and underlying locations for contacts are etched to create trenches 3830 (FIG. 38C). The walls 3810 of the trenches 3808 are insulated 3812 to prevent potential shorting of doped semiconductor material to the contact to be created (FIG. 38D).

Alternatively, the material 3806 can be created "automatically" during the deposition of the insulating layer 3812. For example, we have put TEOS (oxide) on the wafers by eliminating the first deposition of the material 3806, etching the trenches 3808, then depositing TEOS. Because of the way this material deposits, it placed 2.5 microns of material on top of the wafer and 1.25 microns on the walls in the trenches. This provides an alternative approach to getting a thick top layer while still covering the walls of the trenches. In other words, with this alternative, putting the material 3806 on as a separate step could be eliminated or be used in conjunction with the remaining steps depending upon the topology of the wafer.

Metal 3814 is then introduced into the trenches to provide a seed layer for plating of a conductor (FIG. 38E). Then the remaining via volume is filled with the metal 3816 that will be the conductor (FIG. 38F). Next, the excess metal (and optionally some of the material 3806 and/or insulating layer 3812) is removed, for example by a chemical or mechanical process or some combination thereof (FIG. 38G). Then, the wafer is etched to create openings 3820, 3822 that provide access to the original, existing contact locations 3824, 3826 (FIG. 38H). Next, metal 3828, 3830 is applied to interconnect the existing contact locations 3824, 3826 with the new processing-formed contacts 3832, 3834 (FIG. 38I). Next, the back side 3836 of the wafer is thinned to expose the other end of the processing-formed contacts 3832, 3834 and optionally to remove the insulator 3812 at the bottom of the trenches 3808 (FIG. 38J). Then, the back side 3836 of the wafer is etched to create upraised posts 3838, 3840 and, if the insulator 3812 at the bottom of the trenches 3808 was not removed in the prior step, to remove the insulator 3812 (FIG. 38K). Alternatively, in some implementations, the insulator 3812 could be partially removed or, in some cases not removed at all if electrical conductivity is not required, for example, if it is to be used to simply align or to create a non-electrical post-type connection. Finally, if the exposed fill material that became the post is of a type that can oxidize or otherwise react in a manner that is adverse to later forming a connection, an optional barrier layer 3842 can be applied on the upraised posts 3838, 3840 to prevent oxidation or such other adverse reaction.

In still other alternative variants, the steps of FIG. 38J, FIG. 38K and FIG. 38L can be performed after applying a malleable material (for use as described below) on top of the metal 3828, 3830 and protecting it. This variant reduces the number of steps that have to be performed after the wafer is thinned.

At this point, a generic through-chip connection has been created that can facilitate stacking on a chip, die or wafer basis and thereby form one or more multi-wafer units.

Figure 39:
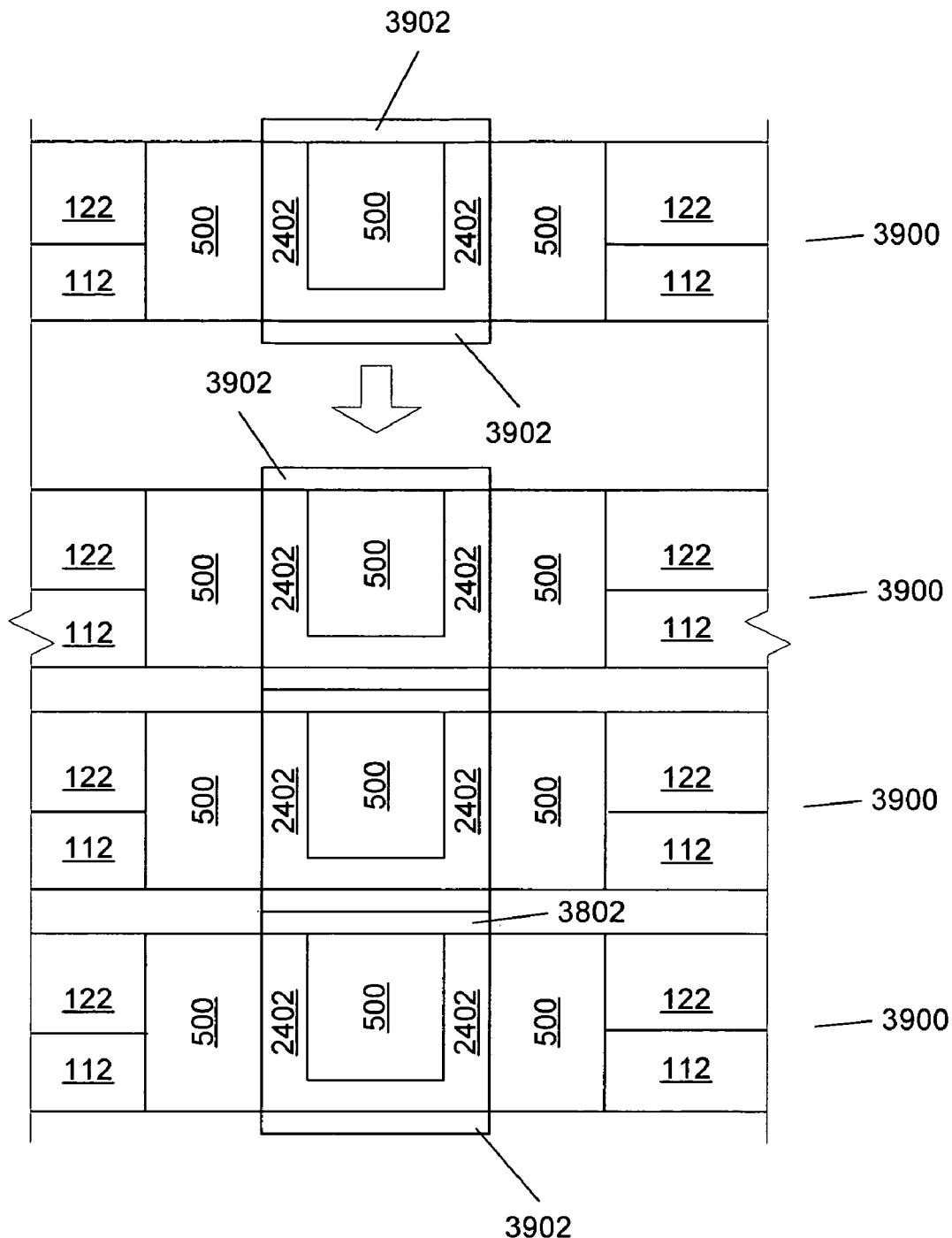
FIGS. 39 through 41 illustrate portions of example chips processed to create through-chip connections using different variants of the herein-described processes that have, thereafter, been stacked together to form a chip unit.
Figure 40:
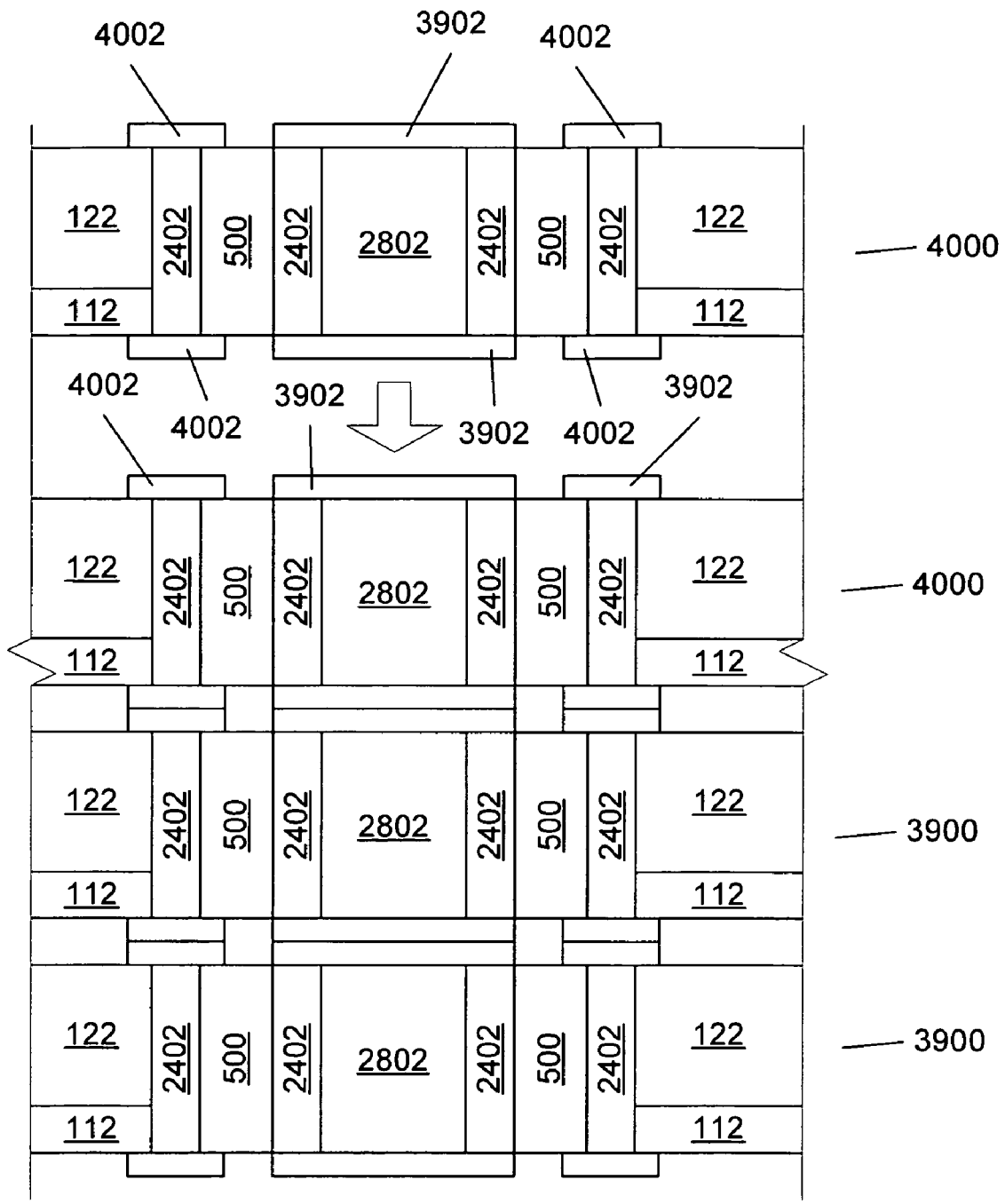
Figure 41:
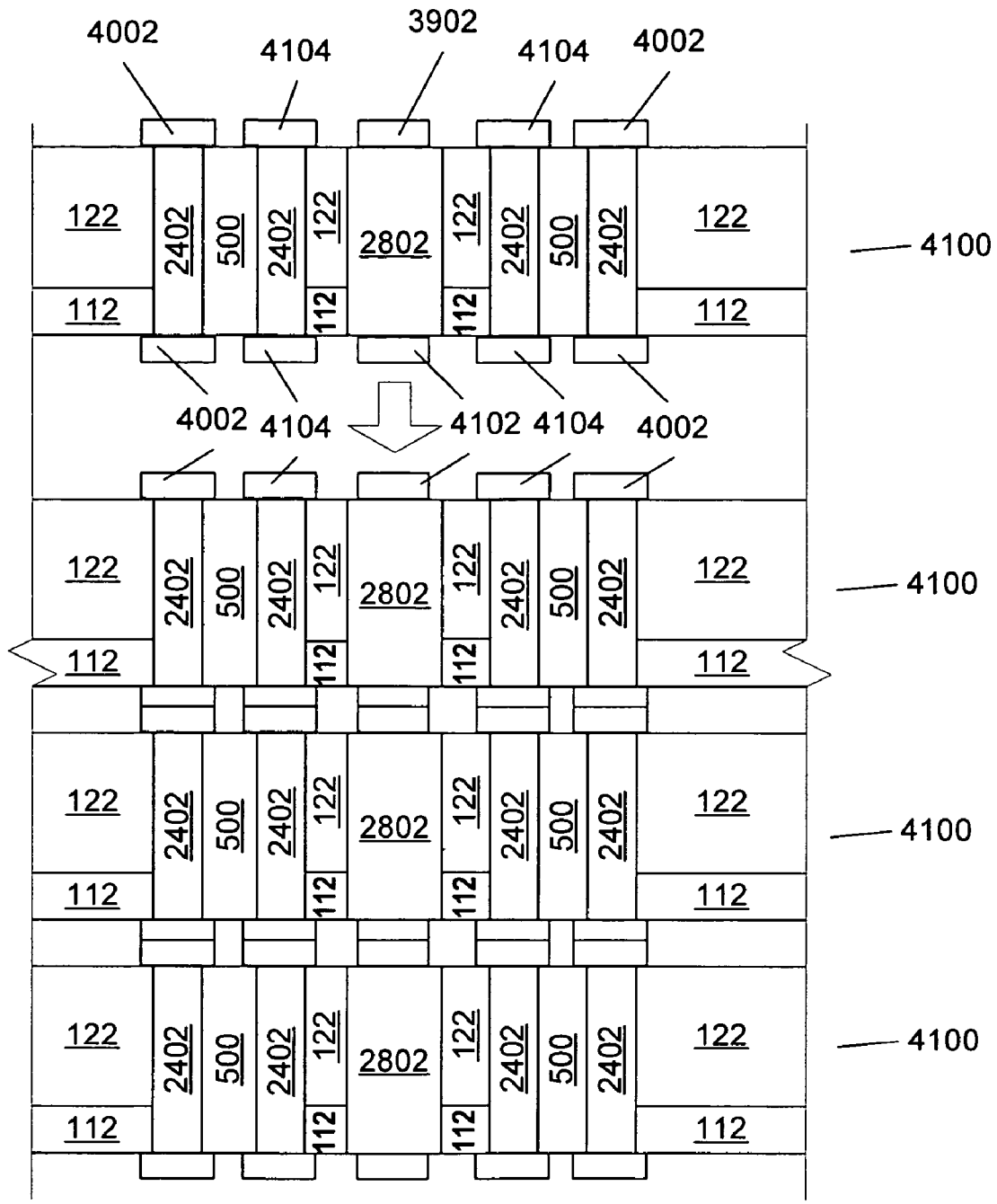

FIGS. 39 through 41 generically illustrate portions of example chips processed to create through-chip connections using different variants of the above-described processes that have, thereafter, been stacked together to form such a unit. Specifically, FIG. 39 shows corresponding portions 3900 of a series of stacked chips interconnected with each other using the basic approach variant. FIG. 40 shows corresponding portions 4000 of a series of stacked dual-conductor variant chips. FIG. 41 shows corresponding portions 4100 of a series of stacked three-conductor variant chips. It should now be appreciated from the above that by employing one of the processes described herein, stacks and units can be formed from wafer components that need not be organized in a coplanar manner or even a fully overlapping manner, but can nevertheless extend in the vertical direction.

Note that, in each of the three stacks of FIGS. 39 through 41, optional contact pads 3902, 4002, 4102, 4104 have been added as standoffs to ensure proper clearance and good electrical contact between wafers.

Depending upon the particular application in which the above will be used, the contacts can be formed in a number of ways. For example, the vias can be microbumped with, for example a C-4 solder type process of the prior art, so that two points to be electrically connected are placed into contact and the solder is changed to a liquidus state and then hardened so that the two pieces will be physically and electrically joined. In other variants, a pair of contacts can be used where one contact of the pair is rigid and the other is malleable relative to the first and a process as described herein is used to join them. In yet other variants, both contacts in the pair can have malleable material on them and an appropriate process as described herein or otherwise is used to join them. Alternatively, a post and socket type approach of the prior art can be used. With this approach, the two contacts to be joined are made in complementary shapes where either the post is slightly oversized relative to the socket or the socket is slightly undersized relative to the size of the post such that bringing the two together results in an interference fit between the two.

Figure 42:
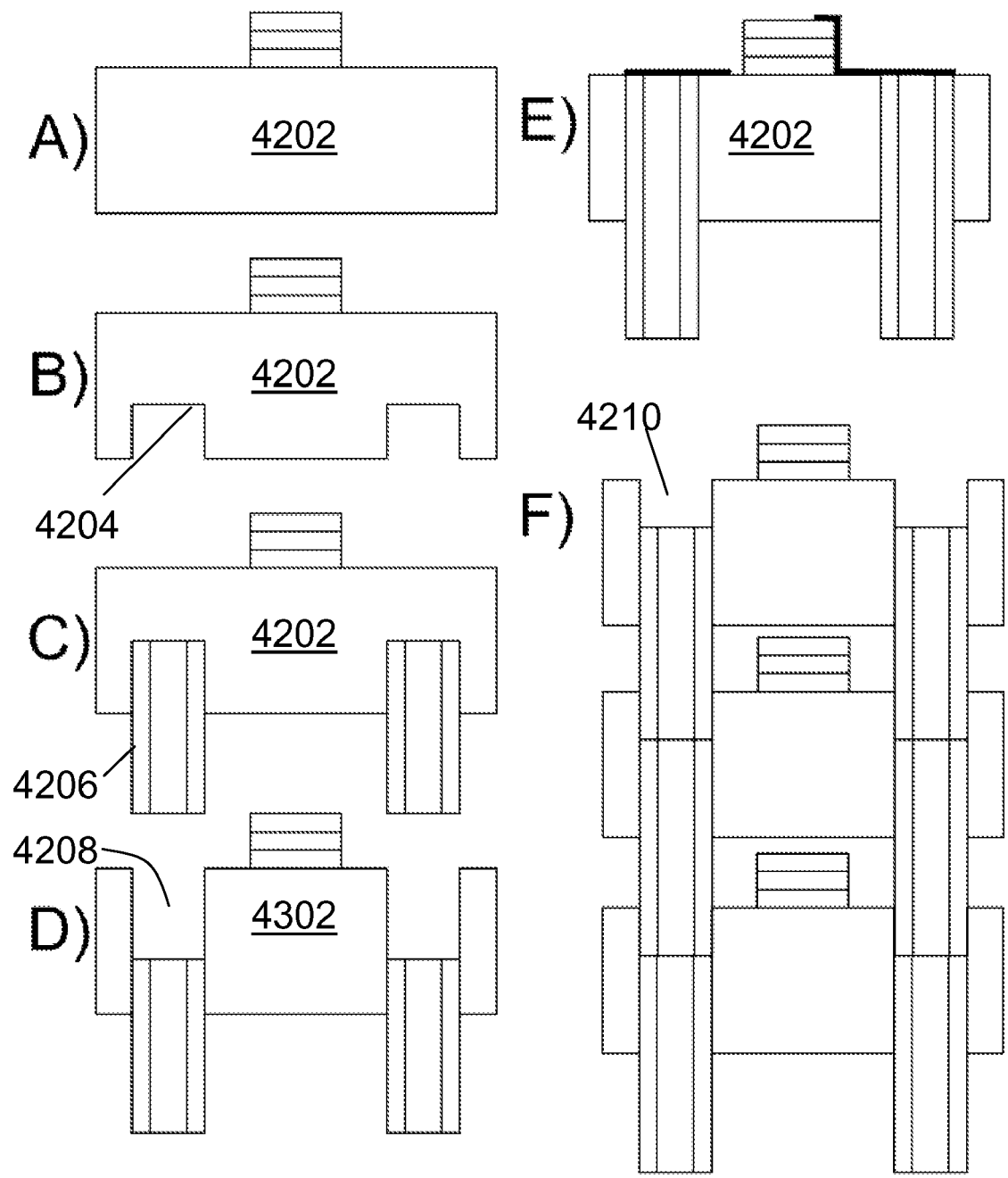
FIG. 42 illustrates in simplified form the process for making a back to front variant.

In certain cases, it is desirable to use thicker wafers 4202 (FIG. 42A) to ensure strength in handling. In situations where a wafer is particularly thick and the diameter of a desired via is less than about $\frac{1}{20}$th to $\frac{1}{30}$th of the desired thickness of the wafer an alternative process can be used for some variants to accommodate the thicker wafer. The process of forming such "back to front" vias is illustrated in simplified form in FIGS. 42B through 42E. First, a via 4204 is etched into the back side of the device-bearing wafer 4202 (FIG. 42B). Then, the via 4204 can be made conductive using one of the processes described herein (i.e. single conductor, coax, triax, etc.) or through some other process like inserting a pre-formed post 4206 (FIG. 42C). The approach can result in the back side having either a malleable material or a rigid post material. Then, a corresponding via 4208 is etched over the conductor 4206 from above (i.e. the front or device side) down to where the bottom of the back side conductor 4206 ends (FIG. 42D). Next, optionally, the front side devices are protected and, if desired, contacts to devices or rerouting is performed (not shown) using, for example, an approach described herein, and the via is made conductive in essentially the same manner as used for the back side (FIG. 42E). Advantageously, with some variants, the material at the bottom of the back side conductor can serve as an etch stop and/or a seed layer for plating the conductor from the front side. This can reduce the number of processing steps relative to the approach used to form the conductor on the back side. Moreover, with other variants, if it is desired that there be no physical connection between the conductor from the back via and the conductor from the front via, a suitable amount of wafer can be left between the two with the connection being made through capacitive coupling.

The approach works with both traditional via processes where a single via is performed and insulator and metals are deposited in one hole or in our previously described process with the annular via approach to create highly controlled impedance vias.

In addition, the back to front approach can be used where one side has a non-completely filled via so that the unfilled part of the via can serve as a "slot" 4210 (FIG. 42F) that will receive a "post" (i.e. a pressure or interference fit connection and thereby provide for alignment and/or physical connectivity as well as electrical connectivity. This type of pressure or interference fit aspect is illustrated in FIG. 42F.

Figure 43:
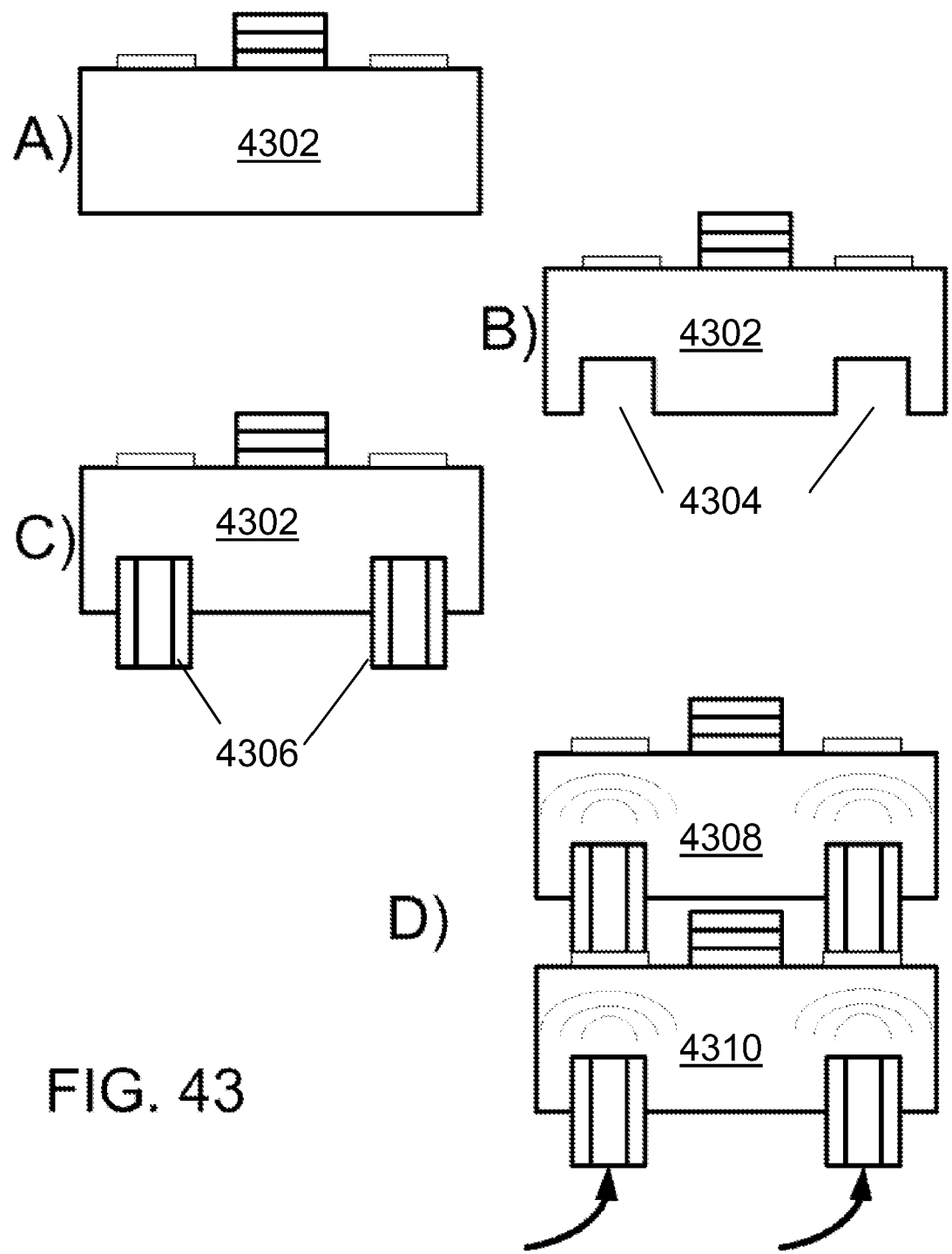
FIG. 43 illustrates in simplified form the process for making a capacitive coupling variant.

In another alternative variant, the back-to-front method of via creation described above can be used to create a connection only part-way through the chip in such a way so that capacitive coupling can be used to send data between the chips. Because capacitive coupling works when the contacts are closer, and because the density of connections is limited by crosstalk, variants of approaches described herein are ideal for creating chips using this type of communication. These approaches readily allow for minimization of crosstalk by close connections, because it is possible for the distance between the contacts to be minimized and through use of coax or triax posts so that shielding can be provided. Moreover, capacitive contacts have the advantage that no actual electrical contact between the parts is necessary. With this approach, shown in FIGS. 43A through 43D, vias 4304 are etched from the back of the chip 4302 (FIG. 43B) in such a way that they are close enough to the contacts on the top of the chip 4302 so as to be physically removed from the contact but, when filled, are sufficiently close to allow for good capacitive coupling of an applied signal between the fill and the contact. The vias 4304 are then filled with metallic studs, single conductor, coax or triax conductors 4306 to allow good capacitive coupling (FIG. 43C). In this way the wafers can be kept at an overall thickness which allows sufficient strength for handling of the wafers while the connections have the appropriate distance. This approach provides the further advantage that it allows stacking to occur by stacking the back of one wafer to the front of another wafer. In this way multi-stacking of chips 4308, 4310 can occur as shown in FIG. 43D. This is in sharp contrast with an approach that would require the chips to be face-to-face rather than front-to-back because such an approach does not readily allow for multi-stacking of chips to occur (i.e. stacking of three or more chips) since a third chip would have to be on the back of one of the other two chips and then communicate through an entire wafer, requiring sparse contact densities to avoid the prospect of crosstalk. Of course, with the approaches described herein, coax or triax via can be used to enhance shielding of signals to prevent crosstalk.

In addition, capacitive coupling can be used with a pressure fit connection if, for example a true back to front connection is not created in that the two vias do not linkup (i.e. material is left between the via created from the front side and the back side post). In such a case, the front side via will be independently created according to one of the variants described herein, as will the back side via.

Still further, capacitive coupling can occur between one or more contacts on a chip surface (whether created through a via approach or other approach). This may be desirable if, for example, with a stacking approach, chip heights do not allow for two complementary contacts to easily physically touch although they are close together because, for example there is a chip or metalization or other topology maintains a separation between the two, or one or both are covered by an insulator, like TEOS, a photoresist or some other oxide.

From the foregoing, the versatility of our approaches should be more apparent. Advantageously, even further variants can be created that illustrate the broad and versatile range of possibilities available through use of our approaches. One such variant, shown in FIG. 44A through 44I, is a "pre-connect" variant which differs from the above and other approaches because the wafer to be processed 4401 gets attached to an underlying pre-formed wafer 4402 (referred to herein as a "base" wafer) before any processing as described herein begins (i.e. before the annular trench is formed). In this variant, any of the basic connection forming processes can be used. This variant process proceeds as follows.

First, the initial wafer 4401 is thinned to the extent necessary to ensure that the via can go completely through the substrate (FIG. 44A). This step is optional, and need not be performed if the particular etching process that will be used can go entirely through the entire chip without difficulty. Then, the initial wafer 4401 is aligned (FIG. 44B) and attached to the base wafer 4402 (FIG. 44C) using a bonding material, wafer fusion or, if the wafers are very flat, through covalent bonding. Next, annular vias 4404 are created in the initial wafer 4401, over the pads of the base wafer 4402, extending down to the base wafer 4402 such that the via surrounds the pad of interest on the base wafer (FIG. 44D). The annular via 4404 is then filled with an insulator 4406 so that subsequent conductor deposition is isolated (FIG. 44E). Then, all or part of the central post is etched away down to the pad of interest on the base wafer 4402 in order to create a void 4408 above the base wafer's pad (FIG. 44F). Finally, the void 4408 is metalized (FIG. 44G) and optionally either fully filled with a conductor 4410 (FIG. 44H) using one of the approaches described herein or if the metalization does not fully fill the center of the void 4408, it can be filled with an insulator 4412 (FIG. 44I). As a result, the metal filling forms an electrical connection to the base wafer 4402 pad and effectively extends the base wafer pad up through the initial wafer 4401 and physically bonds the two chips together. Advantageously, by using this approach the central post of the semiconductor material protects the base wafer's pad so that no insulator interacts with the base wafer pad. This is markedly different that what would happen if conventional approaches were used to try the same thing because those conventional approaches would leave the base wafer pad exposed and thus would allow contamination by the applied insulator.

In some cases however, the pressure fit connection approaches will not be suitable because of a lack of controllability. For those instances, an optional alternative approach we have devised called a "post and penetration" approach can be used. Ideally, the post and penetration approach can, and typically will be, used along with a "tack and fuse" process owing to the advantages each provides alone and the further advantages provided by their use in combination.

The approach involves the use of two contacts in combination: a rigid "post" contact and a relatively malleable (with respect to the post material) pad contact, in some cases, either or both having an underlying rigid supporting structure or standoff. In simple overview, one of the two contacts is a rigid material, such as nickel (Ni), copper (Cu) or paladium (Pd) or other suitably rigid alloy such as described herein. This contact serves as the "post." The other of the two contacts is a material that is sufficiently softer than the post that when the two contacts are brought together under pressure (whether from an externally applied force or a force caused, for example, by flexation of the wafer) the post will penetrate the malleable material (the "post and penetration" part) and heated to above a pre-specified temperature (the tack phase of the tack and fuse process) the two will become "tacked" together upon cooling to below that temperature without either of them reaching a liquidus state.

Note that, as used herein, the term liquidus is intended to mean a state in which the metal or alloy being discussed is in a fully (or substantially fully) liquid form. When a metal is in a non-liquidus or semi-liquidus state, as used herein, the metal is sufficiently soft to allow for attachment as described herein, but is insufficiently liquid to allow it to run or flow like the same metal or alloy would in a pure liquid or liquidus state. Most variants of our processes operate with the metal or alloy in a non-liquidus and non-solidus state. Stated another way, on a phase diagram for the metal or alloy, our process variants operate between the solidus (fully solid) and liquidus (fully liquid) temperatures, with most operating near the equilibrium point between the two. This difference can be further understood with reference, for example, to the joining a chip to another element as illustrated in FIG. 33 through FIG. 36. In those figures, if the material 2404 is a solder (metal or alloy) in the liquidus state it will cause the chip to "float" on the melted solder and the vias 3210, 3310 would self-center over the solder ball as capillary action drew the solder up into the via 3210, 3310. In a non-liquidus or semi-liquidus state, such as used for most variants of the tack and fuse process described herein, the state into which the metals or alloys are driven during both the tack phase and fuse phase are such that the metal or alloy would be highly softened (i.e. have some material in a liquid state) but not be sufficiently liquid to cause the chip to float or the vias 3210, 3310 to self center. Thus, some application of force (whether externally applied or resulting from the weight of the chip without external force application), will be necessary to get the metal or alloy into the vias 3210, 3310.

Thereafter, a second heating to above another temperature higher than the "tack" temperature (the fuse phase of the tack and fuse process) will cause materials from each to inter-diffuse (in contrast with a solder which would enter and exit a liquidus state (i.e. melt and re-harden)).

The tack and fuse integration process is separated into two main components: an "attach" or "tack" phase and a "fuse" phase. The tack phase makes a fairly homogeneous electrical connection between the pairs of contacts. The combination of forming a post and penetration connection with the tack process enables any surface oxide on any of the contacts to be more easily broken through. This non-oxide inhibited contact approach allows for a simpler fuse process without the need for application of significant pressure. In the absence of the combination of post and penetration and tack phase, the fuse process would require substantially greater pressure in order to allow the contacts to break through the oxides that would form at the surface of the rigid and malleable materials during the high-temperature portion of the tack process, or in the early stages of the fuse process. By getting beyond that oxide 'crust' at the initiation of the tack phase, the fuse phase can occur at substantially lower pressure, in some cases at no added pressure beyond the weight of the chip itself.

At this point, a further terminology convention is introduced. It should be understood that, as set forth herein, the terms "daughter" and "mother" are used, for simplicity, to generally connote whether the particular contact on a wafer being discussed is a rigid or malleable contact, with the term "mother" being associated with a rigid contact and the term "daughter" being associated with a malleable contact. Although shown fairly consistently one way herein, it is important to note that the terms "mother" and "daughter" are arbitrarily applied. Individual contacts on each wafer can be either a rigid or malleable contact as long as the corresponding contact on the other wafer to which it will be joined is of the opposite type. Thus, a given wafer surface can exclusively have one or the other type of contact or, in some variants, a single wafer side can have a mixing of both types. However, mixing of types on a single surface can be problematic for some applications and, in those applications where it is used, mixing of types on a single surface can complicate the processing unless the different types are not intermixed in one area but rather are confined to discrete areas such that large areas will contain only one type of contact allowing areas that will contain the other type to be easily protected when certain processing steps are carried out.

During the attach or tack phase of the process, the "mother" wafer is populated with "daughter" chips. The mother wafer is maintained at a single temperature (i.e. the mother wafer is maintained as an isothermal substrate during this attach process). The isothermal temperature for the mother wafer can be as low as room temperature, although raising the temperature above room temperature speeds up this phase of the process. However, the isothermal temperature is kept below the melting point of the malleable material on the daughter chip as well as the tack or the fuse temperatures. Thus, the tack process can be done by heating each small daughter chip to a higher temperature than the mother wafer so that, when the two chips are brought into contact and a post and penetration connection occurs, the interface for just that chip reaches or slightly exceeds the appropriate "tack" temperature. In general, for the primary materials discussed herein, the tack temperature would be between about 190° C. and about 320° C., with a typical nominal tack temperature of about 270° C. In this manner, the other chips on the mother wafer are not heated beyond the point where their contacts see the elevated temperature, a condition which could change the performance of the contact and cause some contacts to see much longer times at elevated temperatures than others, potentially causing non-uniformity of performance.

The tack or attach process can be performed by, for example, keeping the mother wafer at an isothermal temperature below the malleable temperature, bringing the daughter chip to the mother chip, heated to below the malleable temperature, making contact between the two chips, and quickly ramping the daughter chip temperature to the appropriate tack temperature. Thus, once the daughter chip is attached to the mother wafer, the machinery that aligns the parts (and imparts heat to the daughter chip) releases the daughter chip after applying only enough pressure to allow some contact between the parts, for example less than 2 g/contact pair, and preferably less than 1 g/contact pair.

After release, the cap/adhesion layer (or malleable layer if the malleable material also performs the function of the cap/adhesion layer) on the daughter chip becomes less soft under the decreased temperature which would be dominated by the mother chip at that point. For example, with the baseline materials described herein, the mother chip/wafer substrate can be held at between about 230° C. to 250° C., the daughter chip can be brought to the mother chip at a nominal temperature of about 270° C. and quickly ramped, after contact, to about 310° C. to 330° C. The order of the contacting relative to the quick ramp (i.e. whether it happens before or after contact with the mother wafer) can be changed. Notably, we have found that by bringing the chips into contact first and then ramping up the temperature, oxide formation on the surface of the malleable material can be minimized, thus allowing a more reproducible contact. Advantageously, through use of the malleable material, the amount of pressure per contact pair can be low. We have used applied pressures ranging from about 0.001 g to about 10 g per contact pair although lower bounds are possible, the lowest being the effect of gravity on the mass of the chip itself (i.e. its weight).

In addition, as noted above, for the tack process, daughter wafer temperatures as low as room temperature can be used if sufficient pressure is applied to break through any surface oxides. In this manner, the entire mother wafer can be populated with daughter chips before any tack phase is started. Even using this approach, due to the speed in which the process can occur, the mother wafer does not have time to be heated to any substantial degree. Thus the attachment of a second daughter chip to a mother wafer, even within 100 microns of the first chip in the horizontal or vertical direction does not soften the cap/adhesion layer of the first chip to affect its alignment to any meaningful or substantial degree.

Advantageously, the tack and fuse processes are both typically non-liquidus process. This means that the process is done so that the malleable material becomes softened significantly but does not become completely liquidus during either the tack or fuse processes. This is because if the malleable material were to become liquidus, there would be significant risk that the resultant liquid would run and short out adjacent contacts. By keeping the materials non-liquidus, far greater contact density can be achieved. However, in some variants a semi-liquidus state is allowable (i.e. some, but significantly less than all, of the malleable material may briefly become liquidus). However, those variants generally have the common characteristic of using some other type of containment mechanism to prevent the liquidus malleable material from having an adverse effect by constraining it to a defined area to avoid the possibility of shorting an adjacent contact, for example, by ensuring that the pad onto which the malleable material is applied is surrounded or covered on its periphery by a non-metallic substance into which the malleable material can not easily interdiffuse.

In some variants, in conjunction with the "tack" phase of the tack and fuse process, it may be desirable to cap the malleable material (for example, Au/Sn alloy) with an adhesion layer (for example, Sn) which will melt at lower temperature to help speed-up the tack time to enhance throughput. In addition, in some variants, it may be desirable to keep the mother wafer at an isothermal temperature of the highest possible temperature below the fuse temperature such that no degradation of a bond occurs if the chip sits at that temperature for extended times under non-controlled environmental conditions (i.e. the time it could take to populate a whole wafer in volume). We typically use 230° C. although the temperature could be higher to speed up the process. The impact of the lower temperature is an alteration of the temperature and pressure profile of the penetration phase of the attachment. Moreover, in order to speed up the process, it is desirable to have the serial processes of the tack phase (i.e. place and heat) occur as quickly as possible. A further aspect to note is that, in some variants, the longer the time spent in the tack phase, the less critical the fuse phase is for yield, etc. For example, at one extreme, on an FC150 (for silicon-to-silicon), we had a tack phase lasting for about 1 minute and there was no fuse phase needed. This is summarized in FIG. 45.

At the other extreme, in high volume cases, alignment would typically take about 1 second, the tack phase would take 2 to 4 seconds before the fuse phase. Thus, in those variants the environment for transport from tack machine to fuse phase can be important for getting good contacts.

Between these two extremes is a continuum of process options where the tradeoff is among 1) throughput, 2) complexity and 3) criticality of the fuse process. For very fast tack processes, the 2 to 4 second variety, the chips may be held lightly, thereby possibly requiring a reducing environment during the fuse phase or even require applied pressure of a more substantial amount during fuse. At the other end of the spectrum, the 1 minute tack process done at higher pressure and temperature, the tack itself can do a relatively good job of preliminary "fusing" of the chips. In this case the subsequent "fuse" process may merely be a contact anneal coupled with a method to ensure consistency across the wafer, and it may not require any specific environment (or pressure, if the planarity of the chip placement during 'tack' is adequate). This continuum is illustrated in FIG. 46.

An important advantage to the tack phase is that, because electrical connections are non-final and easily undoable, testing of the chips can be performed after the tack process is complete but before the fuse process begins. This allows for testing and identification of bad dies both before and after this first phase of hybridization (i.e. to determine whether an individual chip that was performing before hybridization to another chip has been adversely affected by the hybridization process or is ineffective in combination with the chip to which it was attached. Moreover, the testing can be done, in the case of diced daughter chips being populated onto an undiced mother wafer, before the mother wafer is sawn or diced.

A further important advantage to use of the tack phase is that, because the chips are not combined very strongly, it is possible to easily take apart the joined chips if subsequent testing resulted in a determination that one of the joined chips was nonperforming. Separation of two chips from each other can be performed by using heat or pressure or both in combination. In the case of individually diced daughter chips being populated onto an unsawn or undiced mother waver, if a daughter chip was the problem, another "known-good" daughter chip could then be attached to the mother wafer. If the particular mother wafer chip was bad, it could be noted as such so that no further daughters would be attached and it could easily be identified immediately following dicing of the wafer, in both cases significantly increasing overall yield. In addition, if the mother chip was the one that was non-functional, the removed daughter chip could be saved for a future mother chip attach, again increasing yield and potentially decreasing cost. For example, say the malleable contact of the daughter wafers were a gold-tin or gold-silver-tin alloy and the malleable cap was tin. The tin could be attached at low temperature and, if thin enough, would not spread like thick solder balls. If a daughter chips tested bad, the individual chip on the mother wafer could be heated and pulled apart and another daughter chip attached. Once all of the daughter chips were attached and the combinations tested good, the whole mother wafer could be fused together.

Thus, the tack and fuse approach permits one only integrate known-good dies. In addition, this approach significantly reduces the risk associated with stacking of multiple dies because, a single bad chip does not require scrapping the entire stack. For chips or stacked units that are expensive, this is a significantly valuable advantage in and of itself.

In addition, the tack and fuse phases provide the additional advantages of being low pressure processes. The force used for the both the tack and fuse phases are typically less than 2 g/contact pair for contacts on a 50 micron pitch or less. At the fuse phase, we have proven use of forces of 0.8 g/contact pair to 0.001 g/contact pair. For a 400 contact chip we used 300 grams and for a 10,000 contact chip we also used 300 grams giving a range of 0.75 g to 0.03 g per contact pair; With larger numbers of contacts, e.g. 900,000, we have used use 3 Kg giving 0.003 g/contact pair. Ideally, for speed purposes, the approach uses the least possible force and, under proper circumstances, no force at all beyond the force imparted by gravity on the chip (i.e. the weight of the chip) itself.

Conventional processes for attaching dies together require attachment strengths of several grams to tens of grams per contact pair. This causes enormous stress on each of the semiconductor chips, often leading to damage or cracking. Thus, the described approach dramatically reduces or avoids imparting the levels of stress found with conventional approaches.

Moreover, more conventional approaches are not compatible with the small size dimensions that we can employ. Typical solder processes are liquidus processes and are not compatible with such small sizes and pitches nor are the pressures of several grams per contact pair. In other words, at the typical 5 g/contact pair, a chip with 10,000 contacts of 1 cm×1 cm would require 50 Kg to attach. In contrast, the pressure during the fuse portion of the process is typically less than or equal to the pressure used in the attach process. For example, using the fuse process described herein, the 10,000 contact chip that required 300 grams of pressure during the tack phase only required 9 grams during the fuse phase of the process.

In addition, the use of little to no pressure makes multiple reflows/multi-high stacks practical: In order to create stacks multiple chips high the amount of pressure on the chips should be low to prevent chipping, yield loss, the possibility of disconnecting lower chips in the stack, etc. during the fusion of chips above it, particularly, if some chips on the mother wafer might receive taller daughter chip stacks than others. If substantial pressure were needed to be put on the mother wafer and the daughter chips during the fuse process, and some of the mother chips had far larger stacks than others, a complex set of tooling could be required in order to maintain the correct pressure on each chip. In contrast, with our approach which requires only light or no external pressure, this can be avoided, making multiple high chips far more practical and allowing for stack differentials of double height or more.

A further advantage to variants of the approaches described herein is high strength following completion of the fuse process. The strength of the contacts after the fuse process is typically over several hundred Kilograms per square centimeter with 1000 kg/cm2 being typical. Of course, as a result, once the fuse process has been completed, the rework potential is dramatically reduced.

Representative non-limiting example malleable materials include Gold-Tin (Au/Sn) and Silver-Tin (Ag/Sn) as well as others also identified herein. At this point it should be noted that the term "post" is one of convenience used simply to denote rigidity. It is not intended to in any way limit or mandate size, shape or geometry. Thus, as described below and in the "Specific Variants" section, the "post" could be wider than it is tall or have any cross sectional profile sufficient to accomplish the intended purpose described herein. Moreover, the "post" can be created as part of the processes described herein, for example, by thinning the back of a wafer without thinning the metallization or metal contact, or it can be created separately and attached to, or inserted into, a wafer thereafter.

Where stacking is involved, a given electrical connection through a wafer can have a rigid contact on one end and a malleable contact on the other. In such cases, for simplicity herein, once a wafer has been designated "mother" or "daughter" that term will be retained even if, for a subsequent stacking layer, the "daughter" wafer should properly be designated "mother" because the contact at issue is now a rigid contact for purposes of forming a post and penetration connection. For further clarity, a subsequent "daughter" wafer connecting to that other end will be referred to as a "daughter wafer 2."

An example of this approach is illustrated in FIGS. 47 and 48. In FIGS. 47A and 48A, the complementary contacts 4702, 4704, 4802, 4804 on two respective chips 4706, 4708, 4806, 4808 are shown. For simplicity, neither the electrical connections 4710, 4810 nor other elements, if any, beyond the immediate vicinity of the contacts 4702, 4704, 4802, 4804 are shown.

As shown in FIGS. 47A and 48A, one of the contacts 4704, 4804 is the rigid contact and the other contact 4702, 4802 is the malleable contact. FIGS. 47B and 48B each shows the respective contacts 4702, 4704, 4802, 4804 at the point where they have been brought into contact with each other. By application of pressure before or during the tack phase, the rigid contact 4704, 4804 penetrates the malleable contact 4702, 4802. FIGS. 47C and 48C shows the contacts following the fuse phase in which the two materials have now interdiffused, forming a high-strength bond between the two.

In addition, it is worthy of note that the "width" of the malleable contact can be "minimal" in that it is about the same width as or narrower than the contact (prior to joining) to which it will be connected or it could be an "extended" contact in that its width extends well beyond the minimal width. In examples above, FIG. 47 is an example involving "minimal" contacts and FIG. 48 is an example involving an extended.

In general, there are advantages to making the size of the malleable contact slightly larger than the rigid contact, i.e. using an extended contact. By doing so, the malleable contact will envelope the rigid contact and the alignment accuracy between the two chips during integration can be less because, in such cases, the rigid need only penetrate somewhere within the area of the malleable. As a result, a greater alignment offset can be accommodated. This is best understood by way of example through consideration of a malleable contact of circular cross section having a 12 micron diameter and a round rigid contact of a diameter from between 10 microns and 6 microns. With a rigid contact having a 10 micron diameter, an offset of 3 microns could cause the edge of the rigid material to extend beyond the limit of the malleable. For a rigid contact having a 6 micron diameter, a 3 micron offset would still fit within the 12 micron diameter of the malleable contact material. Typically, the overall rigid contact will be less than 40 microns across at its widest point, and can be less than 25 microns, 15 microns or even less than 10 microns across at its widest point. In addition, with this approach, the malleable should be at least as wide as the rigid and preferably 20% or more wider. In addition, the post height can be greater than or less than its width, but will typically be wider than it is high.

Bearing the above basic description in mind, the approach can be extended to the variants described above by, for example, employing a suitably rigid material as one of the metalizing or conductive material so that it can be used as the rigid contact and, by applying a second more malleable material to another portion of the metalizing or conductive material so that it can serve as the malleable contact for purposes of attaching to other components or stacking.

Figure 49:
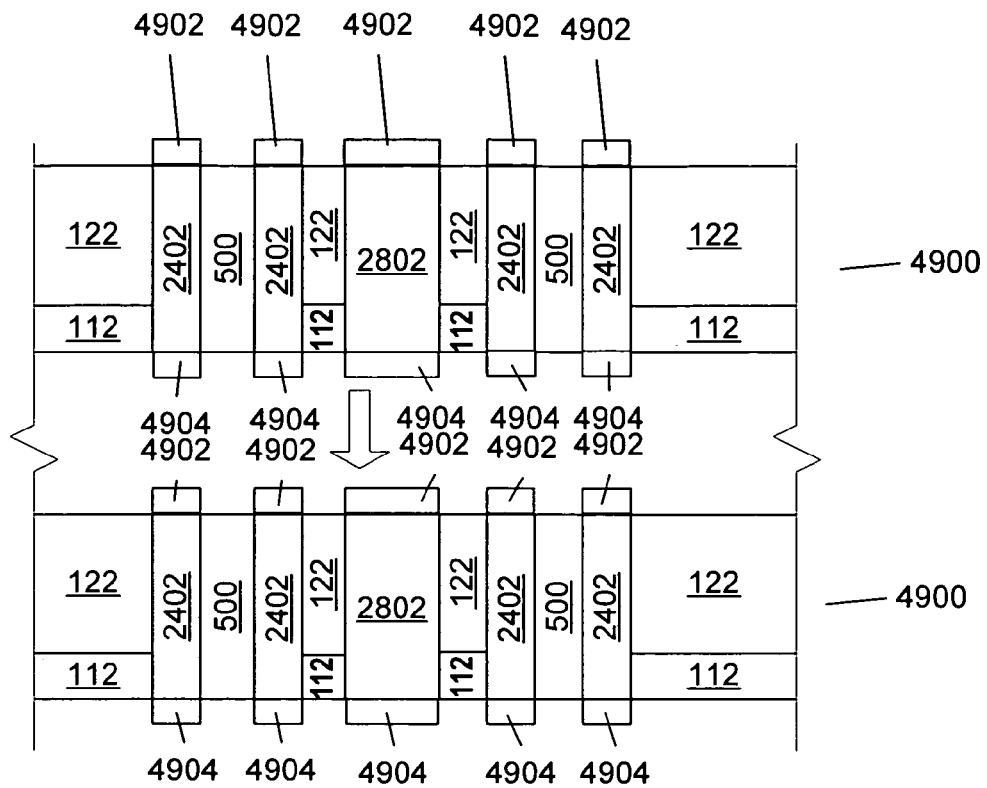
FIG. 49 illustrates a portion of a stack of semiconductor chips each having through-chip connections as described herein.
Figure 50:
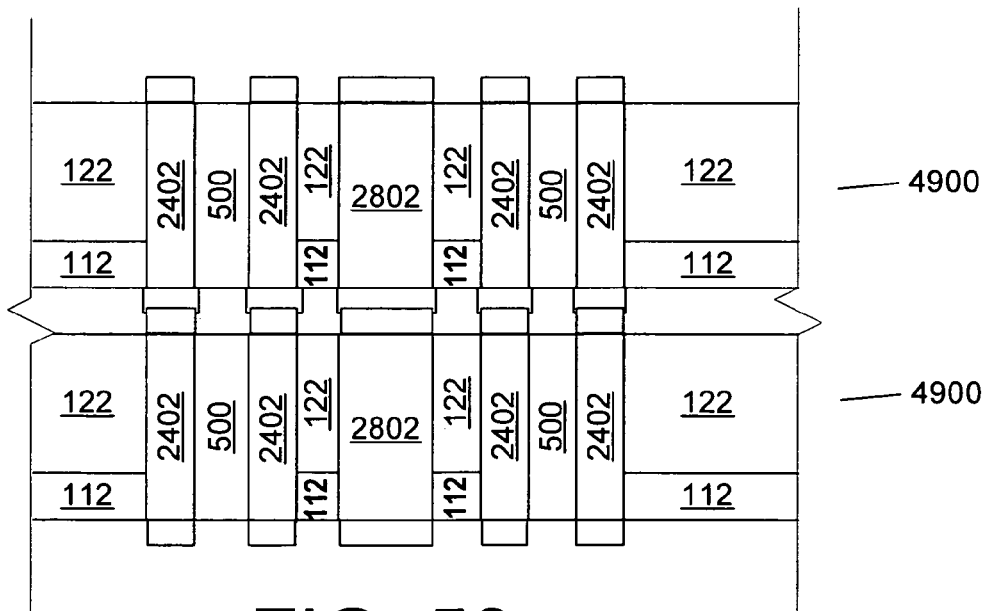
FIG. 50 illustrates a portion of the simplified stack of the chips shown in FIG. 49 stacked using a the post and penetration connection approach.

FIG. 49 illustrates a portion of a stack of semiconductor chips, similar to that of FIG. 41, each having through-chip connections created in accordance with one of the implementations described above. For purposes of simplicity, the through-chip connections are not shown as connected to any device on the respective chip through which they pass because the existence or not of such a connection is not necessary for understanding the post and penetration approach.

As shown in FIG. 49, to facilitate connection of each chip to the chip above and/or below, optional contacts 4902, 4904 have been added to the top and bottom of the metalizing 2412 and conductor 2802. As noted above, the metalizing or metal contact can be directly used. Where optional contacts 4902, 4904 are added, depending upon the particular implementation, the contacts 4902, 4904 can be any prior art types, simple conventional contact pads, non-post and penetration contacts formed as described herein, or post and penetration contacts as described herein.

Figure 44:
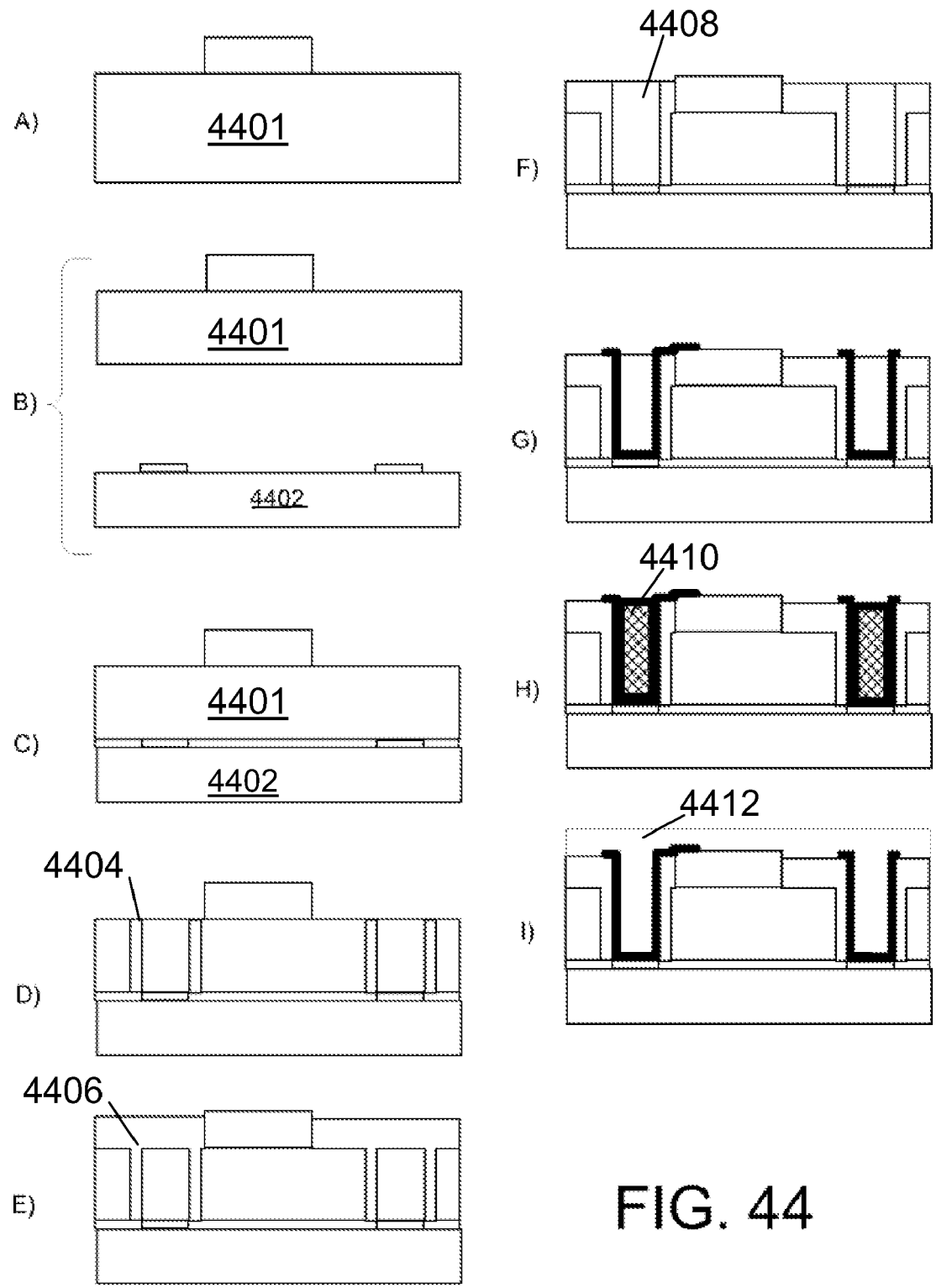
FIG. 44 illustrates in simplified form the process for making a pre-connect variant.

Thus, it will be appreciated that by using the post and penetration approach of FIG. 49, stacking can be more easily performed. FIG. 44 illustrates a portion of the simplified stack of the chips shown in FIG. 49 stacked using the post and penetration approach.

Figure 51:
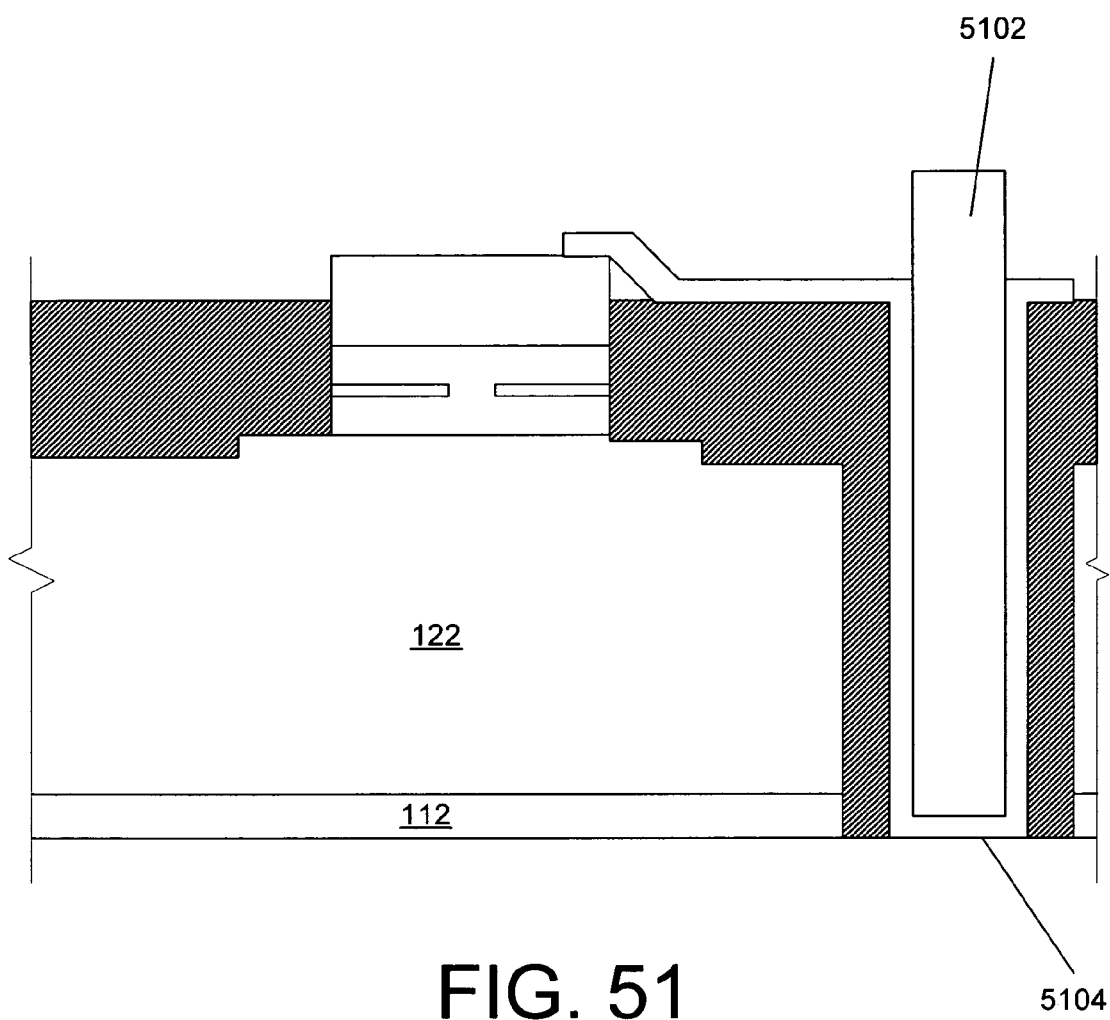
FIG. 51 illustrates in simplified form a void within the metalization filled by a pre-formed post.

In addition, variants of certain of the implementations described above can be created to facilitate use of the post and penetration contact approach. For example, in implementations similar to the one shown in FIG. 15 (i.e. any one where the metalizing at the bottom of the trench is not completely removed) except that the bonding substance 1102 and the finishing substance 1302 are not present, the metalizing 1502 can be used as one of the rigid or malleable contacts and a second material inserted into the void can serve as the opposite contact (i.e. rigid if the metalizing is "malleable" or malleable if the metalizing is "rigid"). In such an implementation, such as shown in FIG. 51, the void within the metalization can be filled, for example, by a pre-formed post 5102 inserted at the appropriate point in the process. Alternatively, the metalizing 1502 and the second material could be the same materials if the malleable material is applied to the end that will contact another "rigid" material to form the bond.

Figure 52:
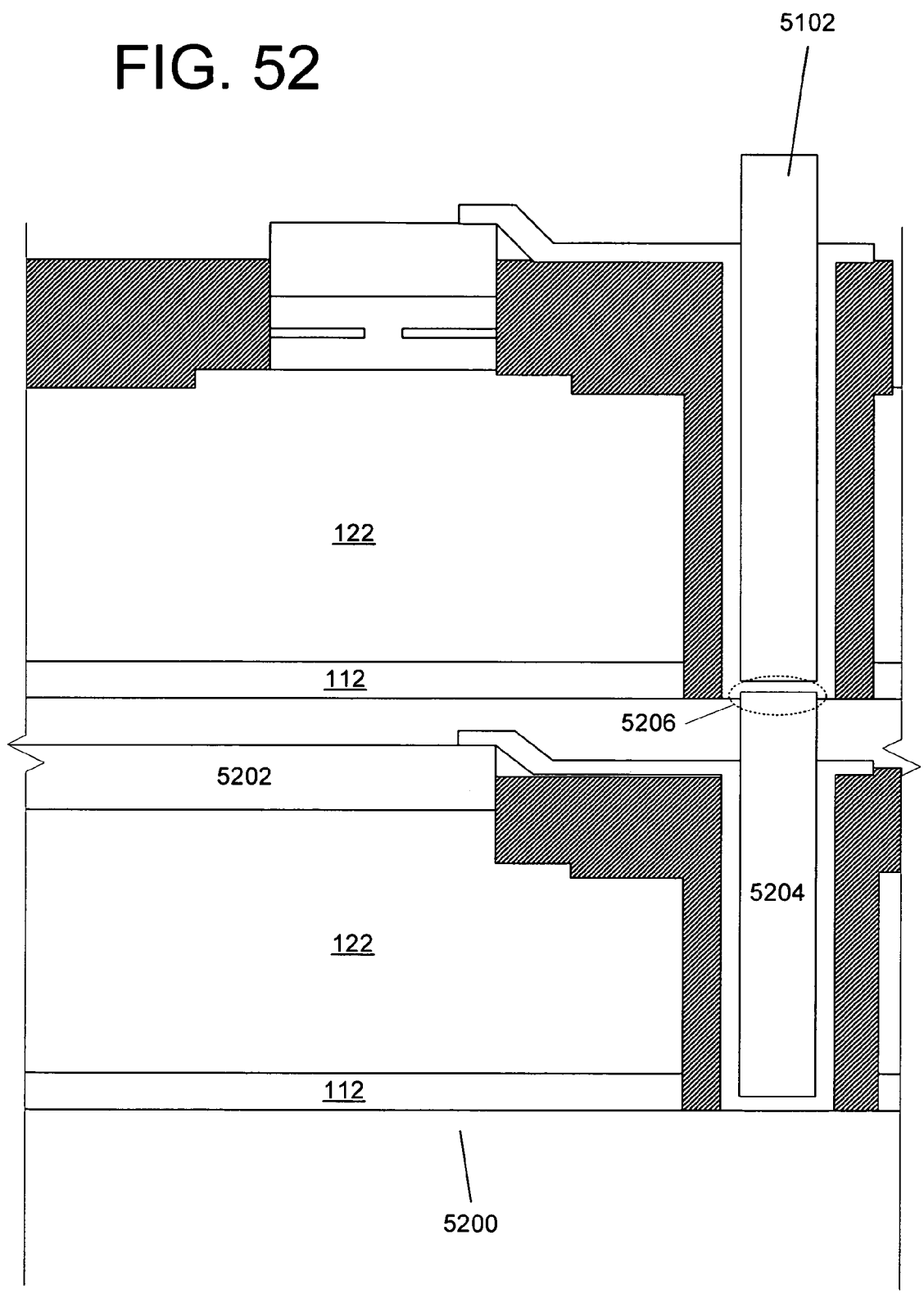
FIG. 52 illustrates, in simplified form, the chip of FIG. 51 after it has been hybridized to an electronic chip.
Figure 53:
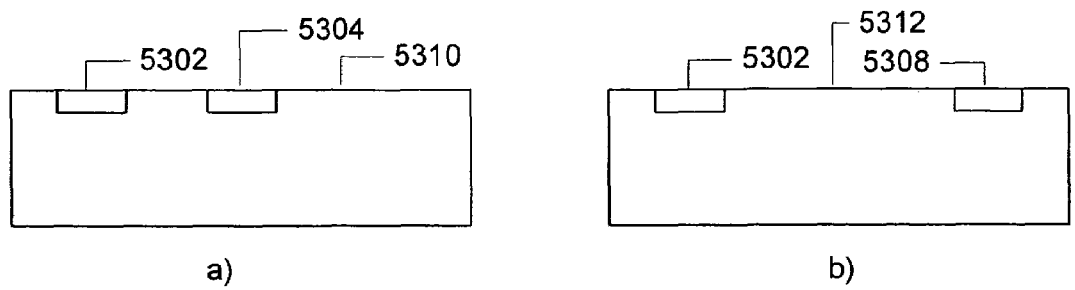
Figure 54:
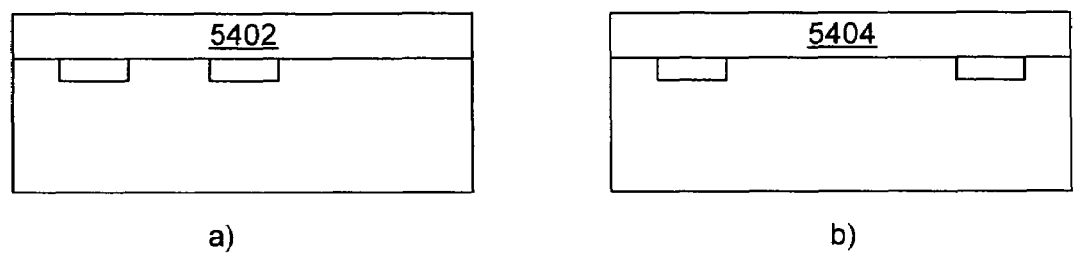
Figure 55:
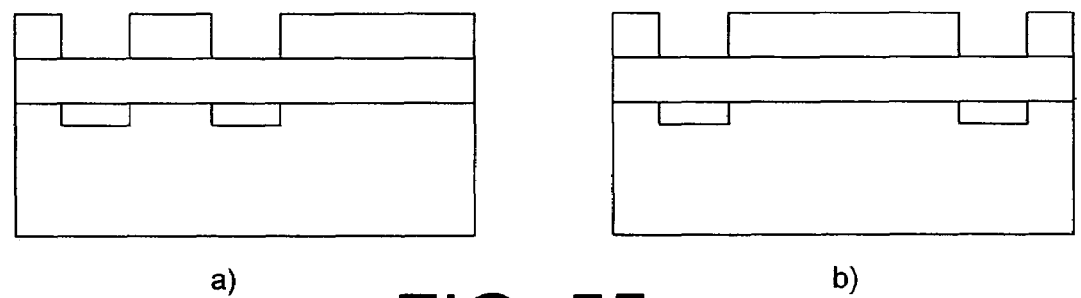
Figure 56:
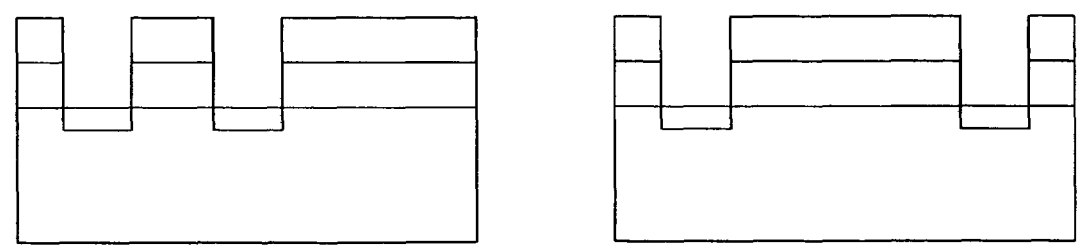
Figure 63:
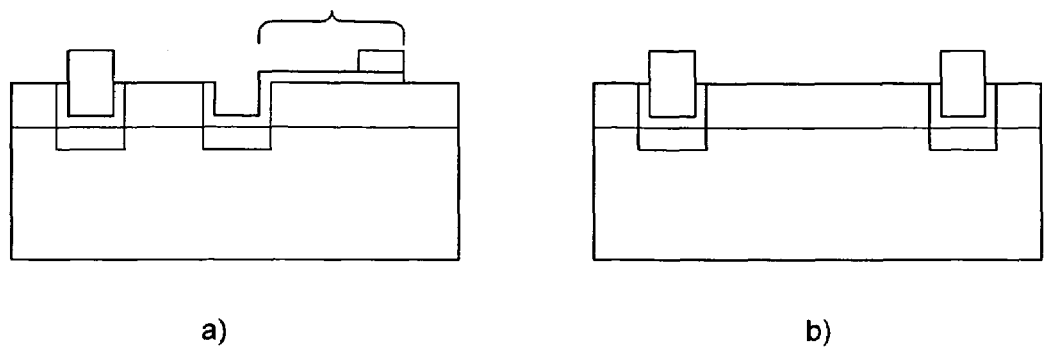

FIG. 52 illustrates, in simplified form, the chip of FIG. 51 after it has been hybridized to another electronic chip 5200 having, for purposes of example, drive and control circuitry 5202 for controlling the laser 5104 shown on the chip of FIG. 51. The electronic chip also contains a post 5204 that is rigid relative to the metalizing material 1504 used for the chip of FIG. 51. Thus, as a result of bringing the two chips together under suitable conditions, a post and penetration connection 5206 is formed, thereby electrically connecting the laser 5104 to the drive and control circuitry 5202 on the electronic chip 5200.

FIG. 53 through FIG. 71 illustrate a simplified example variant of a basic contact formation and hybridization approach. For simplicity, the approach is illustrated with respect to a pair of conventional chips that have been pre-processed (i.e. they contain both devices and their associated contacts and traces) but have not yet been diced into individual chips. As shown the chip in each figure labeled "a)" is a daughter chip which will have a contact rerouted from one IC pad to another location in order to later be hybridized to the mother chip, labeled "b)" in each figure. Note that, although the processing is shown occurring in parallel, this is only for purposes of understanding. In practice, the processing of either one could precede processing of the other, their processing could overlap in time, or it could occur concurrently.

First, we start with a daughter wafer FIG. 53a and a mother wafer FIG. 53b. The wafers are each fully formed chips in that each has multiple devices on it (not shown). As shown, the contacts 5302, 5304 on the daughter wafer are on a pitch of between a 25 microns and 50 microns, although the same approach could be used for contacts on a much smaller pitch, as small as between 2 microns and 7 microns using current technology. For purposes of illustration and understanding, the contacts 5306, 5308, on the mother wafer are on a larger pitch than those 5302, 5304 of the daughter wafer. The contacts 5302, 5304, 5306, 5308 are conventional aluminum IC pads that are accessed through the chip cover glass 5310, 5312.

Next, a thick dielectric layer 5402, 5404 is deposited on the chips (FIG. 54a, FIG. 54b). Then, through photolithographic patterning, the area above the contacts through which access will occur is opened up (FIG. 55a, FIG. 55b).

Then, the dielectric is etched through to provide access to the IC contact pads (FIG. 56a, FIG. 56b). Thereafter, the photolith is stripped away (FIG. 57a, FIG. 57b).

Alternatively, the thick dielectric layer 5402, 5404 could be a thick photoresist layer (FIG. 54a, FIG. 54b). In such a case, the thick layer 5402, 5404 would be removed by stripping of the photoresist (FIG. 57a, FIG. 57b).

Next, a seed layer is deposited on the wafer to facilitate a later plating process (FIG. 58a, FIG. 58b).

Then, a dielectric layer is applied (FIG. 59a, FIG. 59b) and a photolithographic patterning is used to define and control the locations where the plating will occur (FIG. 60a, FIG. 60b).

Thereafter, the wafer is plated until the desired amount of metal is present (FIG. 61a, FIG. 61b).

The dielectric is then removed, leaving "standoffs" or elevated contacts (FIG. 62a, FIG. 62b).

As an aside, in general, both the mother wafer and daughter wafer can have standoffs. On the daughter wafer, the purpose of the rigid structure is to provide a standoff to allow the overall contact to accommodate non-planarity of the two chips so that the contact can be made reliably and it may not be needed in some cases. On Mother Wafer, the purpose of the rigid structure is both as a standoff and as the post which can penetrate into the malleable material on the daughter wafer. In addition, standoffs can also be used to allow for height differences between the top IC cover glass and the IC pads so some contacts can rest on top of the glass and others on top of the pads.

Returning to the process flow, a further etch is performed in order to remove unwanted seed layer (FIG. 63a, FIG. 63b). As shown in FIG. 63a, by leaving seed layer material on the daughter wafer between one of the contacts and the new standoff/contact, rerouting of that original contact is complete. Optionally, an additional or alternative reroute layer could be placed prior to completion of the process or after the process is complete. In addition, it may be desirable to plate the reroute layer thicker in certain regions than others prior to etching to remove the seed layer.

Figure 64:
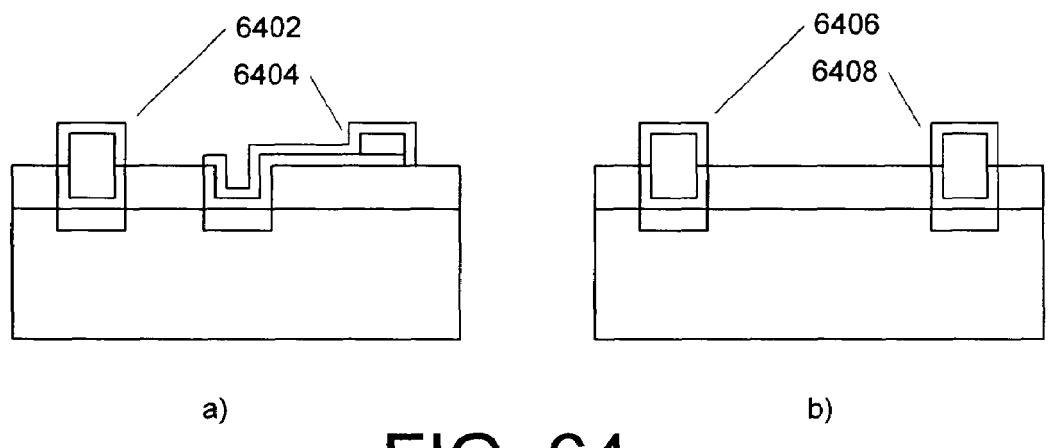
Figure 65:
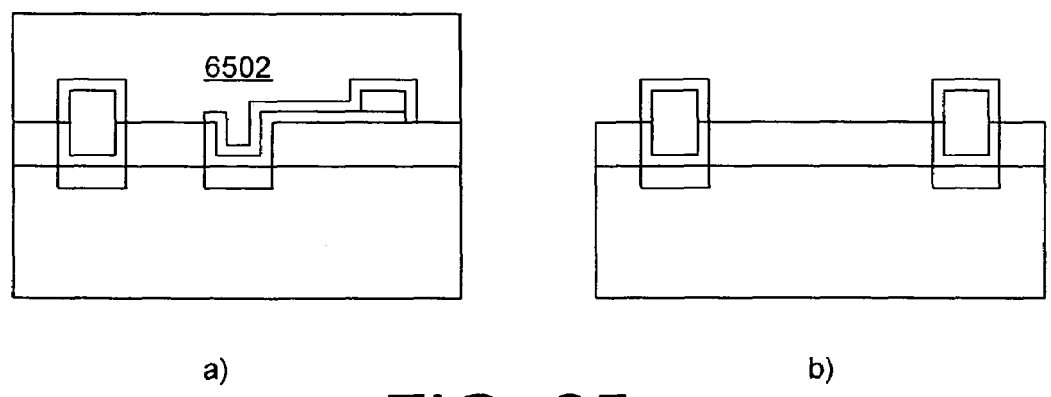

Next, a barrier layer is applied to the contacts on the daughter (FIG. 64a), in this case nickel, to act as a barrier against metal diffusing into the IC pads 5302, 5304, 5306, 5308 or damaging of the individual chip through infiltration of metal under the cover glass 5310, 5312 of the chip. Optionally, a cap layer 6402, 6404, in this case gold, is deposited on top of the barrier, to also prevent unwanted diffusion during the joining process, particularly when the approach is to be used in a tack and fuse joining process involving post and penetration contacts. A cap is also applied to mother wafer (FIG. 64). At this point, the rigid contact on the mother wafer is complete.

Again, a dielectric 6502 is applied to the daughter wafer (FIG. 65a) and, through photolithographic patterning, the area 6602, 6604 above the standoff contacts 6606, 6608 is opened up (FIG. 66a).

Then, the malleable contacts 6702, 6704 are built up on the standoff (FIG. 67a) and the dielectric is removed, leaving a fully formed malleable contact (FIG. 68b).

Figure 69:
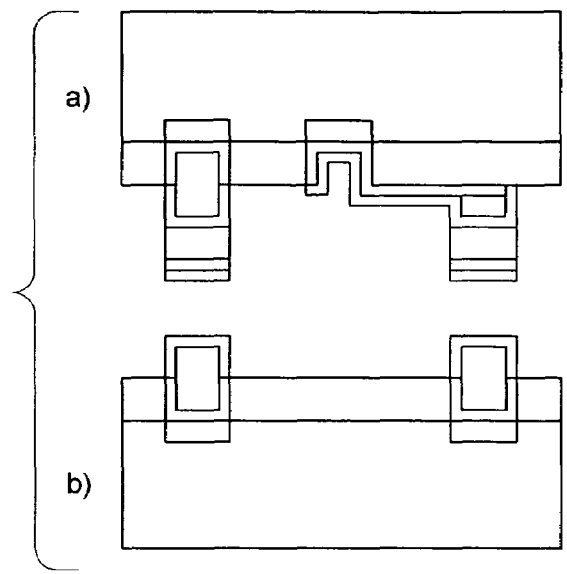

The daughter wafer is then flipped and aligned with the mother wafer photolithographic patterning, the area above the contacts through which access will occur is opened up (FIG. 69).

Figure 70:
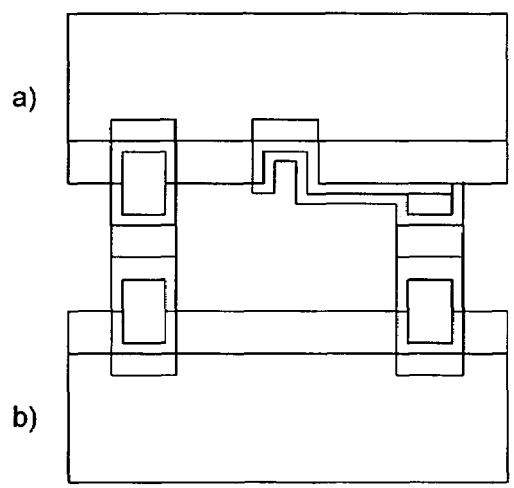

The two chips are then brought together under pressure so that the rigid contact penetrates the malleable contact (FIG. 70).

Figure 71:
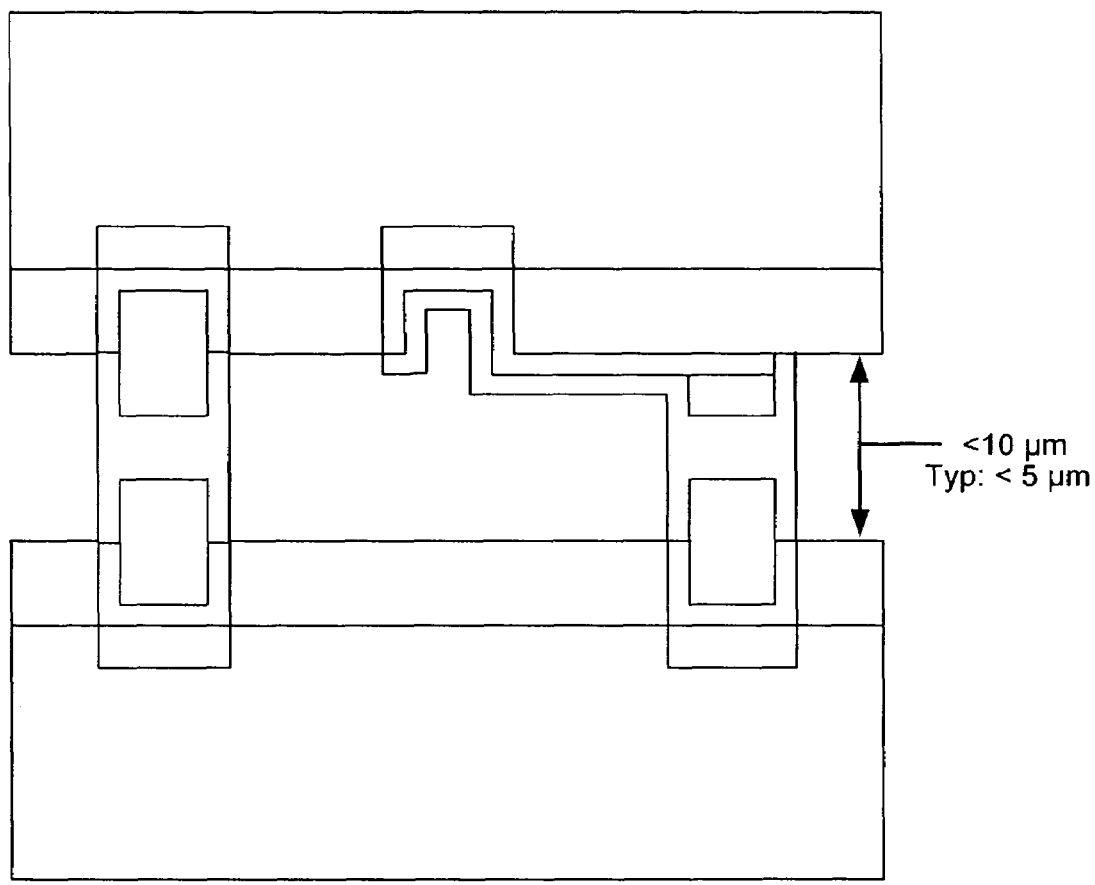
Figure 84:
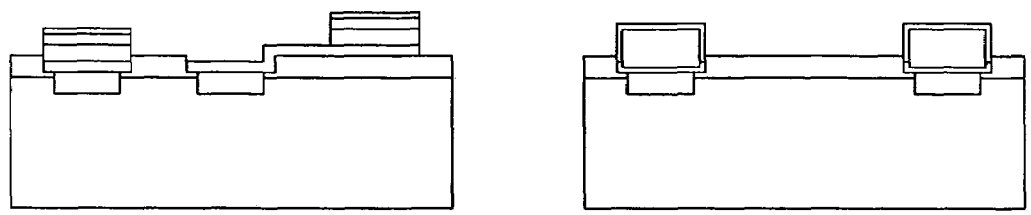
Figure 85:
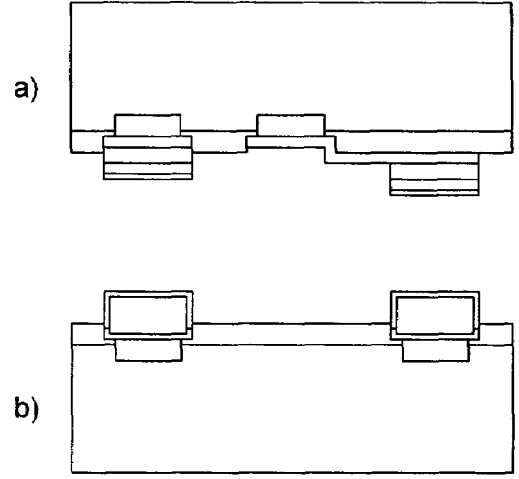
Figure 86:
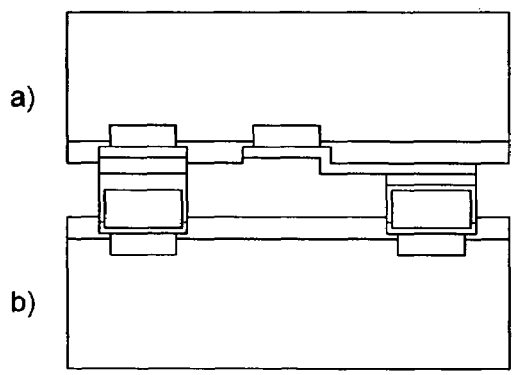

Finally, the two chips undergo the fuse phase, leaving the two chips permanently attached to each other (FIG. 71). Note that, as a result of this process, the chips will be less than 10 microns apart, nominally less than 5 microns apart measured between the top of the rigid post and the top of the contact to which it is connected on the other wafer. If the wafers are, for these purposes, perfectly flat this would also be the distance between the two wafers, if not, the topology of the wafers could cause this distance to be greater or less.

FIG. 72 through FIG. 87 illustrate an alternative simplified process variant for contact creation on a daughter (FIG. 72a) and mother wafer (FIG. 72b) followed by hybridization of two chips together. As with the preceding example, we start out with two wafers. As shown in FIGS. 72a and 72b, the cover glass openings above the contact pads for the IC are between about 8 microns and 14 microns, although such openings could be on the order of 4 microns, and in some cases could be as small as 1 micron or less. Advantageously, through use of one or more processes described herein, these smaller size openings can be dealt with as readily as larger size openings.

In addition, as shown, the spacing of the pads on the daughter wafer (FIG. 72a) are on a typical 25 micron to 50 micron pitch. However, here too, the approaches described herein can readily be used with contacts nominally on a 7 micron pitch and could even be used with contacts on a 2 micron pitch or less.

This variant proceeds as follows. First a thick dielectric is applied to the wafers (FIG. 73). Then photolithographic patterning is done to define the area above the contacts through which access will occur (FIG. 74). Next, the dielectric is etched away above the contacts (FIG. 75a), the photolith is stripped from the mother wafer (FIG. 76b), and the reroute path is formed (FIG. 77).

The exposed areas above the contact and reroute route on the daughter wafer is metalized with a barrier layer (FIG. 78a) and a seed layer applied to the mother wafer (FIG. 78b). Optionally, a barrier could be applied to the mother wafer to protect its IC pad (not shown).

The photolith is then stripped from the daughter wafer (FIG. 79a).

New photolithographic patterning is done to define the area where the contacts will be built up (FIG. 80).

The malleable contacts are the created on the daughter wafer by depositing the appropriate materials, in this case, a gold-tin (Au/Sn) alloy topped by a discrete layer of tin (Sn) in turn topped by a layer of gold (Au) (FIG. 81a) and the rigid contact is formed on the mother wafer by plating the exposed seed layer with copper (FIG. 81b).

The photolith is then stripped off of both the daughter and mother wafers (FIG. 82).

Then, the unwanted remaining exposed seed layer is removed from the mother wafer (FIG. 83).

Finally, a cap (optionally preceded by a barrier) is applied to the mother wafer contacts to prevent oxidation (an oxide cap) (FIG. 84b).

Figure 87:
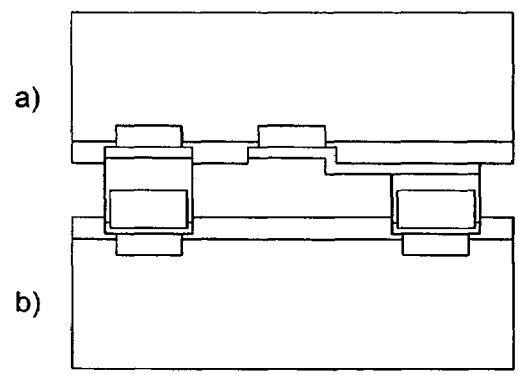

As with previously described variants, the wafers are then aligned (FIG. 85), brought together and tacked (FIG. 86), and, at some point thereafter, fused (FIG. 87).

Having described several variants in more cursory overview, an additional variant will now be presented that includes further details of various steps in the process. It should be understood, however, that those details are equally applicable to the preceding variant as well as the other variants described herein.

FIG. 88 through FIG. 91 and FIG. 95 through FIG. 102 illustrate, in simplified parallel form, two further example variant approaches for forming what will later become a rigid post on the back side of a daughter wafer. The "daughter" reference being appropriate because the aluminum IC pad will become a malleable contact and it will be joined to a rigid post on another "mother" wafer even though the back side contact will be a "mother-type" contact.

Moreover, although illustrated in parallel form for some variants, the processing described herein need not be done in parallel and could represent different variants occurring on the same wafer or at different times on different wafers.

Figure 88:
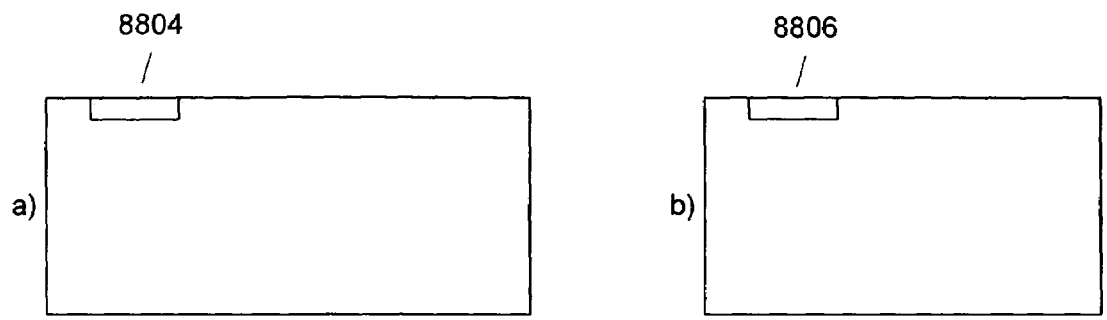
FIG. 88 through FIG. 91 illustrate, in simplified parallel form, a first part of two further example variant approaches for forming what will later become a rigid post on the back side of a daughter wafer.
Figure 89:
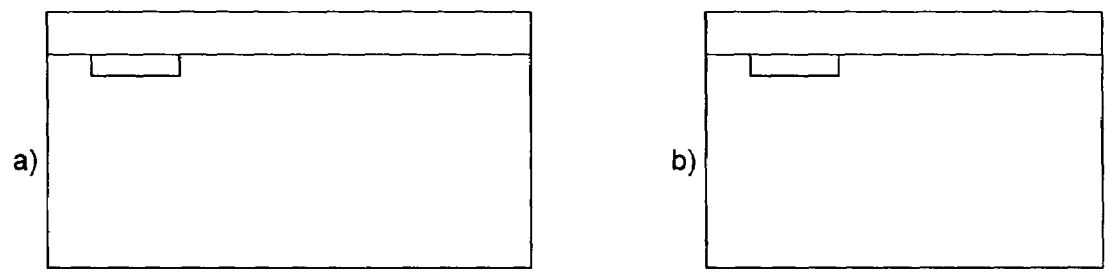

This example begins with the wafers 8800, 8802 respectively shown in FIG. 88a and FIG. 88b and involves preparation for a contact reroute, i.e. where the via will not be aligned with the pad on the surface of the wafer (FIGS. 88a through 99a) and the second example has no rerouting of the contact so the via will be aligned with the pad (FIGS. 88b through 99b). Moreover, the relative difference in widths of the two vias to be created is intended to illustrate that different width vias can be used on a single wafer or chip, and that the via widths can be different from the width of the pads on the chip (i.e. they can be the same width, wider or narrower than the pads. Again, it is noted that the figures are neither to scale nor necessarily in the correct proportions.

First, a thick dielectric layer 8902, 8904 is applied to the wafers 8800, 8802, in this case silicon wafers having aluminum IC pad contacts 8804, 8806 (FIG. 89a, FIG. 89b). This thick dielectric layer serves to protect the chip and to act as a stop region for later in the process when the top surface is thinned after electroplating. Note that, in later steps, if the vias are a) not filled by electroplating or b) filled in a way that allows for removal of excess material deposited on the surface of the wafer during the via metal fill process other than by thinning (i.e. by etching or by photolithographic liftoff) then this step can be optional. Suitable for thick dielectric deposition materials include, for example, but are not limited to: TEOS, Oxides, Nitrides, Spin-on Glass, polyimide, BCB, other polymers or epoxies, thick photoresist layers, etc. (if photosensitive polyimide or thick photoresist is used then, in some variants, a separate photoresist deposition step is not needed in the next step).

Figure 90:
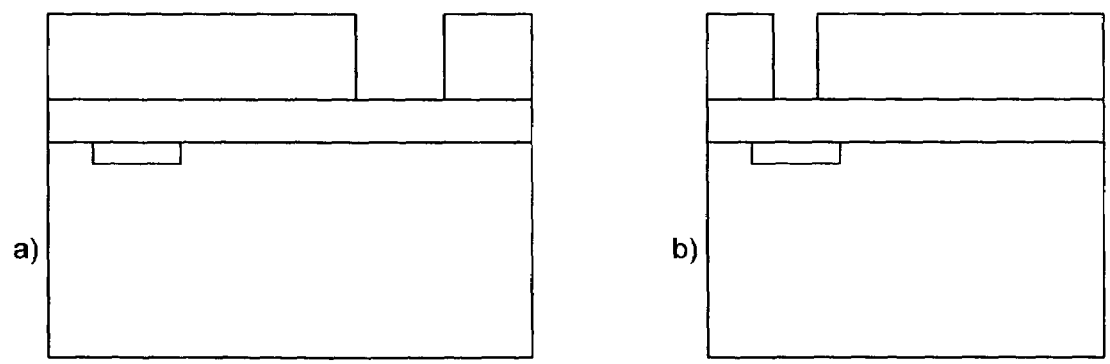
Figure 91:
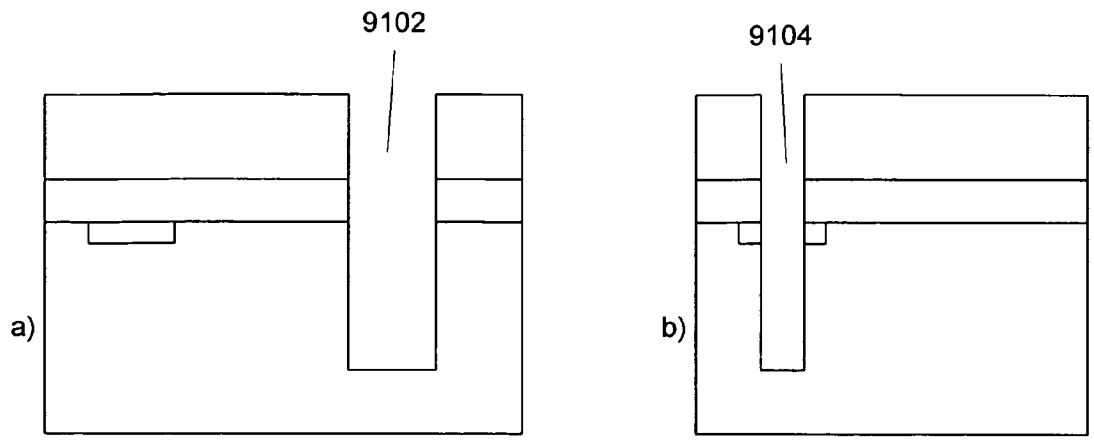
Figure 95:
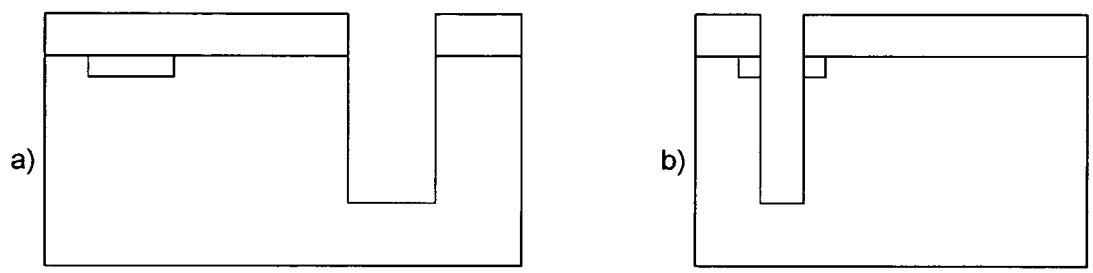
FIG. 95 through FIG. 102 illustrate, in simplified parallel form, a second part of the two further example variant from FIGS. 88 through 91.

Next, a photolith layer is applied and patterned to protect the wafer from etching in undesired places (FIG. 90). This step defines the location for the vias that will be created.

Then, an etch is performed on the wafer (FIG. 91) through the dielectric and into the semiconductor and substrate to create a via 9102 in the reroute case (FIG. 91a), into the wafer at the location where the rerouted contact will be, and in the conventional case (FIG. 91b), the via 9104 goes through the dielectric, the aluminum IC pad contact 8806 and into the wafer. It should be noted here that the desired depth is one which, as will be evident from later figures, allows for exposure of the "post" formed by the process through thinning of the back side of the wafer. Typically, this depth will be about 75 microns. Having this via depth is not critical but rather, under the assumption that there could be thousands or even millions of contacts per square centimeter, such a depth is to permit the entire daughter wafer to be handled in a wafer-scale fashion during subsequent processing steps with good yield and without the need for a carrier wafer. Alternatively, the via can go all the way through the wafer. In those through-wafer variants, the steps to be described below, of thinning and etching of the back side to expose the metal in the via, may be unnecessary. Moreover, although the via illustrated in this example has a single conductor, the same approach is applicable for coaxial or triaxial conductors through straightforward incorporation of those creation steps into this process.

At this point it is worth emphasizing certain attributes and advantages resulting from use of the illustrated process in certain implementations. Attributes and advantages arising from the approach include the fact that etching and creation of the vias can occur before hybridization (chip-to-chip, chip-to-wafer, or wafer-to-wafer). In other words, it is easily performed before the chip, die or wafer is joined to another element. Moreover, this approach allows for etching the vias from the device (i.e. active) side of a previously made and usable electronic chips. The approach can be used virtually anywhere on the chip where there is no circuitry directly in the path of the etch that can not be sacrificed. Thus, vias formed using the approach can be aligned with pads, or not, as desired. Still further, by making the vias over the pad and/or, in some cases, making the vias much smaller than the pad, particularly in areas of the chip where there is little or no circuitry, loss of "real estate" on the IC for circuitry can be minimized.

Figure 92:
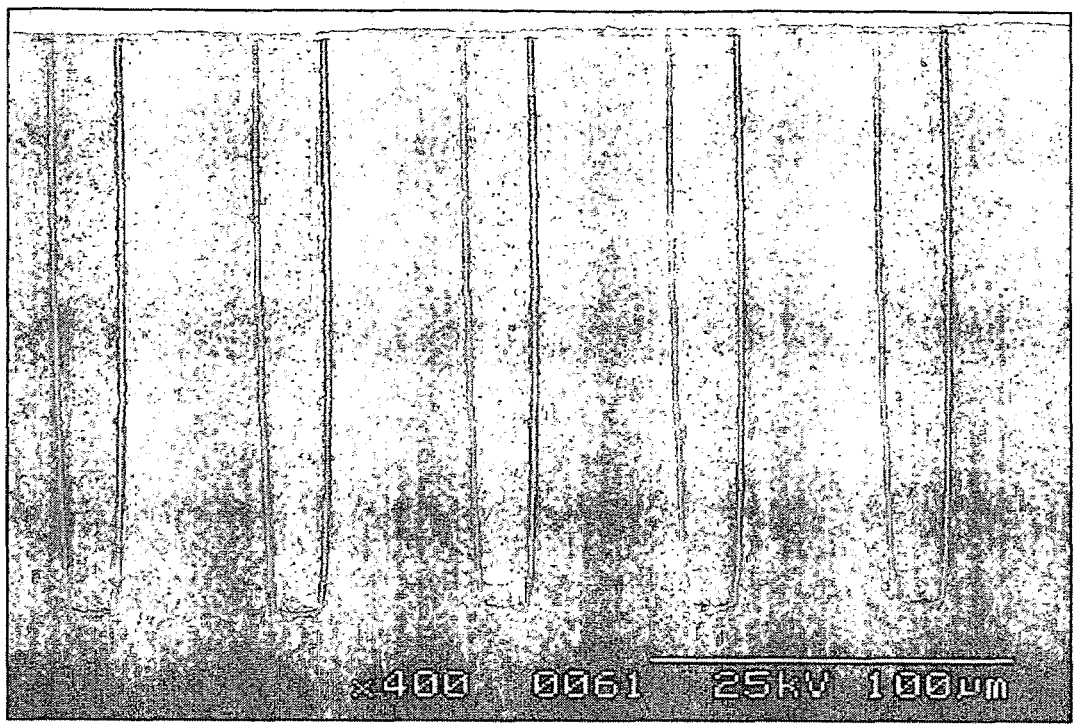
FIG. 92 is a cross sectional photograph of example sloping vias.

With respect to via formation, in some cases it may be desirable to have sloping vias in order to ensure subsequent material deposition adequately coats the sidewalls. In such cases, the slope can be a typical nominal slope of about 88 degrees off of a perpendicular to the vertical axis of the via (i.e. the via width will narrow slightly with increasing depth). A cross sectional photograph of one sloping vias example is shown in FIG. 92.

Figure 93:
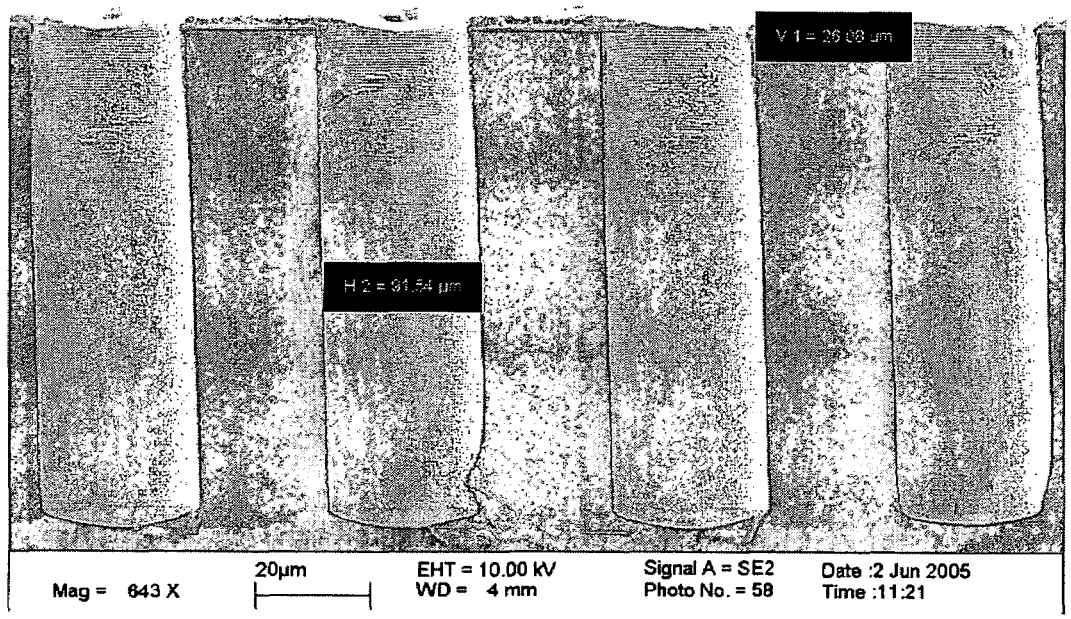
FIG. 93 is a photograph of an example via having a depth of 100 microns and a diameter of 20 microns.

Typically, via depths of 75 microns or greater are used having widths 5 microns or more. The vias of FIG. 92 have a diameter of 20 microns and a depth of about 150 microns. FIG. 93 is a photograph of an example via (already filled) having a depth of 100 microns and a diameter of 20 microns. Widths as small as 0.1 micron can suffice, as can shallower depths (e.g. down to depths of only 5 microns). However, use of smaller than 0.1 micron width vias can reduce the integrity of the final bond that will be formed. Similarly, use of depths of shallower than 5 microns can require the wafer to be thinned to such an extent that underlying circuitry (if any) could be damaged. At present, the typical range is 75 to 150 microns deep and 5 to 25 microns wide, in order to obtain sufficient manufacturing yields with equipment reasonably commercially available. Of course, depths and widths outside that range are possible for specific applications. For example, the vias could go as deep as 300 microns and, in some cases, completely through the wafer, although current commercially available equipment does not presently have sufficient consistency to allow for an acceptable yield at those greater depths involving the number and density of vias presently contemplated for large commercial manufacturing. However, it is expected that advances in such equipment should reduce or remove this limitation over time, rendering the approaches viable at such depths, numbers and densities with little to no modification of the approaches described herein.

Figure 94:
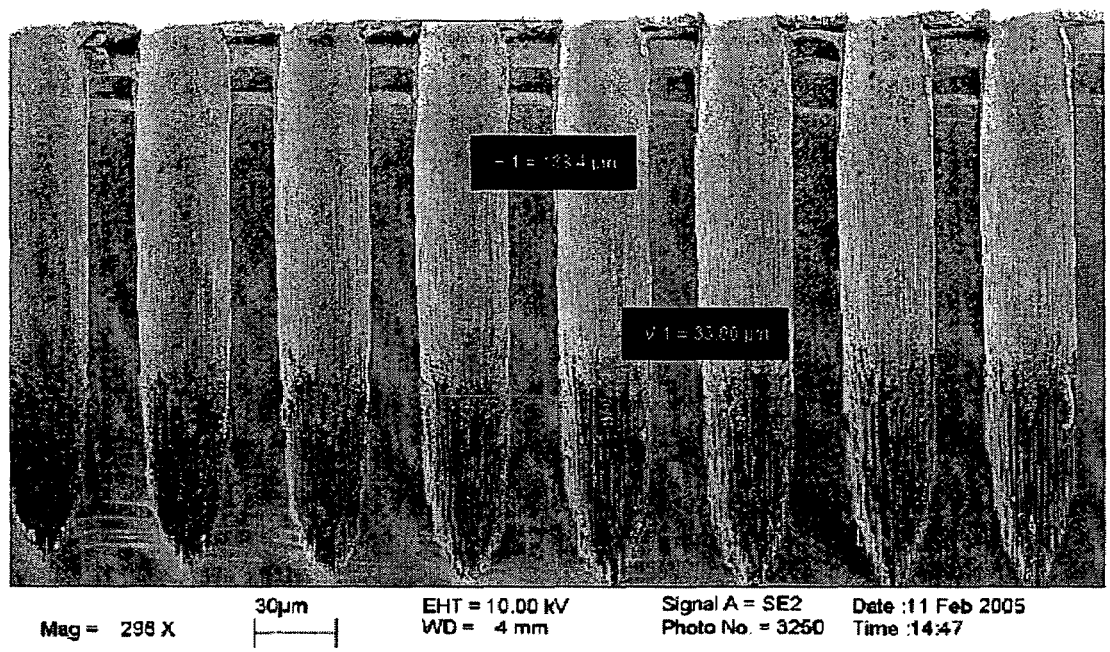
FIG. 94 is a photograph, in cross section, of a chip having pointed vias formed therein.

Optionally, the bottom of a via can be formed so as to have a point. This is a way we have used to ensure a strong rigid post, good penetration of the rigid material into the malleable material, and a strong final contact (to maximize surface contact between the rigid and malleable materials). In order to do this we have been used an approach where the rigid post is made in a pyramid-type shape (or a pyramid on top of a cylinder) where the base of the post is as wide as the underlying contact (maximizing the strength of the attachment of the post to the contact) while the top is tapered to be much smaller than the contact, allowing the alignment relative size factor to be achieved. This variant has the advantage that it will result in formation of a pointed post and thus, when used for a post and penetration connection, will allow penetration similar to that of a later-formed pyramid-type profile of a rigid post. FIG. 94 is a photograph, in cross section, of a chip having pointed vias formed therein.

Next, the photoresist is stripped (FIG. 95) and a dielectric or insulating layer is applied to the exposed via surface (not shown) to prevent the metal in the via from electrically shorting to any of the circuits in the semiconductor. The thickness of this layer will typically be between about 2000 Angstrom and 1 micron thick. However, if the particular application involves balancing the coefficient of thermal expansion or reducing the capacitance of the via (where either is important or critical) the layer could be thicker. Example insulating materials that can be used include TEOS (oxide), other oxides, nitrides, polymers, CVD diamond, etc.

Figure 96:
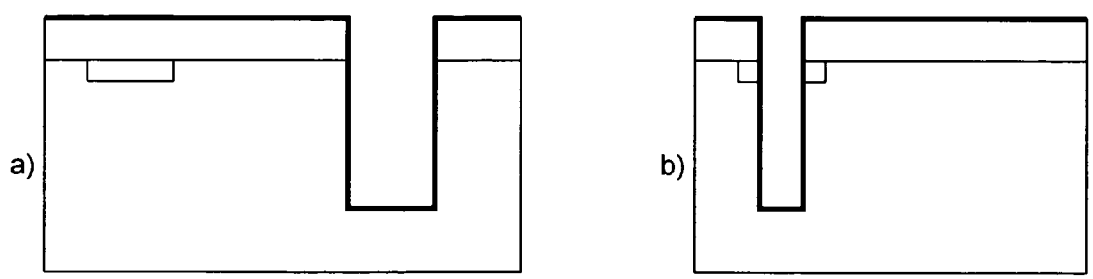

A metal barrier layer is then deposited on the dielectric, (FIG. 96). The barrier layer acts to prevent metal migration to the insulator and the semiconductor. All barrier materials described herein are suitable for this step, but for purposes of this example, the illustrated barrier is titanium-tungsten (TiW).

Figure 97:
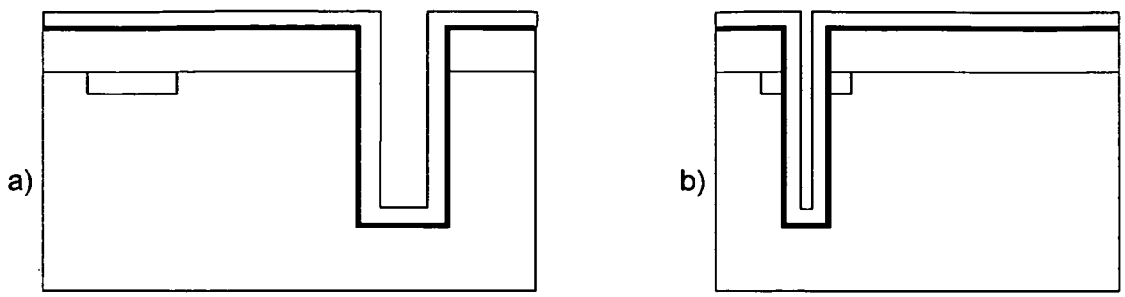

Next, a plating "seed" layer is applied if metal is to be plated in the particular variant (FIG. 97). The seed layer is used as a basis for electroplating of the via. A copper seed layer is good because it is a good electrical and thermal conductor, it is prevalent in industry today, and it is very easy to work with in standard semiconductor and packaging lines. However, any of the materials as described herein in conjunction with the rigid material and/or the seed layer for the rigid material can be used. If the via is to be filled by a method other than electroplating, then this seed might only cover the vias themselves rather than a larger fraction of the wafer or it might be non-existent. For example, if the via will be filled by CVD or evaporation, then there would be no need for a seed layer).

Figure 98:
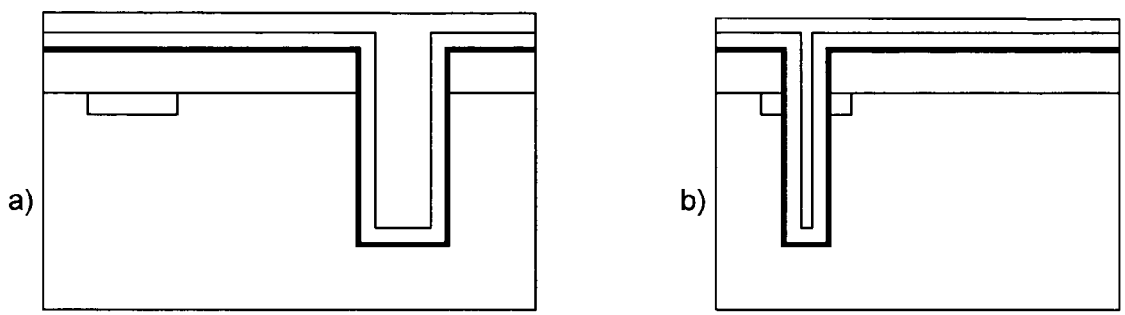

Both the barrier and seed layer are typically deposited by sputtering or physical vapor deposition ("PVD"), but electroless plating can be used since, for some implementations, electroless plating will provide significant advantages over sputtering or PVD. The via is then (typically completely) filled with a metal or other conductor to form the electrical conduit through the wafer (FIG. 98). Typically the fill material will be copper for a plating approach. However, other materials can be used including any of the other materials described herein as suitable rigid or malleable materials. Note that the via doesn't have to be completely filled with conductor if a simple electrical connection is needed and good thermal conductivity or low electrical resistivity is not needed. In these cases, the remainder of the via can be optionally filled with another material such as an oxide or epoxy. The entire via should typically be filled with some type of material because if air is trapped in a void in the via when the chip is packaged and sealed, temperature cycling during operation can cause the chip to fail due to expansion and contraction of the air. Completely filling with metal allows the lowest resistance and best thermal conducting contact. Moreover, where larger diameter vias completely filled with metal are used, that metal can assist with thermal transfer through the wafer.

As shown in FIG. 98, the via is filled by plating the seed layer using an electroplating process. Optionally, if the plating process is completed and a void remains within the center of the plated material, the void can be filled by a filler material such as an oxide, further metal, a solder, or some other material as appropriate for the application.

Advantageously, if the via is filled with the same material as the rigid material for the mother wafer or the same material as the malleable material for the daughter wafer, stacking advantages can be achieved. Alternatively the via could be filled with the same material as the malleable material if the mating contact on the chip to which it will be attached has a rigid material on it.

Note that, as shown in FIG. 98b where the via is aligned with the pad, filling the via with a conductor inherently allows the via to make contact with the pad.

Where the particular wafer is to be joined to another wafer, as is expected for most implementations, it is important that the construction of the barrier and the via filling material of a daughter wafer follow the same guidelines as the barrier and rigid materials for a mother wafer so that when the daughter chip is hybridized to the mother wafer, it performs in the same way that the mother wafer would.

Figure 99:
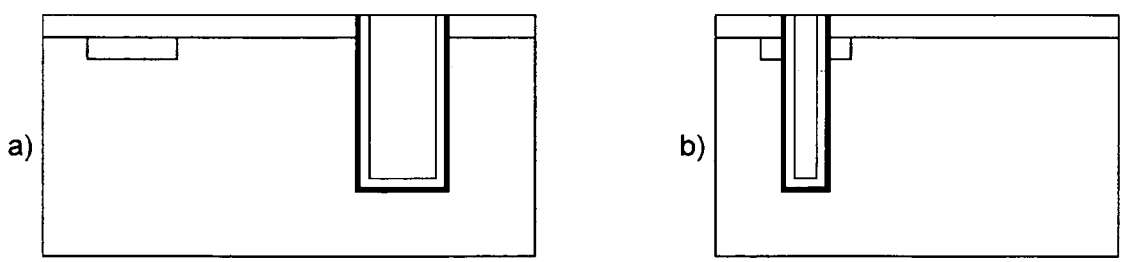
Figure 100:
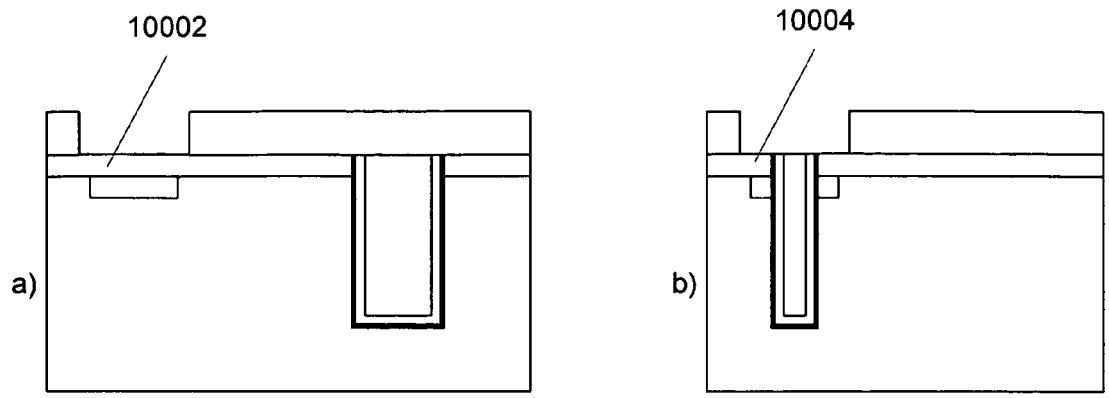

Returning to the process flow, as a result of the plating in the previous step, a large amount of conductor is deposited on top of the wafer and needs to be removed. This can be achieved through lapping, polishing or chemical-mechanical processing ("CMP"). This thinning occurs down into the thick dielectric that was deposited in the first step. The actual thickness used for the dielectric applied as the first step is chosen so as to give a margin of error to this lapping step. This step can be unnecessary if the conductor filling the via is not deposited by electroplating. As shown, a chemical mechanical process ("CMP") is then used to remove the excess plating material and underlying seed layer down to, and slightly into, the surface dielectric layer (FIG. 99).

Figure 101:
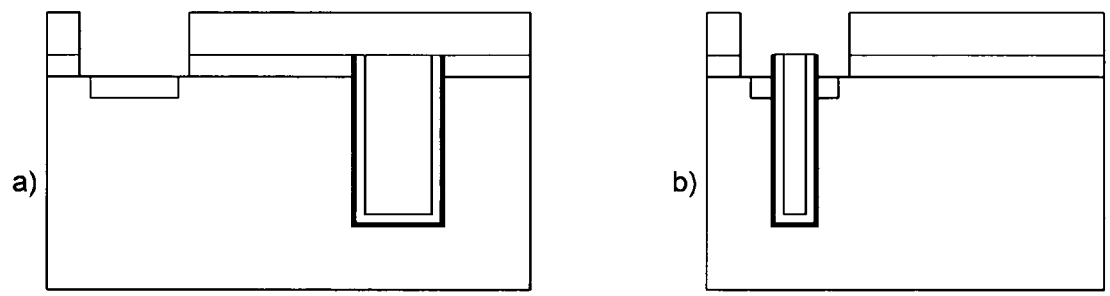

Next, a photolithographic etching process is again used to assist in providing access to the wafer's IC pad contacts 8804, 8806 from the top of the wafer by application of a photoresist (FIG. 100), and then etching the exposed dielectric 10002 (FIG. 101). If the only contact needed is from the pad to the via itself (FIG. 101*b*) and no contact will be needed between that same pad and the mother chip for a particular pad, then that particular pad could forego this step (i.e. that pad could remain covered by the photoresist). In an alternative variant, the photolithography can be performed so that the connection to the IC contact is made at the same time as either the seed layer is deposited (and could functionally be part of the seed layer) or during the plating or filling of he via. In such variants, this photolithographic step could be unnecessary.

Figure 102:
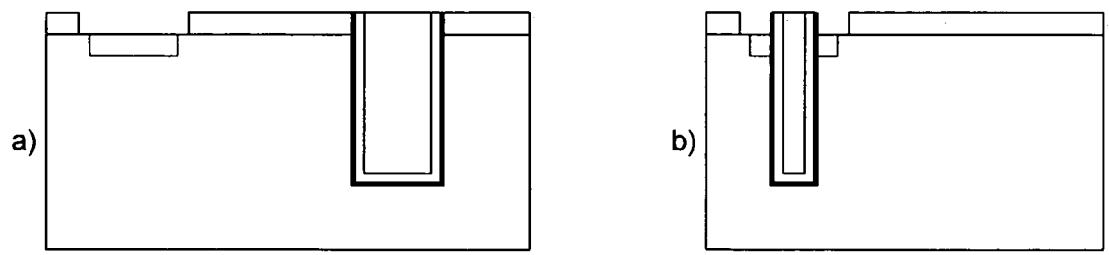

Thereafter the photoresist is stripped away and the wafer is cleaned, leaving a completely formed post within the daughter wafer (FIG. 102).

At this point, it is presumed that the wafer will be further prepared for hybridization to another element, such as another chip, a die, or a wafer (i.e. the approach is equally to all permutations of hybridization: chip-to chip, chip-to die, chip-to-wafer, die-to-die, die-to-chip, die-to-wafer, and wafer-to-wafer). This further processing is illustrated in simplified, parallel form in FIG. 103 through FIG. 125 and begins with the daughter wafers as was shown in FIG. 102. In addition, for purposes of understanding, the process further illustrates processing that is performed on the wafer that would serve as a "mother-type" contact element.

The process proceeds as follows. First, a dielectric layer is applied to the mother wafer except over the IC contact pads. (FIG. 103*b*), the dielectric layer already being present on the daughter wafer (FIG. 102*a*, FIG. 102*b*).

Next, a barrier layer is deposited on the daughter wafer (FIG. 104*a*) a part of which, in the case of the rerouted contact, will ultimately become the electrical connection between the original IC contact and the pre-formed post. Use of a barrier is advantageous because it prevents the malleable material from later interacting with either the IC pads or the rigid or standoff metals.

As shown, a barrier material, for example, Ni/Au, Ti/Pd/Au or Ti/Pt/Au to name a few, is deposited on the daughter wafer via sputtering. In addition, this barrier can generally be used as an under bump metal ("UBM") and for rerouting that does not require seed removal. This layer is typically put down using either a sputtering and/or evaporative process or an electroless plating optionally combined with an electroplating process for the upper layers.

In addition, as shown, a seed layer is deposited on the mother wafer (FIG. 104*b*) through use of, for example, electroless plating or deposition techniques. As shown, the mother wafer has TiW+Cu applied, which is used as both as UBM and the seed for electroplating the rigid contact on the mother wafer. The use of copper on top allows for easier copper electroplating and subsequent rigid post formation. The UBM on the mother wafer can, in some implementations, double as the seed layer for rigid member electroplating, reroute, or act as an RF shield between wafers (although patterning for such would happen on an etch step, not during deposition at this point).

Optionally, and alternatively, the barrier and seed layers could have the same constituents. In such cases, the single material can function as both layers.

Figure 104:
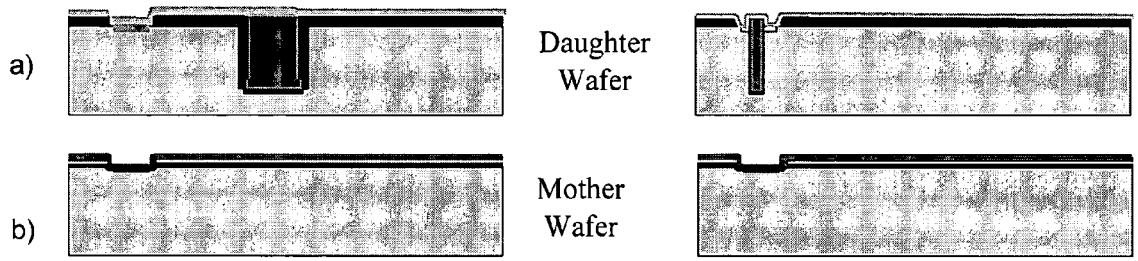
Figure 105:
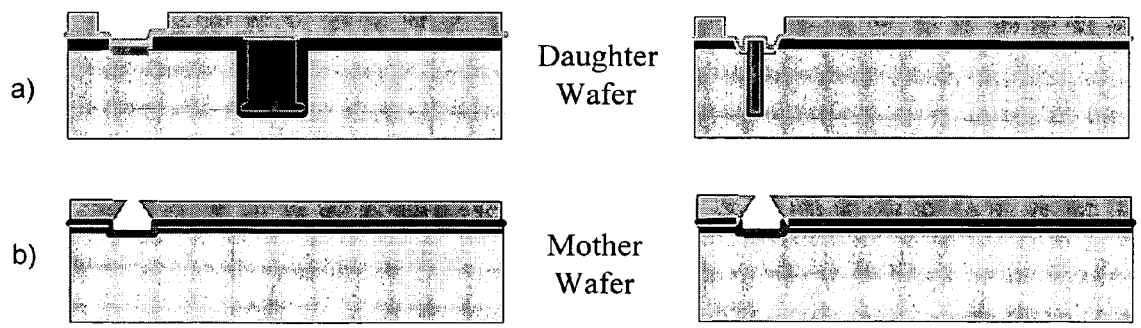

As shown in FIG. 104, the barrier is put over the whole wafer. This is so that a subsequent electroplating step can be performed. After such electroplating, however, the seed and barrier need to be removed from the areas where no contacts exist so that the various contacts do not remain electrically shorted together (unless expressly desirable for other reasons not pertinent here, i.e. the barrier and seed can act as an electrical rerouting material among points).

If, the subsequent materials can be put down with a process other than electroplating, e.g. by sputtering or evaporation, then the mother wafer steps could alternatively include patterning with lithography around the pads, putting down the barrier metals, putting down the subsequent metals and then doing a lift-off process. The net result of metals and barrier being primarily around the pads or where a reroute is desired would be the same.

Then a lithographic process is performed on the daughter wafer to expose the barrier material that is over the original contact (FIG. 105*a*). In addition, the mother wafer is patterned, as illustrated in this case, with an undercut to provide an optional patterned contact having, for example, a pointed, pyramidal, conical or mushroom-like shape (FIG. 105*b*). Alternatively, the mother wafer can be patterned so as to form some other contact shape in order to increase the available surface area of that contact or create a contact that is meaningfully smaller in cross section than the corresponding malleable contact to which it will ultimately be joined. By doing so, penetration can be enhanced because the applied force will be distributed over a smaller area.

This step, (FIG. 105*a*, FIG. 105*b*), defines where the subsequent metal placement will occur. If this subsequent metal were to be deposited by means other than electroplating, this step would occur before the barrier and seed deposition described above. Here it is assumed electroplating will be used. Note again that the patterning of the lithography can be done to allow for the subsequent electroplating and/or seed etch (or the subsequent liftoff process if electroplating were not used) to define a reroute layer.

Figure 106:
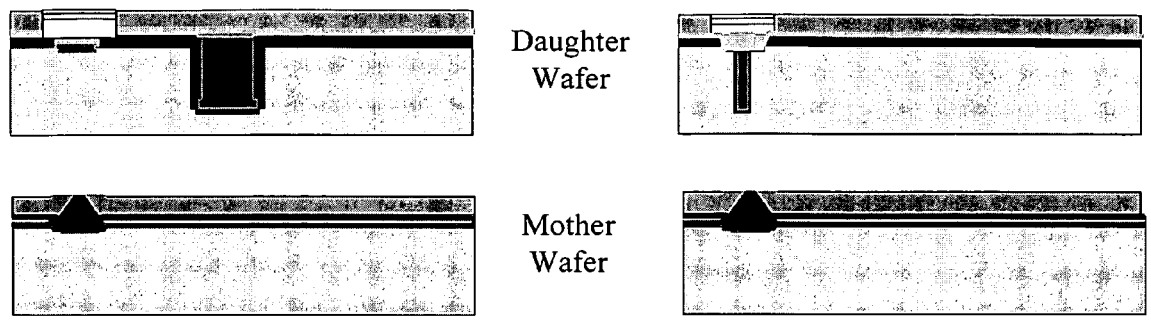

Next, the daughter wafer is metalized by depositing appropriate metals on top of the exposed barrier (FIG. 106). Depending upon the particular implementation, one or more of the following can be put on the daughter wafer: a standoff layer (if desired) to handle non-planarity of the wafers, the diffusion or malleable layer (which is what deforms and forms the contact), a cap or adhesion layer (if needed) to assist adhesion work during the tack phase and/or an oxidation barrier to prevent the adhesion/diffusion layer from oxidizing.

In addition, on the mother wafer, the void created by the lithographic process is filled by plating (electro- or electroless) the seed layer exposed by the lithographic process (FIG. 106). Depending upon the particular implementation, a rigid material to be used for post formation for use in a post and penetration connection can also be added at this stage.

Figure 107:
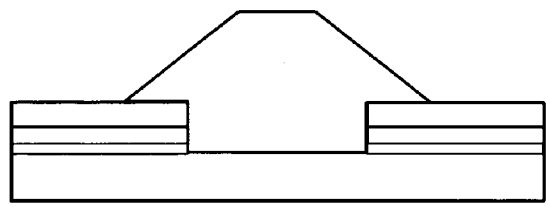

FIG. 107 illustrates in greater detail, an example of the full plated pyramid-shaped contact for the mother wafer.

Figure 108:
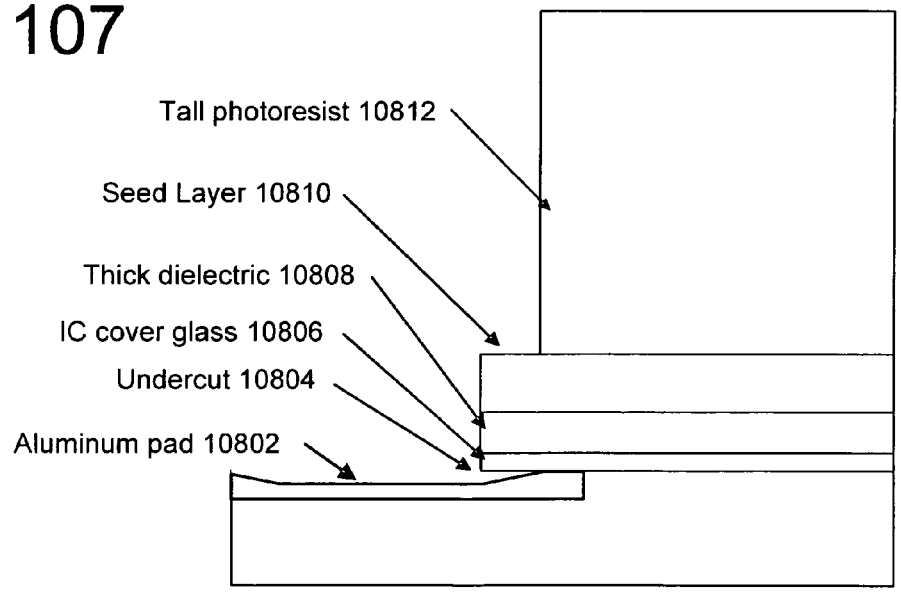

FIG. 108 shows an enlarged portion of an alternative variant of a mother wafer contact, in this case a profiled contact similar to that of FIG. 107. With this optional variant (applicable to profiled and non profiled contacts), before plating the metal (metalization) for the rigid post, a bit of the metal of the semiconductor pad 10802 is etched down, creating an undercut profile 10804 at the edge of the pad 10802. When the rigid material 10902 is built up (FIG. 109), some of the rigid material 10902 fills the undercut 10804. This additional fill acts as an anchor to help hold the rigid contact structure in place during stress applied during further processing or stresses in operation due to thermal cycling. As shown, the rigid material 10902 is nickel (Ni).

Upon completion of the metalization and/or plating, the photolith is then stripped away, exposing the built up contacts on the daughter and mother wafers (FIG. 110). Note however, that if the barrier for the mother contact will be electroplated, that step can optionally be performed following the metalization but before stripping the photoresist.

Next, a photolithographic process is employed to protect the built up contacts or posts but allow for removal of the unwanted barrier and seed materials from, respectively, the daughter and mother wafers (FIG. 111). Note that this step can also be used to define and/or reroute contacts. Moreover, if other metals had not been electroplated, the order of these steps would be slightly different because a liftoff vs. a subsequent etch might have been used.

Figure 112:
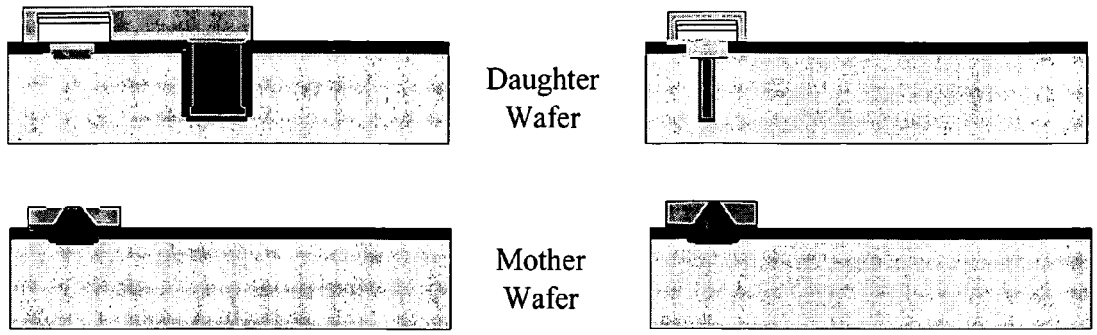

However, since the seed and barrier materials in this example were electroplated, an etch will be used. Thus, the unwanted seed and barrier material is etched away (FIG. 112). In a further alternative and optional variant, only small amounts of barrier and seed are etched away, namely only as much as is necessary to prevent undesirable shorting of contacts together such that much of the surface of the wafer would remain covered and thus could be used as an EMI shield to prevent noise or undesirable coupling of signals between stacked chips, particularly if the remaining barrier/shield was attached to a ground plane.

Figure 113:
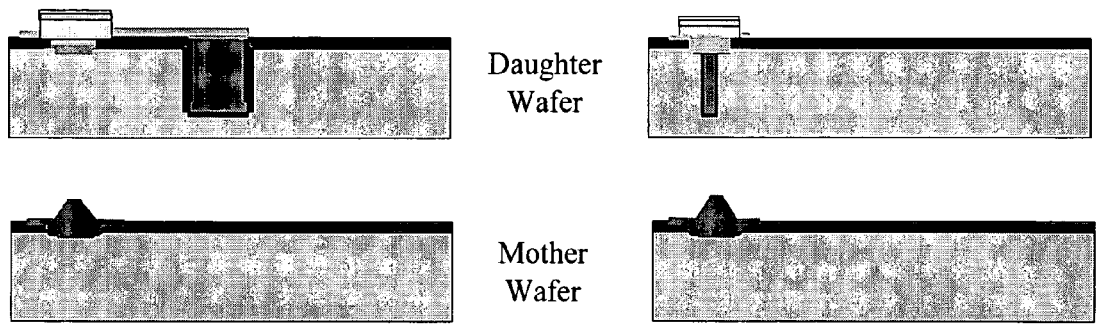
Figure 114:
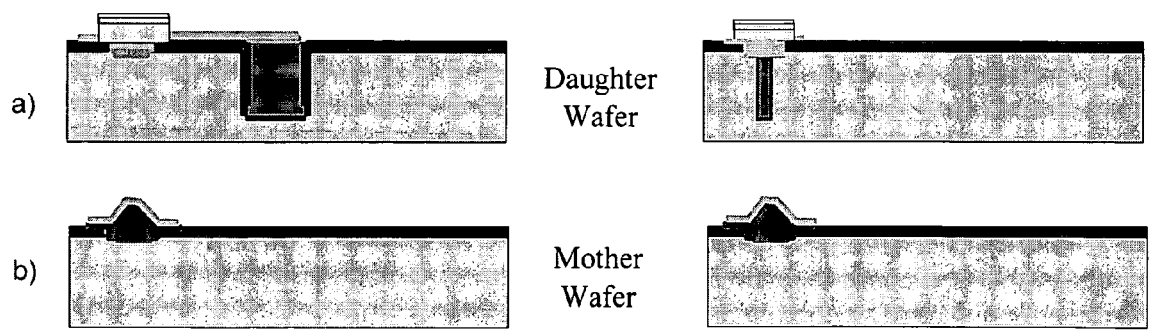
Figure 115:
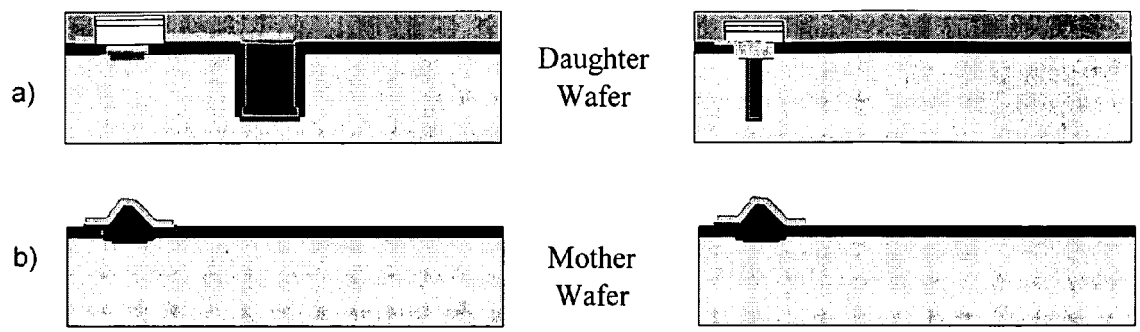
Figure 116:
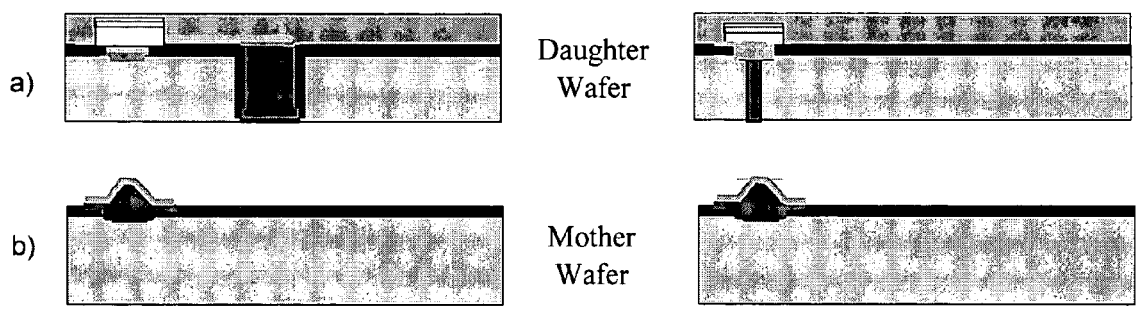
Figure 117:
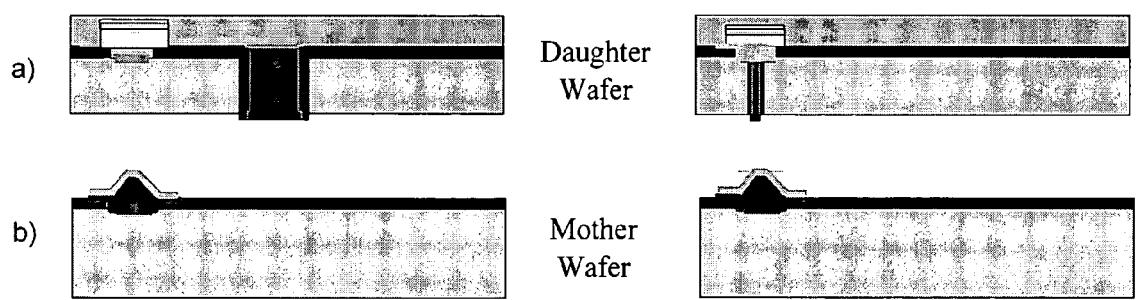

Then the photolith is stripped away (FIG. 113).

At this point, the daughter wafer contains a functional rigid post suitable for use in forming a post and penetration fit connection with another wafer.

However, as will be evident from the description herein, in this case processing of the mother wafer continues, specifically, through electroless plating of a malleable material (relative to the material on the daughter wafer post) onto the contact (FIG. 114b). Notably, although this step is illustrated as an electroless plating step, a variant of the approach can use an electroplating step. In such a variant, this portion of the process would either occur as a part of the metalization step or, alternatively, as an electroplating operation between steps the stripping of the photolith used in the metalization step and application of the protective photolith as described above. In either case however, the deposition of the barrier is important as it prevents the intermixing of the malleable and rigid materials and constrains the malleable material between the rigid material and the IC pad on the daughter wafer).

At this point, the mother wafer now has a functional malleable post for use in forming a post and penetration fit connection with another wafer.

However, in this example, it was pre-planned that a third chip was to be stacked on top of the daughter wafer, hence the formation of the post into the wafer. Thus, further processing of the daughter wafer is required and proceeds as follows.

First, the front side (i.e. device and contact bearing side) of the daughter wafer is protected by application of an appropriate removable, protective material to protect it from contamination during subsequent thinning (FIG. 115a). This cover could consist of just a simple photoresist or a dielectric or could consist of a rigid member such as a glass plate or another semiconductor wafer (a "carrier" wafer) attached to the daughter wafer by such means as photoresist, wax, polymer, epoxy, other adhesive, etc. In some variants, a very thick layer is used (e.g. on the order of at least 50% of the thickness that the daughter wafer will be after thinning). In other variants a rigid carrier wafer can be used. In either case, the very thick layer will give the daughter wafer extra strength so that it can be handled without breaking when thinned.

Next, the back side of the daughter wafer is thinned to expose the via fill material (e.g. the previously formed post) from the back side, typically until the daughter wafer is about 75 microns thick because the typical vias go to about 75 microns deep. If the vias extend deeper, less thinning may be required. Depending upon the particular application, the thinning is specifically done until the post extends above the back side wafer surface or, in some applications, the post will be flush with the back side surface (FIG. 116a). However, where the bottom of the via is pointed, thinning should preferably not go down far enough to remove a meaningful amount of the point at the bottom, if having a pointed, pyramidal, conical or mushroom-like structure is desired when the processing is finished.

In this case, because another post and penetration connection is desired, an etch is performed on the back side so that the post extends above the surface (FIG. 117a). This etching step serves two purposes. First, it removes some of the substrate around the vias, permitting the vias to extend beyond the surface (thus allowing it to act in exactly the same fashion as a rigid post on a mother wafer. Second, it cleans the surface of the contact allowing good adhesion of metals in subsequent processes.

Of course, for daughter wafers that have no through-connections, the thinning and etching steps will generally be unnecessary subject to other height considerations making it desirable nonetheless.

With variants that use a very thick layer or carrier on the front side, thinning can potentially far exceed the typical 75 micron finished thickness. Indeed, with those variants, thinning result in a thickness down to about 10 microns. Moreover, if the carrier wafer will not be removed after a tack and fuse process, the wafer can be thinned to about 5 microns.

Note: In alternative implementations, the thinning steps can be done after hybridization between the mother and daughter. In such variants, the sequence of events would be electroless plating of the mother contact, tack, fuse, thin the daughter, etch the back side of the daughter to extend the contact above the back side surface, application of the barrier and cap to the back side contact, with the front side protection and removal of that protection being omitted as unnecessary.

Figure 118:
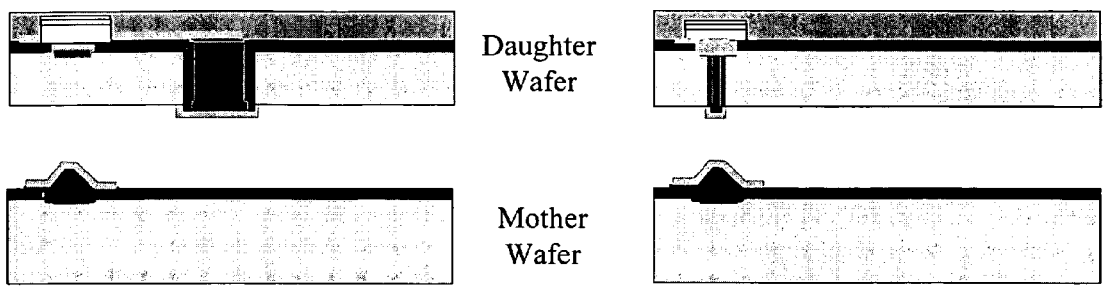

A barrier and cap or cover layer is then deposited on the post (FIG. 118). This barrier layer and cover is important for the protection of the via material. The barrier layer (and barrier cover) performs the same exact function as the barrier material and barrier cover that is deposited on top of the rigid post of a "true" mother wafer. It allows the malleable material to be pinned between the barrier material on this new post and the barrier layer on a subsequent 2nd daughter wafer (i.e. "Daughter Wafer 2"). As shown, the barrier and cap have been deposited using an electroless plating process. In this example, 1 micron of Ni and 0.3 microns of Au are used. The advantage of using electroless plating is that it does not require any photolithographic steps on the backside of the wafer, making the process simple to perform and compatible with the use of thin wafers. This advantage becomes more valuable for wafers thinned to the more extreme limits and to save cost in the original dielectric etch, via etch and via fill steps of the via creation process. Again, the specific materials that could be used include any of the barrier materials referred to herein.

Figure 119:
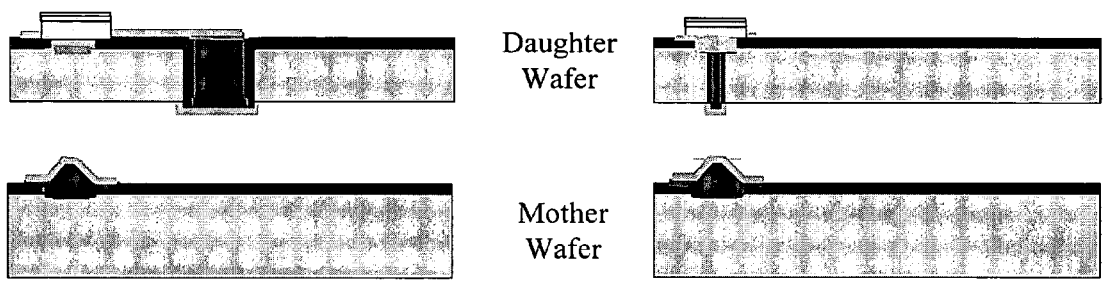

In addition, this barrier does not have to be deposited by electroless plating. Instead, in some variants, electroplating can be used, if a seed layer is deposited on the back, plated and then etched in a similar fashion as described above. In other variants, a patterning and evaporative or sputter or other type of deposition process could be used to apply these barrier layers. While requiring more steps on a thin wafer, these alternate approaches have the advantage of being able to also define a reroute layer, shield or ground plane on the back of the wafer either through the etching of the seed layer in an electroplated process flow or through the liftoff process in a deposited metal process flow. Then the protective layer is removed from the front side of the daughter wafer (FIG. 119).

Alternatively, if the material that is put on as either the protect layer or the adhesive to attach the carrier wafer to the daughter wafer can withstand the temperatures of the tack and fuse process, then this step can be postponed until after the fuse process is compete. This allows for greater thinning of the daughter wafer while making it possible to still handle the individual die during the tack process without cracking or damaging the chips. In this scenario, the daughter chip will typically have its circuitry face-up (i.e. away from the mother chip) with the malleable material being on the mother chip. Of course, bearing in mind that the mother/daughter convention is merely arbitrary, the opposite could be true or, in the case of certain well attachment or other variants, the malleable material could be in the via itself or even added later.

In another alternative variant, this step could be omitted entirely and the protective layer left on permanently, for example, if the vias were not formed to stack a third chip on top, but in order to allow a chip to be hybridized with circuitry facing up rather than down, for example, if optical devices are on the daughter wafer and the top carrier wafer could have built-in microlenses or other passive elements, or if the daughter and mother wafers were RF devices and it was desirable for the two electronic circuits to not be immediately adjacent to one another. Again, this would typically require the mother chip to have the malleable material on it.

At this point, presuming that the contacts described above on the mother and daughter wafers are to be mated together, it is now possible to join the respective chips. The joining process proceeds as follows.

Figure 120:
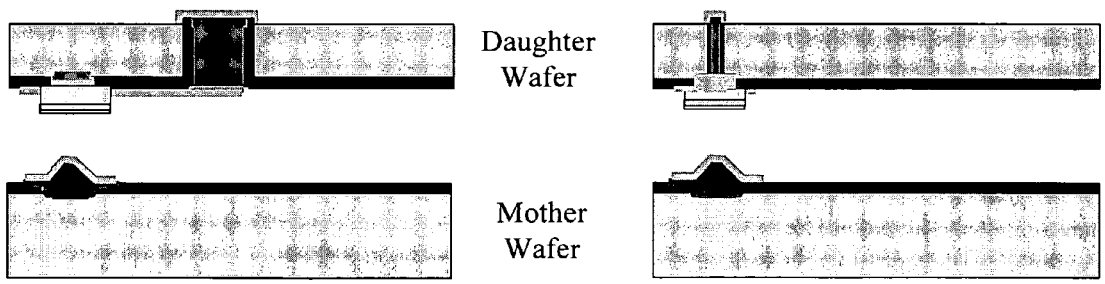

First, the daughter wafer is flipped over and the respective contacts to be joined on the mother and daughter wafers are aligned with respect to each other (FIG. 120). The alignment step is used to align the mother and daughter wafers. The alignment should be with a tolerance of ± about the size of the pad. With an oversized malleable contact the alignment tolerance can be somewhat larger. In general, the alignment is done to ensure that the entirety of the top of the rigid contact hits the malleable contact at some spot. By way of example, if the malleable contact was a square 15 microns wide on a side and the top of the rigid contact was a square 5 microns wide on a side, if perfectly centered, the edges of the rigid contact would be 5 microns from the edge of the malleable contact and the alignment accuracy would be ±5 microns.

Figure 121:
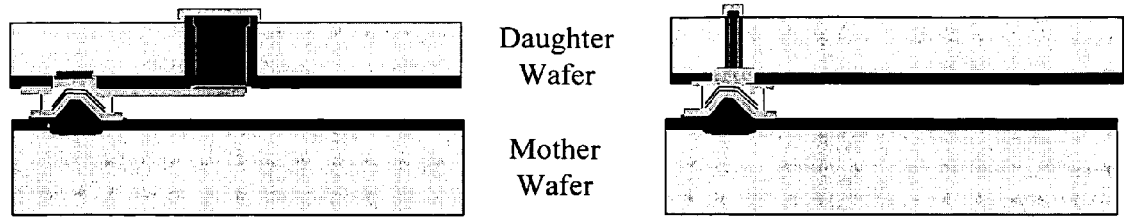
Figure 122:
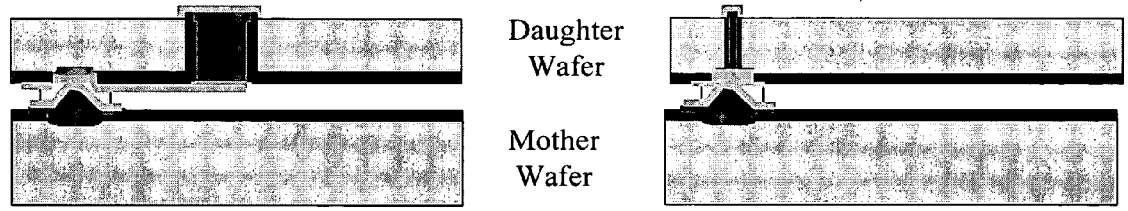

Then, the contacts are brought together under pressure to form a post and penetration connection (FIG. 121).

One of the key advantages to this approach to stacking is that the rigid material penetrates into the malleable material. This permits a strong bond to occur between the two wafers since the surface area between the two contacts is larger than the size of the individual contact itself. Moreover, the bond is stronger because the type of failure necessary for the two parts to pull apart would require both a delamination of the horizontal surface of the post and a shear failure of the vertical side of the post. Notably, the latter is a much less likely form of failure, so the risk of overall failure is even more remote than either alone.

In practice, the amount of protrusion is also important. Typically, at least a half-micron of protrusion is desirable. Although less protrusion can work for some implementations, the strength goes down considerably at lower levels of protrusion. In practice we have determined that, for a malleable material which has total height of 8 microns, the rigid material will typically extend 2-3 microns into the malleable; for a malleable material of 10 microns, the rigid will typically extend 5 microns into the malleable material. A general "rule of thumb" is to have a penetration of 10% or more of the thickness of the malleable contact but have it penetrate less than 90% of the way through the malleable contact.

Another key advantage is that the penetration of the posts allows for significant non-planarity of the daughter and mother chips relative to the pitch of the contacts. For example, for contacts that are 12 microns wide on a 20 micron pitch, the height of the malleable material can be fairly high, for example, up to the point where the height matches the pitch. Similarly, the planarity deviation from contact to contact can be as wide as the thickness of the malleable contacts. For example, if the post had a height of 5 microns and the malleable material had a height of 8 microns the difference in planarity from contact to contact could be as much as 8 microns. In that case, some of the posts would penetrate all the way through the malleable material and some would have less penetration.

Returning to the process flow, following penetration of the rigid contact into the malleable contact or concurrent with it, the tack phase of a tack and fuse process can be performed. As shown in FIG. 121, the two occur concurrently. During the tack phase of the process, electrical connections between the two wafers are made. Advantageously, no intermediate epoxy or other substance is necessary to hold the chips together or that can act as a barrier between the electrical connections.

Optionally, prior to the tack phase, an underfill can be inserted between the two chips to fill the void between the two if, for example, potential rework is not part of the process and the underfill material will not be adversely affected by the temperatures used in the tack or fuse process.

At this point, the mother and daughter wafers are joined and can be tested (and in some cases if one is faulty, replaced).

Once it is determined that a permanent connection between the two is desired, the fuse phase of the tack and fuse process is performed (FIG. 122) to form the joined pair (e.g. hybridized unit) 12202, 12204. During the fuse process, the mother diffusion/cap, the daughter oxidation cap, and the daughter malleable material all interdiffuse together forming the final composition of the overall contact.

Optionally, if not done previously, an underfill can be inserted between the chips prior to the fuse process, if temperature is not a concern, or following the fuse process. The advantage to using an underfill is that it reduces the prospect of air being trapped between the two chips and later damaging the chips or connections due to temperature cycling (because the tack and fuse process forms a hermetic seal).

Once the mother wafer has been populated in the tack process (i.e. in a die-to-wafer process, the alignment and tack processes are repeated for each good location across the mother wafer, with known bad mother die sites not being populated, and in a wafer-to-wafer process, the two wafers are tacked together in their entirety, and if optional testing is performed, the location of bad chips being noted for future elimination), then the entire mother wafer goes through the fuse process, permanently attaching all of the daughter chips. This can be done at a much higher temperature than the tack phase. Moreover, the time is the same for each chip, as the process is done wafer-at-a-time, so the process yields fairly homogeneous connections across the each individual chip.

Temperature for the fuse phase will typically be, for example, 320° C. to 400° C., depending upon the particular materials involved.

Advantageously, by separating the tack process from the fuse process, the equipment performing the tack is not slowed down by having to heat or cool each individual part). By performing this in a controlled manner at a wafer level, all contacts can have a very similar final composition.

An inert or reducing environment can be used during the tack phase, the fuse phase, or both, to help to minimize or remove oxide at the surface of the materials and help lower the required temperature or pressure for each step. Typically these would be gases such as nitrogen, argon, other inert gases or reducing gases such as forming-gas or formic acid, or some other environment with hydrogen content or some other reducing gas.

Figure 123:
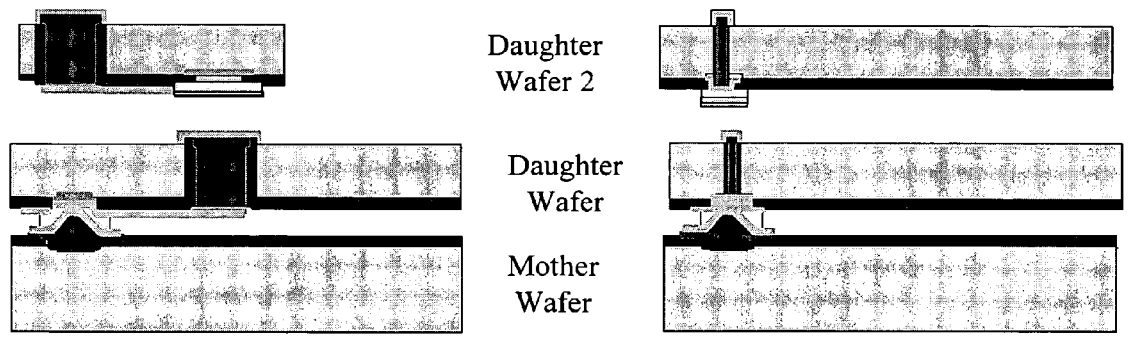

As noted above, the process is not complete because a third chip is to be joined to this newly formed unit. As with the joining of the mother and daughter chips, the unit can be joined to another chip. Thus, as shown in FIG. 123, a second daughter wafer is brought to, and its contact aligned with, the appropriate contact on the unit 12202, 12204.

Advantageously, because of the prior processing steps, the exposed side of the via on the top of the first daughter chip has the same composition as the top of the original rigid contact. Thus, for subsequent "daughter" wafers, the hybridization happens the same way as done for the first two wafers (i.e. align, penetrate, tack (optionally test) and fuse. The malleable material is pinned between the respective barrier layers and the post on the via penetrates into the malleable material). An important advantage to the process is thus, that the vias and the base hybridization are set up to operate with the same material system and the same process flow facilitating repeated stacking beyond the conventional stacked chip pairs one might find.

As a result, a mother wafer can be populated with one set of chips and then another (Daughter Wafer 2), and then another, etc. running the process in an identical fashion with each layer as needed using either a tack, fuse, tack, fuse approach or, in some cases, a tack, tack, tack, fuse all approach.

Figure 124:
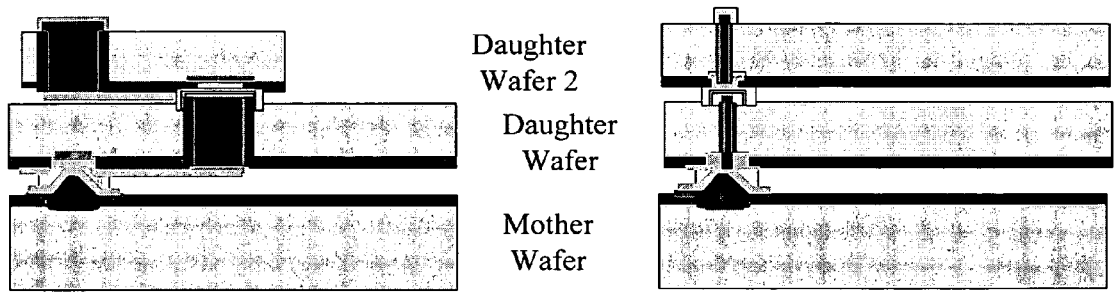
Figure 125:
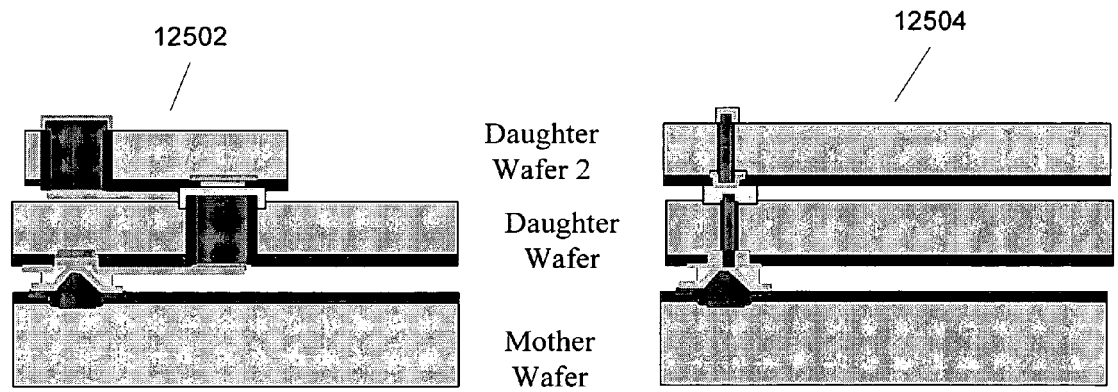

Thus, a second tack phase is performed on the second daughter wafer to bond it to the unit and, once competed, this newly formed larger unit can optionally be further tested and, if the second daughter chip is bad, it can be detached and replaced (FIG. 124).

Finally, when a permanent connection between the second daughter and the unit is desired, the fuse phase of the tack and fuse process is performed again (FIG. 125) to form a new, larger hybridized unit 12502, 12504.

After this step, the process can be repeated over and over to allow multiple further chips to be integrated, for example onto the "Daughter Wafer 2" or other chips present on the wafer (not shown). Because the electrical connections are made during each tack process, each chip needs to be aligned only to the one immediately below it, so a further advantage is achieved in that there is no accumulation of alignment errors as in other stacking techniques where all of the chips must first be stacked before an attempt at through-connection can begin.

Moreover, to the extent necessary, testing of each larger combined unit can be performed following each successive layer (and rework can be done, if required). Again, this provides a distinct advantage and dramatic cost savings and yield increase because, if dies were stacked in multiple layers, conventional techniques would likely require that the entire built up unit be completed before electrical testing could occur. Thus, only after an expensive unit has been created could a conventional part be tested and, if bad and rework were not possible, the only option would be to scrap the entire high cost unit. In addition, with conventional techniques, the risk of damaging the unit during build up or of wasting parts, for example, if the failure was on the first tier chip, dramatically increases.

In contrast, using one of the approaches described herein, a multi-stack configuration could be created with much less risk. Again, depending upon the particular case, the approach could be performed, as above, as a sequence of align, tack, fuse, align, tack, fuse, as many times as was necessary. Under conditions where the tack process had high enough strength, for example>=500 contacts, then the process could alternatively be performed as align, tack, align, tack, as many times as necessary and only after all of the chips were stacked vertically (and tested good if that option was used) would the fuse be performed. This second approach can further be effectively used when different numbers of chips will be stacked at different locations.

At this point it is useful to note that, through use of the post and penetration connections and the tack and fuse processes, the subsequent joining of the second daughter wafer (and subsequent wafers) to the unit can be performed without adversely affecting the prior-formed inter-unit connections. Indeed, we have surprisingly found that by using a tack, fuse, tack fuse, approach (whether or not intervening thinning occurs), the successive fuse steps actually cause the resistance of the previous connections to go down. This is significant because common wisdom would tend to suggest that a subsequent fuse would tend to weaken or degrade prior formed connections (this was especially true with the "well" connections described below).

Figure 103:
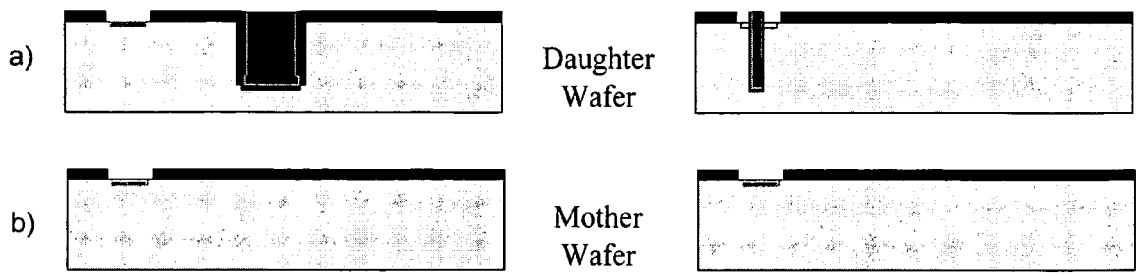

FIG. 126 through FIG. 139 illustrate in abbreviated form, a further variant that, to avoid redundancy, begins with the to-be-rerouted daughter wafer and corresponding mother wafer of FIG. 103. However, in this example, the daughter wafer is processed as illustrated in simplified form in FIG. 77a through FIG. 104, but now includes creation of a post to facilitate stacking of a second daughter wafer on top as with the previous example.

The process begins, starting with the wafer of FIG. 104, by photolithographically defining the area for the reroute on the daughter wafer (FIG. 126). Then, the barrier layer is applied to reroute the contact on the daughter wafer and a seed layer is applied to the mother wafer (FIG. 127). Then the photolith is stripped away (FIG. 128) and new photolithographic patterning is used to protect all but the area above the original contacts (FIG. 129). Next, the contacts are metallized (FIG. 130), the daughter wafer having a gold-tin (Au/Sn) alloy topped by a discrete layer of Sn and a cap of gold, and the mother wafer contact being plated with copper. Again, the photolith is stripped (FIG. 131) and the unwanted seed layer is removed by etching (FIG. 132). Finally, a cap of Ni/Au is applied to the mother wafer contact through electroless plating (FIG. 133).

Then, the wafers are aligned relative to each other (FIG. 134). Thereafter, the contacts can be brought together to form a post and penetration connection, a tack, optional testing, and possibly a fuse process can be performed to create a combined hybridized unit (none of which are shown here to avoid redundancy because they are described and illustrated elsewhere herein).

Now, since this example also involves addition of a second daughter wafer on top of this daughter wafer, the process proceeds as follows. First, the back side of the daughter wafer of the combined unit is thinned to expose the previously-formed back side contact (FIG. 135). Then the substrate is etched to elevate the post above the surface of the substrate (FIG. 136).

While this adds other steps post-hybridization, namely those involved with the thinning, if this is sufficient for the particular application the process can stop here. The advantage to doing so is that no further lithographic patterning or material deposition which each require more touch labor and are the major sources of yield-loss risk. Alternatively, if the time lag to joining to another element, the material, or other factors are such that oxidation could be a problem, a cap could be added (i.e. further processing would be required).

Figure 136:
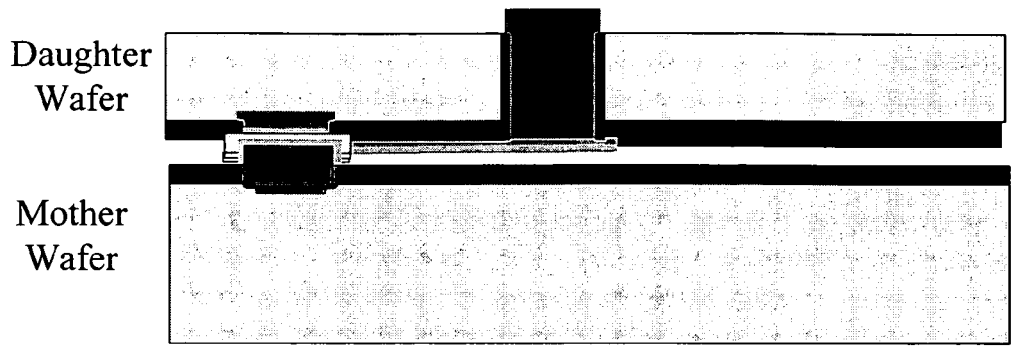
Figure 138:
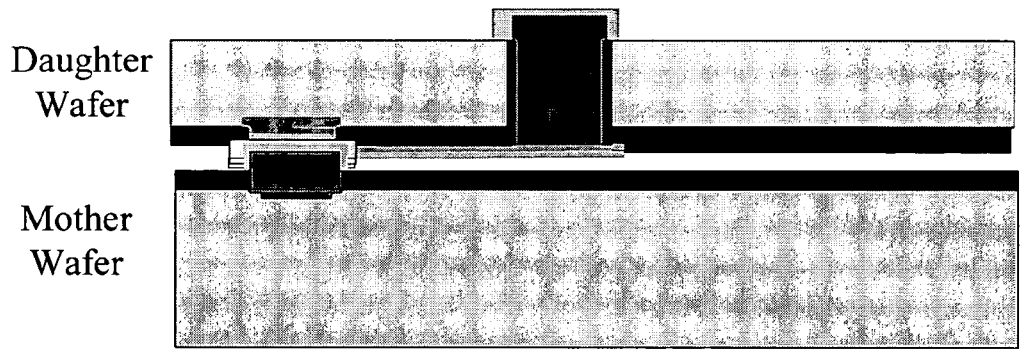
Figure 139:
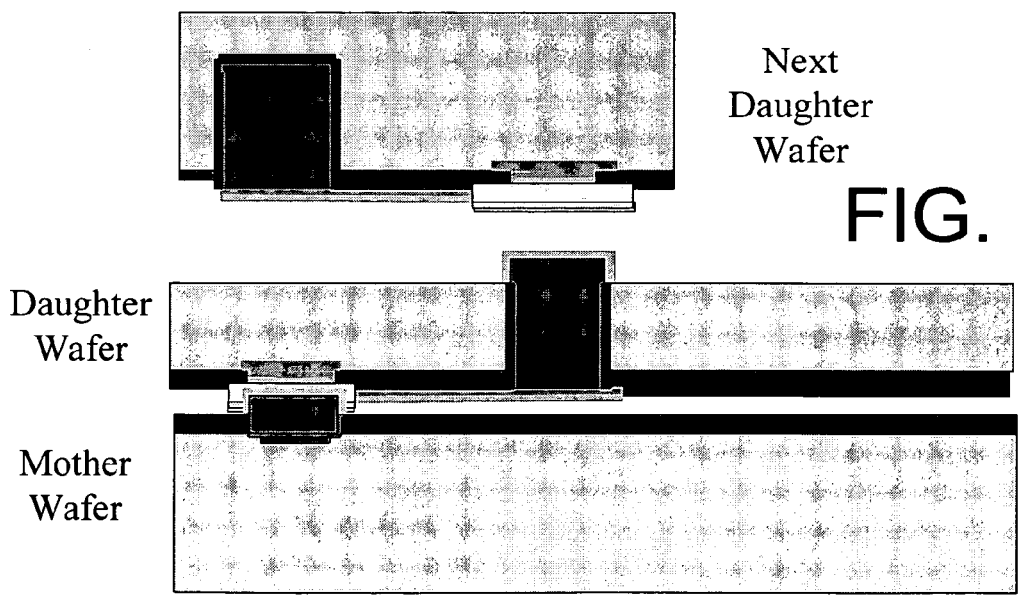
Figure 137:
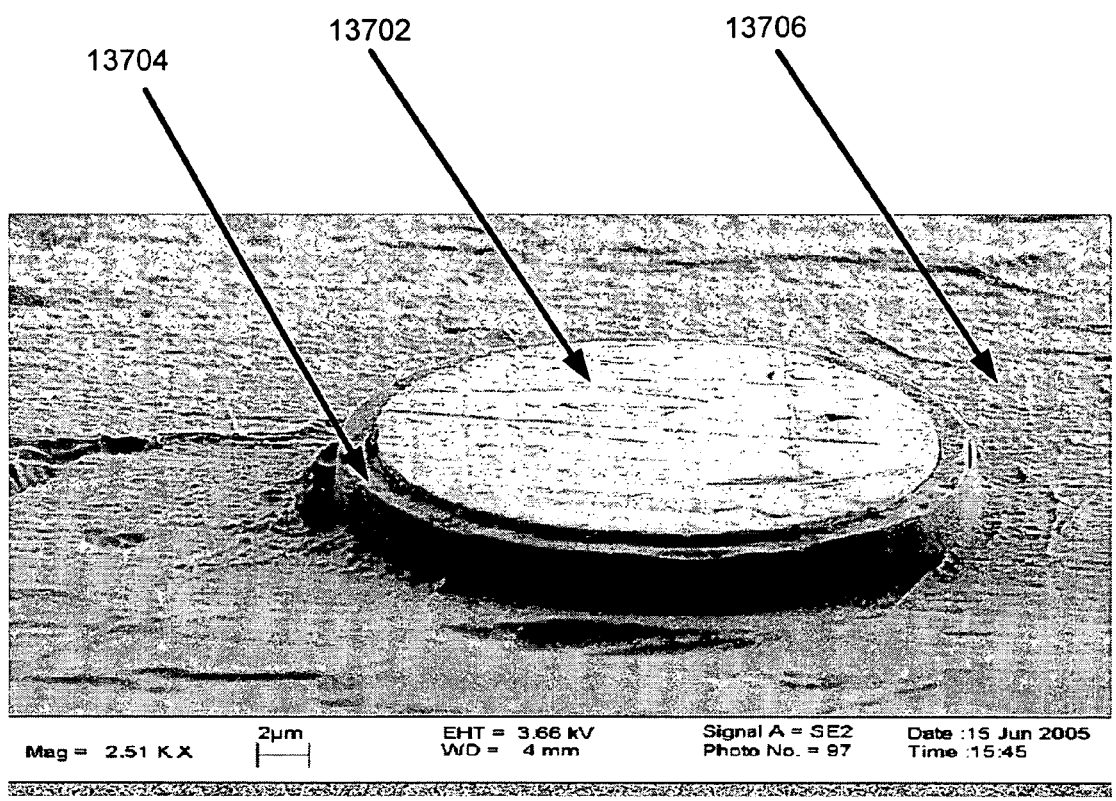

FIG. 137 is a photograph of an example contact following completion of the steps shown in FIG. 135 and FIG. 136. In FIG. 137, the post 13702, barrier 13704 and substrate 13706 are clearly visible.

Presuming that oxidation could be a problem, a cap is applied to the upraised portion of the post (FIG. 138), completing the back side contact formation process.

As with the first daughter wafer, the next daughter wafer is aligned over this back side contact (FIG. 139) at which point a post and penetration connection between the two can be formed, along with or followed by a tack process, etc.

In general, there are numerous materials that are suitable for use as the barrier. Such materials include, but are not limited to: Ni, Cr, Ti/Pt, Ti/Pd/Pt, Ti/Pt/Au, Ti/Pd, Ti/Pd/Au, Ti/Pd/Pt/Au, TiW, Ta, TaN, Ti, TaW, and W.

Suitable materials for the seed layer include, but are not limited to: Ni, Cu, Al, Au, W, Pd, and Pt.

Alternative suitable materials include, but are not limited to: Ta/Cu, TaN/Cu, Ni/Au, Ni/Cu, Ti/Pd/Au, Ti/Pd/Cu, Chromium, conductive epoxy that can be put down in a flat manner (e.g. through evaporation or spraying), or combinations thereof.

Note however, that all of the barriers on a chip or chip pair do not have to be of the exact same materials.

In general, where a barrier is used the material should have the following characteristics:

i) It should be compatible with the particular pad material (typical pads are Aluminum, Copper, and Gold);

ii) It should to be selected so that, if a wafer has coexisting small (<15 um) and larger (>50 um) IC pads, it can be placed onto that wafer with good yield on both; and iii) If an under bump metal is also used as the rigid material or acts as a standoff, then it should satisfy the above and also be able to be made several microns (>3 um) high.

In addition, it is desirable for the barrier material to be compatible with deposition on top of both IC pads and the top cover glass/passivation layer of the chip.

The use of a barrier also can provide one or more of the following advantages:

i) It can allow for high yield and increase reliability of the contacts for hybridization;

ii) If deposited both on top of the pads and the top coverglass/passivation layer of the chip, the barrier layer can later be used as:

1) a signal reroute material, 2) an electrical shield between the two chips to prevent crosstalk between them, and/or 3) a seed layer for any subsequent steps which can be performed by electroplating (e.g. formation of the rigid post and application of the malleable materials);

iii) increased shelf-life of the daughter material because the barrier acts as a cap to prevent or retards oxidation;

iv) it can be pre-patterned to act as a reroute or a shield;

The alternative materials noted above can provide certain advantages in some implementations because:

i) the barrier capabilities of Ta & TaN are believed to be superior to that of TiW, ii) a nickel-based process allows the UBM and subsequent rigid material to be one and the same, thereby simplifying the process, iii) alternatives which do not leave copper exposed have longer shelf-life so they can be more compatible with certain manufacturing processes, iv) if no subsequent electroplating steps are needed (e.g. for deposition of a rigid or standoff member on the daughter wafer), then any of these materials could be just patterned over the pads and reroute or shielding areas, thereby eliminating the need to perform a subsequent seed and etching step to define these regions.

With respect to the use of barrier layers, in many variants, it is important to ensure that: 1) the appropriate metals that are supposed to interact do interact; 2) those same metals interact in a way that the final composition after interaction is correct, 3) other metals used in the stack (i.e. rigid and standoff) do not interact so as to contaminate the metals, and 4) the barrier will allow for multiple high temperature cycles at temperatures up to and above both the package solder conditions (e.g. Pb/Sn at the appropriate temperature or some lead-free solders operating typically near about 240° C. to about 270° C.) for the tack part of the process and temperatures for the fuse part of the process which can typically be between about 300° C. to about 350° C. The barrier maintains the integrity of the attachment material by preventing intermixing of metals that should be kept separate for better integrity of the bond.

Figure 140:
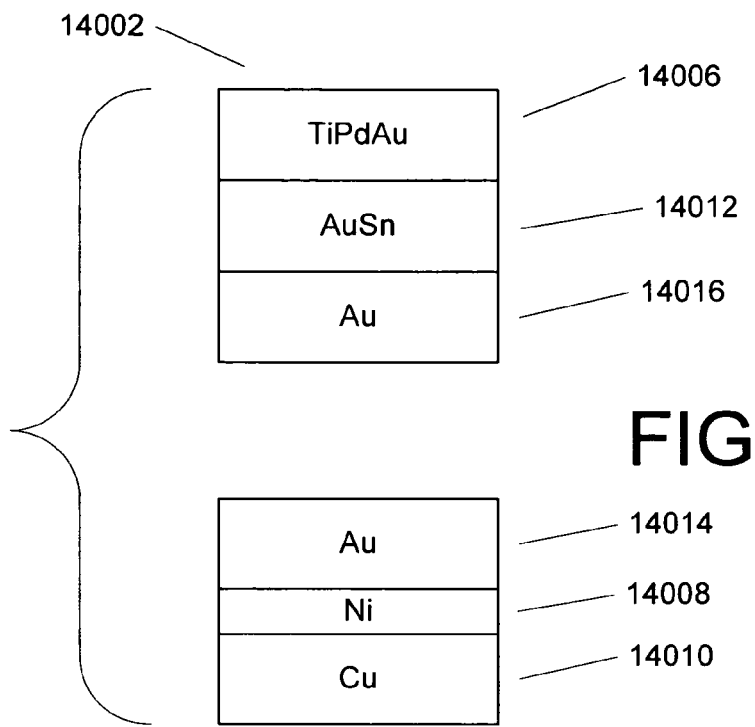
FIG. 140 which illustrates, in simplified form, a daughter wafer contact and a mother wafer contact immediately prior to the tack phase.
Figure 141:
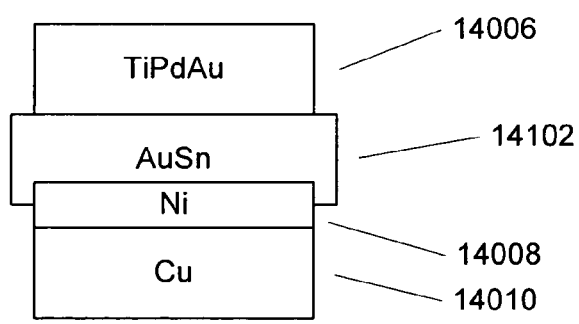
FIG. 141 shows, in simplified form, the contacts of FIG. 140 after the fuse process is complete.

This is shown, by way of example, with reference to FIG. 140 which illustrates a daughter wafer contact 14002 and a mother wafer contact 14004 immediately prior to the tack phase. As shown, the daughter wafer contact's barrier layer 14006 is Ti/Pd/Au and the mother wafer contact's barrier layer 14008 is Ni. The "rigid" material 14010 on the mother wafer is copper and the malleable material 14012 on the daughter is Au/Sn. In addition, a cap 14014, 14016 on each is made of gold and serves the dual-purpose of preventing oxidation of the respective materials on either side, and permitting the initial tack process to occur easily since the two metals in initial contact are comprised of the same material. Note that, in actuality in most variants, the cap 14014, 14016 layer will typically completely surround the other materials, however for simplicity of illustration, it is merely shown on top. FIG. 141 shows, in simplified form, the same contacts after the fuse process is complete. After the final combination of metals is achieved, the two gold cap layers have intermixed with the Au/Sn layer to form an Au/Sn alloy 14102 while the nickel and Ti/Pd/Au act as barriers to prevent intermixing of the Au/Sn with the copper and the pad on top of the Ti/Pd/Au respectively. Thus, the fused Au/Sn 14102 is "trapped" between these two barrier layers 14006, 14008 keeping the composition of the Au/Sn consistent and uniform even over a number of subsequent high temperature steps.

In contrast, for example, if the Nickel barrier layer 14008 were absent, then the Au/Sn 14102 would be in direct contact with a very thick layer of copper 14010 (in an actual implementation of the example, it would be over 60% of the thickness of the Au/Sn. As a result, under temperature, the Sn would diffuse into the copper and then the resulting alloy would begin to change dramatically in properties. For example, copper has a melting point of 1084° C. As the Sn initially diffuses into the copper, the top of the rigid post would be a Sn-rich mixture which would have a melting point much lower (e.g. a 97% Sn 3% Cu mixture has a melting point around 230° C.). As the Sn diffuses further into the copper, it winds up having a lower melting point than the Au/Sn and the copper post ceases to be the rigid member in the tack and fuse process. Equally importantly, the copper 14010 would leach Sn from the Au/Sn 14102 resulting in an increase in the temperature at which it becomes malleable. Thus, an increasingly softer rigid member would be trying to penetrate into an increasingly harder malleable member. This would affect contact strength, uniformity, and ultimately the density of the contact spacing that could be used. Moreover, the effect would be cumulative with time. Depending upon the length of the time over which the fuse process occurs, the composition and the performance of the contact could vary greatly. This would also be the case if a contact underwent multiple fuse cycles, for example if chips were stacked multiple-high vertically. The bottom chips in the stack would have vastly different and inconsistent behavior relative to later fused chips in the stack. By using the barrier metals, the Au/Sn is largely confined and thus can maintain the same composition and characteristics through multiple fuse cycles. Note that even with a barrier some interdiffusion can occur, for example between the Au/Sn and the Ni, but the rate of this diffusion is far, far slower than would be the case with the Cu so it can be neglected for up to a reasonably large number of stacked chips—e.g. 100 or fewer. Thus, whatever materials are used for the particular implementation, the barrier should typically be a constituent of the final joining alloy to avoid or minimize adverse interdiffusion.

Figure 142:
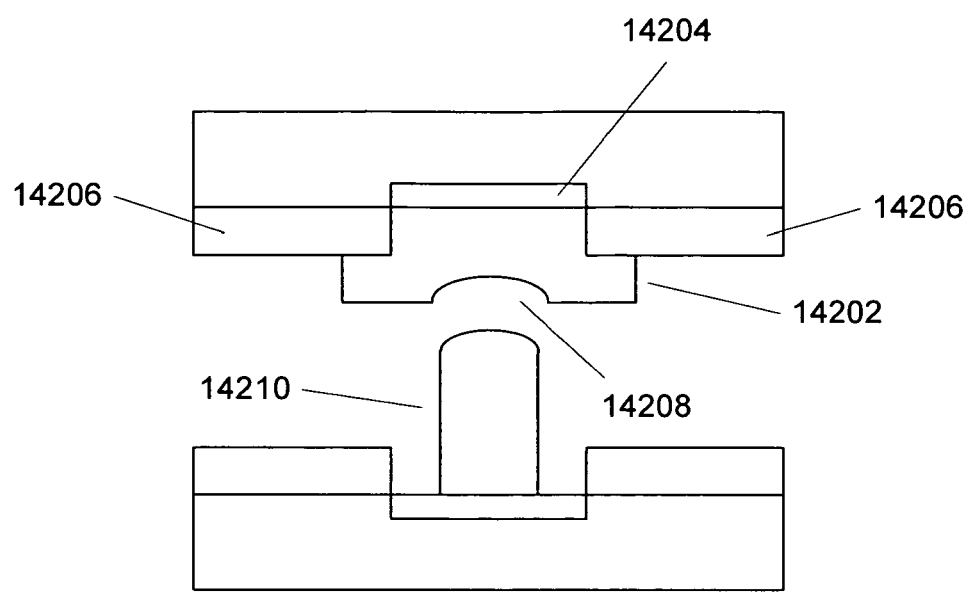
FIG. 142 illustrates a profiled malleable contact.

In the general post and penetration approach, the two mating contacts have been shown as largely flat—although this is neither a requirement nor a necessarily desirable configuration for all applications. Since the quality (or lack thereof) of an electrical connection between two points directly affects the resistance of the connection, and poor connections reduce yield, minimizing of poor connections is desirable. Advantageously, the post and penetration approach can (without increasing the "footprint" of either contact) be readily adapted to reduce the risk of a high resistance connection being created, thereby increasing yield. The approach involves improving penetration and increasing the contact surface area by creating a pattern or profile on the malleable or the penetrating contact.

Where the relative sizing makes the malleable contact larger than the rigid contact, if the malleable contact will be directly over the IC contact pad, the malleable contact can be profiled almost automatically. By patterning the metal for the malleable contact in an area that is larger than the opening for the IC contact pad on which it is built, a natural depression will be formed near the center of the contact, due to the relative height differential between the cover glass on the IC and the IC pad itself. FIG. 142 illustrates such a profiled malleable contact 14202. As shown, the malleable contact 14202 has been formed to be wider than the IC contact pad 14204. As a result, the elevation of the cover glass 14206 relative to the contact pad 14204 naturally causes a depression 14208 in the malleable contact 14202. Advantageously, this natural depression 14208 makes the malleable contact 14202 better suited to receive a rigid contact 14210 and even to aid with alignment if the rigid contact 14210 is meaningfully close to the size of the depression, owing to the natural shapes of each.

Profiling the rigid contact reduces the initial contact area thereby effectively increasing applied force per unit contact area which improves penetration, while the increase in surface area afforded by the walls of the profiles in the depth direction ensures that sufficient area of electrical and mechanical contact is achieved.

For purposes of illustration, representative, non-limiting, illustrative examples of some of the myriad of possible mother contact profiles are shown in top and cutaway side views along section lines A-A in FIGS. 143A through 143H and FIG. 143W for contact pads of circular, hexagonal, cross and square shapes, and FIGS. 143I through 143P for contact pads of complex shapes like an inverted truncated section of a pyramid base with a cube on top (FIG. 143K, FIG. 143L), an inverted truncated pyramid base section alone (FIG. 143M, FIG. 143N) or a post-in-a-well (FIG. 143O, FIG. 143P), as well as the example shapes illustrated, in side view only, in FIG. 143Q through FIG. 143V, it being understood that similar approaches can be used for contact pads that are ring-shaped or made up of a stack of "tiers" in a pyramidal or some other three dimensional shape, for use with the two- or three-conductor variants described above or any other simple or complex combinations of shapes and solid geometry sections.

Figures 1, 143:
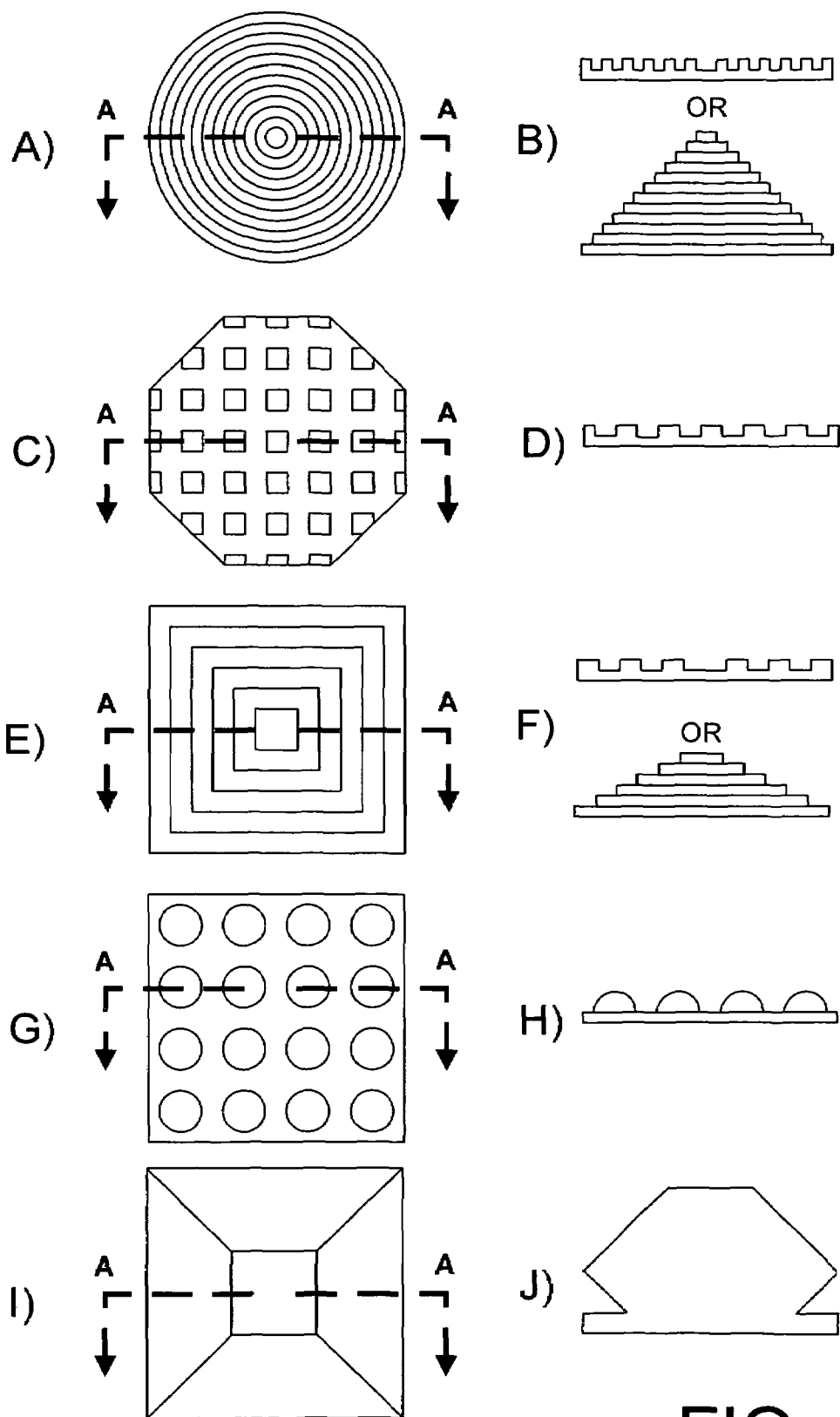

Other alternatives can use "wings" at the base of the contact, such as shown in FIG. 143V, which increase surface area by simply providing additional lateral area for contact.

Still further, it may be desirable to use an asymmetrical or elongated contact (i.e. different widths in different directions in order to absorb strain in a particular direction such as shown in FIG. 143X. Alternatively or additionally, a group of such asymmetric or elongated contacts can be used together such that they are symmetric around a zero stress point but thereby allow for directional variations in any of several directions such as shown in FIG. 143Y. Thus, in some respects the configuration of FIG. 143Y is a more sophisticated version of the contact of FIG. 143T.

In addition, the contact profiles could include undercuts such as shown in FIG. 143J, FIG. 143L, FIG. 143N, FIG. 143Q, FIG. 143R, FIG. 143S and FIG. 143U which would give the contact additional strength because it provides an area for the malleable material to "grab" to. Similarly, a post can be patterned to have a wider facing surface area or overall surface area to ensure sufficient area of contact even with an imperfect connection. In addition, such as shown in FIG. 143T, a given contact can itself be made up of multiple contacts, with the individual parts being electrically independent. Alternatively, some or all could be electrically connected to each other. This variant provides both a larger surface area, for better shear strength, and a redundancy effect so that, if one or more of the sub contacts are misaligned, the overall connection can still be made and have sufficient contact area to carry the required current.

It should be further noted that the particular shape of the contact pad, or the shape or configuration of the profiling used is, per se, irrelevant—the important aspect being the use of some profile to increase the available contact surface area while providing an appropriate shape to bond to for the particular application, not the particular contact or profile shape used, subject to the engineering requirement that the total current requirements for the contact can be handled by the minimum acceptable amount of contact and the particular profile used increases the surface area by an amount sufficient to likely achieve the desired objective relative to the likelihood that a bad connection will result if profiling is not used. Moreover, although discussed in connection with a rigid/mother contact, malleable/daughter contacts that are analogously profiled could be used. However, in that instance, the contact configuration would most typically involve a rigid well configuration on the mother wafer.

Figure 144:
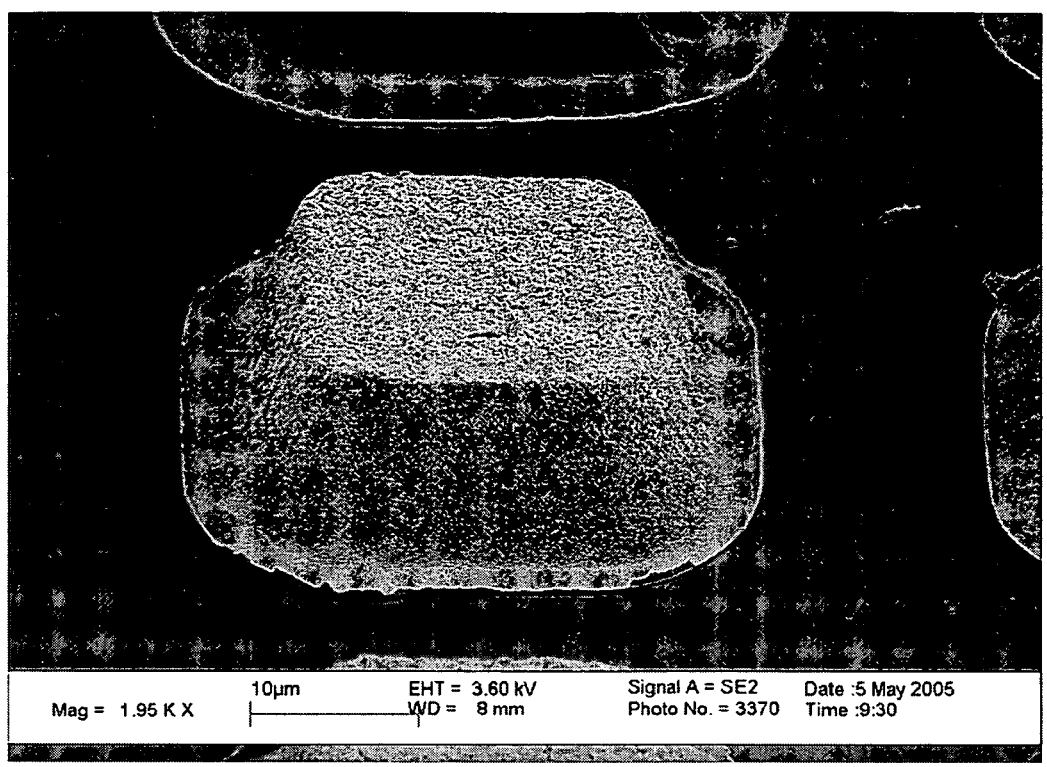
FIG. 144 is a photograph of an alternative example profiled malleable contact.

FIG. 144 is a photograph of an alternative example profiled malleable contact having a shape like a pyramid base that is rounded at the corners and is slightly dished or recessed on top.

Figure 145:
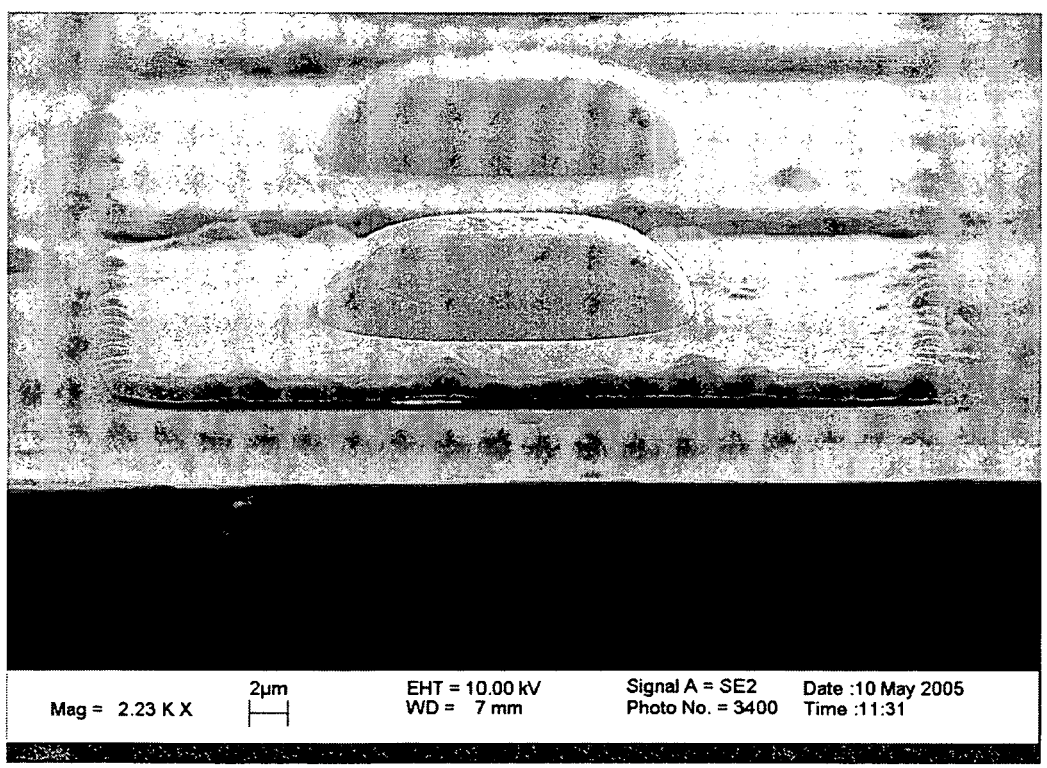
FIG. 145 is a photograph of a profiled rigid contact designed to penetrate the malleable contact of FIG. 144.

FIG. 145 is a photograph of a profiled rigid contact designed to penetrate the malleable contact of FIG. 144.

The above is briefly illustrated with reference to FIGS. 146A and 146B which show portions of a pair of chips 14600, 14602 similar to those of FIG. 47. However, unlike the chips of FIG. 47, one chip 14602 has a profiled rigid contact 14604 as opposed to the non-profiled rigid contact of FIG. 41. The other chip 14600 has a malleable contact 14606 similar to the malleable contact shown in FIG. 47. When the two contacts 14604, 14606 are brought together, as shown in FIG. 146B, a post and penetration fit is formed. However, unlike the contacts of FIG. 47, here the individual mini posts of the profiled contact 14604 each penetrate the malleable contact 14606 and thereby provides a greater amount of surface to surface contact area for the diffusive connection than would be available for a non-profiled contact of the same "footprint" joined to the malleable contact 14606 using the same amount of pressure. Moreover, some implementations of the profiled contact provide a further advantage in terms of minimizing risks associated with imperfect connections. This independent aspect is also illustrated in FIG. 146B whereby, despite the fact that the connection between the two contacts 14604, 14606 is less than ideal (i.e. there are gaps 14608 near the valleys 14610 of the rigid contact 14604) the added contact area provided by the profile sides 14610 on the rigid contact 14604 means that the connection will be acceptable.

Stated another way for purposes of explanation, presume that, if the rigid contact 14604 was not profiled, the contact area would have been equal to the minimum contact area possible to meet the total current requirement for the contact. In such a case, if any portion of the contact did not result in a good connection, the connection would likely be unacceptable and could result in premature failure during use or complete unusability. In contrast, in this example, the rigid contact of FIG. 146 is profiled. Assuming, as shown in FIGS. 146A and 146B, that the profile increases the contact surface area by a factor of at least two (an easily achievable profile), if only half of the overall surface area creates a good connection, the connection will still be able to meet the minimum total current requirement. Thus, as shown in magnified form in FIG. 146B, although there are areas where no contact is made, those areas are much less than a quarter of the necessary contact area needed for a good connection, so the contact is still acceptable for use.

Alternatively, a profiled contact can be created by using multiple small rigid contacts in conjunction with one or more larger malleable contacts to create a single, overall connection. For example, one could have an electrical connection made up of three sets of contact pairs where each individual contact pair is made up of multiple rigid contacts and a single (or multiple) malleable contacts.

A further variant of the profiling concept involves the creation of a "well" designed, depending upon the particular implementation, to assist or improve alignment, constrain the malleable material, or assist in forming a good connection. As shown and described in connection with the following figures, these well-attach variants provide further benefits and advantages to particular implementations.

Figure 147:
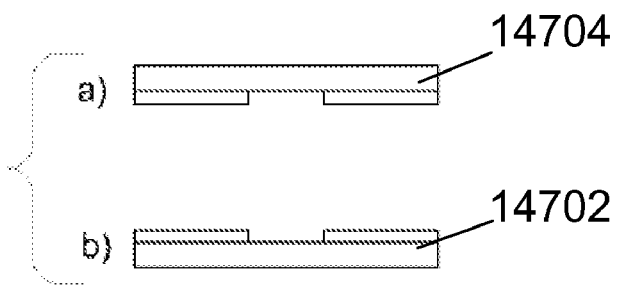
FIGS. 147 through 152 illustrate one variant process for implementing the well attach concept.
Figure 148:
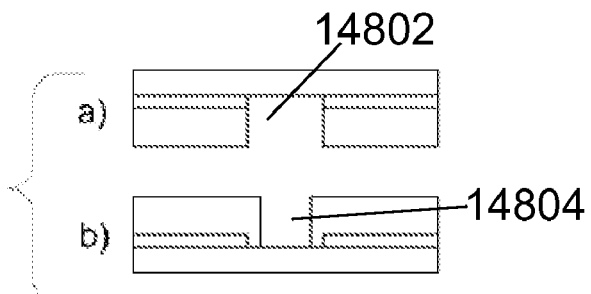
Figure 149:
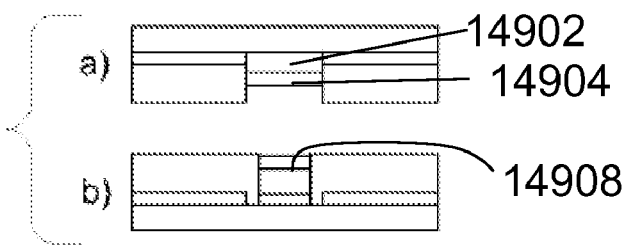
Figure 150:
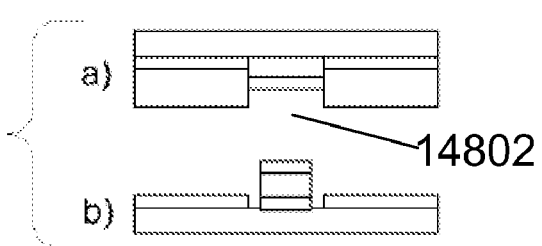
Figure 151:
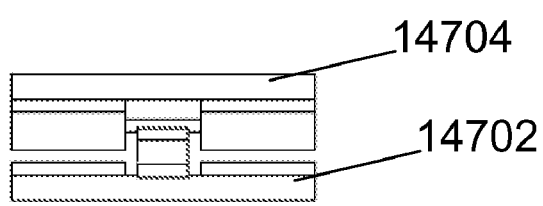

FIGS. 147 through 152 illustrate one variant process for implementing the well attach concept for a mother 14702 and daughter 14704 wafer contact pair (FIG. 147). In this variant, the cover glass openings of the daughter wafer are used as a template and are built up into a permanent well 14802 using, for example, polyimide, SU8, other epoxies, glasses, and/or dielectrics (FIG. 148a). On the mother wafer 14702, a similar approach is used, except the well 14804 does not encompass the entire area bounded by the cover glass (FIG. 148b). The malleable material 14902 and the (optional) malleable cover material 14904 are then inserted in the well 14802 of the daughter wafer 14704, taking care to not fill the well 14802 to its full depth (FIG. 149a). Similarly, the rigid material 14908 is built up from the pad surface of the mother wafer 14702 (FIG. 149b). The well 14804 on the mother wafer 14702 is then removed (FIG. 150), but the well 14802 on the daughter wafer is kept in place.

Figure 152:
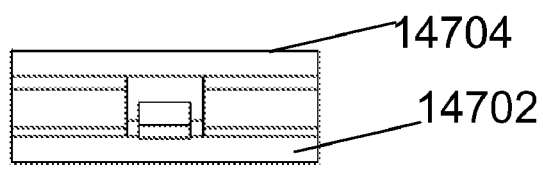
Figure 153:
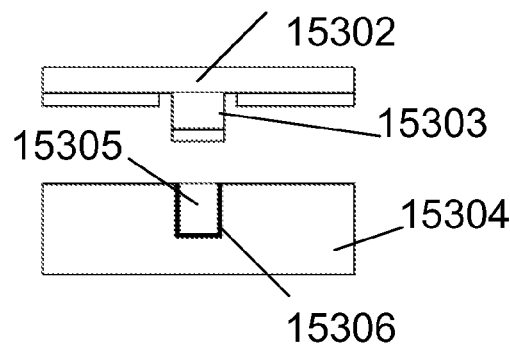
FIGS. 153 through 156 illustrate, in simplified form, classes of reverse well variants.
Figure 154:
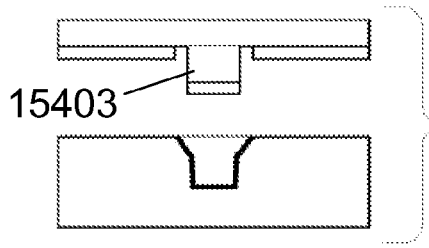
Figure 155:
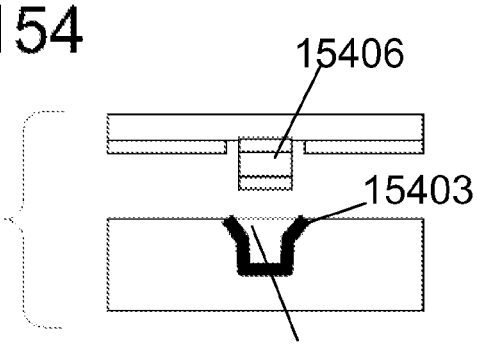
Figure 156:
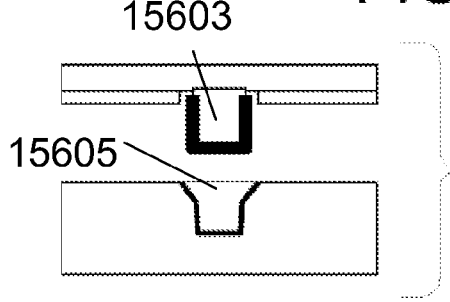

As a result, the daughter wafer's well 14802 will constrain the bonding material (e.g. the covers 14904 and malleable materials 14902) during the penetration process, as well as during the tack (FIG. 151) and fuse (FIG. 152) phases of the joining process. It also can establish a depth limit because the well can have a height such that it impacts the other wafer or some surface thereon before anything else does (FIG. 152).

Advantageously, through this approach, the well can allow the cover or cap materials and or the malleable material itself to be of a material that can be brought to a semi liquidus or even true melting point or, at least to a point where it becomes flexible enough so that that it would ordinarily spread. This is useful for situations where contacts are positioned close together and the flexing that typically occurs during melting will cause the materials to bulge laterally in an effort to reduce surface area. For contacts where the spacing between edges of the contacts without the wells is less than or equal to about 3 times the height of the malleable material, pre integration planning for such use may be desirable (e.g. if the malleable material is 8 microns high and the separation between the contact edges is less than or equal to about 25 microns this approach should be considered).

In addition, if brought too close to their melting temperature, some materials can "wet" a wafer surface and, rather than just spreading, they can creep along a surface. In the case of a malleable contact, left unaccounted for, such action can cause electrical shorting between adjacent contacts. Advantageously, by keeping these materials in the well, any wetting creep will be counteracted by surface tension and keep the material in the well; preventing it from shorting adjacent contacts.

The well can also be critical in some implementations, for example, if a post-joining process will be performed that could cause the combined contact to melt. For example if a contact were made at the appropriate temperature for the rigid-malleable contact to be made, and then the combined chip needed to be soldered into a package but the temperature required for the soldering step was higher than the melting temperature of the contact as it exists at completion of the fuse phase, then the contact would stay in-tact during the process because the melted material would be encapsulated by the well and re-attach upon cooling.

Moreover, the well approach is well suited to making multiple densely packed connections because the wells are patterned using semiconductor lithography techniques rather than conventional mask printing or soldering techniques. In alternative variants, a "reverse" of the well process described above can be used. In these variants, the process is performed so that the well is not filled with the malleable metal. These variants fall into one of four classes respectively illustrated in FIG. 153 through FIG. 156.

Class I (FIG. 153): With this class of well connection, the daughter wafer 15302 contains the malleable material 15303 and the mother wafer 15304 has a rigid well 15305 (shown as etched in the semiconductor wafer). The well 15305 is coated on the walls with simply the diffusion layer metal 15306, for example, Au. To join the two wafers, 15302, 15304, the malleable material 15303 on the daughter wafer 15302 is inserted into and fits inside the well 15305 such that it deforms. Through addition of temperature and pressure during the tack phase causes the malleable material 15303 and diffusion layer 15306 form the tack connection. During the fuse phase, the malleable material 15303 of the daughter wafer 15302 and the diffusion layer 15306 of the mother wafer 15304 interdiffuse to form the metallic bond. Depending upon the particular implementation, the malleable material can be slightly larger than the well or at least contain more volumetric material in order to make the fit between the two wafers strong during the tack phase and to ensure there are no voids after fuse phase is complete. Note that this class violates the mother/daughter convention.

Class II (FIG. 154): This class is similar to class I, except the well or the malleable "post" 15403 are formed into a shape in order to make alignment between the two automatic or easier. Note that this class also violates the mother/daughter convention.

Class III (FIG. 155): With this class, the post 15406 is the "rigid" material and the well 15405 is coated with the malleable material 15403 to some specified thickness. This is like the basic profiled malleable contact approach described above except the malleable material 15403 has a more pronounced recessed profile than the mere indentation that naturally resulted from the height differential between the cover glass and IC pad. Again, it is desirable that the dimensions of the post 15406 and well 15405 be selected such that there are no voids after integration (i.e. completion of the tack and fuse processes).

Class IV (FIG. 156): With this class, the well 15605 is coated with the diffusion layer (similar to classes I and II, and the post 15603 is made of the rigid material, but it is also coated on its outside with a layer of the malleable material. This makes the situation like classes I and II, except the cost of the daughter wafer can be lower if the material cost of the rigid material is less than that of the malleable material, for example, where the rigid material contains mostly copper while the malleable material contains mostly gold.

Figure 158:
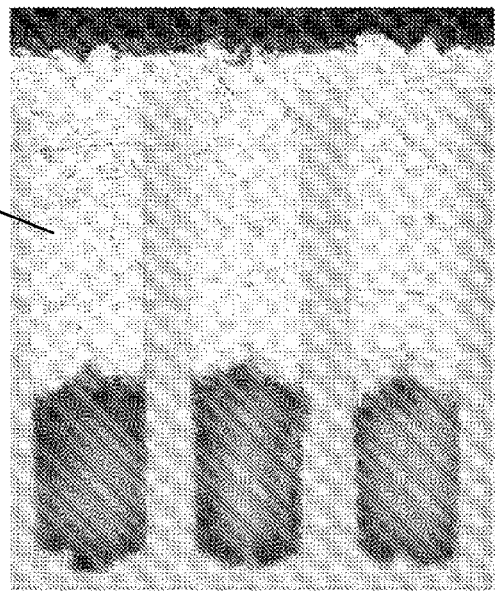
FIG. 158, is a photograph of a via dimilar to those of FIGS. 157A and 157B but not filled all of the way to the bottom.
Figure 157A:
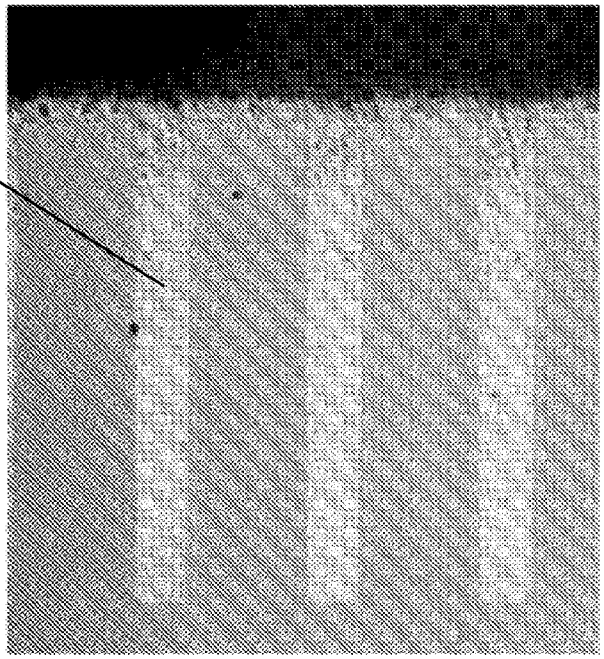
FIGS. 157A and 157B are, respectively, photographs in longitudinal cross section of a set of 15 micron diameter vias extending 135 microns deep and 25 micron diameter vias extending 155 microns deep.
Figure 157B:
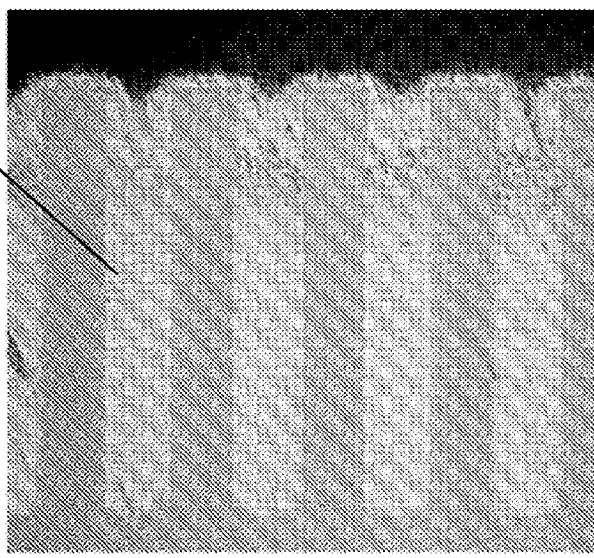

Advantageously, with the approaches described above the well can either be built up using, for example, a dielectric or it can be recessed (i.e. made by etching into the semiconductor). Still further, the well can be a byproduct of the via formation process. For example it can even be part of a via that is not completely filled. FIGS. 157A and 157B are, respectively, photographs in longitudinal cross section of a set of 15 micron diameter vias 15702 extending 135 microns deep and 25 micron diameter vias 15704 extending 155 microns deep. FIG. 158 is a photograph of a similar via 15802 formed but not filled all of the way to the bottom. As a result, by thinning the back side of the wafer until the bottom of the via is exposed, a natural well will be formed. Left as is, this well can be used for a class I well. Alternatively, a flare or taper can be etched at the mouth of each, resulting in a class II well.

Figure 159:
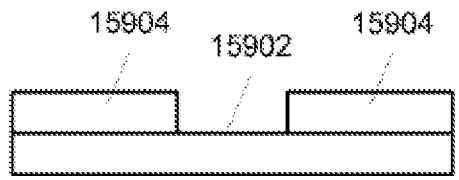
FIGS. 159 through 167 illustrate a further variant of a Class II-type rigid well attach approach.
Figure 160:
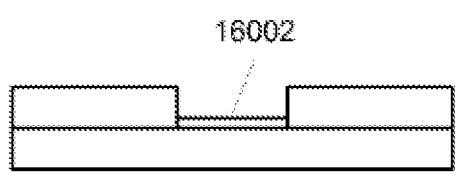
Figure 161:
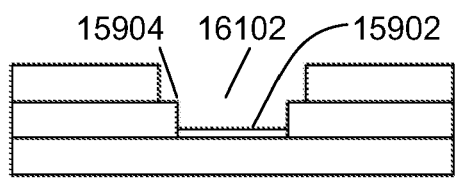
Figure 162:
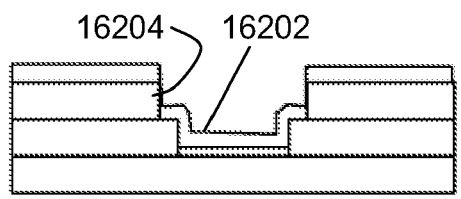
Figure 163:
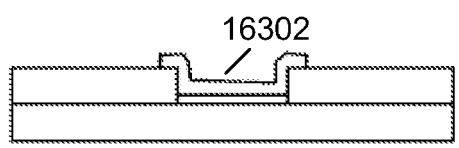

FIGS. 159 through 167 illustrate a further variant of a Class II-type rigid well attach approach. This version of the rigid hole well again starts with a fully formed wafer and specifically one of its pads 15902 exposed through the cover glass 15904 (FIG. 159). Optionally first, a barrier layer 16002 is deposited over the IC pad 15902 (FIG. 160). Then photoresist patterning exposes an area 16102 about the IC pad 15902 that also includes some of the cover glass 15904 (FIG. 161). The well is formed automatically by the process of evaporating metal 16202 into the recess formed by the cover glass on the IC (FIG. 162). This makes the patterning easier than with some of the other rigid well hole processes. Stripping of the photoresist 16204 removes the excess, unwanted metal leaving behind a fully formed rigid well 16302 (FIG. 163).

Figure 164:
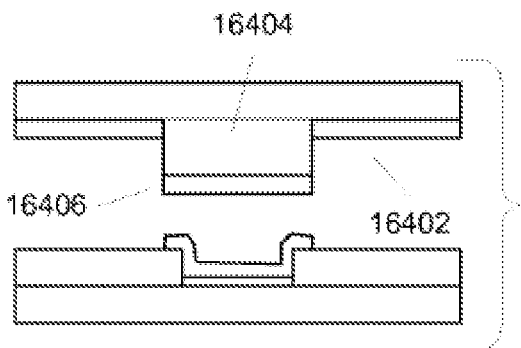
Figure 165:
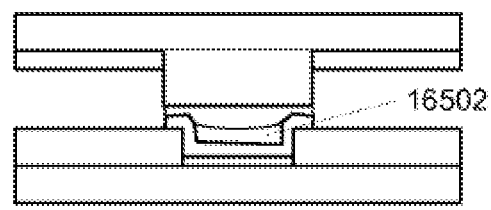
Figure 166:
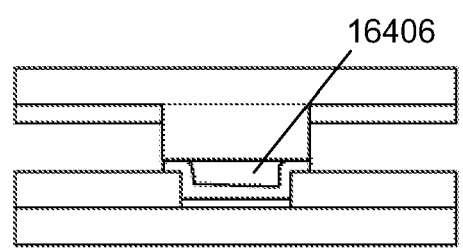
Figure 167:
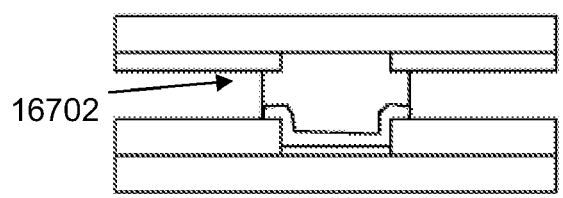

As with the other class II variants, this variant violates the daughter/mother convention because the wafer 16402 bearing the counterpart to the wafer of FIG. 163 does not have a rigid "post" in the sense previously described, but instead has a standoff 16404 coated, in pertinent part, with a cap 16406 of malleable material (FIG. 164). The hole in the rigid formation itself allows penetration of the malleable portion on the standoff (FIG. 164) with a good fit and adequate surface area. As shown in FIG. 165, with the application of heat, the malleable cap wets and attaches to the post. As shown in FIG. 166, during the tack phase, the malleable cap 16406 becomes liquidus or semi-liquidus, and will fill the void 16502 of FIG. 165. This is desirable because trapped gas in the void could render the contact potentially unreliable due to expansion and contraction during thermal cycling. When the malleable cap fills the void during the tack phase or at the start of the fuse phase, then the fuse phase allows the malleable cap to diffuse with the rigid cap & the malleable material forming the final fused connection 16702 (FIG. 167).

A further alternative well attach variant can be formed using the profiled contacts of FIG. 144O, FIG. 144P or FIG. 146. In this variant, the well is formed by the pattern of the rigid material so that it forms a wall over which liquidus material, should there be any, can be prevented from passing. Thus, this approach allows for use of processes and allows very dense connections, with and without use of the rigid-malleable paradigm because, properly designed, the well will contain any liquidus material or prevent the lateral bulging of the malleable material from going too far, in either case allowing for high yield at high contact density.

Figure 168:
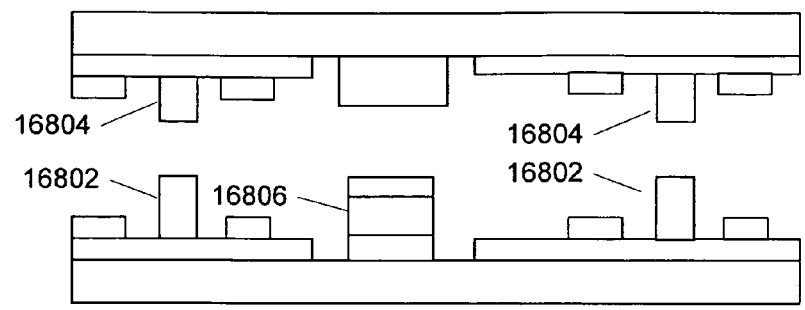
FIG. 168 through FIG. 170 show a further variant of the well attach approach in which the chips are attached to one another by separate remote contacts.
Figure 169:
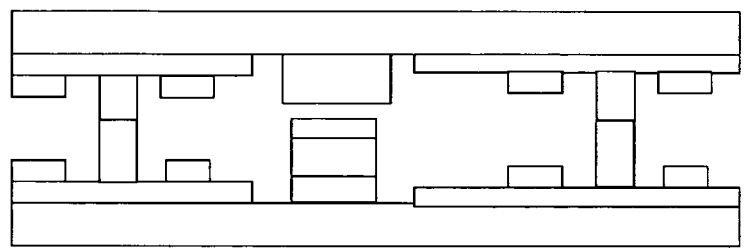
Figure 170:
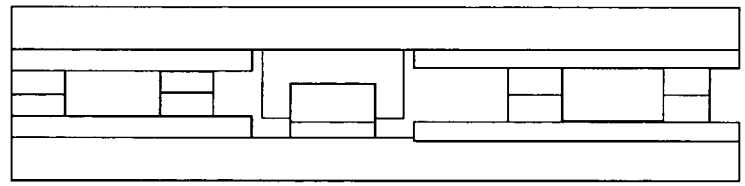

FIG. 168 through FIG. 170 show a further variant of the well attach approach in which the chips are attached to one another by separate remote contacts. This approach is advantageously applicable in at least three situations:

1) where it is undesirable to place a cover material over the malleable material because it could adversely affect the way the materials bond;
2) where the attachment would like to be done at a very low temperature (or, in some cases, even room temperature) to enhance the speed of the process, for example, if the wafers each had very flat surfaces, then van der Waals forces could attach the chips or dangling atomic bonds could create covalent bonds allowing connections to be made by insulators such as oxides, nitrides or other dielectrics (this avoids or reduces waiting time for parts to come up to temperature and potentially decreases the cost of capital equipment since a machine with temperature capability would not be necessary); and
3) where it may be desirable to have the attach materials reflow (turn liquidus) in order to self-center the chips for the subsequent fuse process without having the primary contacts turn completely liquidus since, as noted above, that could cause running or creep and thus would limit the potential density of the actual contacts (this also allows for cheaper equipment to be used to do the attachment since that equipment would not have to have the alignment accuracy necessarily needed by the high pitch of the primary contacts because the remote attach contacts could indirectly provide that level of accuracy.

By way of example, the remote contacts 16802, 16804 could be made out of a material like indium, which is soft at room-temperature and thus, could be made to attach merely by the use of pressure squeezing the parts together. Alternatively, some other low temperature material could be used which can provide adhesion without high temperature, the particular material being largely unimportant, provided it does not adversely affect the whole (i.e. introduce shorts, etc.). For example, a lower temperature solder (less than 250° C.) could be used. If put into its liquidus state, the surface tension could align the two chips together so that the attach process can be done by cheaper pieces of equipment that have poor alignment accuracy, for example, a conventional pick-and place machine. Still further, the remote contacts could be configured so that, if very flat, simple covalent bonding aligns and holds the chips together.

Figures 171A, 171B:
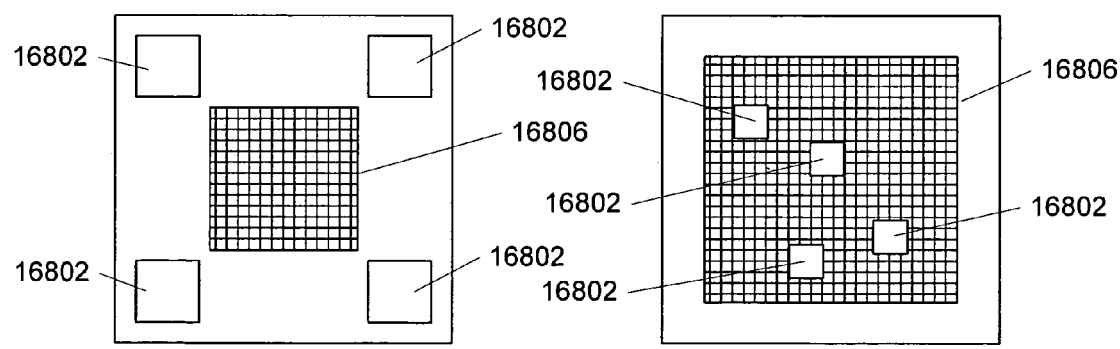
FIGS. 171A and 171B illustrate top views of alternative remote contact variants.

In this process, as shown in FIGS. 168 through 170, separate contacts are used for connecting the devices during an initial attach phase (pre-tack phase). FIGS. 171A and 171B illustrate top views of alternative remote contact variants similar to those of FIGS. 168 through 170. These separate contacts can be completely remote from the electrical contacts, for example at or about the periphery of the individual chips (FIG. 171A) or can be interspersed with the actual electrical contacts 16806 (FIG. 168, FIG. 171B). In addition, and advantageously, the remote contacts as described herein are compatible with all variants of the primary contacts and they can be much larger in height and width than the primary electrical contacts, since they do not have to be on a close pitch. Preferably, they should be high enough so that the primary contacts do not have to touch during the attach process (FIG. 169). It should be noted that this attach or adhesion process does not have to be high strength. It is the subsequent fuse process of the primary contacts which can provide the strength for the joined chips. FIG. 170 shows the wafers of FIG. 169 following the fuse process, the result of which is that the primary contacts are permanently combined together in a high strength bond.

In general, and as with the tack phase, the fuse phase would occur at a higher temperature and/or pressure than is required for the attach or adhesion phase of this variant.

Again, as with materials that could turn liquidus or semi-liquidus during the tack and fuse phases, compression of the attach contacts can cause them to spread laterally and/or heating of the material could cause it to turn liquidus and want to spread out, potentially causing electrical shorting if it spread to the primary contacts. Thus, one advantageous option is to apply the principles of forming "well"-based electrical contacts described herein to the remote contacts. In this manner, they can be allowed to become liquidous or extend laterally during pressure application or at temperature during the tack or fuse process, without contaminating or shorting out the primary contacts.

Advantageously, the remote contacts can also be configured to enable testing of the two chips before bonding the actual contacts together, irrespective of, or prior to, joining in the tack and fuse phases. If the chips are designed so that the location of the remote contacts are also the location of special pads that allow communication between the chips to occur, for purposes of testing whether the combination of the particular individual chips is operational, then if either or both of the chips were not operational (i.e. non-functional or functional but out of specification), the chips could be pulled apart and a new, chip attached.

Moreover, through proper design, this pre-tack, pseudo-hybridization testing approach can be very valuable since it can be incorporated into a design, whether joining will occur on a wafer-to-wafer, chip-to-wafer or chip-to-chip basis. Thus, the selection of the type of joining to be used for a specific application (i.e. wafer-to-wafer, chip-to-wafer or chip-to-chip) can, in part, be a factor of ability to test. For example, if testing is possible on a wafer basis, then all of the chips on two wafers can be hybridized in parallel on a wafer basis, with non-operational chips being flagged for rework once sawn or diced. Alternatively, the approach can be used in cases where individual dies come from one or more foundries and there is no good way to know before hybridization if any given die is a known good die.

In yet another an alternative version, the remote materials could be of the same materials as the primary contacts (e.g. rigid & malleable) as long as they were taller than the primary contacts so that, during the initial attach phase, they did not allow the primary contacts to touch. Then during the fuse process, the remote contacts would be compressed further than the primary contacts. Advantageously, by using the same materials on the remote and primary contacts processing is simplified.

From the above discussions, a derivative variants can be derived that build upon and combine concepts from the multi-axial through vias, well attach, profiled contact and remote attach variants.

Figure 172:
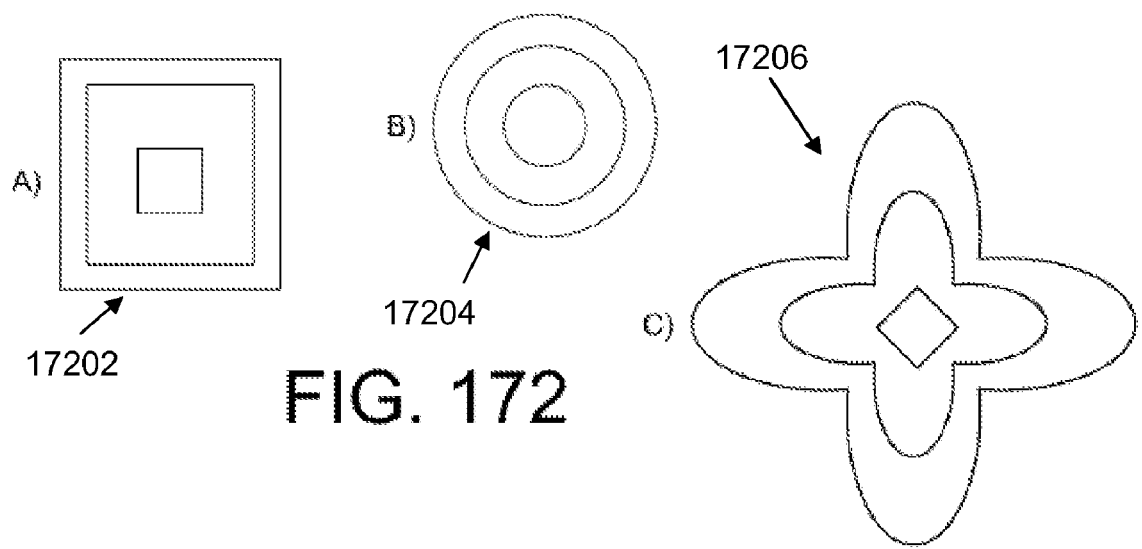
FIG. 172 illustrates cross sections of example coaxial contacts.

The first group of variants involve complex contact shapes (i.e. contact shapes other than the conventional single square or single dot). One such example involves creation of a shielded contact, in the simplest case, similar to a cross section of a square 17202 (FIG. 172A) or round 17204 (FIG. 172B) coax or triax through-chip connection and, in more complex cases, shapes of irregular open or closed (FIG. 172C) geometries 17206.

Figure 173:
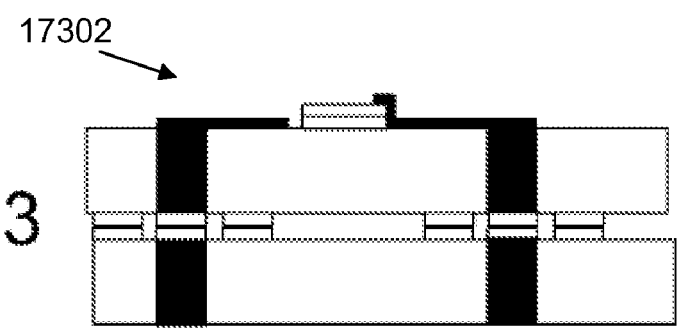
FIGS. 173 through 175 illustrate example uses of coaxial contacts.
Figure 174:
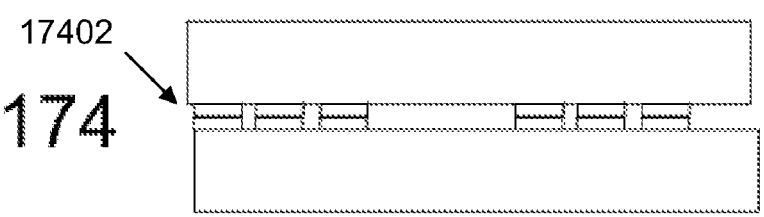
Figure 175:
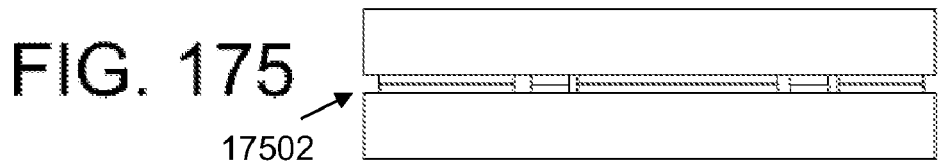

In the case of a coax, triax, or other irregular shaped contact, one of the contact(s) would be connected so as to be signal carrying while another would act as, or connect to, a ground plane. When used with the coaxial via 17302 (FIG. 173), it ensures that the contact is shielded all the way through to another chip. In addition, or alternatively, the coaxial contact 17402 can be used independently from the via itself (FIG. 174) to ensure that each contact itself is shielded. This allows inter-chip contacts to be spaced closer together than would be available without the coaxial approach. Moreover, the non-signal carrying contacts can be connected together and/or to a wafer, electrically isolated metal to form a ground plane, and or inter-chip shielding 17502 (FIG. 175).

Using the outer ring of a contact as a ground allows for shielding between the chips because, the only area where a signal propagates is through very small openings in the shielding layer. The same is true for triax connections where differential signal pairs can exist within an outer ground plane. Thus, such contacts are particularly well suited for chips carrying high-speed or RF signals.

The second group of variants center around using the contact approach for making a hermetic seal between two chips (or between a chip and a package or board) to protect connection pads, for example I/O pads, or other devices (e.g. optical devices) which might exist in between the two outer devices. In this situation, the connection pads and/or optical devices are pre-existing or concurrently are brought into existence in and will be sandwiched between two elements (e.g. two chips or one chip and a package or board). A ring is formed on the two elements outside the area to be protected and configured to be joined using either a malleable/rigid or well attach process so that when the two elements are hybridized together, they form a hermetic, metallic seal around everything within it. This hermetic package can then withstand most arbitrary environments, since metal's non-porous nature renders it is impervious to most environmental conditions.

A key advantage to some variants of our approach is that, because they use malleable and rigid connections (versus other connection approaches such as a metallic solder which becomes liquidus), the connections can take on any of a variety of geometrically closed shapes. This is in sharp contrast to a liquidus material, which would tend to run and reshape through surface tension into the lowest surface area available (e.g. cubes turn to spheres, corners get rounded etc.) and, while techniques could be used to cause the liquidus material to be wicked along a pre-specified surface of the chip through, for example, capillary action, there is no way to reliably ensure proper distribution of material about the contact, avoid creating voids or prevent some of the material from running out of its specified area and potentially shorting out contacts, when complex shapes are involved. To the contrary, with variants of our approaches, the simplicity or complexity of the shape is largely irrelevant because the approach is the same irrespective of shape—the only limitations being tied to the ability to photolithographically define the shape and deposit the appropriate metals.

FIG. 176 through FIG. 179 illustrate two simple examples of the foregoing. Specifically, FIG. 176 illustrates a corresponding chip surfaces having an area 17602 where the sandwiched devices (not shown) will be, and further configured with mating rigid 17604 and malleable 17606 contacts which surround the periphery of the device area 17602 and, when joined, form a hermetic seal about the periphery as described herein. FIG. 177 illustrates a side view cross section taken at A-A of the same chips in FIG. 176 after joining. FIG. 178 illustrates a more complex arrangement where the rigid 17802 and malleable 17804 contacts have a more complex shape and, in effect, form three different hermetically sealed chambers about the device areas 17806, 17808, 17810. FIG. 179 illustrates a side view cross section taken at A-A of the same chips in FIG. 178 after joining.

Figure 181A:
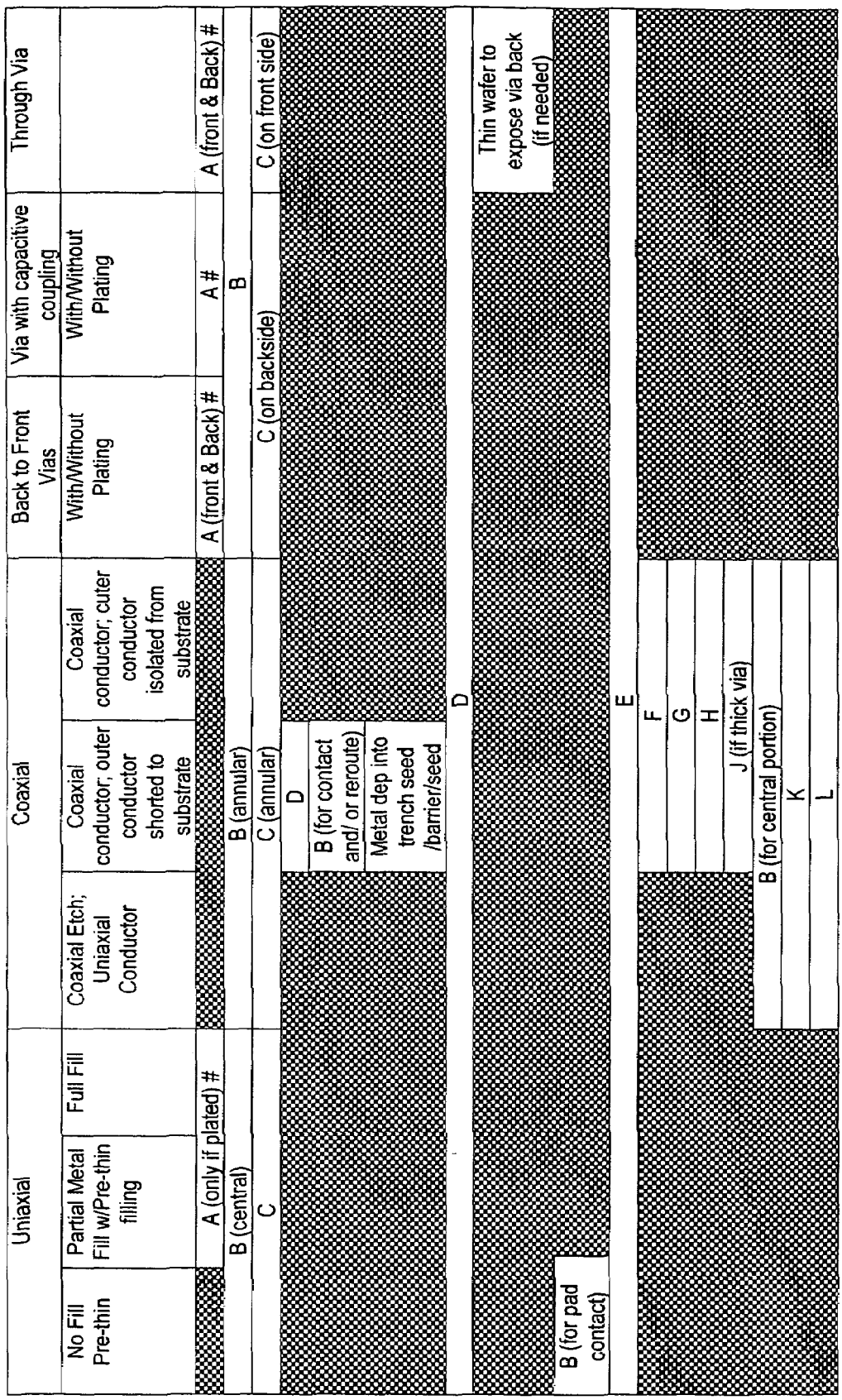

At this point, the rigid/malleable contact variants as well as the via formation variants can be summed up in chart form using the charts of FIG. 180 and FIGS. 181A and 181B.

FIG. 180 is a chart summarizing different approaches for forming other variants using the rigid/malleable contact paradigm. The chart is read downward in columnar fashion with each text-containing box representing a step in that process and each empty box (or portion thereof) representing no action necessary.

Similarly, FIGS. 181A, 181B and 182 are charts summarizing different approaches for forming via variants, including those described herein. These charts also read downward in columnar fashion with each text-containing box representing a step in that process and each empty box (or portion thereof) representing no action necessary The bottom of FIG. 181A continues at the top of FIG. 181B.

Numerous examples above have described the approaches with reference to the alternatives of depositing metal on a daughter wafer or plating of a daughter wafer. To aid in understanding, FIGS. 183 through 192 illustrate in greater detail the process flow for a particular instance involving deposition of metal on the daughter wafer. Thereafter, FIGS. 196 through 205 illustrate the process flow, with the same starting wafers, for plating of the daughter wafer.

Figure 186:
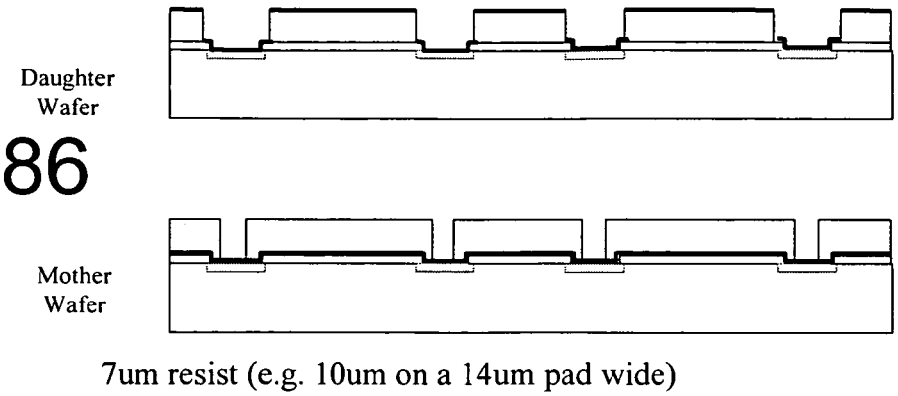
Figure 187:
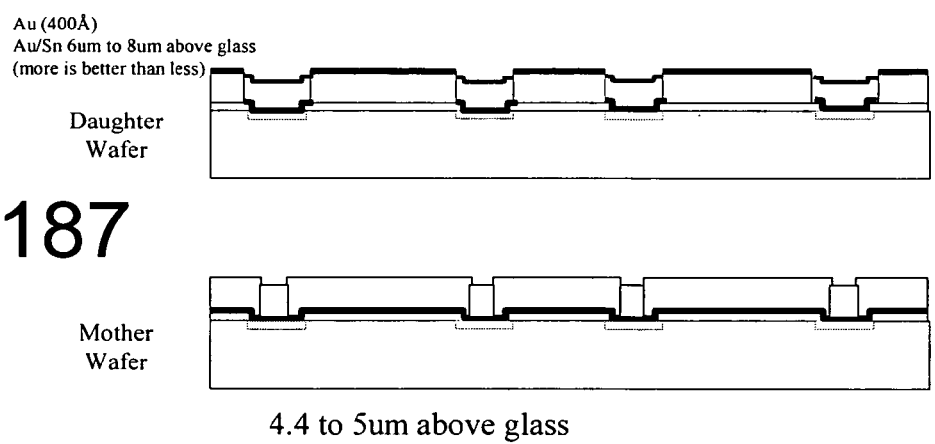
Figure 188:
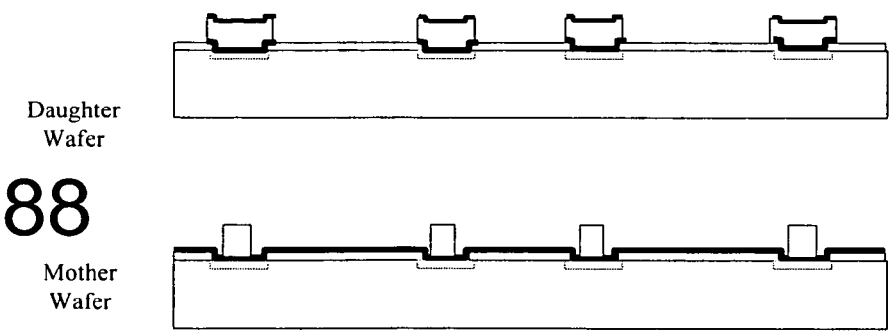
Figure 189:
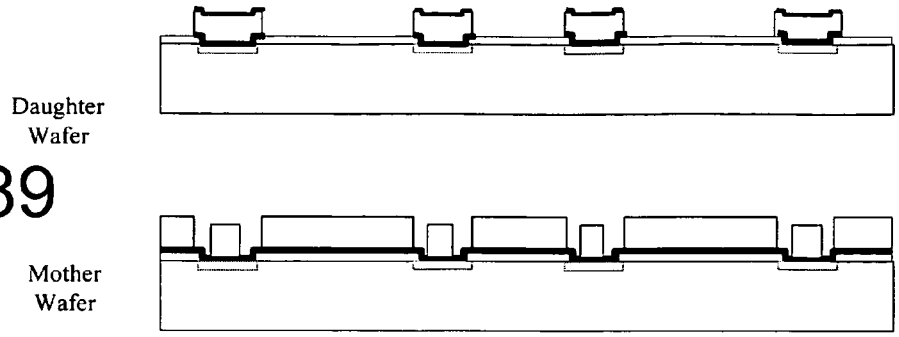
Figure 190:
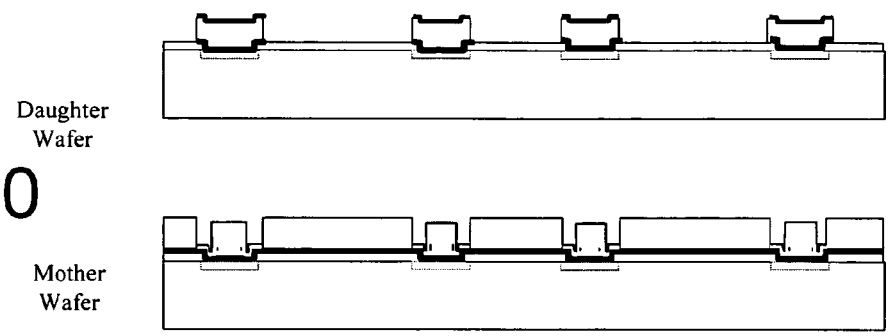
Figure 191:
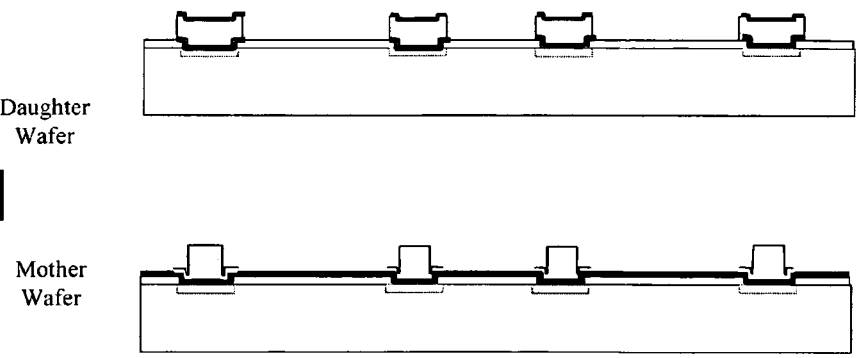
Figure 192:
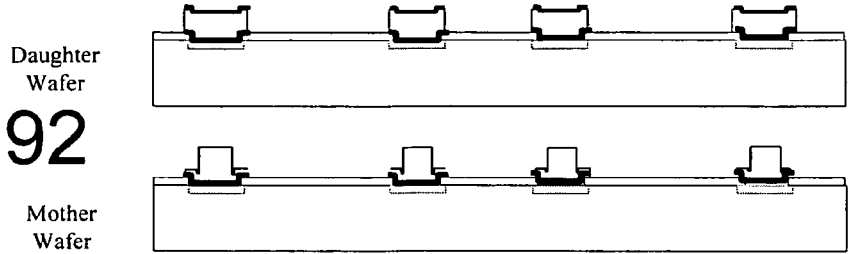
Figure 193:
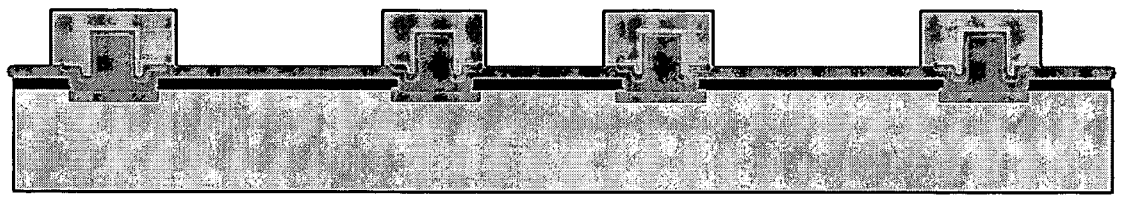
Figure 194:
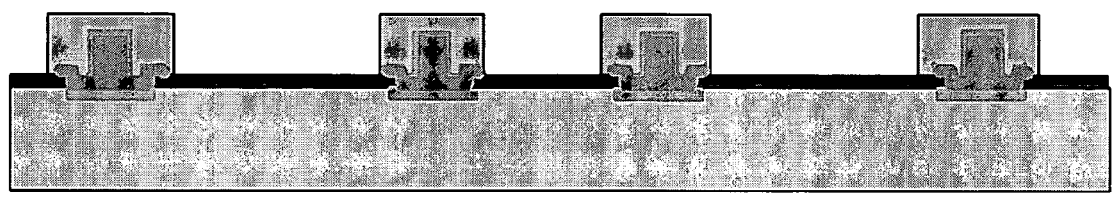
Figure 195:
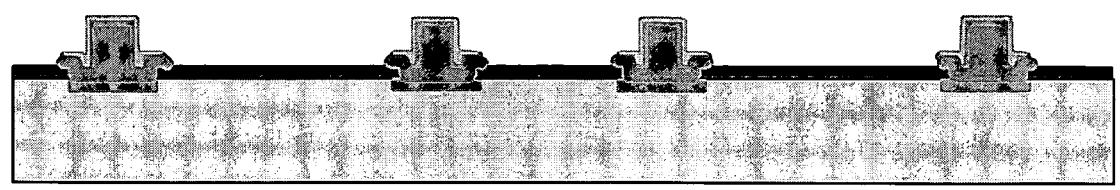

The process begins with the respective daughter and mother wafers of FIG. 183. Photolithographic patterning is performed on the daughter using a 10 micron resist target of, for example, Hoechst AZ4903 or Shipley STR1075 (FIG. 184). A barrier and rerouting layer of 200 Angstroms Ti, 3000 Angstroms Pd and 400 Angstroms of Au is then deposited on the daughter wafer and a barrier layer of 1000 Angstroms TiW and a seed layer of 3000 Angstroms of copper is deposited on the mother wafer (FIG. 185). Next, a thick dielectric (7 microns thick) or photoresist is applied to the mother wafer, assuming a 14 micron wide IC pad, leaving an opening of 10 microns on the pad (FIG. 186). Next, the daughter wafer is metalized by depositing a layer of Au/Sn on the daughter contacts to a height of about 6 to 8 microns above the IC cover glass (more typically being better than less) and then that is, in turn, topped off with 400 Angstroms of Au (FIG. 187). The mother wafer is metalized to a height of 4.4 to 5 microns above the IC cover glass (FIG. 187). The photoresist is then stripped from both of the wafers (FIG. 188). Next, photolithographic patterning is done on the mother wafer to create 15 to 16 micron wide openings in preparation for a barrier deposit (FIG. 189). Alternatively, a self-aligned seed etch can be done that is as wide as necessary to ensure that the undercut does not affect the bumps. Then, a barrier is deposited made up of 2 microns of Ni topped with 3000 Angstroms of Au (FIG. 190). Then, the photoresist is stripped (FIG. 191). Finally, unwanted seed layer is etched away (FIG. 192). This can be performed as a self aligned etch using a spray etcher so that no photolithography is needed because the Ni/Au allows etching through the Cu/Ti/W. If a self aligned etch can not be performed, for example because a spray etcher is not available, then an additional photolithography patterning step (FIGS. 193, 194, 195) may be required to protect those areas that will not be etched. However, because with some etching approaches, there is the possibility for significant undercut, such lithography should ensure that the protective photoresist is sufficiently wide to prevent undesired undercut (FIG. 193). For example, we have performed such an etch with contacts on a 50 micron pitch and, as a precaution, protected an area of about twice the width of the IC pad, in this case 27 microns for a 14 micron pad. However, using a spray etcher to do a self aligned etch, an undercut of less than about 1 micron is possible, so a much smaller area can be protected with that approach. Thereafter, the dice, align, tack and fuse processes can be preformed as desired to join the two.

Figure 196:
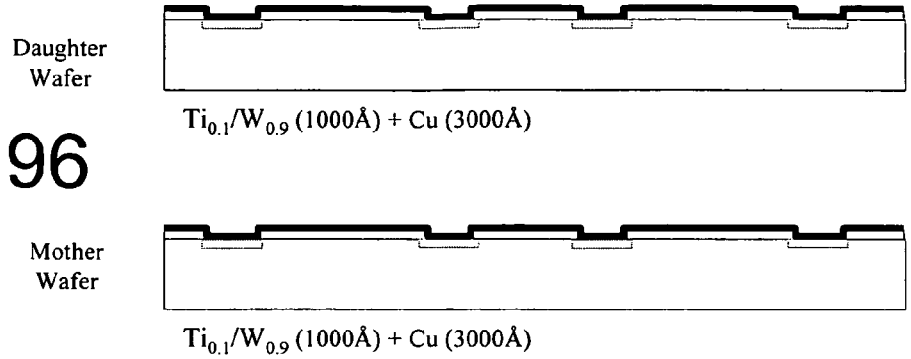
Figure 197:
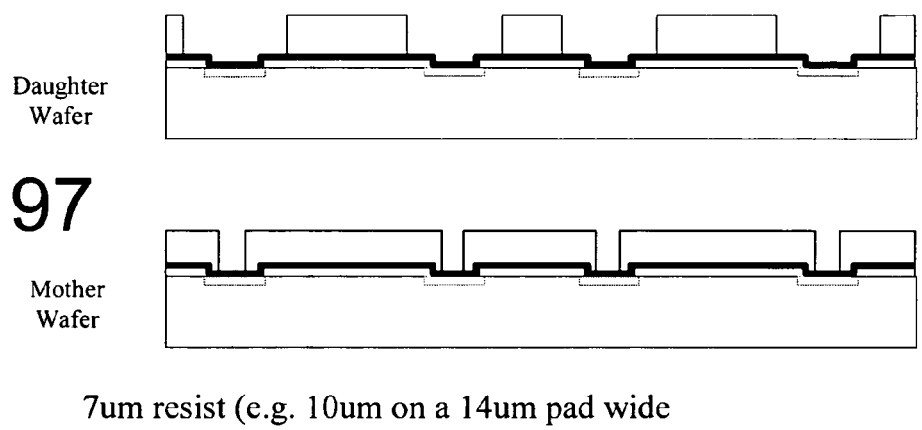
Figure 198:
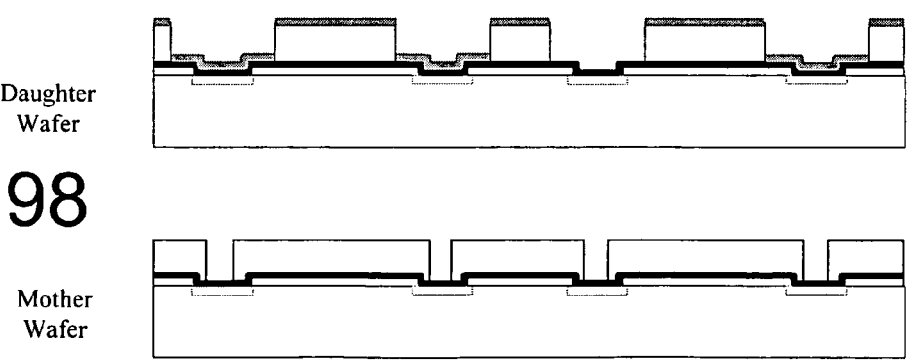

In contrast, the process flow for the plating case is shown in FIG. 196 through FIG. 205 as follows. Again, the process begins with the wafers of FIG. 183. First, the daughter wafer and mother wafer each have barrier of Ti0.1/W0.9 and a reroute (daughter wafer) and seed (mother wafer) layer of 3000 Angstroms of Cu (FIG. 196). Next, as shown in FIG. 197, photolithographic patterning is performed on the daughter wafer to limit the area for the barrier that will be applied and a thick dielectric (7 microns thick) or photoresist is applied to the mother wafer, assuming a 14 micron wide IC pad, leaving an opening of 10 microns on the pad, as in FIG. 186. Then the daughter wafer has its barrier layer added (FIG. 198) and liftoff of the unwanted barrier metal occurs when the photoresist is stripped from the daughter (FIG. 199). Next, photolithography is performed on the daughter using a 10 micron resist target of, for example, Hoechst AZ4903 or Shipley STR1075 (FIG. 200). Next the daughter and mother wafers are metalized by plating (FIG. 201), on the mother wafer to a height of 4.4 to 5 microns above the IC cover glass and on the daughter wafer to a height of 6 to 8 microns (as with FIG. 187). In addition, a cap of, for example, 400 Angstroms of Au can be applied, depending upon the plating complexity. Then, the photoresist is then stripped off (FIG. 202). Next, photolithographic patterning is used on the mother wafer to prepare for adding the barrier (FIG. 203). Next, the barrier is deposited on the mother wafer (FIG. 204). Again, the photoresist is stripped from the mother wafer (FIG. 205). Thereafter, the excess seed is etched away using a self aligned etch as in FIG. 192. As with the deposition example above, if a spray etcher is not available, additional photolithographic masking, etching and stripping steps are required, making sure that the protected area is sufficiently large to allow for the etch undercut.

At this point, the dice, align, tack and fuse processes can be preformed as desired to join the two together.

Based upon the above it is useful to note the advantages and disadvantages to each approach, which will aid in the selection of the process style to use for a particular application.

The deposition approach for the daughter wafer has the advantages of: no seed layer, no electroplating, it is a one mask process, and automatically having the compositional accuracy of Au/Sn. However, the approach has the following disadvantages: thickness control from run to run can be difficult, "wings" of metal can appear if the directionality of the deposition is off, and it may require an Au reclamation program.

The plating approach for the daughter wafer has the advantages that: the cost is lower and there is no need to do reclamation, it can be supported by major equipment vendors because conventional, currently available plating equipment can be used. However it has the disadvantage that the compositional accuracy required is +1.5%/−2.5% and potentially requires an additional mask step.

Figure 206A:
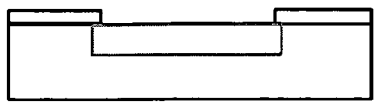
FIG. 206 illustrates in simplified form a mother wafer electroless plating variant.
Figure 206B:
Figure 206C:
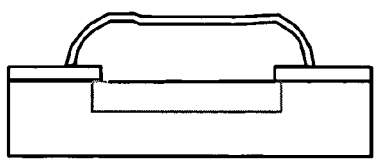
Figure 207A:
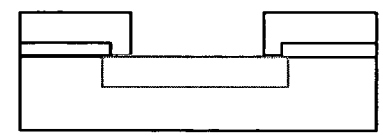
FIG. 207 illustrates in simplified form a mother wafer thin dielectric variant.
Figure 207B:
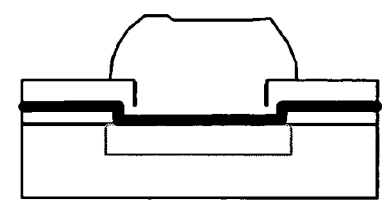
Figure 207C:
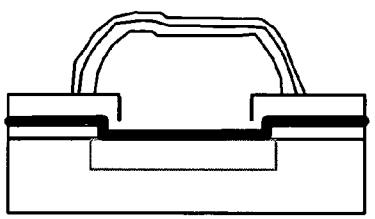
Figure 207D:
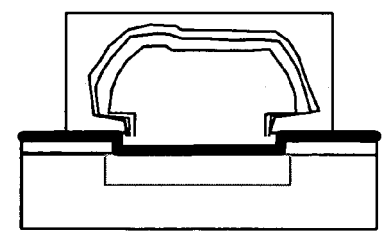
Figure 207E:
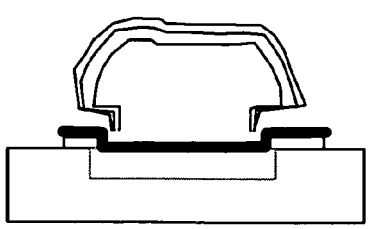
Figure 208A:
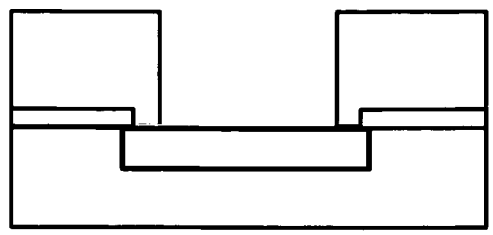
FIG. 208 illustrates in simplified form a mother wafer thick dielectric variant.
Figure 208B:
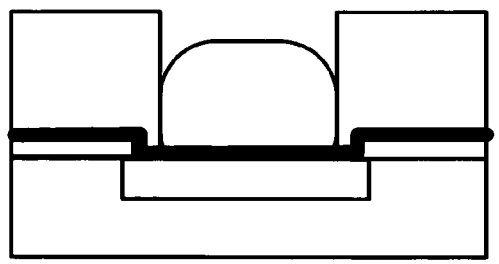
Figure 208C:
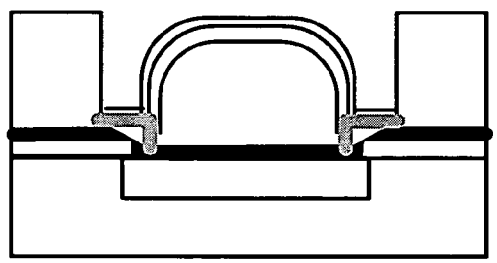
Figure 208D:
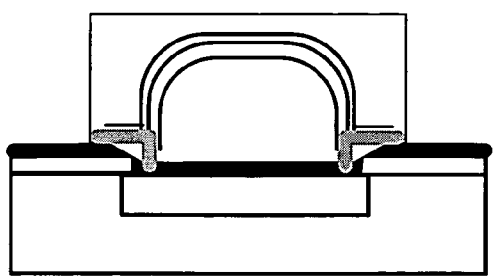
Figure 208E:
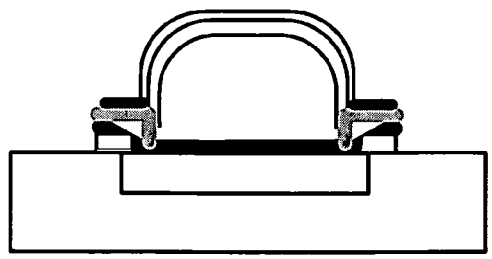

With the mother wafer, there are essentially three process variants:

1) electroless plating (illustrated in FIGS. 206a (chip), 206b (plating with 6-8 microns of Ni), 206c (cap with 3000 Angstroms Au));
2) thin resist electroplating process with copper (illustrated in FIGS. 207a (first masking), 207b (4.5 microns of copper), 207c (2 microns of Ni covered by a cap of 3000 Angstroms of Au), 207d (second masking), 207e (etch away excess seed)); and
3) thick resist electroplating process with copper (illustrated in FIGS. 208a (first masking), 208b (plating with copper), 208c (second masking, barrier and cap), 208d (third masking), 208e (etch away excess seed)).

The attendant advantages and disadvantages of each are as follows. The advantages of the electroless approach include: no separate barrier deposition; no seed layer deposition; no seed etch needed; and maskless Process. However, electroless plating of nickel is more difficult to control in terms of thickness or nodule formation which can affect yield and therefore may not be suitable for high volume wafer yield. The advantages of the thin dielectric process include: thinner Ni is used, so the process is more controllable; copper places lower stress on the IC cover glass; use of copper is more mainstream; and electroplating of copper can be controlled better. However, the penetration of Ni/Au onto mushroom-shaped sidewalls can be inconsistent, potentially leaving some copper exposed; a mushroom shape is not optimal for the tack process and additional process steps are required (i.e. seed deposition, seed etch, etc.).

The advantages of the thick dielectric deposition process include: better contact or "bump" shape, full copper coverage by the barrier/cap, better control of uniformity and shape, lower Ni nodule formation, rendering it typically the highest yield process in volume. However, this approach potentially requires an extra mask step if a self aligned seed etch is not effective, so this approach may require a spray etcher.

In keeping with this discussion of deposition and plating variants, some further specific details of some mother and daughter contacts are now provided to provide a further understanding of the process.

FIG. 209 illustrates an example and some typical dimensions for a mother wafer contact, having 14 micron wide contact pads spaced on a 50 micron pitch, before barrier deposition.

FIG. 210 illustrates the contact of FIG. 209 after barrier and cap deposition.

Figure 211:
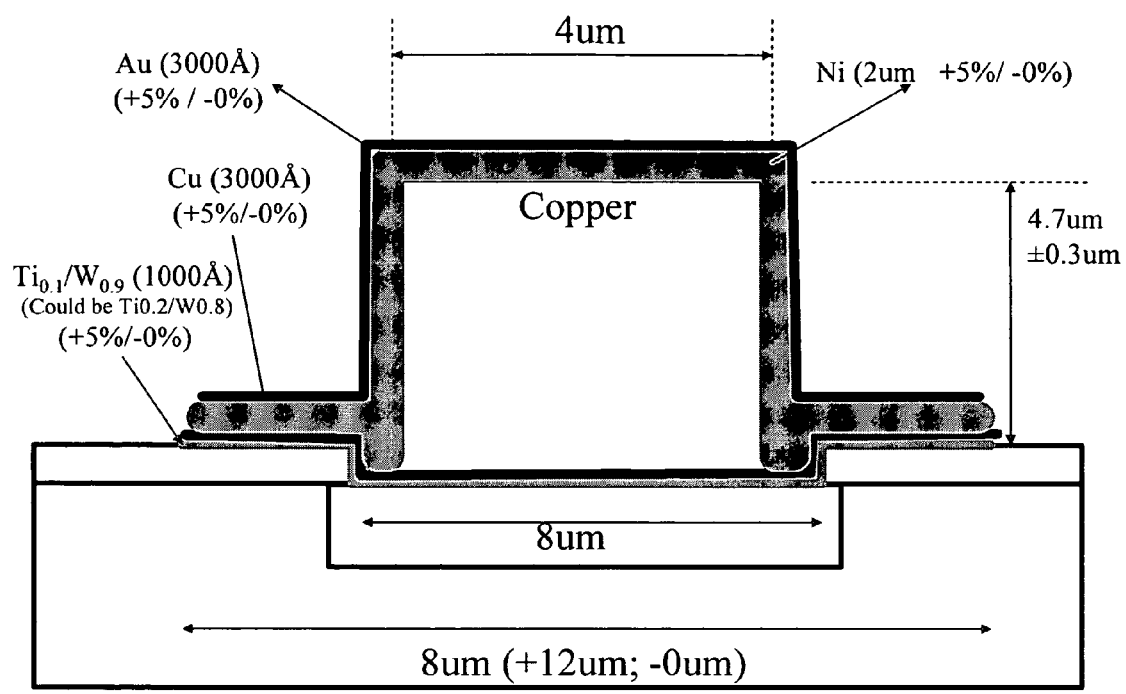
FIG. 211 illustrates typical dimensions for a mother wafer contact, having 8 micron wide contact pads spaced on a 25 micron pitch.

FIG. 211 illustrates typical dimensions for a mother wafer contact, having 8 micron wide contact pads spaced on a 25 micron pitch.

Figure 212:
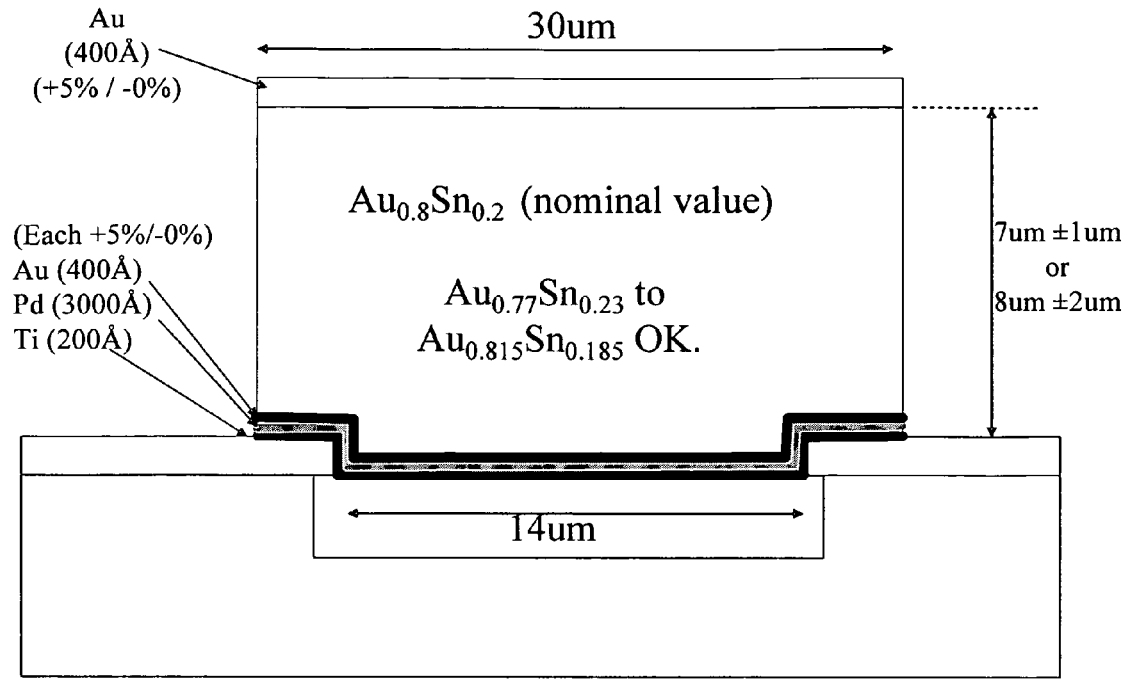
FIG. 212 illustrates an example and some typical dimensions for a daughter wafer contact having 14 micron wide contact pads spaced on a 50 micron pitch, created by deposition.

FIG. 212 illustrates an example and some typical dimensions for a daughter wafer contact having 14 micron wide contact pads spaced on a 50 micron pitch, created by deposition.

Figure 213:
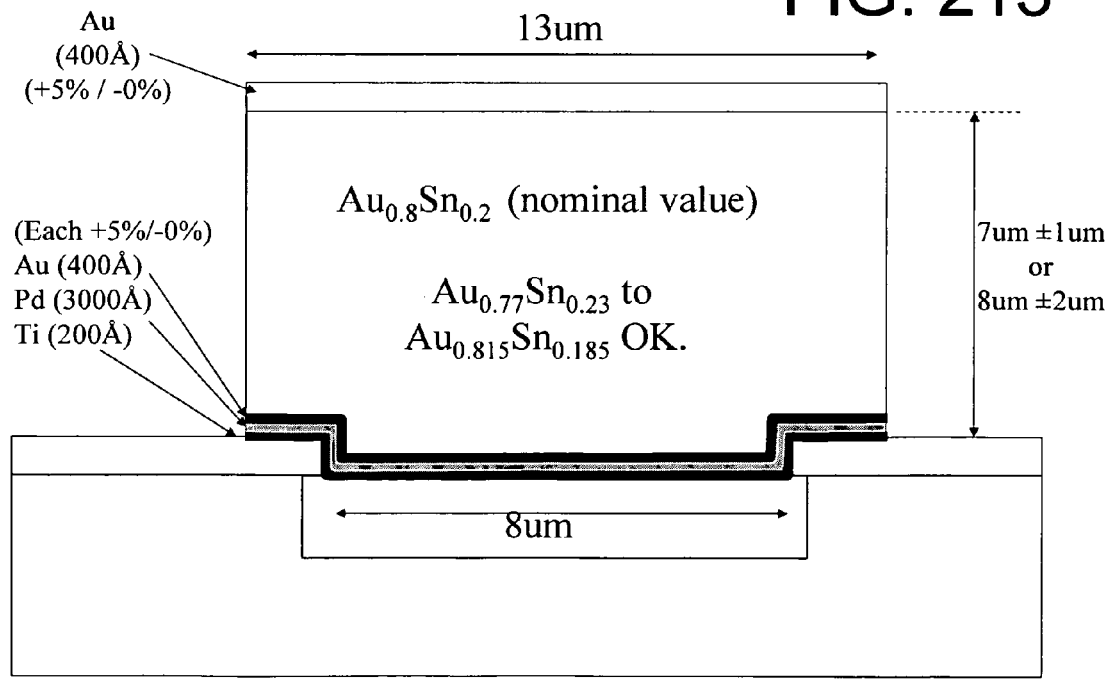
FIG. 213 illustrates an example and some typical dimensions for a daughter wafer contact having 8 micron wide contact pads spaced on a 25 micron pitch, created by deposition.

FIG. 213 illustrates an example and some typical dimensions for a daughter wafer contact having 8 micron wide contact pads spaced on a 25 micron pitch, created by deposition.

Figure 214:
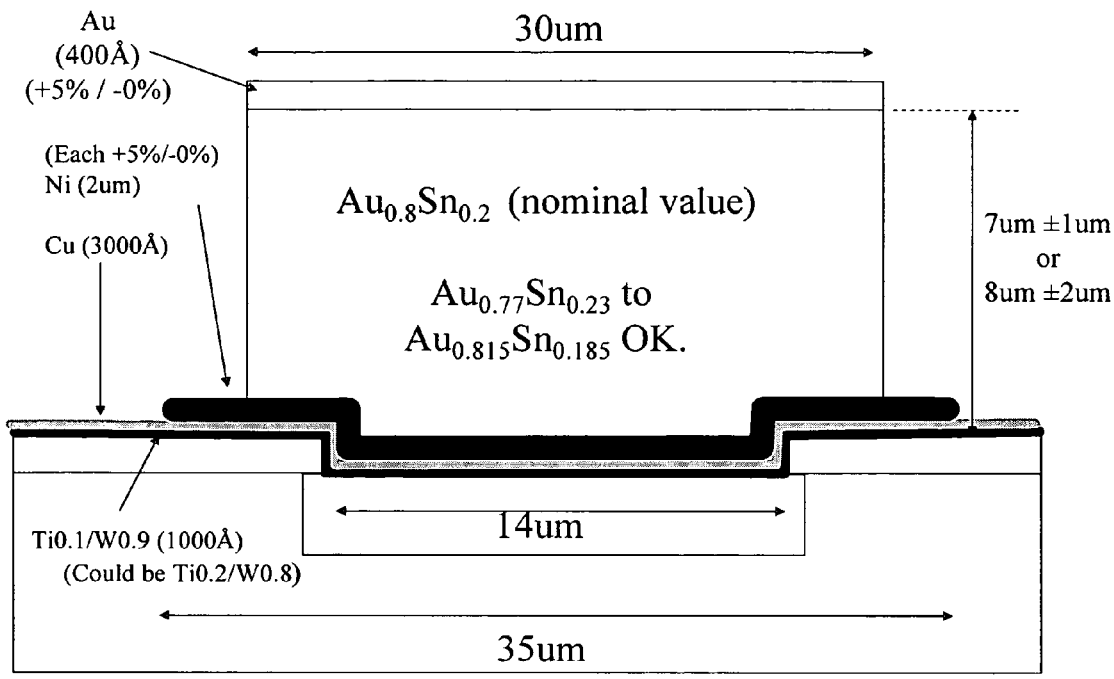
FIG. 214 illustrates an example and some typical dimensions for a plated version mother wafer contact, having 14 micron wide contact pads spaced on a 50 micron pitch before a self aligned seed etch is performed.

FIG. 214 illustrates an example and some typical dimensions for a plated version mother wafer contact, having 14 micron wide contact pads spaced on a 50 micron pitch before a self aligned seed etch is performed.

Figure 215:
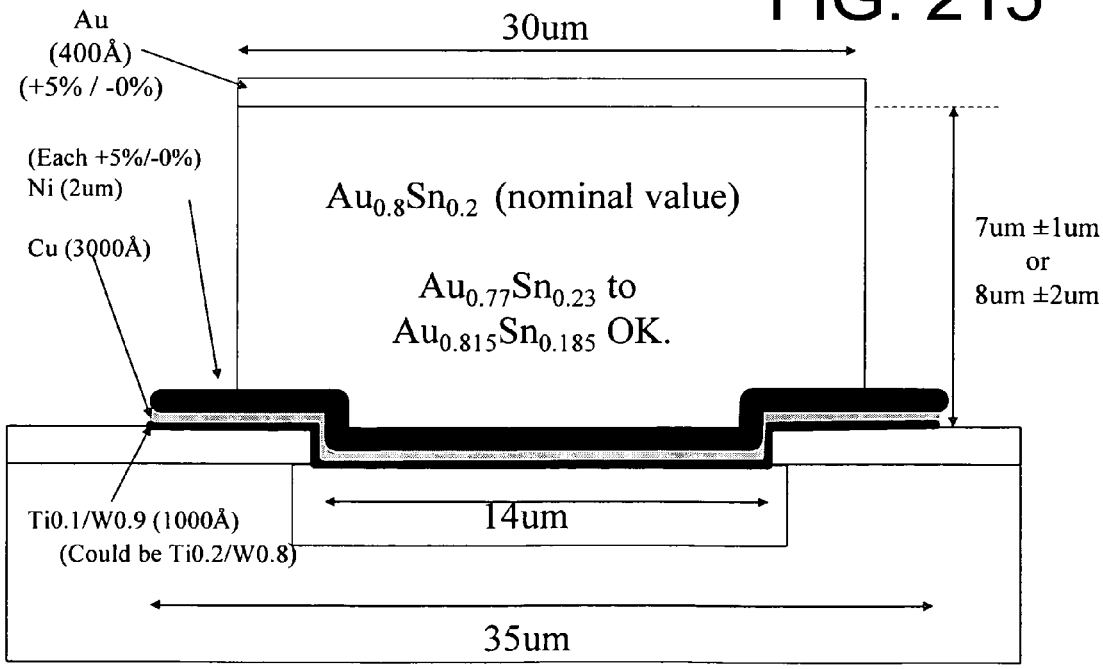
FIG. 215 illustrates the contact of FIG. 214 after the self aligned seed etch is performed.

FIG. 215 illustrates the contact of FIG. 214 after the self aligned seed etch is performed.

It should be noted that the ranges for the Au/Sn presented in connection with FIG. 212 through FIG. 215 are representative of the more typical ranges. In practice, a range of from about $Au_{0.7}Sn_{0.3}$ to $Au_{0.9}Sn_{0.1}$ or even wider could be used if suitable temperature adjustments are made (i.e. higher temperature for greater Au content and lower temperature with lower Sn content.

Having now described numerous through-chip connection variants and applications relating to the electrical aspect of various interchip connections, an additional alternative optional variant that takes advantage of implementations involving an unfilled inner trench or void or variants that do not expressly involve chip to chip signal transfer can now be presented.

In particular, alternative advantageous stacking variants can be created if the innermost voids are left unfilled. By sealing the voids from the surrounding parts, but leaving them open to each other, those voids can be used, for example, to aid in cooling a stack of chips.

With this variant a series of wafers having such vias are stacked in a way such that the material at the periphery of the vias protect the via sidewalls within the resultant semiconductor wafers and creates a continuous, contiguous air and liquid-tight tube when they are attached together. The stacked pieces are arranged so the tube extends through some or all of the stack. An end of the tube through the chip stack is covered by a construction which has a condensing region, for example, they further connect to a tube embedded in a heat sink. When filled with the appropriate fluid (and a wick if necessary), each of these tubes can act as a heat pipe, pulling heat away from the IC stack more effectively. Optionally, an electrically isolated metal can connect to, and extend outwards from, the heat pipe (like fins or plates) in between the stacked chips on unused chip real estate so as to further increase the heat transfer capabilities. Moreover, such fins or plates can be formed by the barrier or seed layers, potentially allowing them to play multiple roles, for example, by acting as a shield or ground plane and a fin at the same time allowing them to serve multiple roles.

Figure 216:
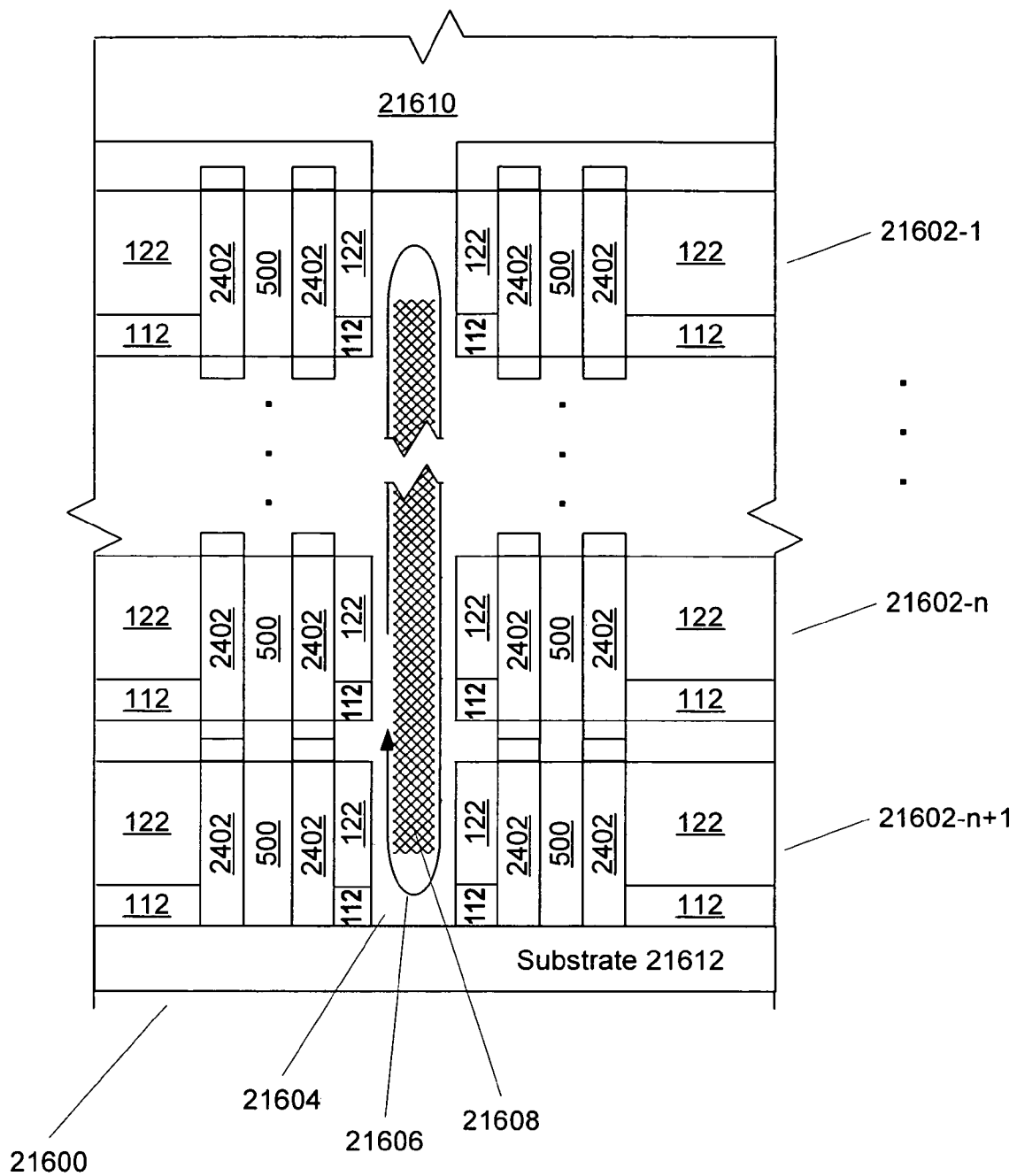
FIG. 216 illustrates using the inner via as part of a heat pipe arrangement.

This is accomplished, for example, as shown in FIG. 216, by using the inner via as part of a heat pipe arrangement. FIG. 216 illustrates in simplified fashion, a portion 21600 of a stack of chips, made up of some number of individual stacked chips 21602-1 through 21602-n+1 which may be identical or dissimilar. In this example, the inner metalization 2402 of each is connected to the one above or below (using a process described herein, such as a post and penetration connection, or some other approach such as wafer fusion or covalent bonding) so as to hermetically seal the inner voids to each other and thereby creating a tube 21604 within the chips. A suitable fluid 21606 (and if necessary a wick 21608) is contained within the tube at an appropriate pressure such that a heat pipe is created that can assist in transferring heat from the individual chips 21602-1 through 21602-n+1 through which it passes, for example, to a heat sink 21610 or other cooling apparatus.

Depending upon the particular implementation, one end of the tube can be sealed to the doped semiconductor material or substrate 21612 within a chip (i.e. the tube does not go all the way through) or to surface material of another chip that does not contain a portion of the tube itself but merely acts as a stopper or plug. In addition, multiple tubes can be formed with each having a different working fluid or different pressures for the respective working fluids (whether the same or different) such that they have different vaporization and condensation temperatures. In this manner, a broader range of heat pipe operation can be obtained. Still further, those heat pipes can be grouped or dispersed about the chips relative to thermal "hot spots" on the chips.

In some variants, the wick 21608, if present, can be made of, for example, a porous or capillary structure, a scintered powder, a grooved tube, a mesh, a carbon nanotube structure, graphite or any other suitable wick material. In addition, the working fluid can be any heat pipe fluid, provided that it will not corrode, degrade or otherwise adversely affect the surfaces (i.e. doped semiconductor, substrate, insulator, conductor metal, etc.) with which it will come into contact. Typical working fluids can include water, an alcohol, acetone or, in some cases, mercury. In addition, in some variants, a material that is a solid at 1 Atm (101.3 kPa) and 68° F. (20° C.) can be used if it will vaporize or sublime in a suitable manner to provide the requisite transfer of heat of vaporization required for a heat-pipe. Finally, it should be noted that a pre-formed (i.e. previously fabricated) heat pipe can be used if it is of suitable dimensions for insertion into the inner via.

Advantageously, because this approach places the heat pipes closer to where the heat is generated and such heat pipes can be interspersed throughout the chip, the approach can increase the effectiveness of whatever cooling methods would additionally be employed. In addition, it should be understood that the above approach can also be used to create heat pipes within chips where no electrical connections are desired or required.

Figure 217:
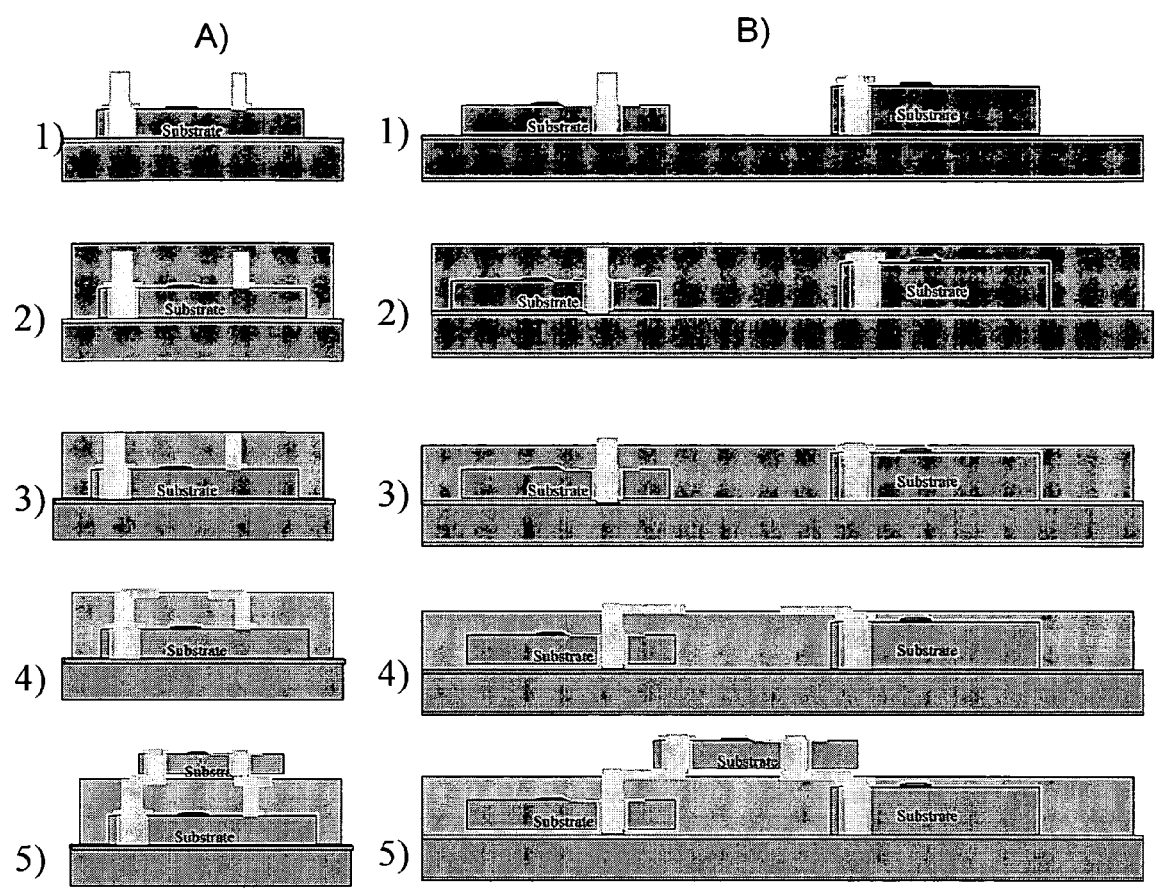
FIG. 217 illustrates in simplified parallel form an example isolation and spanning variant.

Often, there is a desire to electrically isolate chips from one another to prevent electrical crosstalk. In addition, when stacking devices vertically to take advantage of one of the the via processes described herein (or a variant thereof), there may be applications where it is desirable to connect two chips together with a third chip which communicates with both of them, may intervene between communications among them or both. As should be appreciated from the preceding, the processes for forming inter-wafer connections, although illustrated involving one or two contacts, are independent of the number of total contacts and locations of where the mating chip contacts for the rest of the wafer reside (i.e. on one or more chips). This means that, in some cases, a single daughter chip can span two or more mother wafer chips or a "daughter wafer 2" chip can span two daughter chips or a mother and daughter chip. Thus, spanning is a straightforward application of the process of adding of a "daughter wafer" or "daughter wafer 2", the process being the same, but the full set of connections to which the daughter chip will connect do not all have mates on the same chip. However, in certain cases of this variant, the two base chips (i.e. chips to be spanned by a single chip) may be of different heights. Thus, there is a need to deal with such a height differential. Advantageously, further variants of the via processes herein allow this to be achieved. FIG. 217A and FIG. 217B illustrate two examples of how to do so. FIG. 217A illustrates the isolation aspect of this variant, whereas FIG. 217B illustrates the spanning connection aspect. In both cases, the same shielding benefits can be obtained. In combination with previous approaches, we can see that in step 1, one or more chips with a vias are attached to a base chip. In this case the via (or another contact post which connects to the top chip) is fabricated to extend some distance above the chip that was attached. This can be accomplished by, for example, plating of metal or by removing substrate material to expose more metal, depending upon which of the via process variants are used. In this approach, the vias are typically made before the chips are hybridized to each other. In the case of the chips of FIG. 217B, in step 2 the wafers are coated with a layer of non-conductive material, such as polyamide, BCB, another polymer, an oxygen or nitrogen containing dielectric, or other non-conductive material that can be deposited onto the surface of a wafer. In the case shown in FIG. 217A, the thickness of the layer is determined by the need to isolate the two vertically stacked chips from one another. Since signal strength falls off with distance, capacitive coupling falls proportional to distance and EMI interference falls off proportional with the square of distance, this thickness will usually be greater than the width of the signal line (e.g. >5 microns) but in some variants it could be much greater (e.g. 25 microns or more) to get better isolation. As shown in FIG. 217B, the two attached chips can be different heights. The reason for the height difference is not pertinent to the process, but could be due to their being etched or thinned differently, made on substrates that were originally different thicknesses or because of lapping or polishing, which can cause height differences of up to 100 microns or more depending upon the care taken during the process. In any case, the coating material is added so that it is at least as high as the top of the thickest chip attached to the base chip. If no rerouting layer is required (discussed below in conjunction with step 4), then this step 2 might be optional in some variants of FIG. 217B. In step 3, the wafers are lapped or polished to expose the via or other tall plated or otherwise metalized connections of the various chips. In step 4 (optional), to facilitate connection placement, the surface of the polished/lapped wafers are patterned and an electrical rerouting layer (if needed) can be deposited on the surface. This allows two chips which do not have matching pads to be connected together by routing signals to where they need to be to connect the chips together. Moreover, in the situation of FIG. 217B, rerouting allows the two chips in the lower layer to be spaced further apart than the mating connections on the top chip which is placed in step 5. In step 5, of both FIG. 217A and FIG. 217B, another chip is attached to the structure by one of the hybridization method variants, using for example, the malleable and rigid hybridization process. The process of steps 2 through 5 can then be repeated to add a subsequent layer (assuming of course that the chip attached in step 5 has or can have posts extending an appropriate distance upward from the surface. Advantageously, the chip in step 5 does not have to have vias unless it must connect to additional layers on top of that structure.

Figure 218:
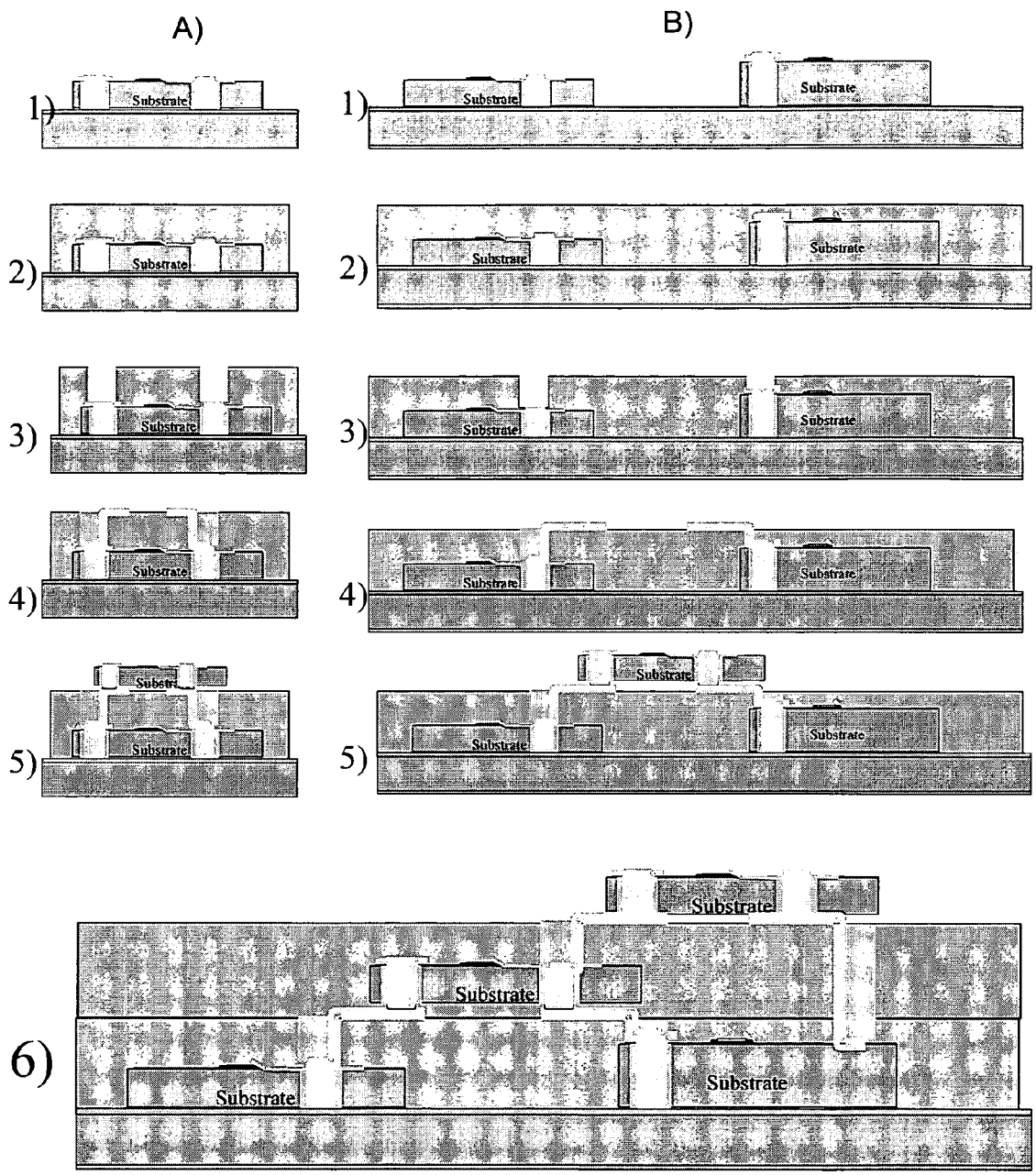
FIG. 218 illustrates in simplified parallel form another example isolation and spanning variant.

FIG. 218A and FIG. 218B illustrate an alternate variant approach for accomplishing the task of FIG. 217A or FIG. 217B. In this alternate variant approach, rather than thinning the chip in step 3 of the process of FIG. 217A or FIG. 217B, holes are etched in the planarization material, which, in this example and typically, will be polyimide. Then, the reroute layer of step 4 is used to both reroute electrical signals (if needed) and to make connections to lower chips. Next, hybridization can occur as in step 5 of FIG. 218A or FIG. 218B. This procedure is more complex than the approach of FIG. 217A or FIG. 217B, since making electrical contacts after hybridization is required. However, as shown in step 6 of FIG. 218B, this process is more amenable to having a subsequent chip connect to multiple other layers simultaneously than in FIG. 217B. To do the same thing in the approach of FIG. 217B is more difficult, since polishing in step 3 of FIG. 217B would likely polish all the posts to the same height, thereby making it difficult to attach the upper level daughter chip down to the lowest level daughter chip.

As noted herein, stacks can be formed an arbitrary multiple number of elements high. However, depending upon the particular instance, in some cases the effect and geometry of the stacking needs to be considered in addition to the decision of whether to join in a tack, fuse, tack, fuse approach or a tack, tack, tack, overall fuse approach. For example, in a wafer scale stacking process such as described herein using through via connections, a decision must be made whether to pre-thin the original daughter wafer before it is diced for joining with the mother wafer or whether it should be joined to the mother wafer (on a per chip or entire wafer basis) and then thinned. The difference is as follows. The tack, fuse, thin, tack, fuse, thin approach has an advantage in that it eliminates a few steps and, more importantly, eliminates the handling of very thin wafers if they are thinned before dicing and joining which can detract from the yield. The disadvantage is that it requires more touch labor on hybridized parts-thinning on a more expensive hybridized part versus just the daughter wafer(s) (detracting from yield).

Another disadvantage occurs when there are several daughter stacks on the mother chip when each stack has different numbers of chips. Placement and ordering of thinning becomes important because a separate thinning step needs to happen for each layer of chips on the mother wafer. As a result, without proper planning, a point will be reached where some stacks cannot have additional chips added because they will be below the height of an adjacent stack, rendering thinning of that chip difficult or impossible.

In contrast, thinning prior to joining has the advantage that it can always be performed, however its disadvantage, noted above, is the increased risk associated with having thin wafers.

Figure 219:
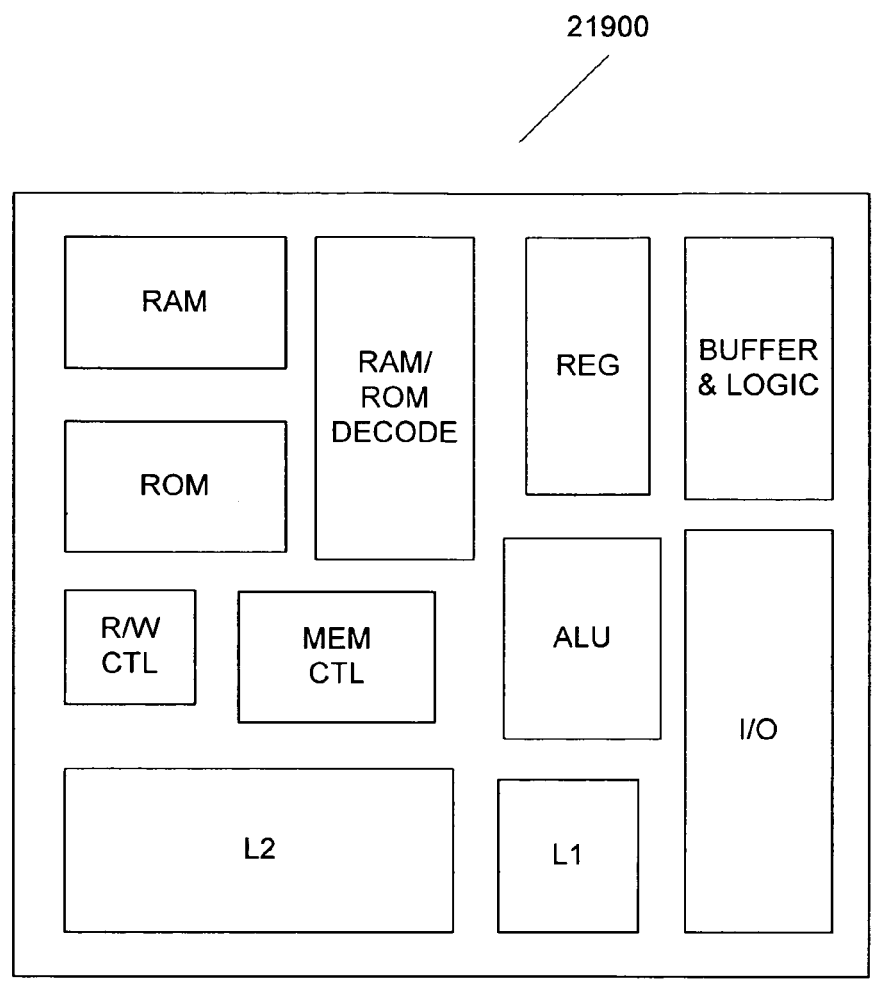
FIG. 219 illustrates in simplified form a representative example conventional microprocessor chip and its respective constituent elements.
Figure 220A:
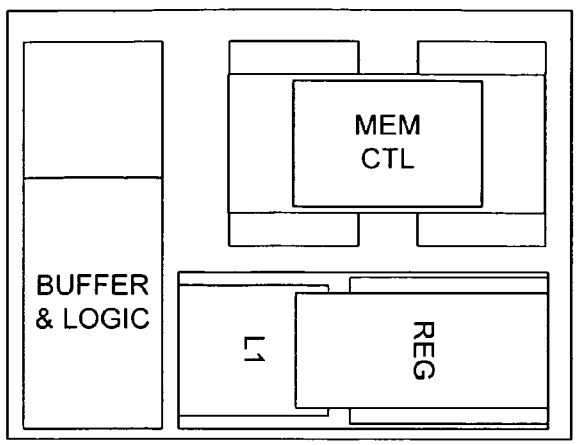
FIG. 220 illustrates in simplified form how an alternative microprocessor can be constructed from the elements of the microprocessor of FIG. 219 to provide a smaller footprint and substantially reduced distances between elements.
Figure 220C:
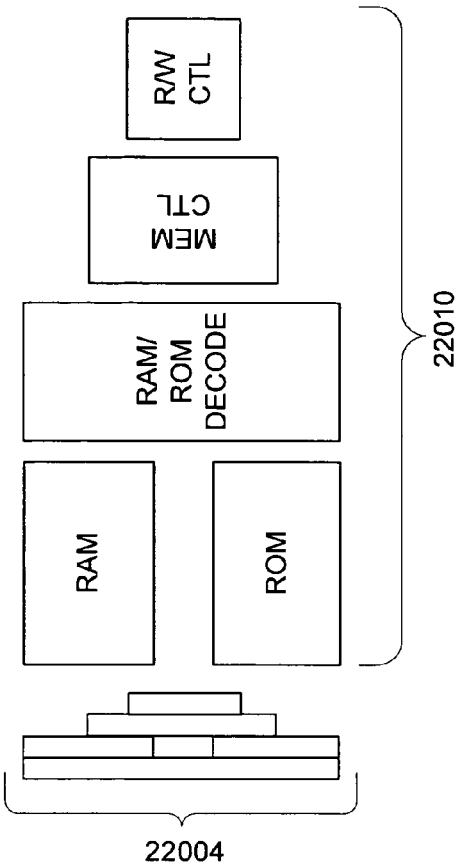
Figure 220D:
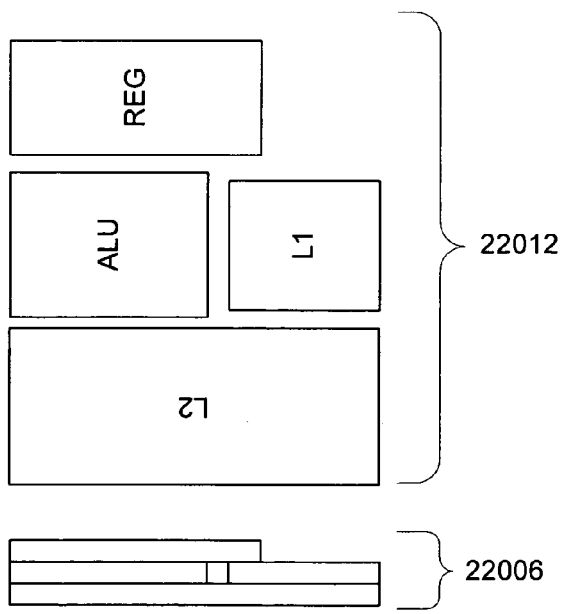
Figure 220B:
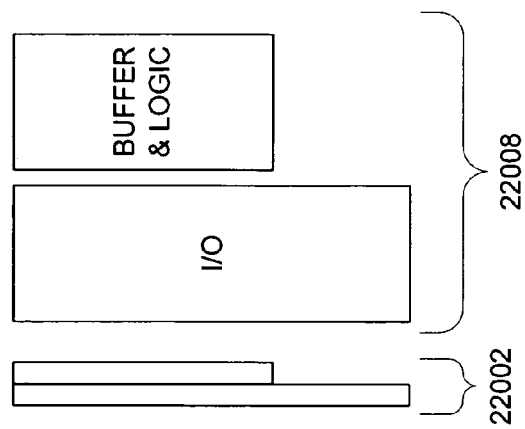

Having described numerous different alternative, optional and complementary variants, an example application of the above is now presented with reference to FIGS. 219 through 221 to illustrate some additional advantages that can be achieved in a particular application, namely a microprocessor application.

FIG. 219 illustrates in simplified form a representative example conventional microprocessor chip 21900 and identifying its respective constituent elements (i.e. an Arithmetic Logic Unit (ALU), Registers (REG), Buffers and other Logic (BUFFER & LOGIC), Input-Output (I/O), First Level Cache Memory (L1), Second Level Cache Memory (L2), Memory Controls (MEM CTL), Memory Read-Write Control (R/W CTL), Random Access Memory (RAM), Read Only Memory (ROM) and Memory Decoding Circuits (RAM/ROM DECODE) laid out in a conventional co-planar manner. As can be seen, the constituent elements take up a considerable amount of area and the distance between any given component and most of the other components is fairly large.

FIG. 220 illustrates in simplified form how, through use of approaches described above, an alternative microprocessor can be constructed from the same elements while having a smaller footprint, mixing of high and low speed technology, and substantially reduced distances between elements. Specifically FIG. 220A shows an example alternative microprocessor 22000, that is made up of the elements from FIG. 219, having a reduced footprint through use of through-chip connections as described herein and stacking of the elements. Through stacking, the elements are formed into chip units 22002, 22004, 22006 (side views) and respectively shown in exploded and views 22008, 22010, 22012) thereby reducing the overall footprint covered by their constituent sub-components. In addition, as shown in the respective side views 22008, 22010, 22012, because of the through-chip connections, the distance between all of the sub-components of each chip unit 22002, 22004, 22006 is substantially reduced. Moreover, the chip-to-chip connections within each chip unit 22002, 22004, 22006 are not required to be about the periphery, but can, in fact, be at nearly any location on a sub-component chip.

FIG. 221 shows a direct comparison of the footprint of the chip 21900 of FIG. 219 to that of the chip 22000 of FIG. 220. As is evident, the footprint of the latter is substantially less than that of the former despite their both having the same size and number of elements.

Still further advantages can be achieved if the chips are designed with the likelihood of stacking in mind. For example, in the example of FIG. 220, different mix and match configurations of the processing unit 22006, 22012 can be designed because each sub-component chip can be independently designed and need only share a common interface with the other. Thus, one could design several different ALUs of different speeds and thereby more easily create a common family of processing chip units. Similarly, different size L2 caches can be designed for use in the processing chip unit 22006 to allow for price-point differentiation or performance enhancements within the families. This concept is a specialized case of what is described below as intelligent, active packaging.

Figure 222:
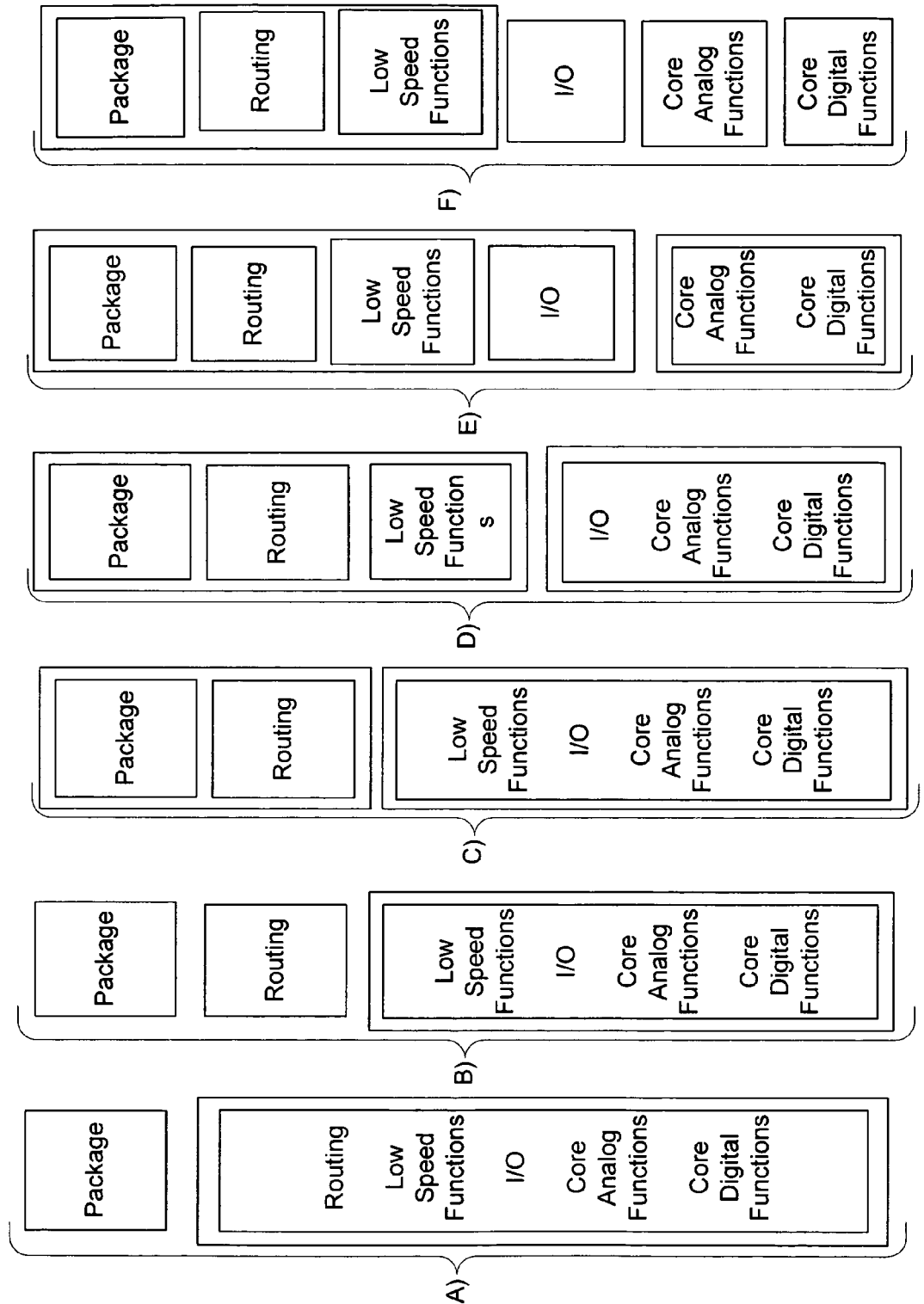
FIG. 222 illustrates functional packaging variants.

As can be seen from the immediately preceding discussion, further outgrowth of the processes and aspects described herein is the ability to efficiently create different kinds of "packaging" than previously used (FIG. 222).

At present, complex integrated circuit chips are created and packaged as shown in FIG. 222A. Through front-end processing, the low speed functions, high speed functions, I/O and high speed (i.e. core analog and digital) functions are all created on a chip. Next, back-end processing adds metalization in layers to the chip to create the connections among the various on-chip devices. Finally, when the chip is completed, it is attached to a separate package such as a pin grid array, ball grid array, conventional IC package, etc. That approach has numerous drawbacks including the requirement that, since all devices reside on the same chip, all devices must be implemented in the highest speed/highest cost technology necessary for any on-chip device. As a result, high cost "real estate" is wasted on low cost and/or low cost devices that could readily be implemented in a slower or cheaper technology.

By using aspects described herein however, different types of packaging can be used to advantageously aid in optimizing cost, time to process, and risk of low yield, to name a few. For example, through use of aspects as described herein, configurations such as illustrated in FIG. 222B through 222F can be created.

FIG. 222B illustrates one representative example arrangement attainable using aspects described herein we call a routingless architecture because it separates the routing process from the chip formation process and allows them to be performed concurrently. In the example, a chip (Chip 1) is created using the front end processing that contains the low speed functions, I/O and core analog and digital functions. A second chip is created (Chip 2) using the back end process to create the metalized layers that will interconnect the devices on Chip 1. Then, Chip 1 and Chip 2 are hybridized together, for example, using an approach described herein, through a wafer-to-wafer or covalent bonding approach, wafer fusion, etc. Then this hybridized unit can be treated as a conventional chip and connected to a conventional package in the conventional manner or further processed, for example as described herein, for hybridization to another wafer, chip or element.

Another alternative approach is illustrated in FIG. 222C and we call this approach a "chip package" approach because chip interconnections are part of the package. This approach is similar to that of FIG. 222B with respect to Chip 1 except, with this approach, either the back-end processing is performed on a wafer portion that will also serve as the package or the back end processing to create the routing is performed on one wafer, the package is created on another, and the two are processed as described herein so that they can be hybridized together to form a "Chip 2" for this approach. Thereafter, the Chip 1 and Chip 2 of this approach can be processed and hybridized together as described herein. Optionally and alternatively, the processing needed for the hybridization of the "Chip 1" to the "Chip 2" can be performed, in whole or part, as part of the processing necessary to hybridize the routing portion to the package portion. Advantageously, with this approach and appropriate design planning, the "Chip 2" design can be generic to multiple different Chip 1 designs, resulting in further potential cost and other savings.

Yet another alternative approach is shown in FIG. 222D and we call this approach an "active package" approach because, with this approach, the "Chip 2" creation process adds the low speed functions to the package "Chip 2" as opposed to being part of the main "Chip 1" of this approach. Thereafter, the Chip 1 and Chip 2 can be hybridized together or connected together through other means appropriate to the particular application. This enables a reduction in use of higher cost real estate by low speed/low cost devices. Here to, if the low speed functions are more generic, further advantages and savings can be achieved.

A further alternative approach is illustrated in FIG. 222E. This approach is similar to that of FIG. 222D except that I/O is moved from the "Chip 1" technology to the "Chip 2" to create what we call an "active package with I/O" approach. As a result, with this approach, the "Chip 1" will simply contain the core analog and core digital functions. Here too, the chips can be hybridized or otherwise interconnected to each other for operability. Again, I/O is typically low speed and large sized, so substantial savings can be achieved with this approach. Similarly, careful design can still allow the "Chip 2" of this approach to be generic to multiple "Chip 1" designs, thereby again providing advantages over the conventional approach of FIG. 222A.

Yet a further approach, the most sophisticated of the approaches, is illustrated in FIG. 222F. We call this approach a "system on chip" or "system stack." With this approach, only the core digital functions reside on a "Chip 1" of the appropriate speed/cost technology. A "Chip 2" is similarly created that simply has the core analog functions of the appropriate speed/cost technology. A "Chip 3" is also created and merely includes the I/O function implemented in its own appropriate technology. Finally, a "Chip 4", which essentially corresponds to the "Chip 2" of FIG. 222D is created. Advantageously, through this approach, significant mixing and matching can occur because, in many cases, the Chip 1, Chip 2, Chip 3 and Chip 4 designs can be designed with only the chip to which they will attach in mind. Moreover, as should be apparent, this approach allows for each chip to be, for example, one of a family of chips for that function, all sharing a common interface.

Thus, all of the approaches of FIG. 222B through FIG. 222F make it possible to create intelligent, active packages so that designers can break up their designs such that most, if not all, circuits use the technology best suited to their function. In some cases, this can mean creation of wholly new designs and in other cases using existing chips in combination with each other, in both cases using one or more aspects of variants described herein. In this regard, it should be understood that the functions represented in such examples are not intended to mean that those particular aspects must be broken up in the way shown, but merely to illustrate a concept. It is equally possible that, for example, a chip could be created that contained some of the analog functions and some of the digital functions, as could another chip—as opposed to a single chip for each function group—the key point being the ability to match portions of an overall design to their appropriate technologies and, through our approaches, achieve a functional result that is similar to what is conventionally done (e.g. FIG. 222A) or a result that was previously not possible or cost prohibitive because of the limitations inherent in the conventional approach of FIG. 222A.

Figure 223:
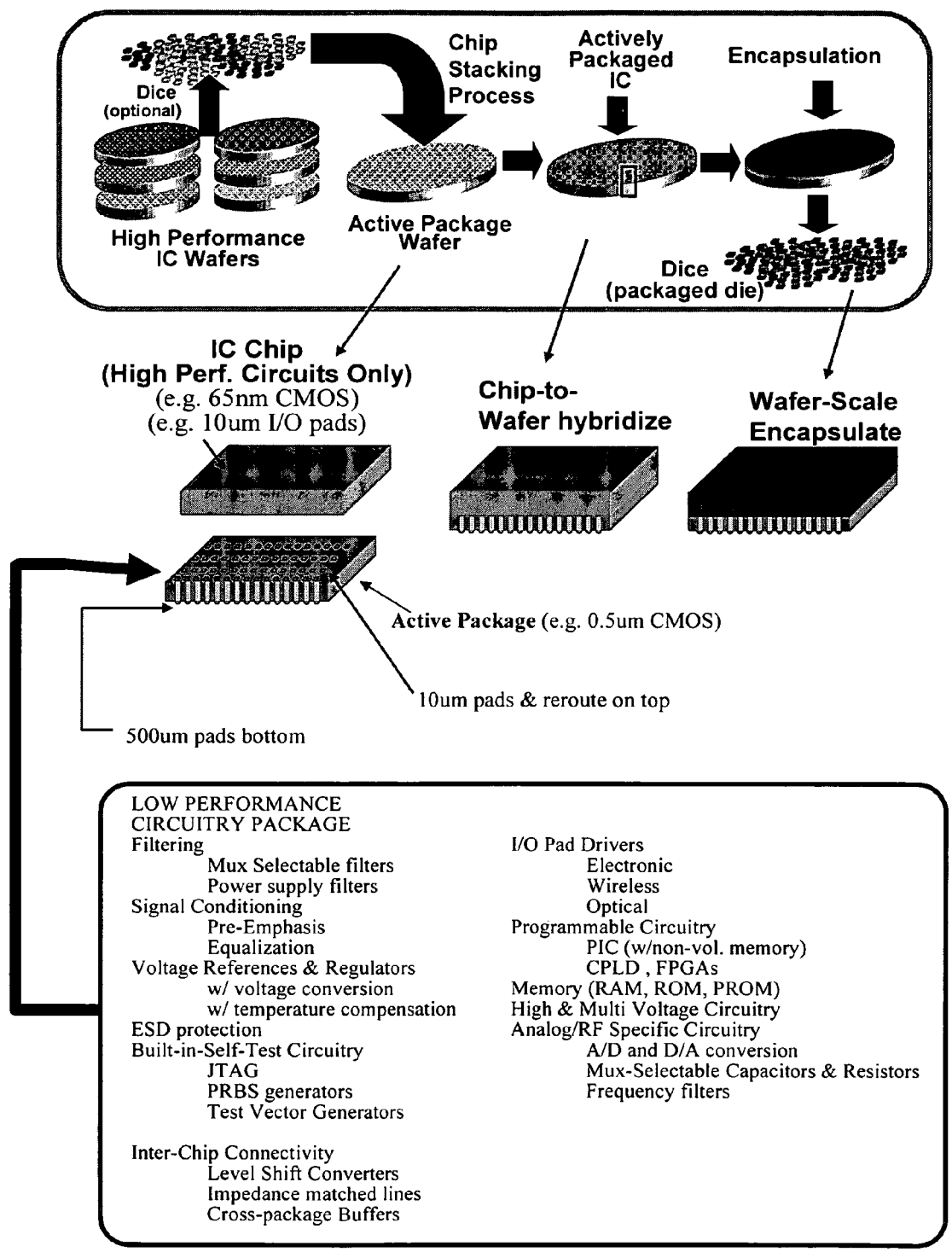
FIG. 223 illustrates details for variants of the packaging of FIG. 222.
Figure 224:
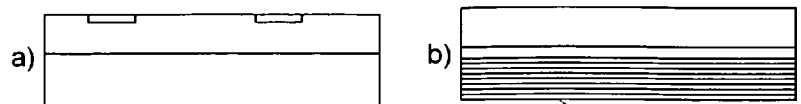
FIGS. 224 through 231 illustrate in simplified overview a routingless processing variant.
Figure 225:
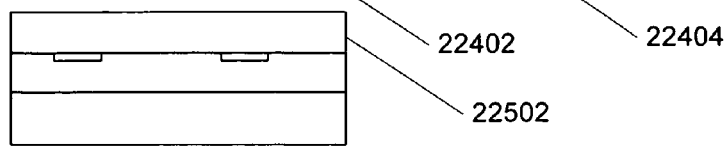
Figure 226:
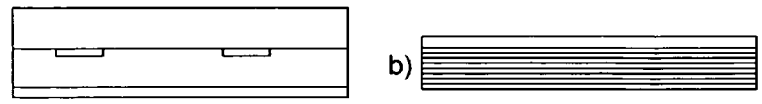
Figure 227:
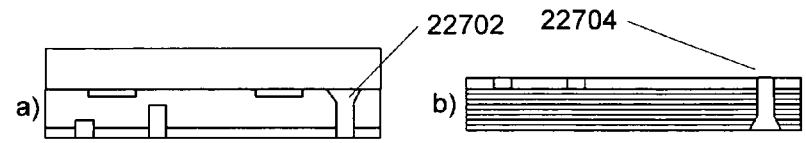
Figure 228:
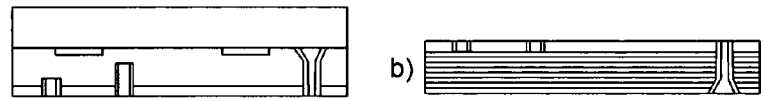
Figure 229:
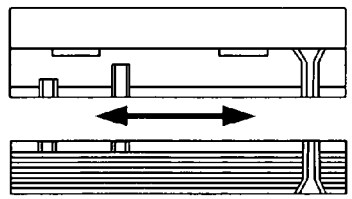
Figure 230:
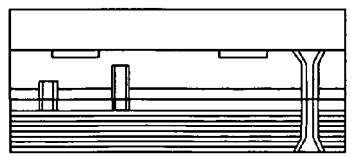
Figure 231:
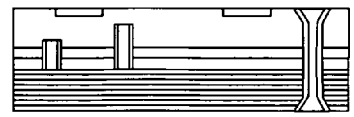

As a result, low performance circuitry can be designed on one chip and high performance chips can be designed for higher performance technology. Moreover, this type of approach can be more cost efficient because a significant amount of high-speed technology real estate can be saved by moving low-speed circuits "off-chip" without needing powerful signal driver circuits to do so. Some examples of the myriad of possibilities are shown, in connection with a high-level representation of the processes described herein, in FIG. 223.

At this point, some further discussion of portions of the aspects described above will be detailed. At present, in order to create an electronic chip, a wafer has to undergo two sets of processes—front-end processing and back-end processing. In front-end processing, the actual devices, including transistors and resistors are created. This involves, in the case of a silicon chip, for example, growth of silicon dioxide, patterning and implantation or diffusion of dopants to obtain the desired electrical properties, growth or deposition of gate dielectrics, and growth or deposition of insulating materials to isolate neighboring devices.

In back end processing, the various devices created during the front-end process are interconnected to form the desired electrical circuits. This involves, for example, depositing layers of the metal traces that form the interconnections, as well as insulating material, and etching it into the desired patterns. Typically, the metal layers consist of aluminum or copper. The insulating material is typically silicon-dioxide, a silicate glass, or other low dielectric constant materials. The metal layers are interconnected by etching vias in the insulating material and depositing tungsten in them.

At present, for a 12" wafer, using 90 nm processes, front- and back-end processing each take about 20 days to complete, and they occur serially. As a result, it can take more than 40 days to fabricate a single wafer from start to finish.

Advantageously, using the processes described herein, that time can be cut to nearly half for most current submicron design rule based chip fabrication technologies (for example, 0.5 µm, 0.18 µm, 0.13 µm, 90 nm, 65 nm, 45 nm, etc . . . ) because the above approaches can allow front- and back-end processing to occur concurrently, in parallel and even in different and unrelated foundries. This is accomplished by performing the front-end processing in a conventional manner on one wafer (a front-end or "FE-wafer") and back-end processing in the conventional manner on another wafer (a back-end or "BE-wafer"), in parallel, as if the two were the same wafer.

In this way, the routing can be performed in a cheap foundry, relative to the transistor or other device-bearing portion, and each can be created in about 20 days. Then, by thinning the wafer and creating connection points on the back side of the FE-wafer through use of one variant of the via processes described herein, connection points can be established thereon. In a similar manner, the processes described herein can be used with the BE-wafer to create a set of complementary connection points corresponding to those on the FE-wafer. Thereafter, the two can be joined together using, for example, a tack and fuse approach, if malleable and rigid corresponding connections are formed (typically with the FE-wafer being the daughter wafer of the above processes (i.e. carrying the malleable contact), a remote attachment approach as described herein, covalent or other wafer surface bonding techniques (alone, with a through-via approach, and/or with simple filled vias that serve to lock the two together and maintain alignment, or some combination thereof/alternative thereto.

Advantageously, through this approach, the metal layers do not have to be limited in thickness or density as might be required by the topology and stress limitations imposed by ever increasingly sensitive transistors. In addition, by separating the process into two chips, lines can be larger and there can be more layers, thereby potentially allowing greater in-chip connectivity and lower parasitic resistance for faster cross-chip communication.

Advantageously, because our approach is independent of the particular fabrication or interconnect technology used to create the particular FE-wafer or BE-wafer, or the design rules applicable to such fabrication, the processes described herein can be used to bring dissimilar technologies together at the nano-level. In other words, the approaches described herein are independent of whatever chip design rules are appropriate to ensure that devices or their interconnections do not overlap or interact with one another in undesirable ways for the particular material (a Si wafer, a GaAs wafer, a SiGe wafer, a Ge wafer, an InP wafer, an InAs wafer, an InSb wafer, a GaN wafer, a GaP wafer, a GaSb wafer, a MgO wafer, a CdTe wafer, a CdS wafer, etc.), or what high resolution mask or non-mask based approaches are used to form submicron or sub-nanometer features or define spacing between devices, their interconnections, or the geometries of the interconnections themselves. Thus, the advance described herein allows for chip fabrication technology to shift from current technologies, for example, CMOS and silicon, to SiGe, silicon-on-insulator (SOI), carbon nanotube based interconnects, biochip, molecular electronics or other approaches designed to give greater performance and/or reduce power requirements.

FIGS. 224 through 231 illustrate in simplified overview this approach. As shown in FIG. 224a, an FE-wafer 22402, having had its front-end processing to form the transistors and other devices completed, has the front-side devices protected using a photoresist or other removable but protective material 22502 to provide support (FIG. 225a). The FE-wafer is then thinned down as necessary (FIG. 226a) to a thickness of a few microns or larger (i.e. removing some or all of the underlying substrate) as needed based upon the required or desired height for the combined FE/BE chips. Vias are then created from and into the back side of the FE-wafer to the appropriate device connection location points using, for example a back-side process as described herein or a front side via process as described herein, simply performed from the back side (FIG. 227a). Optionally, in addition one or more through-vias 22702 are created at the periphery of each die that is slightly flared on the device side and has, for example, a malleable contact on the back side, using, for example, a well or reverse well approach or one side of a pressure fit connection. Such vias can serve to "lock" the FE- and BE-wafer chips together laterally relative to each other if, for example, a covalent or wafer surface joining approach will be used between the two. Still further, accommodation for inter-chip connections in the form of vias that will become part of a heat-pipe arrangement or non-electrical communication arrangement (both of which are described in greater detail below) can be added. The vias are then made conductive (FIG. 228) and, at this point the FE-wafer will be ready to join to a BE-wafer.

Concurrently, the BE-wafer is created to form its metalized layers 22404 (FIG. 224b). Given its makeup, no protection/support may be necessary because the semiconductor material can serve that purpose. However, if it too will be thinned substantially, application of a removable supporting layer may be necessary. The front side of the BE-wafer is then thinned (FIG. 226b) and, in addition, vias can be created (FIG. 227b) and metalized (FIG. 228b) if necessary or desired completely through or merely down to a particular internal metal layer FIG. 227b, FIG. 228b). In addition, depending upon the particular implementation, contact to that internal layer can be by physical connection or non-physical (i.e. capacitive) coupling. Otherwise, complementary connections are created, for example, posts if a post and penetration/tack and fuse approach is to be used, or the complementary connections for a well, reverse well or other connection. Similarly, and optionally, complementary locking vias 22704 (FIG. 227b) can be added to the BE-wafer, or vias that will become part of a heat-pipe arrangement or non-electrical communication arrangement can be added. Moreover, if a heat-pipe arrangement is to be used, it may be desirable to use the BE-wafer metalization (FIG. 228b) to seal one end of the heat-pipe, particularly if the malleable/rigid and tack/fuse approaches are used due to the strength and hermetic nature of the seal that can be formed.

The FE-wafer and BE-wafer are then aligned relative to each other (FIG. 229), so that once they are brought together (FIG. 230) and joined (FIG. 231) they will form a completed wafer unit of individual electronic chips.

Figure 232:
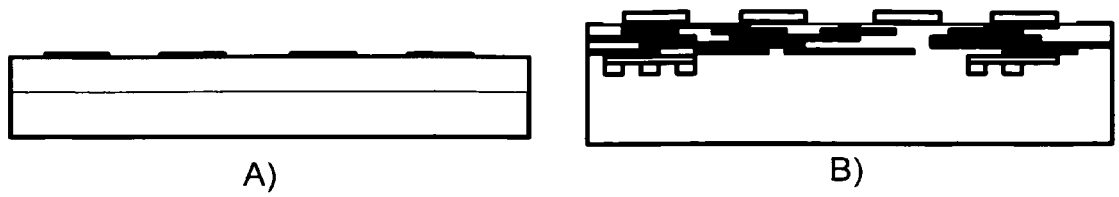
FIGS. 232 through 235 illustrate in simplified form alternative routingless variants.
Figure 233:
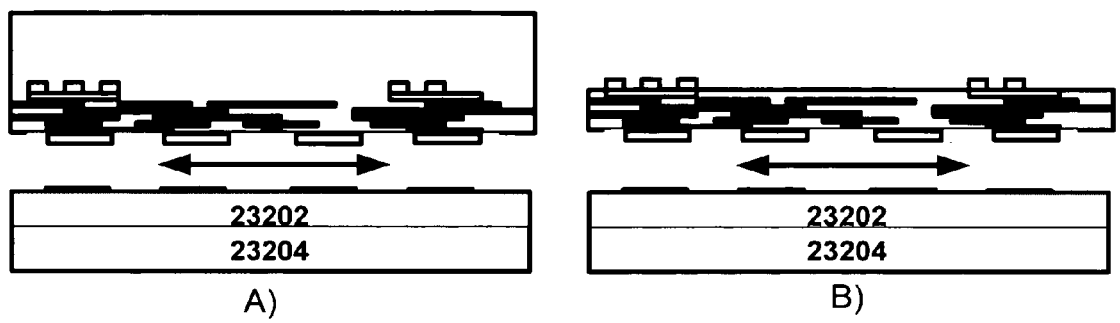
Figure 234:
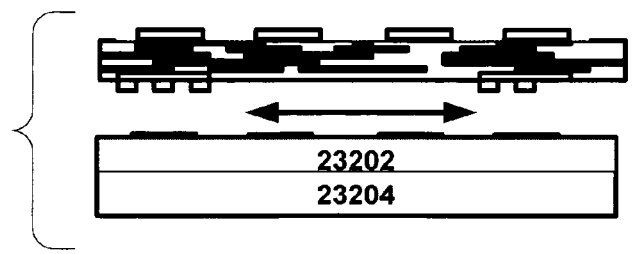
Figure 235:
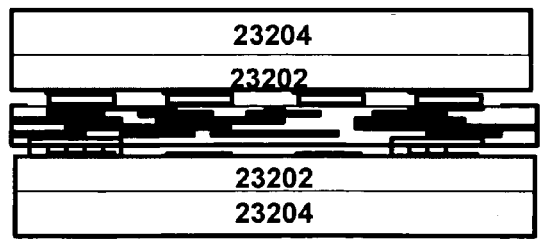

FIG. 233 through FIG. 235 illustrate further variants of the preceding approach. As with the approach of FIG. 224 through FIG. 231, the alternate variants begin with the separate FE-wafer (FIG. 232A), made up of doped semiconductor devices 23202 (i.e. transistors, lasers, photodetectors, capacitors, diodes, etc.) on a substrate 23204, and BE-wafer (FIG. 232B) containing the metalized future inter-device connection layers. However, unlike the approach of FIG. 224 through FIG. 231, the BE wafer is flipped, aligned and bonded to the top of the FE-wafer and this occurs before the substrate is thinned off (FIG. 232A). Alternatively, the same approach as FIG. 232A can be performed as shown in FIG. 232B wherein the BE-wafer is thinned before attachment.

Yet another alternative approach is illustrated in FIG. 234. In this instance, the BE-wafer is thinned to expose the most internal layer of the original chip from FIG. 232B and that layer is attached to the top of the FE-wafer.

FIG. 235 illustrates a further enhancement or alternative variant. As a result of the approaches of FIG. 231, FIG. 232B, FIG. 233B or FIG. 234, after attachment, the other side of the BE-wafer's metal is exposed. As a result, another chip can be attached to that metal as well to create another type of chip stacking approach.

At this point it should be noted that a further advantage to these approaches is that, if necessary, some further rerouting of connections can be made on the FE-wafer or BE-wafer (or possibly both). As a result, it is even possible to create the FE- and BE-wafers to be more generic, with the other providing suitable connection locations for a particular application. Moreover, at this point, the combined FE/BE-wafer or FE/BE/(FE-wafer or chip) stack can be treated like any other wafer created using wholly conventional processes, and thus can be a mother or daughter wafer with respect to other wafer(s) for purposes of the subject matter described herein.

Figure 236:
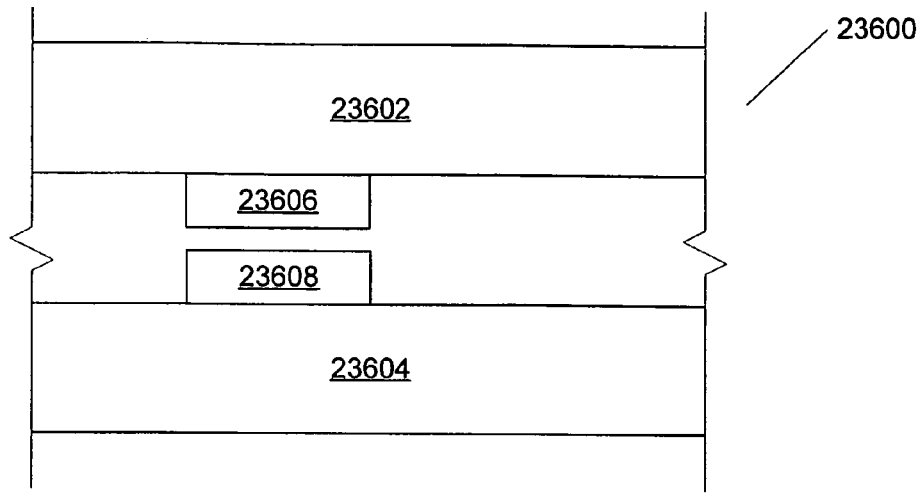
FIG. 236 illustrates in simplified form the use of an optical, rather than wired, connection between two chips.
Figure 237:
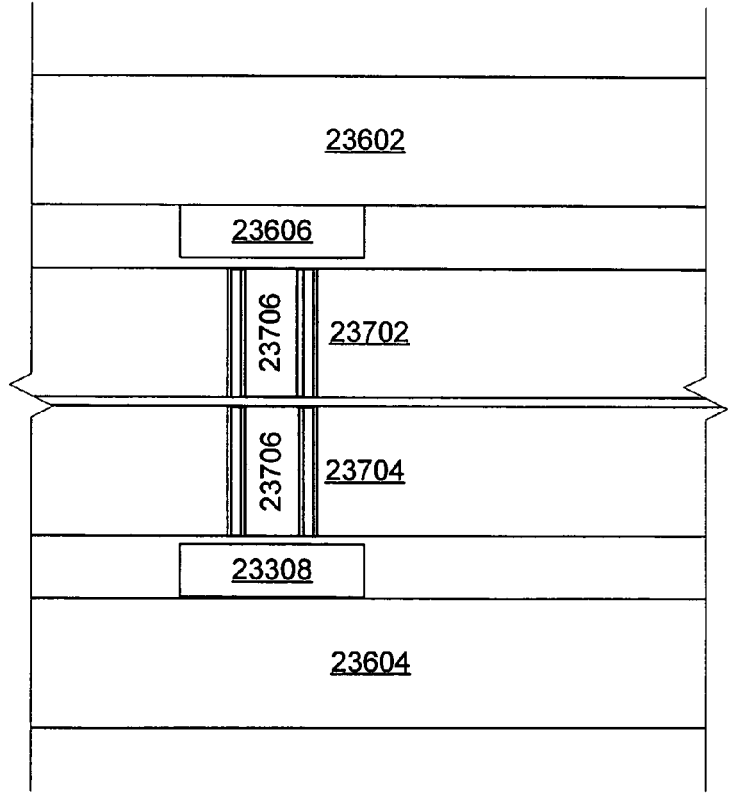
FIG. 237 illustrates in simplified form use of a variant of the heat pipe configuration to allow light to pass from a laser-bearing chip to a photodetector-bearing chip even though there are two other chips interposed between them.

Still further, chip units can be designed that use much higher speed communication between chips than are available with wired connections, due to problems related to crosstalk causing interference, through use of chip-to-chip optical connections. For example, by placing a semiconductor laser on one chip in a stack and a corresponding photo detector on the other chip in the stack to which it is mated, an optical— rather than wired—connection can made between the two. If the two are sufficiently close to each other, the possibility of even optical crosstalk is minimized. This aspect is illustrated in simplified fashion in FIG. 236 which shows a portion of a chip unit 23600 comprising two chips 23602, 23604. One of the chips 23602 has a laser 23606 thereon and the other chip 23604 has a photodetector 23608 thereon with the two arranged so that optical signals emitted by the laser 23606 are received by the photodetector 23608. Moreover, the techniques described herein facilitate optical communication between chips even if there are one or more chips interposed between the two. For example, as shown in FIG. 237, a variant of the heat pipe configuration can be created to get light from the laser-bearing chip 23602 to the photodetector-bearing chip 23604 even though there are two other chips 23702, 23704 interposed between the two. To do so, a through-chip approach is used but the inner void is neither filled with any electrical conductor nor left open for use as a heat pipe, but rather the void is filled with an optically transmissive medium 23706, like an optical epoxy or other light carrying material, to form an optical waveguide. With the optical waveguide, the metal and/or insulator acts to confine the light so that the via operates similar to an optical fiber. Moreover, by adjusting the via size and the composition of the outer metal or insulator, the waveguide can have essentially the same properties as a single mode or multi-mode optical fiber. Still further, with a variant having a "central island" of silicon, if the central island is thermally oxidized and not removed, the oxidation will cause the center island to become silicon dioxide and would be a surrogate for an optical fiber "core." Thereafter, by placing a laser at one end of the waveguide and a photodetector at the other end of the waveguide, the laser light can now be carried "through" the interposed chip(s) via the transmissive medium 23706.

Detailed Contact and Material Alternatives

Figure 238:
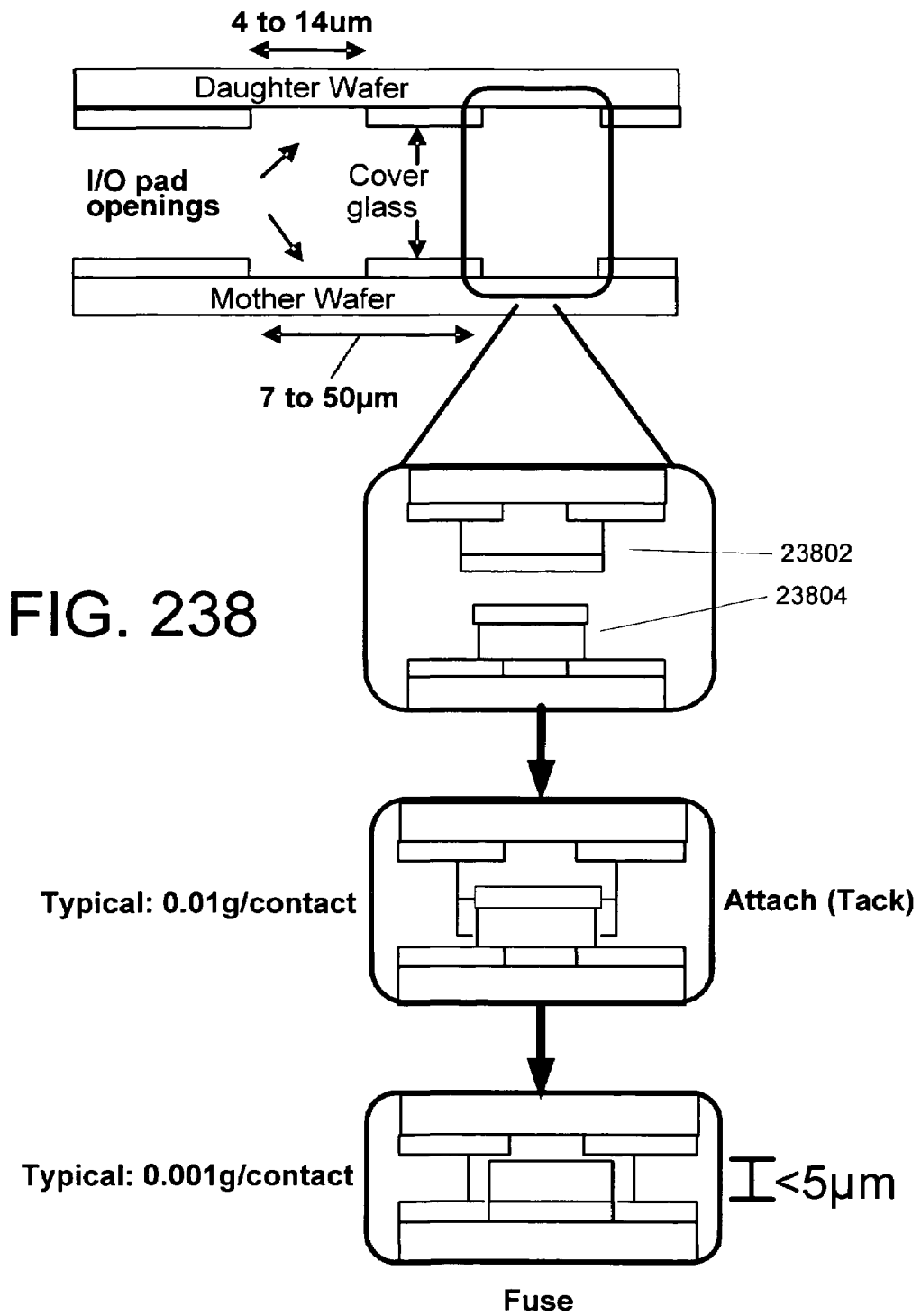
FIG. 238 illustrates in simplified form the tack and fuse process approach.

As will now be appreciated, the contacts fairly complex aspects, in and of themselves due to the nature of the tack and fuse processes, reiterated in simplified form in FIG. 238. As a result, it is important to note some of the alternative materials that can be used for the contact components for both the daughter wafer 23802 and the mother wafer 23804.

Figure 239:
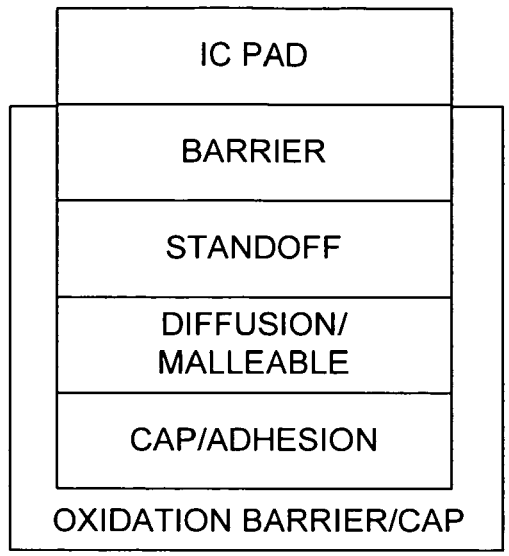
FIG. 239 illustrates in simplified form the functional layers of a daughter contact.
Figure 240:
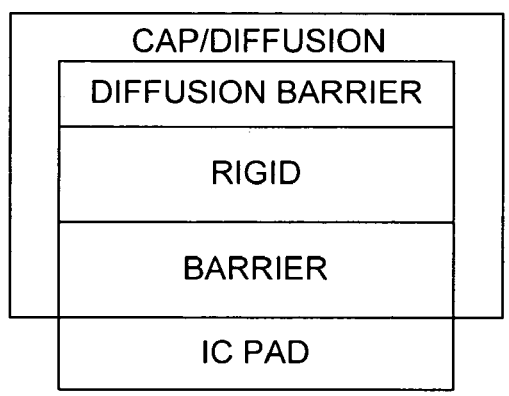
FIG. 240 illustrates in simplified form the functional layers of a mother contact.

In general, whatever the application, a daughter wafer contact 23802 of FIG. 238 will have the functional layers shown in FIG. 239. Similarly, a mother wafer contact 23804 of FIG. 238 will have the functional layers shown in FIG. 240. It is noteworthy that, for both contacts 23802, 23804, each functional layer could be made up of one or more material layers or a single material layer could fill the role of multiple functional layers. This is best illustrated by way of some specific daughter wafer contact examples such as shown in FIG. 241 and some specific mother wafer contact examples such as shown in FIG. 242. From these figures it will be apparent that any particular layer could be made up of a discrete material, an alloy or a superlattice of materials.

Referring back to FIG. 239, in the case of an electroless variant, the daughter contact 3802 could have the following constituents:

Barrier Layer: Ti/W+Pd
Standoff Layer: Absent
Diffusion/Malleable Layer: Gold/Tin (80/20) (between 1 and 12 microns)
Cap/Adhesion: Gold (>500 Angstroms; Typically 1500 to 10,000 Angstroms)
Oxidation Barrier: the Cap/Adhesion layer serves as this layer also.

Note, while the malleable layer may be composed of any combination of standoff, diffusion, cap and barrier layer, here the malleable is the combination of the diffusion and cap layers.

Similarly, for the mother contact (with reference to FIG. 240), the mother contact 23304 could have the following constituents:

Barrier Layer: Absent for Cu/Al pads
Rigid: Copper (>2 microns)
Diffusion Barrier Layer: Nickel (5000 Angstroms; typically 0.5 to 3 microns)
Cap/Diffusion: Gold (>500 Angstroms; typically 1500 to 10,000 Angstroms)

With respect to the above, the following sets forth further, non-exhaustive, alternative materials that can be used for the specified contact layers.

Barrier (mother or daughter)/Diffusion Barrier (mother): This could be, for example, Ni, Cr, Ti/Pt, Ti/Pd/Pt, Ti/Pt/Au, Ti/Pd, Ti/Pd/Au, Ti/Pd/Pt/Au, TiW, Ta, TaN, Ti, TaW, W, or could be absent if the IC pad is made of the same material as the standoff layer. Standoff Layer (daughter)/Rigid Layer (mother): Ni (especially if barrier is Ni), Cu (especially if pad is Cu), Al, Au, W, Pt, Pd, Co, or Cr. If sputtered rather than plated, then any type of metal which has a melting temperature higher (typically >50° C. higher) than the melting temperature of the malleable (diffusion) material. It could also be made of any of the barrier materials.

Malleable (Diffusion) Material: A metal that melts at low temperature like: tin, indium, lead, bismuth, aluminum, zinc, magnesium or other material with melting point less than 1000° C. or an alloy combining two or more of those together, or combining one or more of those together with a higher temperature melting material like gold, silver, copper, titanium, or other analogous material. Combination examples include: Au/Sn, Cu/Sn, Cu/Zn, Bi/Ag, etc. Note: An important aspect for this selection is that it is not desirable for the selected material to actually melt during the attach process since that would be too slow of a process, adding to cost, and could cause problems with creep or running causing contact shorting and thus limiting the density. It is the malleable/rigid combination which ultimately gives the strength of the contact. Typically an alloy containing compounds with mixtures of one or more of: Au, Ag, Bi, Cd, Cu, Fe, In, Pb, Sn, Sb, or Zn are good choices. The primary condition is that the melting temperature should be less than or equal to the melting temperature of the rigid post and, if present, the standoff layer. Typically, the malleable should have a melting point of at least 50° C. lower than the melting point of the rigid, although we have used a melting point differential of between 100° C. to 500° C. Advantageously, the malleable material can also be built up of several materials to give the proper height needed to overcome non-planarity of the contacts. In fact the malleable material can be built on top of a standoff post of the rigid material. For example, in one case, the malleable material could consist of Au/Sn, 5 microns high. Alternatively, in another case, the post could consist of a stack of a rigid material such as 4 microns of nickel covered by a thinner layer, for example, 1 to 1.5 microns, of the malleable material.

Malleable Cover Material (Cap/Adhesion layer): These can be a material that could become wet under temperature, such as a low-temperature metal (or alloy) like tin, indium, lead or zinc. Note that this cover material layer is generally much thinner than the malleable material layer. For example, it would normally be around 10 to 20 times thinner. For example, if the malleable (plus any standoff) material were 5 microns high, the malleable cover material could be 0.5 microns, and would typically in the range of 0.1 micron to 1 micron (or about 50× to 5× thinner than the malleable layer). One good example of such a cover is tin (Sn). Such a cover material will have a low melting temperature and can turn liquidus at the tack temperature. However, because the layer is very thin, it will not cause shorting between adjacent contacts as there is not enough liquid; to do so. At the same time it can make for a quicker attach process to the rigid cap, because the tack phase becomes a liquid process. In general, this cover should be selected so as to be compatible with the malleable material so that, after fuse, the resultant combination would be suitable for a strong bond. For the tin example, such an approach would typically use a Au/Sn contact with a Sn cap.

Malleable Cover Material (Oxidation Barrier)/Rigid Cover Material (diffusion cap): If the adhesion layer is used for the "tack" process and it is a material prone to oxidize, like tin or zinc, then it should be covered with a very thin oxidation barrier. Otherwise, a reactive gas or liquid should be used during the tack process to remove the oxide, or a high enough pressure must be used to break through the oxide, as can happen for example, if indium is used as the cap. The cover can even be an epoxy. For most materials, a thickness of 10 times thinner than the cap itself will work. Note again that the malleable cover could be of a higher temperature material that only becomes a lower-temperature alloy (or only becomes a bonding agent) when the malleable cover material comes into contact with and begins to mix with the rigid cover material or with the malleable material. For example if the two covers were two parts of a mixable epoxy or if the oxidation barrier were gold and the malleable gold-tin then the intermixing of the tin into the oxidation layer during the attach process would cause that material to have a lower melting point. In general, this layer can be any metal/material which does not readily oxidize (e.g. Au, Pt, etc.).

Figure 243C:
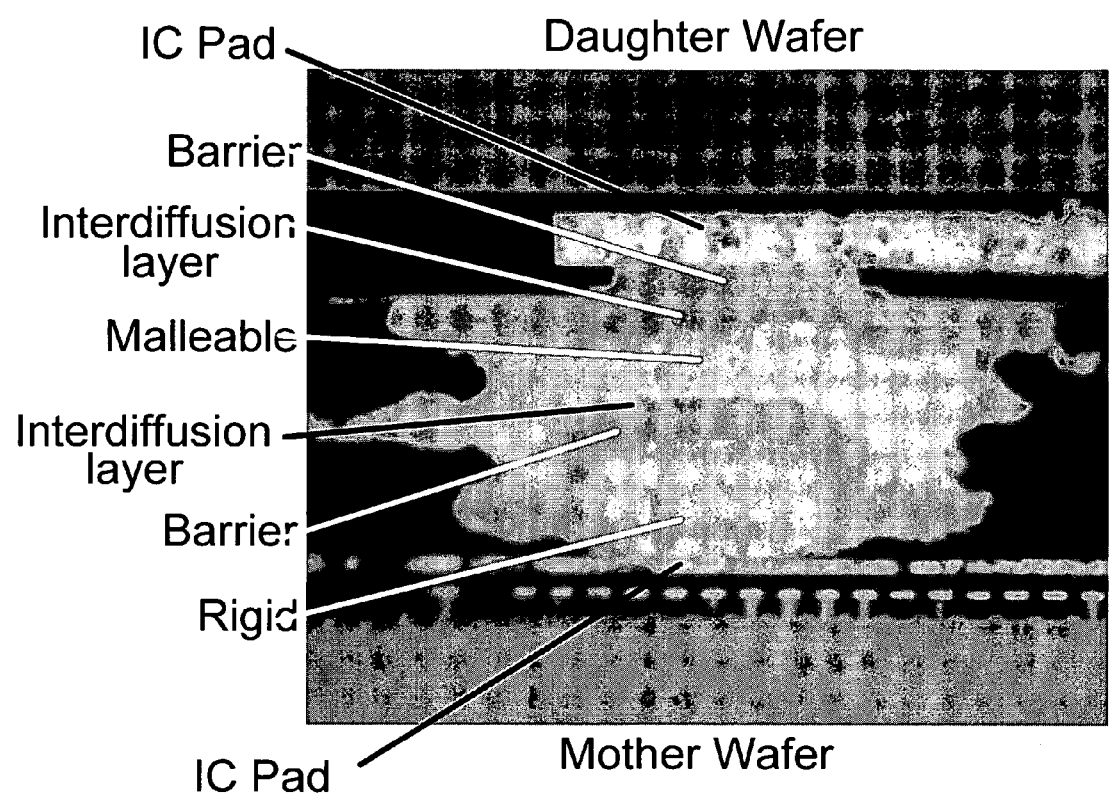

FIGS. 243A through 243C are photographs of cross sections of actual contacts (nother and daughter) formed using variants of the above in a tack and fuse process that show an example of the different layers and how they do or do not interact.

FIG. 243A is a pair of contacts connecting a mother wafer and daughter wafer following completion of the tack pahse of the tack and fuse process. As can be seen, while there is a good connection between the two, it is not permanent, as evidenced by the large area of unconnected material.

FIG. 243B is a similar contact pair following completion of the fuse phase. Here, the permanent connection is evident as is the value of using barriers. Note that in both FIG. 243A and FIG. 243B, the malleable material has largely been trapped between the barriers.

FIG. 243C is a photograph of a similarly joined pair of contacts, also following the fuse phase. In this picture, although the components are not as clearly visible, the IC pads of the mother and daughter wafers are and they provide a sense of the relative size relationship between the two.

Connection-Related Tooling

Having described numerous different approaches for interconnection of chips on a chip, die and wafer basis, and various details that make it possible to employ many permutations, variations and combinations thereof, it is useful to diverge and describe certain different types of tooling that have been devised and can be advantageously used to assist in the joining process. Note that none of these tooling approaches are essential for accomplishing any of the permutations, variations or combinations, but rather they have been developed to ease the process and can be used for other chip-related operations, like "pick and place," particularly where it is desirable to simultaneously do so for multiple chips at the same time and even more advantageously, in circumstances where those chips vary in height with respect to each other.

For purposes of explanation, different tooling variants will be described with respect to use in the tack and fuse process, since an understanding of that approach will obviate the need to describe the simpler uses, since they will be a subset or trivial variant thereof.

As described herein, the attachment process is split into two parts: A first part in which chips are lightly attached together (the "tack" phase) and a second part, the "fuse" phase that provides the bond strength. The tack process heats up the contacts and keeps them abutting under light pressure to allow the materials on the two corresponding contacts to interdiffuse into one another.

During this process, if the force of gravity alone is not sufficient to provide for the requisite pressure, a small amount of pressure can be applied to ensure that the chips do not move during the process reducing the prospect of mechanical shock or non-uniformity in attachment, either of which could result in less than adequate adhesion between the contacts and thereby an inability to withstand wafer handling. In addition, the pressure can help ensure that if any local heating causes the malleable material to become partially or completely liquidus (or simply become more malleable than ideal without becoming liquidus, and counteract the pressures and surface tensions or other forces that might otherwise push the pieces apart or, in the case where excess softness of the malleable material occurs, it can prevent excess lateral movement of the parts individually and collectively Thus, the application of slight pressure can ensure more latitude in the temperatures and handling conditions for the fuse process to account for manufacturing tolerances and variations.

However, one of the problems with putting pressure on these chips is that if the base element, for example a wafer, has multiple chips which are attached to it, the individual chips might not be co-planar and could even differ significantly in height. Thus, if one were to simply place a flat surface or plate on the top of the chips, the applied pressure would be unevenly applied.

As illustrated below, the approaches devised for addressing the foregoing is to use an arrangement between the source of the force and the chips that will conform to or account for the different heights and thus allow all chips to have equal pressure applied to them.

One approach for accomplishing this uses a series of pins or posts that match with the individual chips on a one-to-one basis as the arrangement. Two different variants of this approach will now be described with the understanding that other variants can be devised by, for example, combining aspects from each or from the other tooling approaches as described below.

FIGS. 244 through 247 illustrate example tooling for implementing a pin or post based approach.

As illustrated in FIG. 244 and FIG. 245, the approach uses a set of pins or posts 24402 within a frame 24404. The individual pins or posts are movable at least along their length axis (some implementations can also allow for a sleight degree of pivot if planarity or tilt is a potential issue). The posts or pins can be constrained and released. Each post or pin has a face surface that is configured to contact a single respective chip.

Depending upon the particular implementation, the face of any particular pin or post can be: flat, an inverse die of the chip it will apply pressure to, or some other shape appropriate for the particular application. In addition, the pin or post itself at or near the face (as well as along some or all of its length) can have a circular cross section or some other, non-circular (i.e. oval, quadrilateral, hexagonal, octagonal, etc.) closed shape. Moreover, the perimeter and planar area of the face can be larger or smaller than the perimeter or area of the particular chip it will contact (i.e. it can extend beyond the periphery of the chip or be wholly or partially contained within it, the important aspect being that the face is configured to apply force to the chip without damaging it, particularly without cracking or chipping it.

In use, the posts within the frame (and in some cases, the frame itself) are brought downward, in an unconstrained condition, until each post is in appropriate contact with its respective chip (FIG. 245). Once this is the case, the pins are constrained in place. As a result, an appropriate level of force can be applied to the frame, or in some implementations the pins or posts. As the tool is brought down, it only applies vertical force on the chips. so that the force will be evenly transmitted via the pins or posts to the respective chips.

Thereafter, the joining process can continue as described herein or in some other manner.

FIG. 246 and FIG. 247 illustrate an alternative pin or post based approach that is similar to the approach of FIG. 244 and FIG. 245 except that, instead of a single pin or post per chip it uses a group of smaller pins or posts to contact an individual chip. As a result, with this approach, the individual pins or posts within a group can be used to account for nonplanarity or height variations of a single chip. Moreover, depending upon the particular implementation, if the group is configured such that at least some pins are beyond the peripheral boundary of the chip, by extending them so that they extend below the upper surface of the chip, they can serve to constrain the chip from lateral movement. Otherwise, the approach is the same as with the pin/post-per-chip (i.e. the faces 24606 of unconstrained groups pins/posts are brought into contact with their respective chips and constrained so that a force can be applied via the frame, groups or pins. Moreover, the individual pins/posts in the group can have a circular or non-circular cross section near their respective faces. Moreover, as will become evident below, by selecting the appropriate shapes for the pins, spacing between the pins/posts in a group can be created or eliminated and certain advantages can be achieved.

Note that the individual pins/posts or groups (if multiple pins/posts per chip) need to be wide enough to ensure that any pressure transferred by them to the chips does not crack the chips and they should be placed so that they do not clip an edge or a corner of a chip during the process.

In both cases, by using the frame to hold the posts or pins, once constrained, the posts or pins can only meaningfully move in the vertical direction, allowing the structure to only apply vertical pressure while conforming to the topography of the chips attached to the wafer.

Advantageously, as noted herein, where a tack and fuse approach is used, the forces needed for the "tack" step will typically be on the order of 1 gram per contact or less and for the fuse process, typically less than 0.001 grams per contact. As a result, the pins or posts can be readily constrained within the frame without difficulty through, for example a clamping or other locking approach, the particular approach being a matter of design choice and unimportant for understanding the tooling and its use.

Advantageously, in some implementations, either of the above tooling can be further enhanced by making it possible to apply a vacuum to the chips. In the case of the pin/post-per-chip tooling, this can be accomplished by providing passageways 24412, 24414 through the post and openings on the post face 24406. Alternatively, with the group-of-pins/posts approach, the pins/posts themselves can house the passage through which the vacuum is drawn. Alternatively, by selecting the appropriate shapes and spacings for the pins/posts, passages among abutting pins can be formed (within the chip boundary) or eliminated (near the chip periphery) so as to allow for the vacuum to be drawn through those interstitial passages.

In either tooling instance, with such a variant, a vacuum can be applied to the chips to, for example, allow for the tooling itself to be used in a pick-and-place operation or for the vacuum to further inhibit non-vertical (i.e. undesirable) movement of the chip during, for example, the tack or fuse processes.

Through a further alternative approach, a material can be applied to the face 24406, 24606 of the pins or posts which will cause them to initially adhere to the chips, but is also selected so as to be able to "detach" from the chip when the operation is complete. For example, a material can be used on the faces that will liquify and run, melt or vaporize at about the tack or fuse temperature but, in doing so will not damage the chips and, if it leaves a residue on the chip or element to which the chip is attached, the residue can be removed through some non-damaging process or ignored without detrimental effect.

While the post/pin solution provides only vertical motion, some implementations of that approach do not actually hold the chips in place and, in some cases, cannot guarantee that force will be uniformly applied across each chip or that the chips will not tilt in angle during, for example, the tack or fuse process. Thus, in some cases, movement of the chips or non-uniform fusing, across individual chips or between chips with different heights, could occur.

In such cases, an alternative tooling approach, shown in FIG. 248 and FIG. 249 can be used that involves a spongy, flexible, conformable or deformable material 24802 arranged between a rigid plate 24804 and the daughter chips 24906 which, as shown in FIG. 249, would conform or adjust itself to the heights of the various parts while keeping pressure over the chips and preventing localized pressure which could result in scratching, chipping or damage to the chips. This approach uses a spongy or deformable material of suitable thickness for the particular application (typically between 0.01" and 0.125"). Non-exhaustive examples of such materials include, but are not limited to for example, a high-temperature polymer like Kalrez® 7075, Kapton®, or Teflon® (all commercially available from DuPont), high-temperature silicone rubber, thermal pads commercially sold by Bergquist Company of Chanhassen, Minn., a ceramic fiber reinforced alumina composite such as Zircar RS-100 (commercially available from Zircar Refractory Composites, Inc. of Florida, N.Y. 10921), ceramic tape, for example, an aluminum oxide based ceramic tape such as those commercially available through McMaster-Carr Supply Company under the Catalog Nos. 390-2xM, 390-4xM and 390-8xM (where the x is a 1, 2 or 3 to denote width), a ceramic fiber strip such as commercially sold by McMaster-Carr as part number 87575K89, fiberglass paper sold by McMaster-Carr as part number 9323K21, or some other material.

Moreover, depending upon the particular material used between the plate and chips, the material can be reusable for two or more cycles of pressure application and joining or it can strictly be a one-time use material.

As with the pin/post variants, and shown in FIG. 249, the plate is brought down onto the chips under pressure, thereby causing the deformable material to conform to the chips while constraining them against lateral movement by surrounding the chips at their periphery. The joining process then proceeds as with the pin/post based tooling.

Alternatively, and advantageously, this arrangement can also be used along with pin/post based tooling if the particular application renders it less desirable to apply the force to the pins/posts via the frame. In such an arrangement, the pin based tooling is applied as above. However, if the pins/posts are all of equal height, once brought into contact with the chips, the ends of the pins/posts will reflect the same height differentials as the chips. However, by using the plate and material arrangement on the ends of the pin/posts opposite the chips, the height differential can be accommodated and the appropriate force easily and uniformly applied. Moreover, through this approach, the particular material will likely be sufficiently removed physically from the chips that it need not be a temperature resistant as those materials that must be brought into direct contact with the chips.

Another alternative approach to maintaining the chips in contact with the element(s) to which they will be joined, that is similar to the plate variant of FIG. 248 and FIG. 249 is shown in FIG. 250 through FIG. 254 and involves tooling made up of a body 25000 that is formed by coating a relatively thin, but rigid, material 25002 with another hardenable material 25004, which preferably can be deposited in liquidus or gel form (for example, an epoxy) and hardened later.

This body 25000 is then placed on the array of chips 24906 so that the hardenable material 25004 adheres to each while being maintained in a level position (FIG. 251). The hardenable material is then hardened so that the entire body becomes rigid. (alternatively, the rigid part of the fuse body could be a flexible, conforming material as long as the subsequent hardenable material is then kept thick enough so that when it hardens, the entire body (i.e. body and hardenable material) behaves like a rigid body).

Once hardened, the chips can be moved to the element to which they will be attached, and the body can be weighted with a separate and removable weight, if necessary, during the attachment process (if needed) (FIG. 252). Moreover, because the hardenable material is attached to each chip and hardened, the attached chips cannot move in any direction (either laterally, vertically, or in tilt (pitch and yaw)) with respect to each other except as through movement of the overall body itself. As a result, if the overall body is maintained in a level position during the attachment process, the chips will be maintained in a similar orientation.

Optionally, an underfill 25302 material can be flowed in between the body and the element to which the chips will be attached (FIG. 253). This underfill 25302 can be used to fill in any gaps between the chips and the element to which they will be attached. Moreover, because the area between the chips and the body is enclosed, the underfill 25302 can be flowed in a controllable manner (i.e. without it running into undesirable places).

Once joined, and after removing the weight if a weight was used or applying the underfill (if done), the entire (or a large portion of the) body can be removed (FIG. 254) by any appropriate process that will not damage the chips, for example, a chemical process, by lapping or polishing the wafer down or a chemical-mechanical process (CMP). By removing the body, the entire chip assembly would then be available to have a new layer of chips attached as if they are now the underlying element.

Similarly, this "body" approach can be used in conjunction with a pin/post based tooling to account for differences in pin/post heights and allow for application of the force through other than direct application to the frame. In such a case, the pins/posts are brought into contact with the chips, the body is then brought into contact with the ends of the pins/posts opposite the chips and hardened. Thereafter the force is applied as above in the desired process. Once the chips are attached, the pin/post-frame-overall body combination can be readily removed from the chips as with the normal pin/post approaches. Thereafter, the overall body can be separated from the pin/post-frame tooling through any convenient process that would soften or remove the hardenable material or by simply cutting or shearing off the pins at a point outside the hardenable material.

Moreover, a further advantage to this particular combination approach is that it allows for repeatability in cases where an assembly-line approach to joining a multiple chips to one or more respective underlying elements and, as noted above with respect to certain variants, use as part of a pick-and-place approach.

Finally, with respect to all of the above tooling as well as other variants, permutations or combinations thereof, it should be noted that, if required for a particular use, a gas, like forming gas or formic acid or a flux can be flowed in between the frame and the chip during the fuse portion of the process.

Note that, in some cases, the pin/post approach will be preferable to use of some flexible or spongy materials (i.e. those which could themselves apply too much lateral pressure on the chips, causing them to tilt or to shift during the fuse process, or could require extremely (and commercially impractical) tight tolerances with respect to the fuse process conditions)).

In summary reiteration, although the invention has been described in connection with particular types of chips including optical chips (i.e. ones carrying, for example, one or more lasers, one or more photodetectors, or some combination thereof) however, the approaches described herein can be used equally well to create "through-chip" electrical connections in any kind of doped semiconductor chip comprising transistors or other electronic circuit components in addition to, or instead of, optical components.

Similarly, although certain materials have been identified as suitable for use as "post and penetration" contact materials, those materials should not be considered literally the only materials that can be used, since the important aspect is the relative hardness between the two such that diffusion between the two occurs to form the connection, not the particular materials used. Since the particular pairings of materials will, to some extent, be determined by factors such as availability, cost, compatibility with the other components being used or other manufacturing-related processes that are unrelated to those described herein, it is unhelpful to itemize more than a few of the potentially limitless pairs of materials. Similarly, there are a number of optically transmissive materials beyond optical epoxies. However, the criteria for selection of the particular material that would be used for a particular application may be affected or governed by other factors not pertinent to the subject matter herein. Accordingly, it should be understood that any optically transmissive medium (or media) that could be inserted into the void and transmit laser light as required for the particular application should be considered as being a suitably usable material without specific itemization of all possible alternatives thereof.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A method of forming an electrical connection from a first chip, having a contact pad exposed through an opening in a cover glass on the first chip, to a second chip having a first side and a second side, the method comprising:
    attaching the first side of the second chip to the first chip;
    etching an annular via having an inner perimeter and an outer perimeter and a thickness in between, wherein the inner perimeter corresponds to a shape and size of an outer perimeter of the contact pad, and wherein the annular via extends from the second side of the second chip, into and through the second chip, and down to the cover glass of the first chip so that the inner perimeter of the annular via substantially corresponds to the outer perimeter of the contact pad on the first chip;
    filling the annular via with an insulator so that an inner perimeter of the insulator coincides with the inner perimeter of the annular via;
    removing a volume of semiconductor material from the second chip, wherein the semiconductor material is removed from within the inner perimeter of the insulator, to create a void that extends from the second side of the second chip to the contact pad on the first chip; and
    filling at least some of the void with a conductive material so that an electrically conductive path is created within the void, wherein the electrically conductive path extends between the contact pad on the first chip and the second side of the second chip.

2. The method of claim 1, wherein the filling at least some of the void with a conductive material comprises completely filling the void with one of a metal or alloy.

3. The method of claim 1, further comprising selecting the inner perimeter of the annular via so that the inner perimeter of the annular via and the outer perimeter of the contact pad directly coincide.

4. The method of claim 1, further comprising selecting the inner perimeter of the annular via so that the inner perimeter of the annular via is smaller than the outer perimeter of the contact pad.

5. The method of claim 1, further comprising selecting the inner perimeter of the annular via so that the inner perimeter of the annular via coincides with the opening in the cover glass over the contact pad.

6. The method of claim 1, wherein attaching the first side of the second chip to the first chip comprises gluing the first side of the second chip to the first chip.

7. The method of claim 1, wherein attaching the first side of the second chip to the first chip comprises processing at least one of the first side of the second chip, or a side of the first chip to which the first side of the second chip will attach, so that the first chip and the second chip will be bonded to each other by one of van der Waal's force or covalent bonding.

8. The method of claim 1, wherein attaching the first side of the second chip to the first chip comprises performing a wafer fusion process.

9. The method of claim 1, further comprising forming a coaxial conductor within the annular via.

10. A method of forming an electrical connection from a first chip, having a contact pad exposed through an opening in a cover glass on the first chip, to a second chip having a first side and a second side, the method comprising:
    attaching the first side of the second chip to the first chip;
    etching a via into the second chip, wherein the via has a perimeter that corresponds to a shape and size of an outer perimeter of the contact pad, and wherein the via extends from the second side of the second chip, into and through the second chip, and down to the contact pad of the first chip so that the perimeter of the via substantially corresponds to the outer perimeter of the contact pad on the first chip;
    insulating an inner surface of the via with an insulator so that a void remains in the second chip, wherein the void is bounded along its length by the insulator; and
    filling at least some of the remaining void with a conductive material so that an electrically conductive path is created within the void, wherein the electrically conductive path extends between the contact pad on the first chip and the second side of the second chip.

11. The method of claim 10, wherein the filling at least some of the void with a conductive material comprises completely filling the void with one of a metal or alloy.

12. The method of claim 10, further comprising selecting the perimeter of the via so that the perimeter of the via and the outer perimeter of the contact pad directly coincide.

13. The method of claim 10, further comprising selecting the perimeter of the via so that the perimeter of the via is smaller than the outer perimeter of the contact pad.

14. The method of claim 10, further comprising selecting the perimeter of the via so that the perimeter of the via is larger than the outer perimeter of the contact pad and surrounds at least some of the cover glass over the contact pad.

15. The method of claim 10, wherein attaching the first side of the second chip to the first chip comprises gluing the first side of the second chip to the first chip.

16. The method of claim 10, wherein attaching the first side of the second chip to the first chip comprises processing at least one of the first side of the second chip, or a side of the first chip to which the first side of the second chip will attach, so that the first chip and the second chip will be bonded to each other by one of van der Waal's force or covalent bonding.

17. The method of claim 10, wherein attaching the first side of the second chip to the first chip comprises performing a wafer fusion process.

* * * * *

UNITED STATES PATENT AND TRADEMARK OFFICE
CERTIFICATE OF CORRECTION

PATENT NO. : 7,538,033 B2  Page 1 of 1
APPLICATION NO. : 11/329873
DATED : May 26, 2009
INVENTOR(S) : John Trezza It is certified that error appears in the above-identified patent and that said Letters Patent is hereby corrected as shown below:

On the Title Pg

Item [*] Notice:   Subject to any disclaimer, the term of this patent is extended or adjusted under 35 USC 154(b) by (0) days Delete the phrase "by 0 days" and insert -- by 84 days --

Signed and Sealed this

First Day of June, 2010

David J. Kappos
*Director of the United States Patent and Trademark Office*